(12) United States Patent
Choi et al.

(10) Patent No.: US 8,975,653 B2
(45) Date of Patent: Mar. 10, 2015

(54) SEMICONDUCTOR LIGHT EMITTING DEVICE

(71) Applicant: Samsung Electronics Co., Ltd., Suwon-si, Gyeonggi-do (KR)

(72) Inventors: Pun Jae Choi, Gyeonggi-do (KR); Seung Yu Kim, Gyunggi-do (KR); Jin Bock Lee, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 14/080,455

(22) Filed: Nov. 14, 2013

(65) Prior Publication Data

US 2014/0070263 A1    Mar. 13, 2014

Related U.S. Application Data

(62) Division of application No. 13/125,256, filed as application No. PCT/KR2009/006144 on Oct. 22, 2009, now Pat. No. 8,686,454.

(30) Foreign Application Priority Data

Oct. 22, 2008   (KR) .................. 10-2008-0103671
Oct. 22, 2009   (KR) .................. 10-2009-0100912

(51) Int. Cl.
*H01L 33/00*     (2010.01)
*H01L 33/40*     (2010.01)
*H01L 33/08*     (2010.01)
*H01L 33/38*     (2010.01)
(Continued)

(52) U.S. Cl.
CPC ............. *H01L 33/40* (2013.01); *H01L 33/08* (2013.01); *H01L 33/382* (2013.01); *H01L 33/20* (2013.01); *H01L 33/22* (2013.01)
USPC .................. 257/98; 257/76; 257/E33.034

(58) Field of Classification Search
USPC ..................... 257/98, 76, E33.034
See application file for complete search history.

(56) References Cited

U.S. PATENT DOCUMENTS 6,278,136 B1   8/2001  Nitta
6,828,596 B2  12/2004  Steigerwald et al.
(Continued)

FOREIGN PATENT DOCUMENTS

DE         101 47 886 A1    4/2003
DE    10 2005 007 601 A1    9/2005
(Continued)

OTHER PUBLICATIONS

United States Office Action issued in U.S. Appl. No. 12/406,568, mailed Sep. 24, 2010.
(Continued)

*Primary Examiner* — Dale E Page
(74) *Attorney, Agent, or Firm* — McDermott Will & Emery LLP

(57) ABSTRACT

There is provided a semiconductor light emitting device including a conductive substrate, a first electrode layer, an insulating layer, a second electrode layer, a second semiconductor layer, an active layer, and a first semiconductor layer that are sequentially stacked. The contact area between the first electrode layer and the first semiconductor layer is 3% to 13% of the total area of the semiconductor light emitting device, and thus high luminous efficiency is achieved.

13 Claims, 66 Drawing Sheets

(51) Int. Cl.
*H01L 33/20* (2010.01)
*H01L 33/22* (2010.01)

(56) References Cited

U.S. PATENT DOCUMENTS

| | | | |
|---|---|---|---|
| 6,995,401 | B2 | 2/2006 | Yamada et al. |
| 7,592,637 | B2 * | 9/2009 | Zimmerman et al. ........... 257/98 |
| 2004/0130002 | A1 | 7/2004 | Weeks et al. |
| 2006/0124954 | A1 | 6/2006 | Akaishi |
| 2007/0096130 | A1 | 5/2007 | Schiaffino et al. |
| 2007/0176188 | A1 | 8/2007 | Tanaka et al. |
| 2008/0191215 | A1 | 8/2008 | Choi et al. |
| 2008/0237619 | A1 | 10/2008 | Epler et al. |
| 2008/0237622 | A1 * | 10/2008 | Choi et al. ....................... 257/98 |
| 2009/0065800 | A1 | 3/2009 | Wirth et al. |
| 2010/0171135 | A1 | 7/2010 | Engl et al. |
| 2011/0049555 | A1 | 3/2011 | Engl et al. |

FOREIGN PATENT DOCUMENTS

| | | |
|---|---|---|
| JP | 10-098210 A | 4/1998 |
| JP | 10-117017 A | 5/1998 |
| JP | 2011-517064 A | 5/2011 |
| KR | 10-0818466 B1 | 4/2008 |
| KR | 10-0849826 B1 | 7/2008 |
| KR | 10-0887072 B1 | 3/2009 |
| KR | 10-0891761 B1 | 4/2009 |
| KR | 10-2009-0062619 | 6/2009 |
| TW | 200903863 A | 1/2009 |
| WO | 20091075551 A2 | 6/2009 |

OTHER PUBLICATIONS

International Preliminary Report on Patentability and Written Opinion of the International Searching Authority issued in International Patent Application No. PCT/KR20091006144, mailed Jun. 9, 2011.
Japanese Office Action, w/ English translation thereof, issued in Japanese Patent Application No. 2009-092180, dated Oct. 18, 2011.
Taiwanese Office Action, w/English translation thereof, issued in Taiwanese Patent Application No. TW 098135879 dated Jan. 31, 2013.
Office Action dated Feb. 1, 2013 issued in the corresponding Chinese Patent Application No. 200980142209.9 and its English translation.
European Search Report issued in European Application No. 09822229.2-1551 dated Jun. 11, 2014.
German Office Action issued in German Application No. 10 2009 030 243.3 dated Jun. 18, 2014, w/English translation.

* cited by examiner

SEMICONDUCTOR LIGHT EMITTING DEVICE

RELATED APPLICATIONS

This application is a Divisional of U.S. application Ser. No. 13/125,256 filed on Jul. 11, 2011 which is the U.S. National Phase under 35 U.S.C. §371 of International Application No. PCT/KR2009/006144, filed on Oct. 22, 2009, which in turn claims the benefit of Korean Application No. 10-2008-0103671, filed on Oct. 22, 2008 and Korean Application No. 10-2009-0100912, filed on Oct. 22, 2009, the disclosures of which Applications are incorporated by reference herein.

TECHNICAL FIELD

The present invention relates to a semiconductor light emitting device, and more particularly, to a semiconductor light emitting device capable of performing an operation at a high current and improving luminous efficiency by changing an electrode arrangement structure.

BACKGROUND ART

Semiconductor light emitting devices include materials that emit light. For example, light emitting diodes (LEDs) are devices that use diodes, to which semiconductors are bonded, convert energy generated by the recombination of electrons and holes into light, and emit the light. The semiconductor light emitting devices are widely used in applications such as lighting, display devices and light sources, and the development thereof has been expedited.

In general, semiconductor junction light emitting devices have a junction structure of p-type and n-type semiconductors. In the semiconductor junction structure, light may be emitted by the recombination of electrons and holes at junction regions of both types of semiconductors, and further an active layer may be formed between both types of semiconductors in order to activate light emission. The semiconductor junction light emitting devices have a vertical structure and a horizontal structure according to the positions of electrodes for semiconductor layers. The horizontal structure includes an epi-up structure and a flip-chip structure.

FIG. 1 is a view illustrating a horizontal semiconductor light emitting device according to the related art and FIG. 2 is a cross-sectional view illustrating a vertical semiconductor light emitting device according to the related art. For convenience of explanation, in FIGS. 1 and 2, a description will be made on the assumption that an n-type semiconductor layer is in contact with a substrate and a p-type semiconductor layer is formed on an active layer.

First, a horizontal semiconductor light emitting device will be described with reference to FIG. 1.

A horizontal semiconductor light emitting device 1 includes a non-conductive substrate 13, an n-type semiconductor layer 12, an active layer 11, and a p-type semiconductor layer 10. An n-type electrode 15 and a p-type electrode 14 are formed on the n-type semiconductor layer 12 and the p-type semiconductor layer 10, respectively, and are electrically connected to an external current source (not shown) in order to apply voltage to the semiconductor light emitting device 1.

When voltage is applied to the semiconductor light emitting device 1 through the electrodes 14 and 15, electrons move from the n-type semiconductor layer 12 and holes move from the p-type semiconductor layer 10, which results in the recombination of the electrons and the holes to emit light. The semiconductor light emitting device 1 includes the active layer 11 and the light is emitted from the active layer 11. In the active layer 11, the light emission of the semiconductor light emitting device 1 is activated and light is emitted. In order to make an electrical connection, the n-type electrode 15 and the p-type electrode 14 are positioned on the n-type semiconductor layer 12 and the p-type semiconductor layer 10, respectively, with the lowest contact resistance values.

The positions of the electrodes may be varied according to substrate types. For instance, in the case that the substrate 13 is a sapphire substrate that is a non-conductive substrate as shown in FIG. 1, the electrode of the n-type semiconductor layer 12 cannot be formed on the non-conductive substrate 13, but should be formed on the n-type semiconductor layer 12.

Therefore, when the n-type electrode 15 is formed on the n-type semiconductor layer 12, parts of the p-type semiconductor layer 10 and the active layer 11 that are formed at an upper side are consumed to form an ohmic contact portion. Since the electrodes are formed in this way, a light emitting area of the semiconductor light emitting device 1 is reduced, and thus luminous efficiency also decreases.

In order to solve a variety of problems including the above-described problems, a semiconductor light emitting device that uses a conductive substrate, rather than the non-conductive substrate, has appeared.

A semiconductor light emitting device 2, as shown in FIG. 2, is a vertical semiconductor light emitting device. Since a conductive substrate 23 is used, an n-type electrode 25 may be formed on the substrate. Although, as shown in FIG. 2, the n-type electrode is formed on the conductive substrate 23, a vertical light emitting device may also be manufactured by growing semiconductor layers by using a non-conductive substrate, removing the substrate, and then directly forming an n-type electrode on an n-type semiconductor layer.

When the conductive substrate 23 is used, since voltage can be applied to an n-type semiconductor layer 22 through the conductive substrate 23, an electrode may be formed directly on the substrate.

Therefore, as shown in FIG. 2, the n-type electrode 25 is formed on the conductive substrate 23 and a p-type electrode 24 is formed on a p-type semiconductor layer 20, thereby manufacturing a semiconductor light emitting device having a vertical structure.

However, in this case, particularly in the case that a high-power light emitting device having a large area is manufactured, an area ratio of the electrode to the substrate needs to be high for current spreading. As a result, light extraction is limited and light loss is caused due to optical absorption, and further luminous efficiency is reduced.

The horizontal and vertical semiconductor light emitting devices, which are described with reference to FIGS. 1 and 2, have a reduced light emitting area to reduce luminous efficiency, limit light extraction, and cause light loss due to the optical absorption.

For this reason, a semiconductor light emitting device having a new structure needs to be urgently developed in order to solve the problems of the conventional semiconductor light emitting devices.

DISCLOSURE

Technical Problem

An aspect of the present invention provides a semiconductor light emitting device having a new structure.

An aspect of the present invention also provides a semiconductor light emitting device with high luminous efficiency.

An aspect of the present invention also provides a high-current semiconductor light emitting device.

Technical Solution

According to an aspect of the present invention, there is provided a semiconductor light emitting device including a light emitting structure having a conductive substrate, a first electrode layer, an insulating layer, a second electrode layer, a second semiconductor layer, an active layer, and a first semiconductor layer sequentially stacked. Here, the second electrode layer includes at least one exposed region formed by exposing a portion of an interface in contact with the second semiconductor layer. The first electrode layer penetrates the second electrode layer, the second semiconductor layer, and the active layer and is electrically connected to the first semiconductor layer by being extended to predetermined regions of the first semiconductor layer through a plurality of contact holes penetrating the predetermined regions of the first semiconductor layer. The insulating layer insulates the first electrode layer from the second electrode layer, the second semiconductor layer and the active layer by being provided between the first electrode layer and the second electrode layer and on side surfaces of the contact holes. A contact area between the first electrode layer and the first semiconductor layer is 0.615% to 15.68% of a total area of the light emitting structure.

The contact holes may be uniformly arranged.

The number of the contact holes may be 1 to 48,000.

The contact area between the first electrode layer and the first semiconductor layer may be 6,150 $\mu m^2$ to 156,800 $\mu m^2$ per 1,000,000 $\mu m^2$ area of the semiconductor light emitting device.

A distance between central points of adjacent contact holes among the contact holes may be 5 $\mu m$ to 500 $\mu m$.

The semiconductor light emitting device may further include an electrode pad portion formed on the exposed region of the second electrode layer.

The exposed region of the second electrode layer may be formed at a corner of the semiconductor light emitting device.

The second electrode layer may reflect light generated from the active layer.

The second electrode layer may include one selected from the group consisting of Ag, Al, Pt, Ni, Pt, Pd, Au, Ir and a transparent conductive oxide.

The conductive substrate may include one selected from the group consisting of Au, Ni, Al, Cu, W, Si, Se, and GaAs.

The contact area between the first electrode layer and the first semiconductor layer may be 3% to 13% of the total area of the light emitting structure.

According to another aspect of the present invention, there is provided a semiconductor light emitting device including a conductive substrate; a light emitting structure having a second semiconductor layer, an active layer, and a first semiconductor layer sequentially stacked; a first electrode layer including contact holes in contact with an inside of the first semiconductor layer by penetrating the second semiconductor layer and the active layer and an electrical connection portion extended from the contact holes and exposed outwardly of the light emitting structure; and an insulating layer electrically separating the first electrode layer from the conductive substrate, the second semiconductor layer and the active layer. Here, a contact area between the contact holes and the first semiconductor layer is 0.615% to 15.68% of a total area of the light emitting structure.

MODE FOR INVENTION

Figure 1:
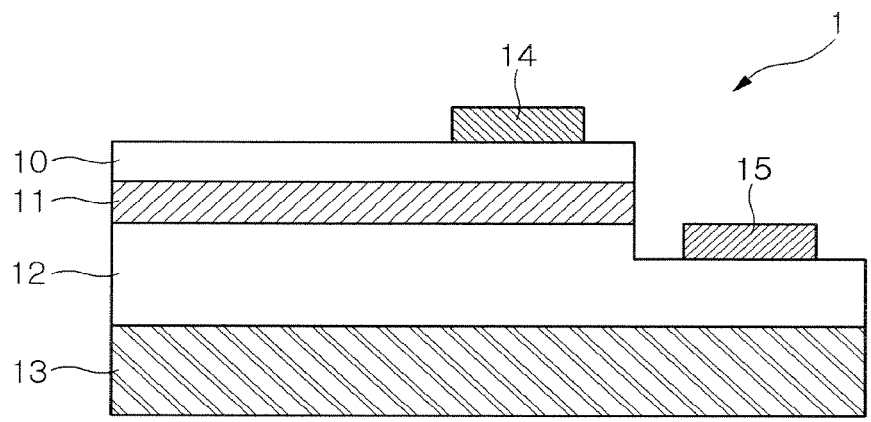
FIG. 1 is a view illustrating a horizontal semiconductor light emitting device according to the related art.
Figure 2:
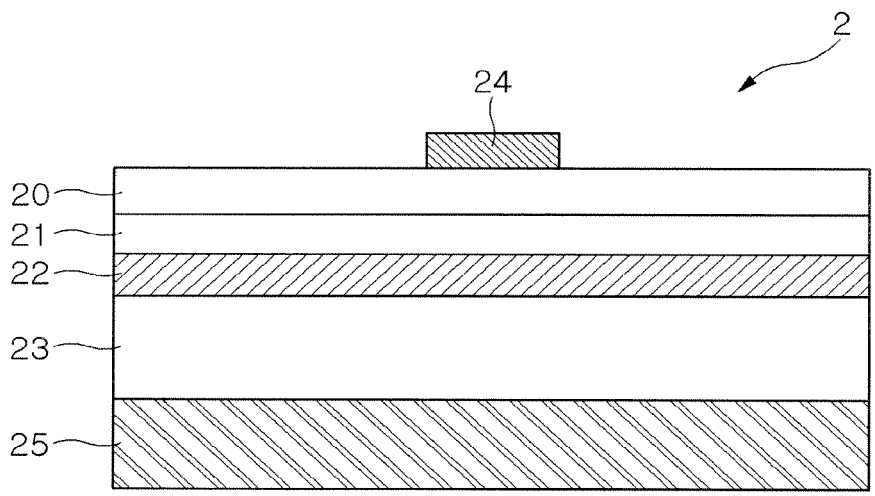
FIG. 2 is a cross-sectional view illustrating a vertical semiconductor light emitting device according to the related art.

Exemplary embodiments of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like elements.

First, a semiconductor light emitting device will be described in detail through a variety of exemplary embodiments, and a light emitting device package and a backlight device using the same will also be described.

<Semiconductor Light Emitting Device>

Figure 3:
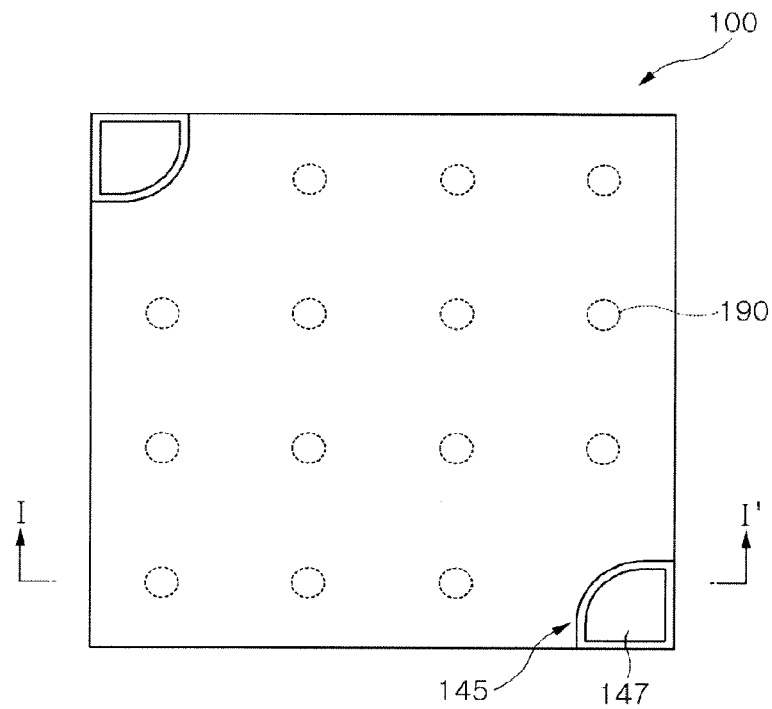
FIG. 3 is a plan view illustrating a semiconductor light emitting device according to an exemplary embodiment of the present invention.
Figure 4:
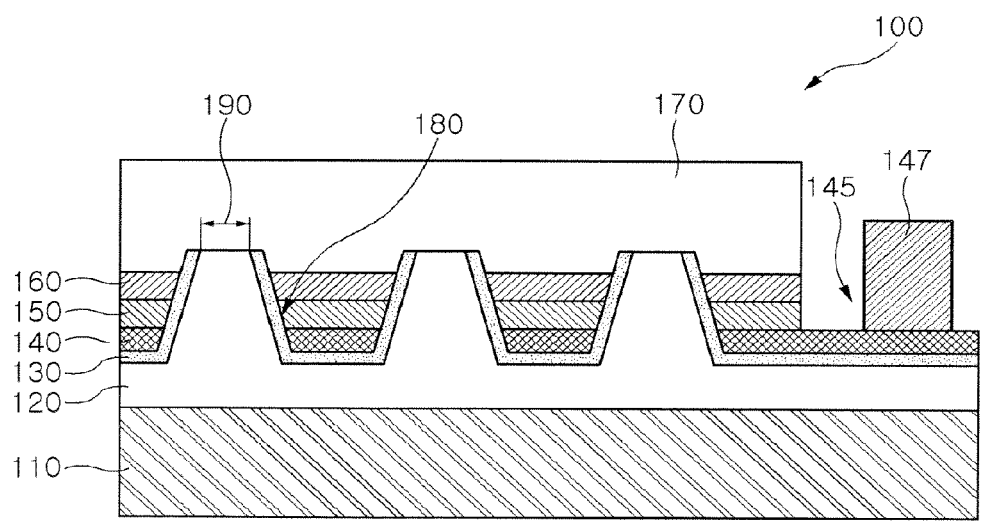
FIG. 4 is a cross-sectional view illustrating a semiconductor light emitting device according to an exemplary embodiment of the present invention.

FIGS. 3 and 4 are a plan view and a cross-sectional view illustrating a semiconductor light emitting device according to an exemplary embodiment of the present invention. Here, FIG. 4 is a cross-sectional view taken along a line I-I' shown in FIG. 3.

Referring to FIGS. 3 and 4, a semiconductor light emitting device 100 according to an exemplary embodiment of the invention includes a conductive substrate 110, a first electrode layer 120, an insulating layer 130, a second electrode layer 140, a second semiconductor layer 150, an active layer 160, and a first semiconductor layer 170 which are sequentially stacked.

The conductive substrate 110 may be formed of an electrically conductive material. The conductive substrate 110 may be formed of a material including any one of Au, Ni, Al, Cu, W, Si, Se, and GaAs, for example, an alloy of Si and Al.

The first electrode layer 120 is stacked on the conductive substrate 110. Since the first electrode layer 120 is electrically connected to the conductive substrate 110 and the active layer 160, the first electrode layer 120 may be formed of a material capable of minimizing contact resistance with the conductive substrate 110 and the active layer 160.

The first electrode layer 120 is stacked on the conductive substrate 110 and further, some portions thereof, as shown in FIG. 4, penetrate the insulating layer 130, the second electrode layer 140, the second semiconductor layer 150 and the active layer 160 and are in contact with the first semiconductor layer 170 by being extended through contact holes 180 which penetrate predetermined regions of the first semiconductor layer 170, whereby the conductive substrate 110 and the first semiconductor layer 170 are electrically connected.

That is, the first electrode layer 120 electrically connects the conductive substrate 110 to the first semiconductor layer 170 through the contact holes 180. The conductive substrate 110 and the first semiconductor layer 170 are electrically connected through areas which are the size of the contact holes 180, more exactly, contact regions 190 that are areas in which the first electrode layer 120 and the first semiconductor layer 170 are in contact with each other through the contact holes 180.

Meanwhile, the insulating layer 130 is formed on the first electrode layer 120 in order to electrically insulate the first electrode layer 120 from other layers except for the conductive substrate 110 and the first semiconductor layer 170. In other words, the insulating layer 130 may be formed not only between the first and second electrode layers 120 and 140, but also between the first electrode layer 120 and the side surfaces of the second electrode layer 140, the second semiconductor layer 150 and the active layer 160 which are exposed by the contact holes 180. Furthermore, the insulating layer 130 may be formed on side surfaces of the predetermined regions of the first semiconductor layer 170 which the contact holes 180 penetrate to achieve insulation.

The second electrode layer 140 is formed on the insulating layer 130. As described above, the second electrode layer 140 is not formed on the predetermined regions which the contact holes 180 penetrate.

Here, the second electrode layer 140, as shown in FIG. 4, includes at least one region where a portion of an interface in contact with the second semiconductor layer 150 is exposed, i.e., an exposed region 145. An electrode pad portion 147 may be formed on the exposed region 145 in order to connect an external current source to the second electrode layer 140. Meanwhile, the second semiconductor layer 150, the active layer 160, and the first semiconductor layer 170, which will be described later, are not formed on the exposed region 145. Further, the exposed region 145, as shown in FIG. 3, may be formed at the corners of the semiconductor light emitting device 100 in order to maximize a light emitting area of the semiconductor light emitting device 100.

Meanwhile, the second electrode layer 140 may be formed of a material including any one of Ag, Al, Pt, Ni, Pt, Pd, Au, Ir and a transparent conductive oxide. This is because the second electrode layer 140 may be formed as a layer, a characteristic of which is the minimization of contact resistance with the second semiconductor layer 150, since the second electrode layer 140 is in electrical contact with the second semiconductor layer 150, and has a function of improving luminous efficiency by reflecting light generated from the active layer 160 outward.

The second semiconductor layer 150 is formed on the second electrode layer 140. The active layer 160 is formed on the second semiconductor layer 150. The first semiconductor layer 170 is formed on the active layer 160.

Here, the first semiconductor layer 170 may be an n-type nitride semiconductor and the second semiconductor layer 150 may be a p-type nitride semiconductor.

Meanwhile, the active layer 160 may be formed by selecting different materials according to materials of which the first and second semiconductor layers 170 and 150 are formed. That is, since the active layer 160 is a layer in which energy generated by the recombination of electrons and holes is converted into light and the light is emitted, the active layer 160 may be formed of a material having a smaller energy band gap than those of the first semiconductor layer 170 and the second semiconductor layer 150.

Figure 8:
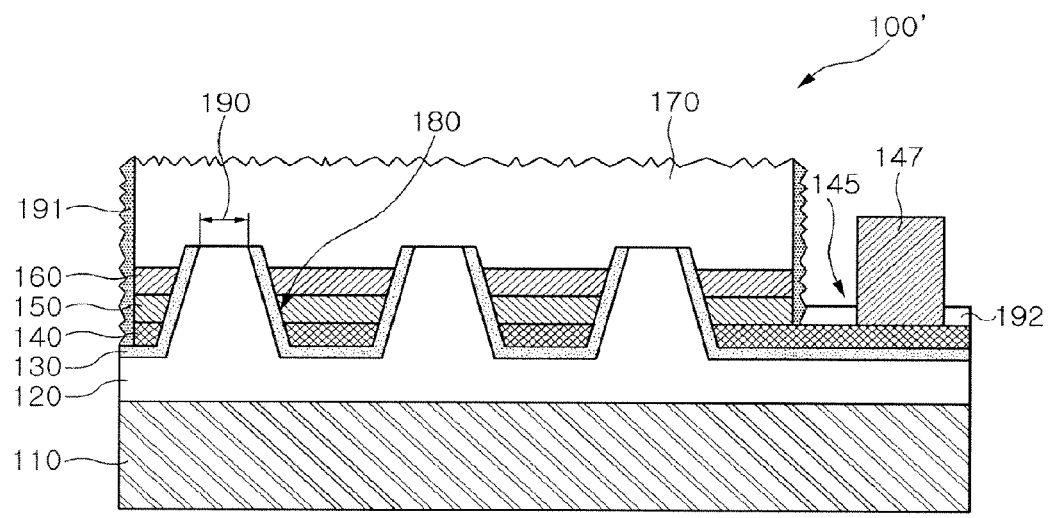
FIG. 8 is a view illustrating a modification of the semiconductor light emitting device of FIG. 4.

FIG. 8 illustrates a modification of the semiconductor light emitting device of FIG. 4. A semiconductor light emitting device 100' of FIG. 8 has the same structure as that of FIG. 4, except that it has passivation layers 191 formed on the side surfaces of a light emitting structure including the second semiconductor layer 150, the active layer 160 and the first semiconductor layer 170, and an unevenness formed on the top surface of the first semiconductor layer 170. The passivation layer 191 protects the light emitting structure, particularly the active layer 160, from the outside. The passivation layer 191 may be formed of a silicon oxide and a silicon nitride such as $SiO_2$, $SiO_xN_y$ and $Si_xN_y$, and its thickness may be 0.1 μm to 2 μm. The active layer 160, exposed outwardly, may function as a current leakage path during the operations of the semiconductor light emitting device 100'. Such a leakage may be prevented by forming the passivation layers 191 on the side surfaces of the light emitting structure. As shown in FIG. 8, when unevenness is formed on the passivation layers 191, an improved light extraction effect may be expected. Likewise, the unevenness may be formed on the top surface of the first semiconductor layer 170, and accordingly, light incident in a direction of the active layer 160 may be increasingly emitted outwards. Although not shown, when the light emitting structure is etched in order to expose the second electrode layer 140 in the manufacturing process, an etch stop layer may be further formed on the second electrode layer 140 in order to prevent the material forming the second electrode layer 140 from adhering to the side surface of the active layer 160. The above-described modified embodiment of FIG. 8 may be applicable to an exemplary embodiment of FIG. 9.

Figure 9:
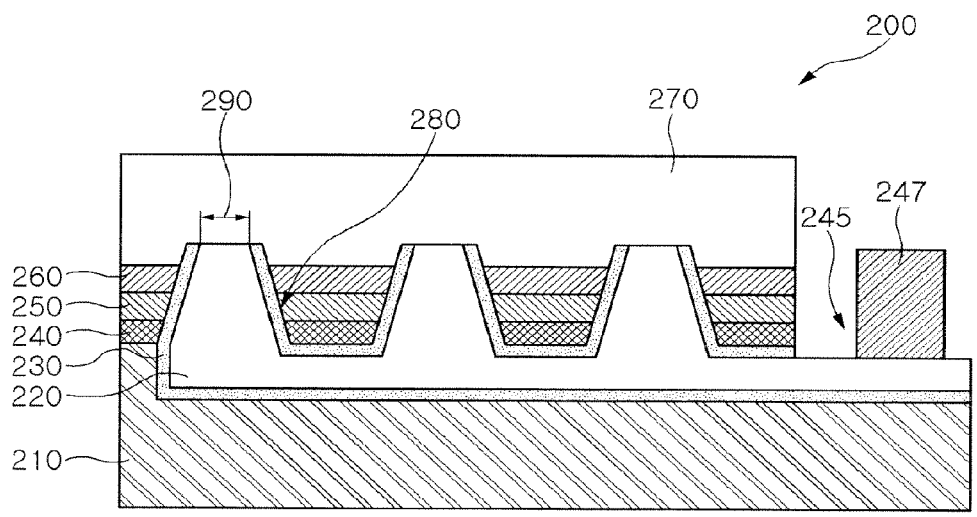
FIG. 9 is a cross-sectional view illustrating a semiconductor light emitting device according to another exemplary embodiment of the present invention.

Meanwhile, the semiconductor light emitting device proposed in the present invention may have a structure modified in such a manner that the first electrode layer connected to the contact holes may be exposed outwardly. FIG. 9 is a cross-sectional view illustrating a semiconductor light emitting device according to another exemplary embodiment of the present invention. A semiconductor light emitting device 200 according to this embodiment may have a second semiconductor layer 250, an active layer 260 and a first semiconductor layer 270 formed on a conductive substrate 210. In this case, a second electrode layer 240 may be disposed between the second semiconductor layer 250 and the conductive substrate 210. Unlike the aforementioned embodiment, the second electrode layer 240 is not necessarily required. According to this embodiment, contact holes 280 having contact regions 290 in contact with the first semiconductor layer 270 are connected to a first electrode layer 220. The first electrode layer 220 is exposed outwardly to have an electrical connection portion 245. An electrode pad portion 247 may be formed on the electrical connection portion 245. The first electrode layer 220 may be electrically separated from the active layer 260, the second semiconductor layer 250, the second electrode layer 240 and the conductive substrate 210 by an insulating layer 230. Unlike the contact holes connected to the conductive substrate in the aforementioned embodiment, the contact holes 280 according to this embodiment are electrically separated from the conductive substrate 210, and the first electrode layer 220 connected to the contact holes 280 is exposed outwardly. Accordingly, the conductive substrate 210 is electrically connected to the second semiconductor layer 240 and has a polarity different from that of the aforementioned embodiment.

Hereinafter, an optimal state of the contact holes in terms of size and shape will be found through a simulation regarding changes in electrical characteristics according to a contact area between the first electrode layer and the first semiconductor layer in the semiconductor light emitting device proposed in the present invention. In this case, the result of the simulation below may be applicable to the structures of FIGS. 3 and 8. Also, the first and second semiconductor layers are formed of n-type and p-type semiconductor layers, respectively.

Figure 5:
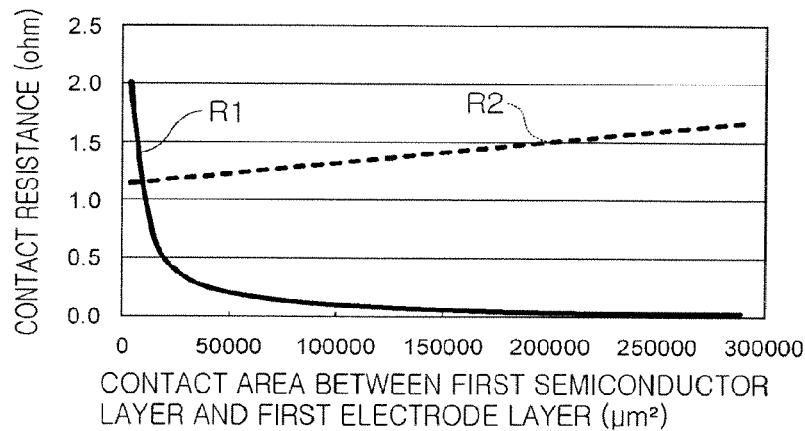
FIG. 5 is a graph illustrating n-type ohmic contact resistance and p-type ohmic contact resistance of a semiconductor light emitting device having an area of 1,000×1,000 $\mu m^2$.

FIG. 5 is a graph illustrating n-type ohmic contact resistance and p-type ohmic contact resistance of a semiconductor light emitting device having an area of 1,000×1,000 μm².

In the simulation of FIG. 5, n-type specific contact resistance, namely, specific contact resistance of the first electrode layer 120 and the contact holes 180 is $10^{-4}$ ohm/cm² while p-type specific contact resistance, namely, specific contact resistance of the second semiconductor layer 150 and the second electrode layer 140 is $10^{-2}$ ohm/cm².

Referring to FIG. 5, assuming that the semiconductor light emitting device 100 according to this embodiment of the invention is a rectangular chip having a size of 1,000,000 μm², that is, a width which is 1,000 μm and a height which is 1,000 μm, the resistance of the semiconductor light emitting device 100 includes the first electrode layer 120, the second electrode layer 140, the first semiconductor layer 170, and the second semiconductor layer 150, contact resistance between the second semiconductor layer 150 and the second electrode layer 140 (hereinafter, referred to as "second contact resistance"), and contact resistance between the first semiconductor layer 170 and the first electrode layer 120 (hereinafter, referred to as "first contact resistance"), wherein major changes are made to the first contact resistance R1 and the second contact resistance R2 according to a contact area.

In particular, as shown in FIG. 5, as the contact area increases, more change is made to the first contact resistance R1 as compared to the second contact resistance R2. Here, the X axis of FIG. 5 represents the size of the contact area in which the first semiconductor layer 170 and the first electrode layer 120 are in contact with each other, and the Y axis of FIG. 5 represents contact resistance values. Therefore, the figures of the X axis represent contact areas in which the first semiconductor layer 170 and the first electrode layer 120 are in contact with each other. As for the contact area between the second semiconductor layer 150 and the second electrode layer 140, a value obtained by subtracting a value of the X axis from the total area (1,000,000 μm²) of the semiconductor light emitting device 100 corresponds to the contact area between the second semiconductor layer 150 and the second electrode layer 140 which corresponds to the second contact resistance R2.

Here, the contact area between the first semiconductor layer 170 and the first electrode layer 120 indicates the total area of the contact regions 190 where the first electrode layer 120 and the first semiconductor layer 170 are in contact with each other through the contact holes 180 as described with reference to FIGS. 3 and 4, i.e., the sum total of areas of the contact regions 190 since there are a plurality of contact holes 180.

Figure 6:
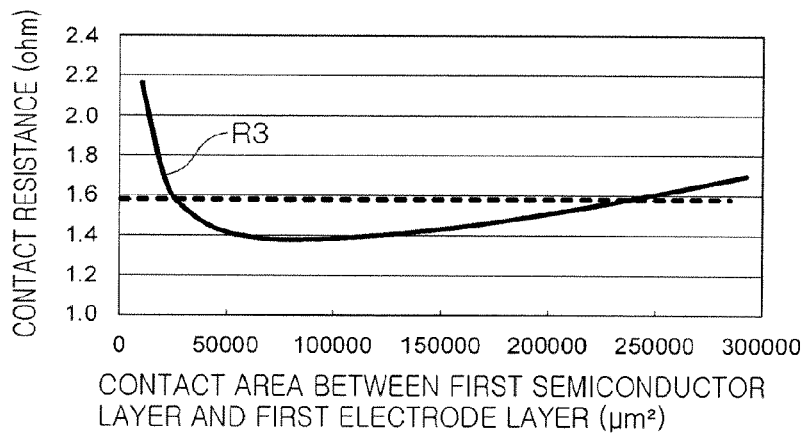
FIG. 6 is a graph illustrating the total resistance of a first contact resistance and a second contact resistance according to the contact area between a first semiconductor layer and a first electrode layer.

FIG. 6 is a graph illustrating the total resistance of the first contact resistance and the second contact resistance according to the contact area between the first semiconductor layer and the first electrode layer.

Referring to FIG. 6, since the first contact resistance R1 and the second contact resistance R2 of the semiconductor light emitting device 100 according to this embodiment are connected to each other in series, the total resistance R3 obtained by adding the first contact resistance R1 and the second contact resistance R2 among the resistances of the semiconductor light emitting device 100 is most deeply influenced by the contact area.

Here, as shown in FIG. 6, it is understood that as the contact area (referring to the values of the X axis) between the first semiconductor layer 170 and the first electrode layer 120 increases, the total resistance R3 (referring to the values of Y axis) rapidly decreases at an early stage, and as the contact area between the first semiconductor layer 170 and the first electrode layer 120 further increases, the total resistance R3 tends to increase.

Meanwhile, when the size of the semiconductor light emitting device 100 is 1,000,000 $\mu m^2$, the n-type and p-type contact resistance of the semiconductor light emitting device 100 is preferably below 1.6 ohm so that the contact area between the first semiconductor layer 170 and the first electrode layer 120 is approximately 30,000 $\mu m^2$ to 250,000 $\mu m^2$.

A semiconductor light emitting device usually operates at an operation voltage of 3.0 V to 3.2 V and at an operation current of approximately 0.35 A. If the total resistance of the semiconductor light emitting device is approximately 2 ohm, the voltage becomes 0.70 V according to the Equation of 0.35 A×2 ohm=0.70 V, which is beyond the common range of 2.8 V to 3.8 V. When the voltage is beyond the range, modifications of circuit configuration may be required, and also heat and light output degradation may occur due to an increase in input power. Therefore, the total resistance of the semiconductor light emitting device is preferably below 2 ohm, and since the sum of n-type and p-type contact resistance corresponds to approximately 80% of the total resistance, a reference contact resistance is 1.6 ohm derived from the Equation of 2 ohm×0.8=1.6 ohm.

That is, in the semiconductor light emitting device 100 as described with reference to FIGS. 3 and 4, it is most preferable in terms of contact resistance that the total contact area of the contact regions 190 where the first electrode layer 120 and the first semiconductor layer 170 are in contact with each other through the contact holes 180 be approximately 30,000 $\mu m^2$ to 250,000 $\mu m^2$.

Figure 7:
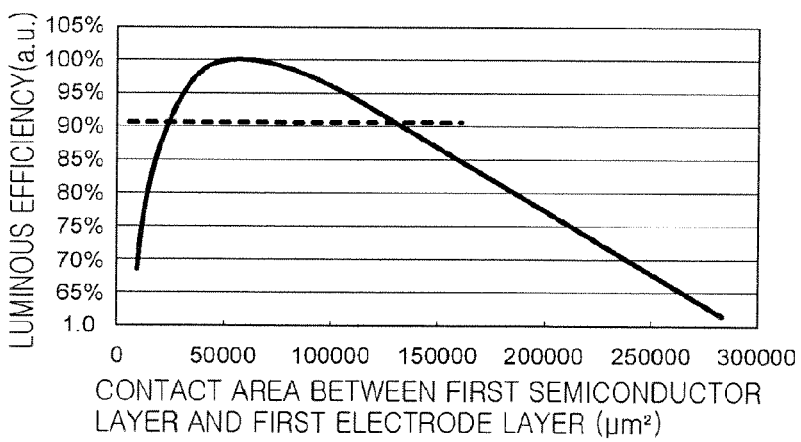
FIG. 7 is a graph illustrating luminous efficiency according to the contact area between the first semiconductor layer and the first electrode layer.

FIG. 7 is a graph illustrating luminous efficiency according to the contact area between the first semiconductor layer and the first electrode layer.

As described with reference to FIG. 6, when the contact area between the first semiconductor layer 170 and the first electrode layer 120 is 30,000 $\mu m^2$ to 250,000 $\mu m^2$, the total resistance is low, and accordingly, the luminous efficiency of the semiconductor light emitting device 100 is likely to be high. However, it is not considered that as the contact area between the first semiconductor layer 170 and the first electrode layer 120 increases, a light emitting area of the semiconductor light emitting device 100 is practically reduced.

That is, as shown in FIG. 7, the luminous efficiency of the semiconductor light emitting device 100 increases by reducing the total resistance until the contact area between the first semiconductor layer 170 and the first electrode layer 120 is 70,000 $\mu m^2$. However, when the contact area between the first semiconductor layer 170 and the first electrode layer 120 continuously increases above 70,000 $\mu m^2$, luminous efficiency becomes lower. An increase in the contact area between the first semiconductor layer 170 and the first electrode layer 120 indicates a decrease in the contact area between the second semiconductor layer 150 and the second electrode layer 140, which reduces a light-emitting amount of the semiconductor light emitting device 100.

Therefore, the contact area between the first semiconductor layer 170 and the first electrode layer 120 needs to be appropriately determined, that is, the contact area between the first semiconductor layer 170 and the first electrode layer 120 is preferably below 130,000 $\mu m^2$ so that the level of luminous efficiency is above 90% as shown in FIG. 7.

As a result, in the semiconductor light emitting device 100 according to this embodiment, it is most preferable that the contact area between the first semiconductor layer 170 and the first electrode layer 120 through the contact holes 180 be 30,000 $\mu m^2$ to 130,000 $\mu m^2$. Since the semiconductor light emitting device 100 corresponds to a case where the chip size is 1,000,000 $\mu m^2$, a contact area between the first electrode layer 120 and the first semiconductor layer 170 that is 3% to 13% of the total area of the semiconductor light emitting device 100, is the most proper amount of contact area.

Meanwhile, when the number of the contact holes 180 is very small, the contact area between the first semiconductor layer 170 and the first electrode layer 120 for each of the contact regions 190 between the first semiconductor layer 170 and the first electrode layer 120 increases, and accordingly, the area of the first semiconductor layer 170 to which current needs to be supplied increases, and the amount of current which should be supplied to the contact regions 190 also increases. This causes a current-crowding effect at the contact regions 190 between the first semiconductor layer 170 and the first electrode layer 120.

In addition, when the number of the contact holes 180 is very large, the size of each of the contact holes 180 necessarily becomes very small, thereby causing difficulty in the manufacturing process.

The number of the contact holes 180 may therefore be properly selected according to the size of the semiconductor light emitting device 100, i.e., the chip size. When the size of the semiconductor light emitting device 100 is 1,000,000 $\mu m^2$, the number of the contact holes 180 may be 5 to 50.

Meanwhile, when the plurality of contact holes 180 of the semiconductor light emitting device 100 are formed, the contact holes 180 may be uniformly arranged. In order to uniformly spread current, since the first semiconductor layer 170 and the first electrode layer 120 are in contact with each other through the contact holes 180, the contact holes 180, i.e., the contact regions 190 between the first semiconductor layer 170 and the first electrode layer 120 may be uniformly arranged.

Here, when the size of the semiconductor light emitting device 100 is 1,000,000 $\mu m^2$ and the number of the contact holes 180 is 5 to 50, separation distances between adjacent contact holes among the plurality of contact holes may be 100 $\mu m$ to 400 $\mu m$, in order to uniformly arrange the semiconductor light emitting device 100. The separation distances are values measured by connecting central points of the adjacent contact holes.

Meanwhile, the semiconductor light emitting device 100 is capable of achieving uniform current spreading by uniformly arranging the plurality of contact holes 180. Contrary to a semiconductor light emitting device having a size of 1,000, 000 μm², which conventionally operates at approximately 350 mA, the semiconductor light emitting device 100 according to this embodiment of the invention operates stably and decreases the current crowding effect even though a high current of approximately 2 A is applied, resulting in the semiconductor light emitting device with improved reliability.

Figure 10:
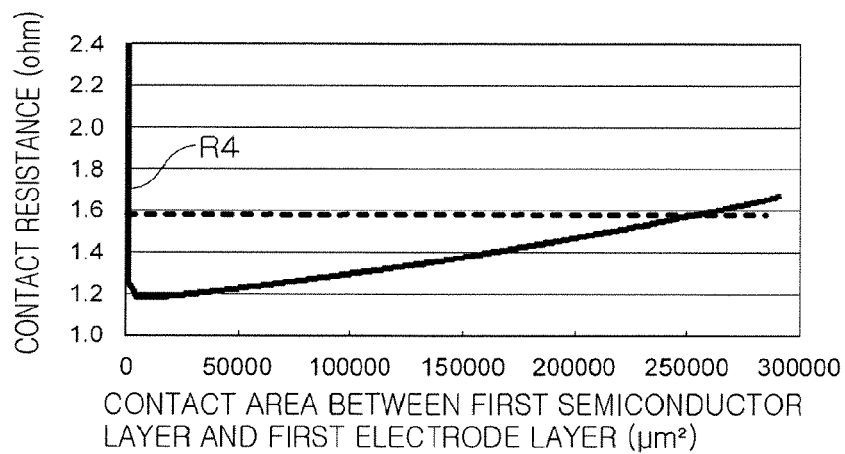
FIGS. 10 and 11 illustrate the result of a simulation conducted by changing n-type specific contact resistance.
Figure 11:
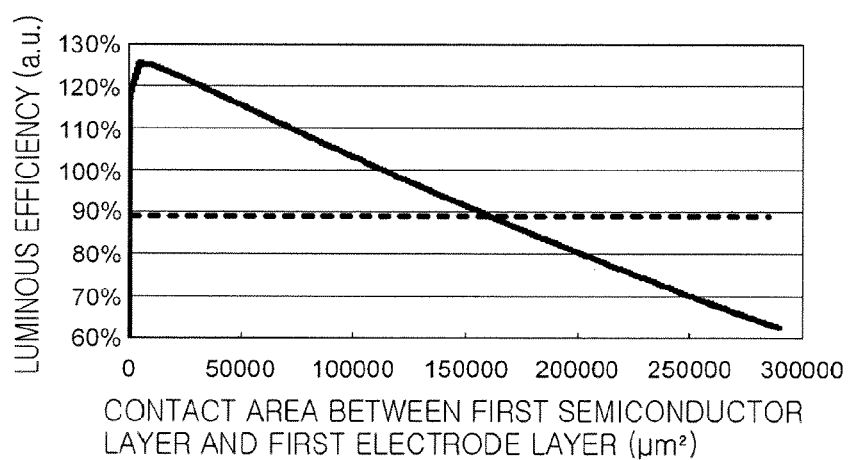
Figure 12:
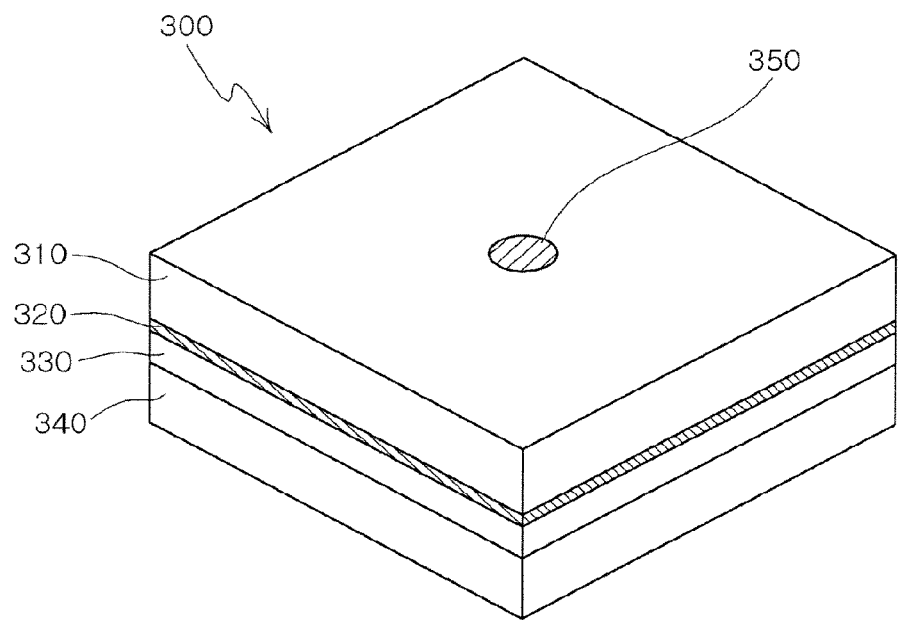
FIGS. 12 through 16 are views illustrating a semiconductor light emitting device according to another exemplary embodiment of the present invention.
Figure 13:
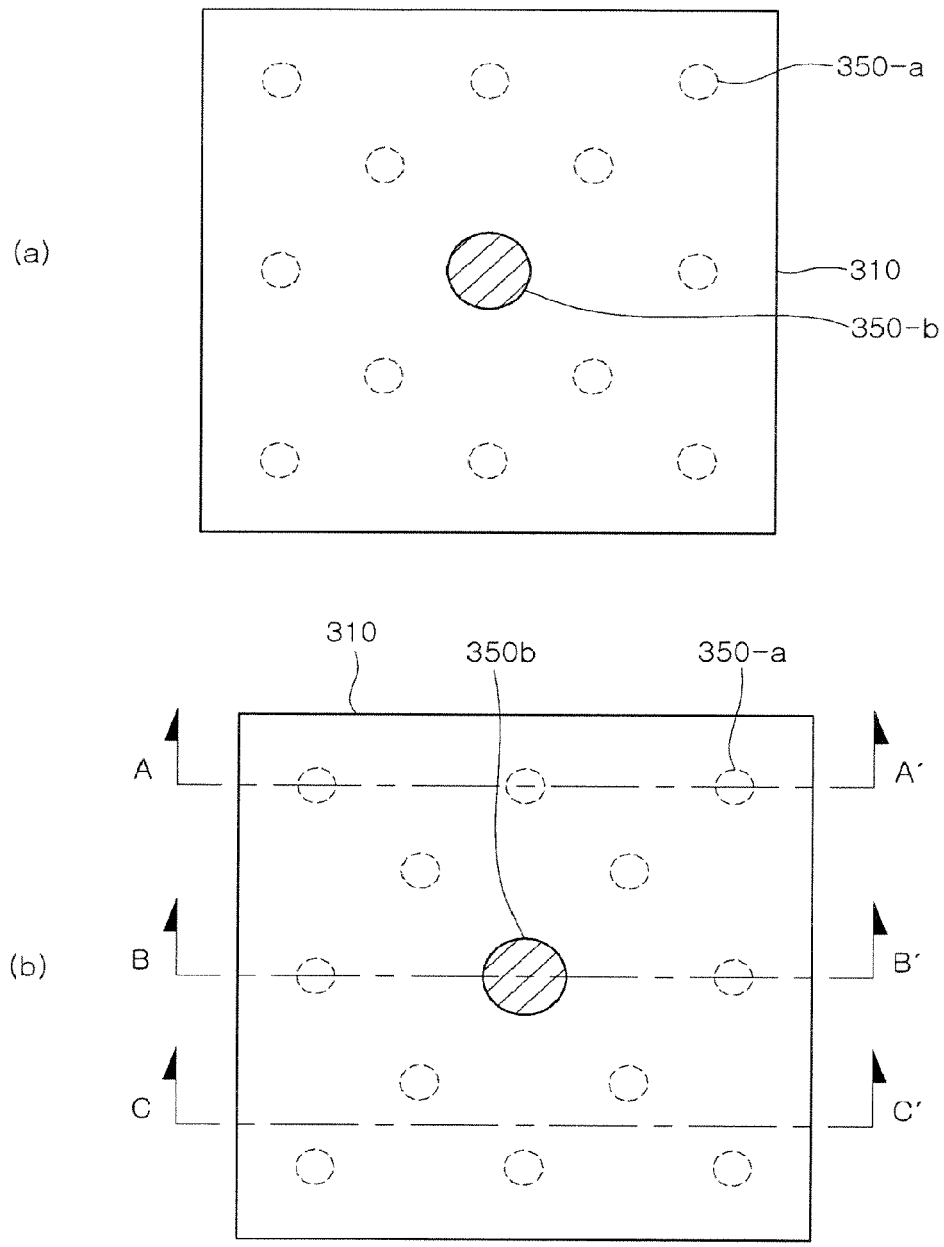
Figure 14:
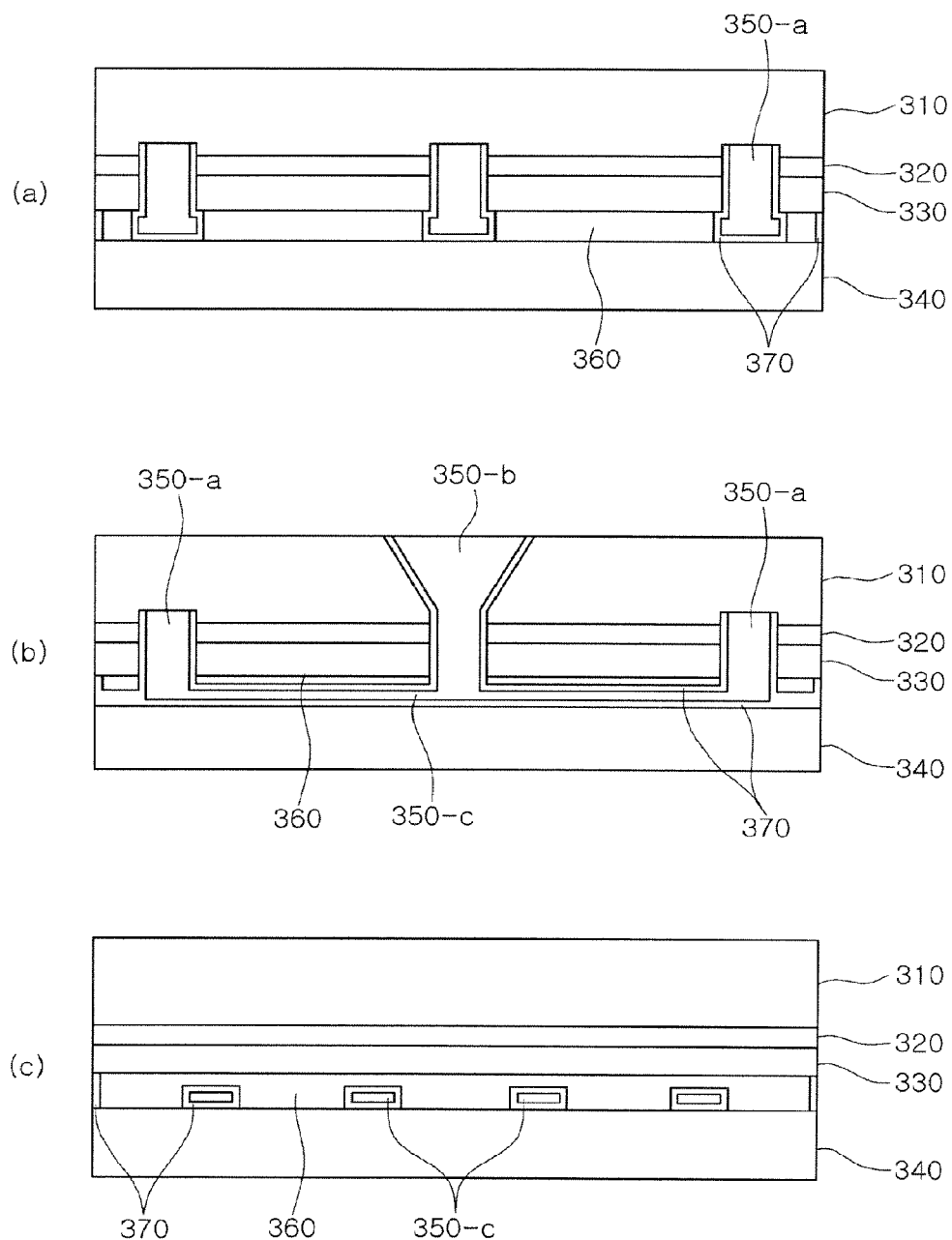
Figure 15:
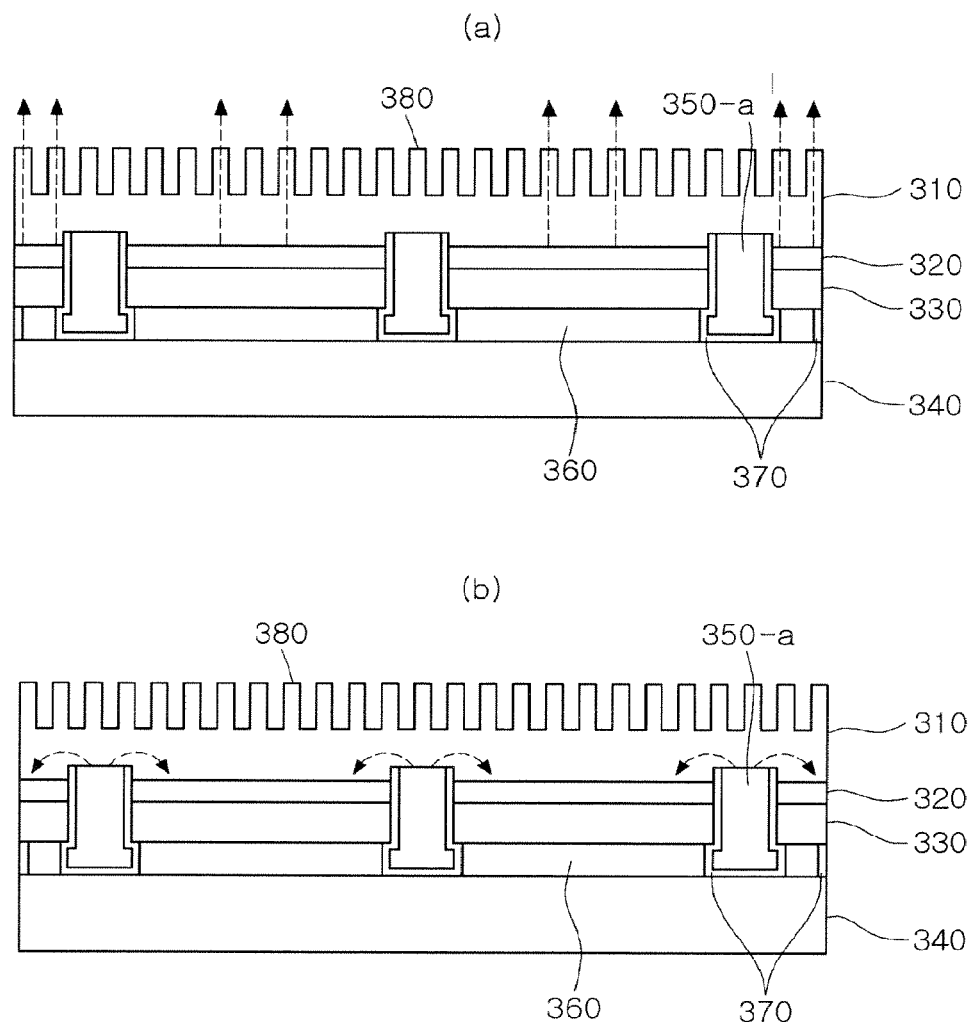

FIGS. 10 and 11 illustrate the result of a simulation conducted by changing n-type specific contact resistance. In this simulation, the n-type specific contact resistance is $10^{-6}$ ohm/cm² and p-type specific contact resistance is $10^{-2}$ ohm/cm². The n-type specific contact resistance is influenced by the doping levels of the n-type semiconductor layer, n-type electrode materials, and heat treatment methods. Therefore, the n-type specific contact resistance may be reduced by up to $10^{-6}$ ohm/cm² by increasing the doping concentration of the n-type semiconductor layer or adopting metal having a low energy barrier such as Al, Ti and Cr as an n-type electrode material. That is, the n-type specific contact resistance may be commonly $10^{-4}$ ohm/cm² to $10^{-6}$ ohm/cm².

Referring to FIG. 10, the sum total of the n-type and p-type specific contact resistance, namely, the total contact resistance R4 may be maintained at a very low level even in a smaller contact area, as compared with the result shown in FIG. 6. Also, as a result of reviewing luminous efficiency according to the contact area with reference to FIG. 11, luminous efficiency may be maintained at a high level even in a smaller contact area, as compared with the result shown in FIG. 7. In this case, the value of luminous efficiency above 100% indicates a value relative to the result shown in FIG. 7. Referring to the result of the simulation shown in FIGS. 10 and 11, the condition that the total contact resistance is below 1.6 ohm and the luminous efficiency is above 90% is when the contact area between the first electrode layer and the first semiconductor layer is 6150 μm² to 156,800 μm² per 1,000,000 μm² area.

When the number of contact holes is determined on the basis of such a result, the contents described with reference to the result of the previous simulation may be applied. Specifically, in the case of circular contact holes having a radius of approximately 1 μm to 50 μm, approximately 1 to 48,000 contact holes are required to satisfy the above condition. Further, assuming that the contact holes are uniformly arranged, the distance between two adjacent contact holes should be approximately 5 μm to 500 μm.

Hereinafter, a semiconductor light emitting device according to another exemplary embodiment of the present invention will be described through a variety of embodiments.

First, a semiconductor light emitting device according to another exemplary embodiment of the invention will be described with reference to FIGS. 12 through 16.

A semiconductor light emitting device 300 according to another exemplary embodiment of the invention includes a conductive substrate 340, a first conductivity type semiconductor layer 330, an active layer 320 and a second conductivity type semiconductor layer 310 that are sequentially stacked. This semiconductor light emitting device 300 includes a first electrode layer 360 formed between the conductive substrate 340 and the first conductivity type semiconductor layer 330, and a second electrode part 350 including an electrode pad portion 350-*b*, an electrode extension portion 350-*a*, and an electrode connection portion 350-*c*.

The electrode pad portion 350-*b* extends from the first electrode layer 360 to the surface of the second conductivity type semiconductor layer 310 and is electrically separated from the first electrode layer 360, the first conductivity type semiconductor layer 330, and the active layer 320. The electrode extension portion 350-*a* extends from the first electrode layer 360 to the inside of the second conductivity type semiconductor layer 310 and is electrically separated from the first electrode layer 360, the first conductivity type semiconductor layer 330, and the active layer 320. The electrode connection portion 350-*c* is formed in the same layer as the first electrode layer 360, but is electrically separated from the first electrode layer 360. The electrode connection portion 350-*c* connects the electrode pad portion 350-*b* to the electrode extension portion 350-*a*.

The conductive substrate 340 may be a metallic substrate or a semiconductor substrate. When the conductive substrate 340 is the metallic substrate, the conductive substrate 340 may be formed of any one of Au, Ni, Cu, and W. Also, when the conductive substrate 340 is the semiconductor substrate, the conductive substrate 340 may be formed of any one of Si, Ge, and GaAs. Examples of a method of forming a conductive substrate in a semiconductor light emitting device include a plating method of forming a plating seed layer to form a substrate and a substrate bonding method of separately preparing a conductive substrate and bonding the conductive substrate by using a conductive adhesive, such as Au, Au—Sn, and Pb—Sr.

Each of the semiconductor layers 330 and 310 may be formed of an inorganic semiconductor such as a GaN-based semiconductor, a ZnO-based semiconductor, a GaAs-based semiconductor, a GaP-based semiconductor, and a GaAsP-based semiconductor. The semiconductor layers may be formed by using, for example, molecular beam epitaxy (MBE). In addition, the semiconductor layers may be formed of any one of semiconductors, such as a group III-V semiconductor, a group II-VI semiconductor and Si.

The active layer 320 is a layer where light emission is activated. The active layer 320 may be formed of a material having a smaller energy band gap than each of the first and second conductivity type semiconductor layers 330 and 310. For example, when the first and second conductivity type semiconductor layers 330 and 310 may be a GaN-based compound semiconductor, the active layer 320 may be formed by using an InAlGaN-based compound semiconductor that has a smaller energy bandgap than GaN. That is, the active layer 320 may be $In_xAl_yGa_{(1-x-y)}N$ (where $0 \leq x \leq 1$, $0 \leq y \leq 1$, and $0 \leq x+y \leq 1$ are satisfied).

Here, in consideration of the characteristics of the active layer 320, the active layer 320 is preferably not doped with impurities. A wavelength of emitted light may be controlled by adjusting a mole ratio of constituents. Therefore, the semiconductor light emitting device 300 may emit any one of infrared light, visible light, and UV light according to the characteristics of the active layer 320.

An energy well structure appears in the entire energy band diagram of the semiconductor light emitting device 300 according to the active layer 320. Electrons and holes from each of the semiconductor layers 330 and 310 are moving and are trapped within the energy well structure, which results in higher luminous efficiency.

The first electrode layer 360 electrically connects the first conductivity type semiconductor layer 330 to an external current source (not shown). The first electrode layer 360 may be formed of metal. For example, the first electrode layer 360 may be formed of Ti as an n-type electrode, and Pd or Au as a p-type electrode.

The first electrode layer 360 may reflect light generated from the active layer 320. The reflected light is directed to a light emitting surface, and accordingly, the luminous efficiency of the semiconductor light emitting device 300 is improved. In order to reflect the light generated from the active layer 320, the first electrode layer 360 may be formed of metal that appears white in a visible light region. For example, the white metal may be any one of Ag, Al, and Pt. The first electrode layer 360 will be further described with reference to FIGS. 14A through 14C.

The second electrode part 350 electrically connects the second conductivity type semiconductor layer 310 to an external current source (not shown). The second electrode part 350 may be formed of metal. For example, the second electrode part 350 may be formed of Ti as an n-type electrode, and Pd or Au as a p-type electrode. Particularly, the second electrode part 350 according to this embodiment includes the electrode pad portion 350-b, the electrode extension portion 350-a, and the electrode connection portion 350-c.

Referring to FIG. 13A, the electrode pad portion 350-b is formed on the surface of the second conductivity type semiconductor layer 310, and the plurality of electrode extension portions 350-a, indicated by a dotted line, are located inside the second conductivity type semiconductor layer 310.

In FIG. 13B, the top surface of the second conductivity type semiconductor layer 310 shown in FIG. 13A is taken along lines A-A', B-B', and C-C'. The line A-A' is taken to show a section that only includes the electrode extension portion 350-a. The line B-B' is taken to show a section that includes the electrode pad portion 350-b and the electrode extension portion 350-a. The line C-C' is taken to show a section that includes neither the electrode extension portion 350-a nor the electrode pad portion 350-b.

FIGS. 14A through 14C are cross-sectional views of the semiconductor light emitting device shown in FIG. 13B taken along lines A-A', B-B', and C-C'. Hereinafter, a detailed description will be made with reference to FIGS. 12, 13A, 13B, and 14A through 14C.

In FIG. 14A, the electrode extension portion 350-a extends from the first electrode layer 360 to the inside of the second conductivity type semiconductor layer 310. The electrode extension portion 350-a passes through the first conductivity type semiconductor layer 330 and the active layer 320 and extends to the second conductivity type semiconductor layer 310. The electrode extension portion 350-a extends at least to part of the second conductivity type semiconductor layer 310. However, the electrode extension portion 350-a does not necessarily extend to the surface of the second conductivity type semiconductor layer 310. This is because the electrode extension portion 350-a is used to spread current in the second conductivity type semiconductor layer 310.

The electrode extension portion 350-a needs to have a predetermined area to spread the current in the second conductivity type semiconductor layer 310. Contrary to the electrode pad portion 350-b, the electrode extension portion 350-a is not used for the electrical connection. Therefore, the electrode extension portion 350-a is formed by a predetermined number so that each electrode extension portion 350-a has an area small enough to allow uniform current spreading in the second conductivity type semiconductor layer 310. A small number of electrode extension portions 350-a may cause deterioration in electrical characteristics due to non-uniform current spreading. A large number of electrode extension portions 350-a may cause difficulty in the process of forming the electrode extension portions 350-a and a decrease in a light emitting area due to a decrease in the area of the active layer. Therefore, the number of electrode extension portions 350-a may be appropriately determined in consideration of these facts. Each of the electrode extension portions 350-a is formed to have as small an area as possible and allows for uniform current spreading.

The plurality of electrode extension portions 350-a may be formed for current spreading. Also, the electrode extension portion 350-a may have a cylindrical shape. A cross section of the electrode extension portion 350-a may be smaller than that of the electrode pad portion 350-b. Further, the electrode extension portions 350-a may be separated from the electrode pad portion 350-b by a predetermined distance. The electrode extension portions 350-a and the electrode pad portion 350-b may be connected to each other in the first electrode layer 360 by the electrode connection portion 350-c to be described below. For this reason, the electrode extension portions 350-a are separated from the electrode pad portion 350-b by the predetermined distance, and thus induce uniform current spreading.

The electrode extension portions 350-a are formed from the first electrode layer 360 to the inside of the second conductivity type semiconductor layer 310. Since the electrode extension portions 350-a are used for current spreading in the second conductivity type semiconductor layer 310, the electrode extension portions 350-a need to be electrically separated from the other layers. Accordingly, the electrode extension portions 350-a are electrically separated from the first electrode layer 360, the first conductivity type semiconductor layer 330, and the active layer 320. Electrical separation may be achieved by using an insulating material such as a dielectric.

In FIG. 14B, the electrode pad portion 350-b extends from the first electrode layer 360 to the surface of the second conductivity type semiconductor layer 310. The electrode pad portion 350-b starts from the first electrode layer 360, passes through the first conductivity type semiconductor layer 330, the active layer 320 and the second conductivity type semiconductor layer 310, and extends to the surface of the second conductivity type semiconductor layer 310. Since the electrode pad portion 350-b is formed to connect the second electrode part 350 to the external current source, at least one electrode pad portion 350-b needs to be included.

The electrode pad portion 350-b extends from the first electrode layer 360 to the surface of the second conductivity type semiconductor layer 310. Since the electrode pad portion 350-b is electrically connected to the external current source at the surface of the second conductivity type semiconductor layer 310 to supply current to the electrode extension portions 350-a, the electrode pad portion 350-b may be electrically separated from the first electrode layer 360, the first conductivity type semiconductor layer 330, and the active layer 320. Electrical separation may be achieved by using an insulating material such as a dielectric.

The electrode pad portion 350-b supplies the current to the electrode extension portions 350-a. Further, the electrode pad portion 350-b may be formed so that the electrode pad portion 350-b is not electrically separated from the second conductivity type semiconductor layer 310 so as to directly spread the current. The electrode pad portion 350-b may be electrically separated from the second conductivity type semiconductor layer 310 or not, according to whether current supply to the electrode extension portions 350-a or current spreading in the second conductivity type semiconductor layer 310 is required.

A cross section of the electrode pad portion 350-b at the active layer 320 may be smaller than that of the electrode pad portion 350-b at the surface of second conductivity type semiconductor layer 310. In this way, the area of the active layer 320 is maximized as much as possible in order to ensure an increase in luminous efficiency. However, the electrode pad portion 350-b at the surface of the second conductivity type semiconductor layer 310 needs to have a predetermined area so as to be connected with the external current source.

The electrode pad portion 350-*b* may be located at the center of the semiconductor light emitting device 300. In this case, the electrode extension portions 350-*a* are preferably separated from the electrode pad portion 350-*b* by the predetermined distance, and uniformly distributed. Referring to FIG. 13A, the electrode pad portion 350-*b* and the electrode extension portions 350-*a* are uniformly distributed over the second conductivity type semiconductor layer 310 to optimize the current spreading. In FIG. 13A, it is assumed that there are one electrode pad portion 350-*b* and twelve electrode extension portions 350-*a*. However, the number of electrode pad portion 350-*b* and the number of electrode extension portions 350-*a* may be appropriately determined in considerations of factors for electrical connection state (e.g. the position of the external current source) and current spreading state (e.g. the thickness of the second conductivity type semiconductor layer 310).

When the plurality of electrode extension portions 350-*a* are formed, the electrode pad portion 350-*b* may be directly connected to each of the plurality of electrode extension portions 350-*a*. In this case, the electrode pad portion 350-*b* is formed at the center of the semiconductor light emitting device 300, and the electrode extension portions 350-*a* are formed around the electrode pad portion 350-*b*. Further, the electrode connection portion 350-*c* may directly connect the electrode pad portion 350-*b* and the electrode extension portions 350-*a* in a radial direction.

Alternatively, some of the plurality of electrode extension portions 350-*a* may be directly connected to the electrode pad portion 350-*b*. Other electrode extension portions 350-*a* may be connected to the electrode extension portions 350-*a* that are directly connected to the electrode pad portion 350-*b*, such that these electrode extension portions 350-*a* are indirectly connected to the electrode pad portion 350-*b*. In this way, a larger number of electrode extension portions 350-*a* can be formed to thereby increase current spreading efficiency.

In FIGS. 14A through 14C, the electrode connection portion 350-*c* is formed in the first electrode layer 360 and connects the electrode pad portion 350-*b* and the electrode extension portions 350-*a* to each other. Therefore, a considerable amount of the second electrode part 350 is located at a rear surface opposite to the direction in which light is emitted from the active layer 320, thereby increasing luminous efficiency. Particularly, in FIG. 14C, only the electrode connection portion 350-*c* is located in the first electrode layer 360. The second electrode part 350 is not located at the first conductivity type semiconductor layer 330, the active layer 320, and the second conductivity type semiconductor layer 310. Accordingly, as shown in FIG. 14C, the electrode pad portion 350-*b* and the electrode connection portions 350-*a* do not affect light emissions, so they have higher luminous efficiency. Although not shown in FIG. 14C, the first electrode layer 360 may be in contact with the conductive substrate 340 to thereby be connected to the external current source.

The electrode connection portion 350-*c* is electrically separated from the first electrode layer 360. The first electrode layer 360 and the second electrode part 350 include electrodes that have polarities opposite to each other to supply external power to the first conductivity type semiconductor layer 330 and the second conductivity type semiconductor layer 310, respectively. Therefore, the two electrodes must be electrically separated from each other. Electrical separation may be achieved by using an insulating material, such as a dielectric.

In FIG. 14B, since the electrode pad portion 350-*b* is located on the surface of the second conductivity type semiconductor layer 310, it is possible to obtain characteristics of a vertical semiconductor light emitting device. In FIG. 14C, since the electrode connection portion 350-*c* is located in the same plane as the first electrode layer 360, it is possible to obtain the characteristics of a horizontal semiconductor light emitting device. Therefore, the semiconductor light emitting device 300 has a structure in which the horizontal semiconductor light emitting device and the vertical semiconductor light emitting device are integrated.

Referring to FIGS. 14A through 14C, the second conductivity type semiconductor layer 310 may be an n-type semiconductor layer, and the second electrode part 350 may be an n-type electrode part. In this case, the first conductivity type semiconductor layer 330 may be a p-type semiconductor layer, and the first electrode layer 360 may be a p-type electrode. The second electrode part 350 includes the electrode pad portion 350-*b*, the electrode extension portions 350-*a*, and the electrode connection portion 350-*c* that are connected to each other. When the second electrode part 350 is formed of the n-type electrode, the second electrode part 350 may be electrically separated from the first electrode layer 360 formed of the p-type electrode by an insulating part 370 that is formed of an insulating material.

FIG. 15A illustrates the light emission of a semiconductor light emitting device having an uneven pattern formed on the surface thereof according to a modified embodiment of this embodiment. FIG. 15B illustrates the current spreading of a semiconductor light emitting device having an uneven pattern formed on the surface thereof according to another modified embodiment of this embodiment.

The semiconductor light emitting device 300 according to this embodiment includes the second conductivity type semiconductor layer 310 that forms an outermost surface in a direction in which emitted light moves. Accordingly, it is easy to form an uneven pattern on the surface by using a method well-known in the art, such as photolithography. In this case, light emitted from the active layer 320 passes through an uneven pattern 380 that is formed on the surface of the second conductivity type semiconductor layer 310, and then the light is extracted. The uneven pattern 380 increases light extraction efficiency.

The uneven pattern 380 may have a photonic crystal structure. Photonic crystals contain different media with different refractivity in which the media are regularly arranged in a crystal-like manner. The photonic crystals may increase light extraction efficiency by controlling light in unit of length corresponding to a multiple of a wavelength of light. The photonic crystal structure may be formed according to an appropriate process after forming the second conductivity type semiconductor layer 310 and the second electrode part 350. For example, the photonic crystal structure may be formed through an etching process.

Even though the uneven pattern 380 is formed on the second conductivity type semiconductor layer 310, current spreading is not affected by the uneven pattern 380. Referring to FIG. 15B, the current spreading in the electrode extension portions 350-*a* is not affected by the uneven pattern 380. Each of the electrode extension portions 350-*a* spreads current below the uneven pattern 380 and the uneven pattern 380 extracts emitted light, thereby increasing luminous efficiency.

Figure 16:
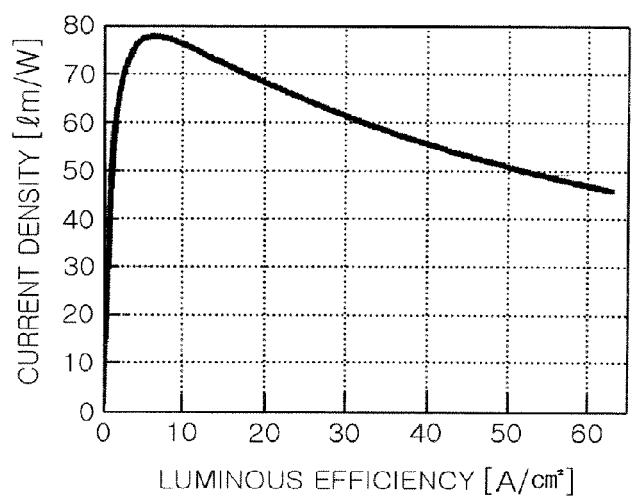

FIG. 16 is a graph illustrating the relationship between the current density and luminous efficiency of a light emitting surface. When current density is above approximately 10 A/cm$^2$ in the graph, a smaller level of current density indicates higher luminous efficiency and a larger level of current density indicates lower luminous efficiency.

Table 1 below shows values related thereto.

TABLE 1

| Light Emitting Area (cm$^2$) | Current Density (A/cm$^2$) | Luminous Efficiency (lm/W) | Improvement Rate (%) |
|---|---|---|---|
| 0.0056 | 62.5 | 46.9 | 100 |
| 0.0070 | 50.0 | 51.5 | 110 |
| 0.0075 | 46.7 | 52.9 | 113 |
| 0.0080 | 43.8 | 54.1 | 115 |

As the light emitting area increases, luminous efficiency improves. However, in order to ensure the light emitting area, it is necessary to decrease the area of distributed electrodes, and accordingly, the current density of the light emitting surface tends to decrease. Such a decrease in the current density of the light emitting surface may deteriorate the electrical characteristics of the semiconductor light emitting device.

This problem may be solved by ensuring current spreading by using the electrode extension portions. That is, the problem of the electrical characteristics that may caused by the decrease in the current density may be addressed by forming the electrode extension portions in such a manner that the electrode extension portions are formed inside the light emitting device without extending to the light emitting surface and serve to spread current therein. Therefore, the semiconductor light emitting device according to this embodiment is capable of achieving desired current spreading and obtaining a maximum light emitting area, thereby improving luminous efficiency.

A semiconductor light emitting device according to another exemplary embodiment of the present invention will be described with reference to FIGS. 17 through 20.

Figure 17:
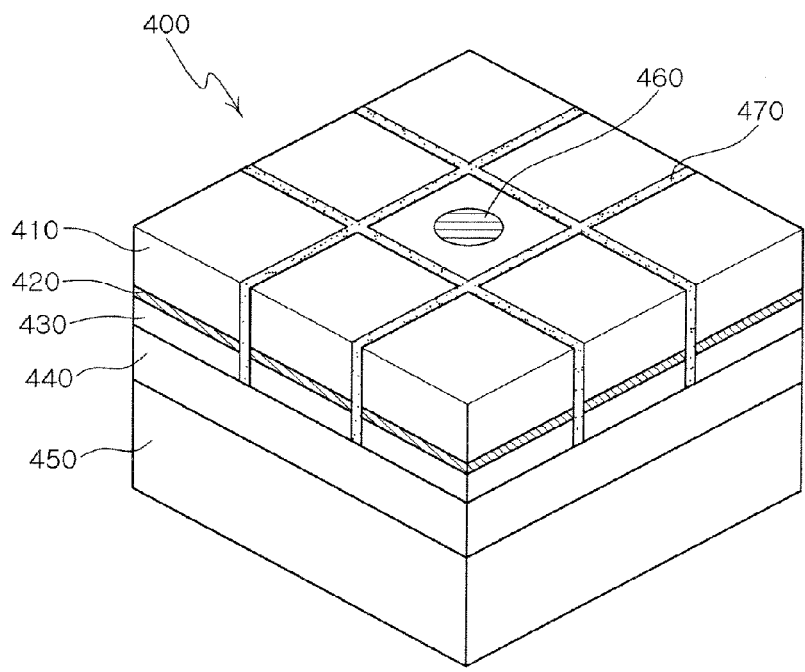
FIGS. 17 through 20 are views illustrating a semiconductor light emitting device according to another exemplary embodiment of the present invention.
Figure 18:
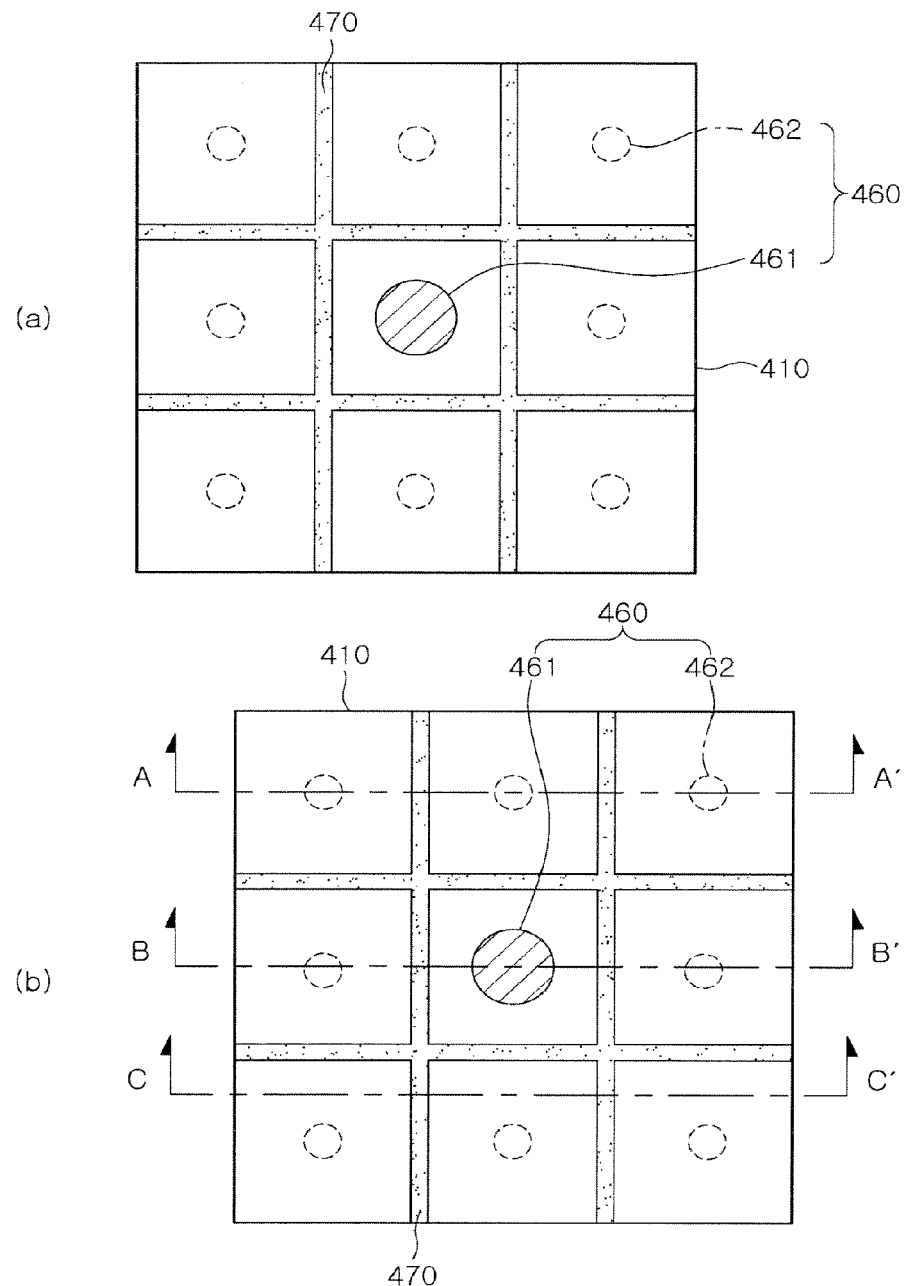
Figure 19:
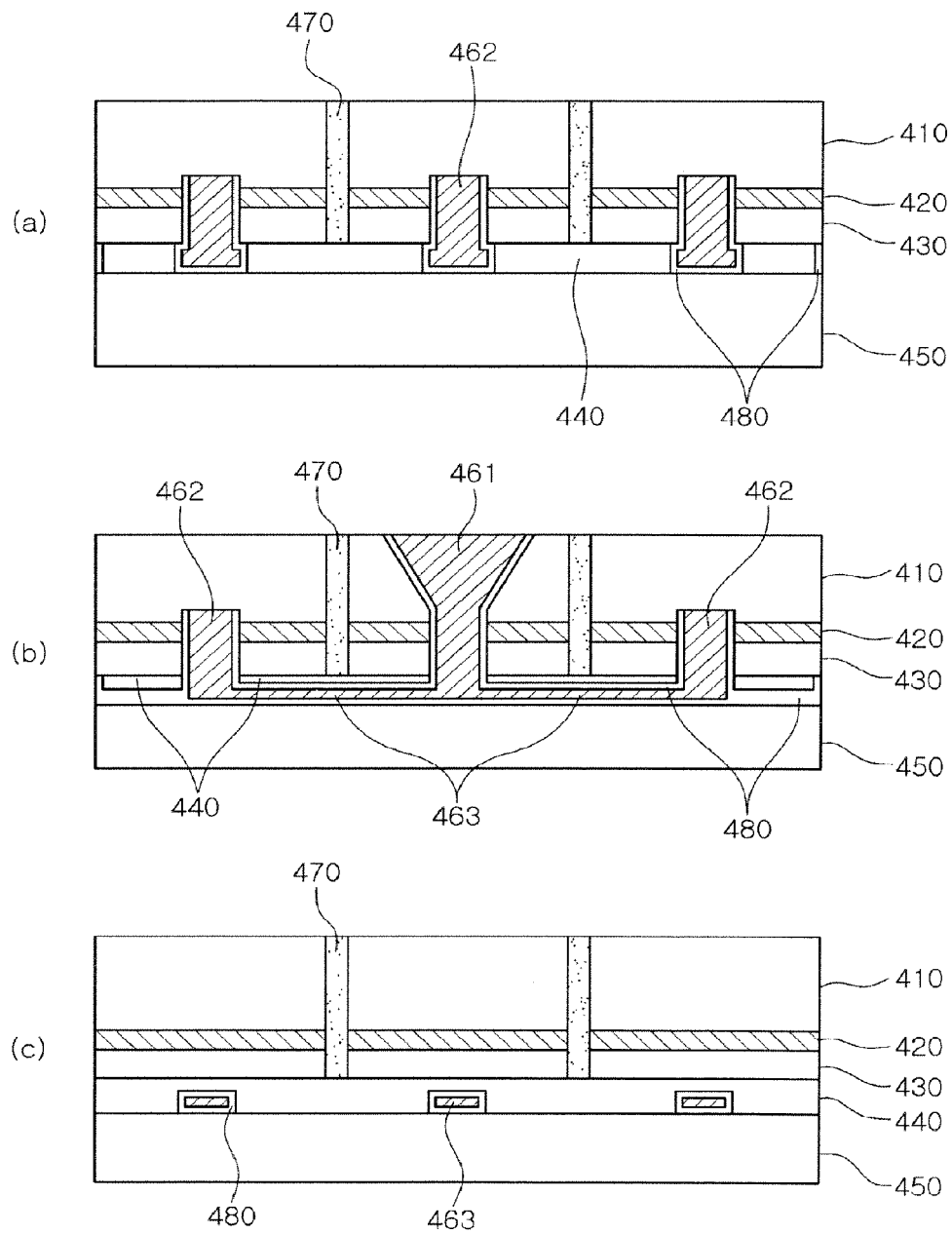

FIG. 17 is a perspective view illustrating a light emitting device according to another exemplary embodiment of the present invention. FIGS. 18A and 18B are top views illustrating the light emitting device of FIG. 17. FIGS. 19A through 19C are cross-sectional views illustrating the light emitting device of FIG. 18B, taken along lines A-A', B-B', and C-C', respectively.

A light emitting device 400 according to another exemplary embodiment of the invention includes a light emitting stack 430, 420 and 410, at least one barrier portion 470, a second electrode structure 460, a first electrode structure 440, and a conductive substrate 450. The light emitting stack 430, 420 and 410 includes first and second conductivity type semiconductor layers 430 and 410, and an active layer 420 formed therebetween, and has a first surface and a second surface opposite to each other and provided as the first and second conductivity type semiconductor layers 430 and 410. The barrier portion 470 has electrical insulation and extends from the second surface of the light emitting stack 430, 420 and 410 to at least part of the second conductivity type semiconductor layer 410 to divide the light emitting stack 430, 420 and 410 into a plurality of light emitting regions. The second electrode structure 460 is connected to the second conductivity type semiconductor layer 410 that is located at the plurality of light emitting regions. The first electrode structure 440 is formed on the second surface of the light emitting stack 430, 420 and 410 so as to be connected to the first conductivity type semiconductor layer 430. The conductive substrate 450 is formed on the second surface of the light emitting stack 430, 420 and 410 so as to be electrically connected to the first electrode structure 440.

The light emitting stack 430, 420 and 410 includes the first and second conductivity type semiconductor layers 430 and 410, and the active layer 420 formed therebetween. The light emitting stack 430, 420 and 410 has an outer surface of the second conductivity type semiconductor layer 410 that serves as the first surface and an outer surface of the first conductivity type semiconductor layer 430 that serves as the second surface.

Each of the semiconductor layers 430 and 410 may be formed of a semiconductor, such as a GaN-based semiconductor, a ZnO-based semiconductor, a GaAs-based semiconductor, a GaP-based semiconductor, and a GaAsP-based semiconductor. The semiconductor layer may be formed by using, for example, molecular beam epitaxy (MBE). In addition, each of the semiconductor layers may be formed of any one of semiconductors, such as a group III-V semiconductor, a group II-VI semiconductor, and Si. The light emitting stack may grow on a non-conductive substrate (not shown), such as a sapphire substrate, having relatively small lattice-mismatching. The non-conductive substrate is removed later before a conductive substrate is bonded.

The active layer 420 is a layer in which light emission is activated. The active layer 420 is formed of a material that has a smaller energy bandgap than each of the second and first conductivity type semiconductor layers 410 and 430. For example, when each of the second and first conductivity type semiconductor layers 410 and 430 is formed of a GaN-based compound semiconductor, the active layer 420 may be formed by using an InAlGaN-based compound semiconductor that has a smaller energy bandgap than GaN. That is, the active layer 420 may include $In_xAl_yGa_{(1-x-y)}N$ (where $0 \leq x \leq 1$, $0 \leq y \leq 1$, and $0 \leq x+y \leq 1$ are satisfied).

Here, in consideration of the characteristics of the active layer 420, the active layer 420 is preferably not doped with impurities. A wavelength of emitted light may be controlled by adjusting a mole ratio of constituents. Therefore, the light emitting device 400 may emit any one of infrared light, visible light, and UV light according to the characteristics of the active layer 420.

An energy well structure appears in the entire energy band diagram of the light emitting device 400 according to the active layer 420. Electrons and holes from each of the semiconductor layers 430 and 410 are moving and are trapped within the energy well structure, which results in higher luminous efficiency.

The barrier portion 470 extends from the second surface of the light emitting stack 430, 420, and 410 to at least part of the second conductivity type semiconductor layer 410, such that the light emitting stack 430, 420, and 410 is divided into the plurality of light emitting regions. The barrier portion 470 divides the second conductivity type semiconductor layer 410 into a plurality of regions. When a separating unit, such as a laser, is used between the second conductivity type semiconductor layer 410 and a substrate for growth (not shown) formed on the second conductivity type semiconductor layer 410, the barrier portion 470 reduces stress that is generated due to heat energy applied to the interface therebetween.

For example, when a laser is used as the separating unit for separating the second conductivity type semiconductor layer 410 from the substrate for growth, the temperature at the interface is approximately 1000° C. Heat energy from the laser separates the second conductivity type semiconductor layer 410 from the substrate for growth. However, the heat generates stress that induces contraction and expansion of the semiconductor layers and the conductive substrate 450 to be bonded later. In general, since the magnitude of stress is in proportion to the area, the stress may adversely affect a large area light limiting device.

However, since the light emitting device 400 according to this embodiment includes the barrier portion 470, the area of the second conductivity type semiconductor layer 410 is divided into a plurality of smaller areas of the plurality of light emitting regions to thereby reduce stress. That is, expansion and contraction are more easily performed according to the plurality of light emitting regions, such that light emission of the light emitting stack 430, 420, and 410 can be stabilized.

Preferably, the barrier portion 470 electrically insulates the semiconductor layers 430 and 410, and the active layer 420. To do so, the barrier portion 470 may be filled with air. Alternatively, the barrier portion 470 may have an insulating layer formed therein, in which the insulating layer is filled with air. Further, the entire barrier portion may be filled with an insulating material, such as a dielectric, to achieve electrical insulation.

In order to electrically insulate the light emitting stack 430 and 410, the barrier portion 470 may extend from the second surface to the top surface of the second conductivity type semiconductor layer 410. However, the barrier portion 470 does not necessarily extend to the top surface of the second conductivity type semiconductor layer 410. The barrier portion 470 may extend to the inside of the second conductivity type semiconductor layer 410.

Also, the barrier portion 470 may have a single structure. Alternatively, the barrier portion 470 may include a plurality of barriers that are separated from each other. In this case, the plurality of barriers may appear different from each other in order to allow required electrical insulating characteristics. For example, the barrier that surrounds a bonding portion 461 and the barrier that surrounds a contact hole 462 may be different in height and shape.

The second electrode structure 460 is connected to the second conductivity type semiconductor layer 410 located at the plurality of light emitting regions that are separated from each other by the barrier portion 470. The second electrode structure 460 includes the contact hole 462, the bonding portion 461, and a wiring portion 463.

There may be a plurality of contact holes 462. Each of the plurality of contact holes 462 may be formed in each of the plurality of light emitting regions. A single contact hole may be formed in a single light emitting region or a plurality of contact holes may be formed in a single light emitting region. While the contact holes 462 are electrically connected to the second conductivity type semiconductor layer 410, the contact holes 462 are electrically insulated from the first conductivity type semiconductor layer 430 and the active layer 420. To do so, the contact hole 462 extends from the second surface of the light emitting stack 430, 420, and 410 to at least part of the second conductivity type semiconductor layer 410. The contact holes 462 are formed to spread current in the second conductivity type semiconductor layer 410.

The bonding portion 461 is connected from the first surface of the light emitting stack 430, 420, and 410 to at least one of the plurality of contact holes 462. A region that is exposed at the first surface is provided as a bonding region.

The wiring portion 463 is formed at the second surface of the light emitting stack 430, 420, and 410. While the wiring portion 463 is electrically insulated from at least the first conductivity type semiconductor layer 430, the wiring portion 463 electrically connects one contact hole 462, which is connected to the bonding portion 461, and another contact hole 462. Also, the wiring portion 463 may connect the contact holes 462 to the bonding portion 461. The wiring portion 463 is located below the second conductivity type semiconductor layer 410 and the active layer 420 to thereby increase luminous efficiency.

Hereinafter, the contact holes 462, the bonding portion 461, and the wiring portion 463 will be described in more detail with reference to FIGS. 18A through 19C.

The first electrode structure 440 is formed on the second surface of the light emitting stack 430, 420, and 410 so as to be electrically connected to the first conductivity type semiconductor layer 430. That is, the first electrode structure 440 has an electrode that electrically connects the first conductivity type semiconductor layer 430 to an external current source (not shown). The first electrode structure 440 may be formed of metal. For example, the first electrode structure 440 may be formed of Ti as an n-type electrode, and Pd or Au as a p-type electrode.

The first electrode structure 440 may reflect light generated from the active layer 420. Since the first electrode structure 440 is located below the active layer 420, the first electrode structure 440 is located at a surface opposite to a direction, in which the light emitting device emits light, on the basis of the active layer 420. Light moving from the active layer 420 to the first electrode structure 440 is opposite to the light emitting direction, and thus the light needs to be reflected to increase luminous efficiency. Therefore, the light reflected by the first electrode structure 440 moves toward a light emitting surface, thereby increasing the luminous efficiency of the light emitting device.

In order to reflect the light generated from the active layer 420, the first electrode structure 440 may be formed of metal that appears white in the visible light region. For example, the white metal may be any one of Ag, Al, and Pt. The first electrode structure 440 will be described below in more detail with reference to FIGS. 19A through 19C.

The conductive substrate 450 is formed on the second surface of the light emitting stack 430, 420, and 410 so as to be electrically connected to the first electrode structure 440. The conductive substrate 450 may be a metallic substrate or a semiconductor substrate. When the conductive substrate 450 is the metallic substrate, the conductive substrate 450 may be formed of any one of Au, Ni, Cu, and W. Further, when the conductive substrate 450 is the semiconductor substrate, the conductive substrate 450 may be formed of any one of Si, Ge, and GaAs. Examples of a method of forming a conductive substrate in a light emitting device include a plating method of forming a plating seed layer to form a substrate and a substrate bonding method of separately preparing a conductive substrate and bonding the conductive substrate by using a conductive adhesive, such as Au, Au—Sn, and Pb—Sr.

Referring to FIG. 18A, the bonding portion 461 is formed on the surface of the second conductivity type semiconductor layer 410, and the plurality of contact holes 462, indicated by a dotted line, are located inside the second conductivity type semiconductor layer 410. The second conductivity type semiconductor layer 410 includes the plurality of light emitting regions that are separated from each other by the barrier portion 470. In FIGS. 18A and 18B, only one bonding portion 461 is shown. However, a plurality of bonding portions may be formed on the same light emitting region or a plurality of bonding portions may be formed on each of the plurality of light emitting regions. Further, each of the contact holes 462 is formed in each of the light emitting regions. However, the plurality of contact holes 462 may be formed in a single light emitting region to thereby improve current spreading.

In FIG. 18B, the top surface of the second conductivity type semiconductor layer 410 shown in FIG. 18A is taken along lines A-A', B-B', and C-C'. The line A-A' is taken to show a section that only includes the contact holes 462. The line B-B' is taken to show a section that includes the bonding portion 461 and the contact holes 462. The line C-C' is taken to show a section that only includes the wiring portion 463 and does not include the contact holes 462 and the bonding portion 461.

FIGS. 19A through 19C are cross-sectional views illustrating the light emitting device of FIG. 18B taken along lines A-A', B-B', and C-C'. Hereinafter, a detailed description will be made with reference to FIGS. 17, 18A, 18B, and 19A through 19C.

In FIG. 19A, each of the contact holes 462 extends from the first electrode layer 440 to the inside of the second conductivity type semiconductor layer 410. The contact holes 462 pass through the first conductivity type semiconductor layer 430 and the active layer 420 and extend to the second conductivity type semiconductor layer 410. The contact holes 462 extend at least to part of the second conductivity type semiconductor layer 410. However, the contact holes 462 do not necessarily extend to the surface of the second conductivity type semiconductor layer 410. However, since the contact holes 462 are used for current spreading in the second conductivity type semiconductor layer 410, the contact holes 462 need to extend to the second conductivity type semiconductor layer 410.

The contact hole 462 needs to have a predetermined area to spread the current in the second conductivity type semiconductor layer 410. Contrary to the bonding portion 461, the contact hole 462 is not used for an electrical connection. Therefore, the contact holes 462 are formed in a predetermined number so that each contact hole 462 has an area small enough to allow for uniform current spreading in the second conductivity type semiconductor layer 410. A small number of contact holes 462 may cause deterioration in electrical characteristics due to non-uniform current spreading. A large number of contact holes 462 may cause difficulty in the process of forming the contact holes 462 and a decrease in a light emitting area due to a decrease in the area of the active layer. Therefore, the number of contact holes 462 may be appropriately determined in considerations of these facts. Each of the contact holes 462 is formed to have as small an area as possible and allow for uniform current spreading.

The plurality of contact holes 462 may be formed for current spreading. Also, the contact hole 462 may have a cylindrical shape. A cross section of the contact hole 462 may be smaller than that of the bonding portion 461. Further, the contact hole 462 may be separated from the bonding portion 461 by a predetermined distance. The contact holes 462 and the bonding portion 461 may be connected to each other in the first electrode structure 440 by the wiring portion 463 to be described below. For this reason, the contact holes 462 are separated from the bonding portion 461 by the predetermined distance, and thus induce uniform current spreading in the first conductivity type semiconductor layer 430.

The contact holes 462 are formed from the first electrode structure 440 to the inside of the second conductivity type semiconductor layer 410. Since the contact holes 462 are formed to spread the current in the second conductivity type semiconductor layer 410, the contact holes 462 need to be electrically separated from the first conductivity type semiconductor layer 430 and the active layer 420. Accordingly, the contact holes 462 are electrically separated from the first electrode structure 440, the first conductivity type semiconductor layer 430, and the active layer 420. Electrical separation may be achieved by using an insulating material such as a dielectric.

In FIG. 19B, the bonding portion 461 starts from the first electrode structure 440, passes through the first conductivity type semiconductor layer 430, the active layer 420 and the second conductivity type semiconductor layer 410, and extends to the surface of the second conductivity type semiconductor layer 410. Since the bonding portion 461 is connected from the first surface of the light emitting stack 430, 420, 410 to at least one of the plurality of contact holes 462. A region of the bonding portion 461 that is exposed at the first surface is provided as a bonding region.

Particularly, since the bonding portion 461 is formed to connect the second electrode structure 460 to an external current source (not shown), at least one bonding portion 461 needs to be included in the second electrode structure 460.

Since the bonding portion 461 is electrically connected to the external current source on the surface of the second conductivity type semiconductor layer 410 to supply current to the contact holes 462, the bonding portion 461 may be electrically separated from the first electrode structure 440, the second conductivity type semiconductor layer 410, and the active layer 420. Electrical separation may be achieved by forming an insulating layer using an insulating material such as a dielectric.

The bonding portion 461 supplies current to the contact holes 462. Further, the bonding portion 461 may be formed so that the bonding portion 461 is not electrically separated from the second conductivity type semiconductor layer 410 so as to directly spread the current. The bonding portion 461 may be electrically separated from the second conductivity type semiconductor layer 410 or not, according to whether current supply to the contact holes 462 or current spreading in the second conductivity type semiconductor layer 410 is required.

The cross section of the bonding portion 461 at the active layer 420 may be smaller than that of the bonding portion 461 at the surface of the second conductivity type semiconductor layer 410. In this way, the area of the active layer 420 is maximized as much as possible in order to ensure an increase in luminous efficiency. However, the bonding portion 461 at the surface of the second conductivity type semiconductor layer 410 needs to have a predetermined area so as to be connected with the external current source.

The bonding portion 461 may be located at the center of the light emitting device 400. In this case, the contact holes 462 are preferably separated from the bonding portion 461 by the predetermined distance, and uniformly distributed. Referring to FIG. 18A, the bonding portion 461 and the contact holes 462 are uniformly distributed over the second conductivity type semiconductor layer 410 to optimize the current spreading. In FIG. 18A, it is assumed that there are one bonding portion 461 and eight contact holes 462. However, the number of bonding portion 461 and the number of contact holes 462 may be appropriately determined in consideration of factors for electrical connection state (e.g. the position of the external current source) and current spreading state (e.g. the thickness of the second conductivity type semiconductor layer 410).

When the plurality of contact holes 462 are formed, the bonding portion 461 may be directly connected to each of the plurality of contact holes 462. In this case, the bonding portion 461 is formed at the center of the light emitting device 400, and the contact holes 462 are formed around the bonding portion 461. Further, the wiring portion 463 may directly connect the bonding portion 461 and the contact holes 462 in a radial direction.

Alternatively, some of the plurality of contact holes 462 may be directly connected to the bonding portion 461. Other contact holes 462 may be connected to the contact holes 462 that are directly connected to the bonding portion 461, such that these contact holes 462 are indirectly connected to the bonding portion 461. In this way, a larger number of contact holes 462 can be formed to thereby increase current spreading efficiency.

In FIGS. 19A through 19C, the wiring portion 463 is formed in the first electrode structure 440 and connects the bonding portion 461 and the contact holes 462 to each other. Therefore, a considerable amount of the first electrode structure 440 is located at a rear surface opposite to the direction in which light is emitted from the active layer 420, thereby increasing luminous efficiency. Particularly, in FIG. 19C, only the wiring portion 463 is located in the first electrode structure 440. The second electrode structure 460 is not located at the first conductivity type semiconductor layer 430, the active layer 420, and the second conductivity type semiconductor layer 410. Accordingly, as shown in FIG. 19C, the bonding portion 461 and the contact holes 462 do not affect light emission, so they have higher luminous efficiency.

The wiring portion 463 is electrically separated from the first electrode structure 440. The second electrode structure 460 and the first electrode structure 440 include electrodes that have polarities opposite to each other to supply external power to the second conductivity type semiconductor layer 410 and the first conductivity type semiconductor layer 430, respectively. Therefore, the two electrodes must be electrically separated from each other. Electrical separation may be achieved by forming an insulating layer 480 using an insulating material, such as a dielectric.

In FIG. 19B, since the bonding portion 461 is located on the surface of the second conductivity type semiconductor layer 410, it is possible to obtain the characteristics of a vertical light emitting device. In FIG. 19C, since the wiring portion 463 is located in the same plane as the first electrode structure 440, it is possible to obtain the characteristics of a horizontal light emitting device. Therefore, the light emitting device 400 has a structure in which the horizontal light emitting device and the vertical light emitting device are integrated.

Referring to FIGS. 19A through 19C, the first conductivity type semiconductor layer 430 may be a p-type semiconductor layer, and the first electrode structure 440 may be a p-type electrode part. In this case, the second conductivity type semiconductor layer 410 may be an n-type semiconductor layer, and the second electrode structure 460 may be an n-type electrode. The second electrode structure 460 includes the bonding portion 461, the contact holes 462, and the wiring portion 463 that are connected to each other. When the second electrode part 460 is formed of the n-type electrode, the second electrode structure 460 may be electrically separated from the first electrode structure 440 formed of the p-type electrode by the insulating layer 480 that is formed of an insulating material.

Figure 20:
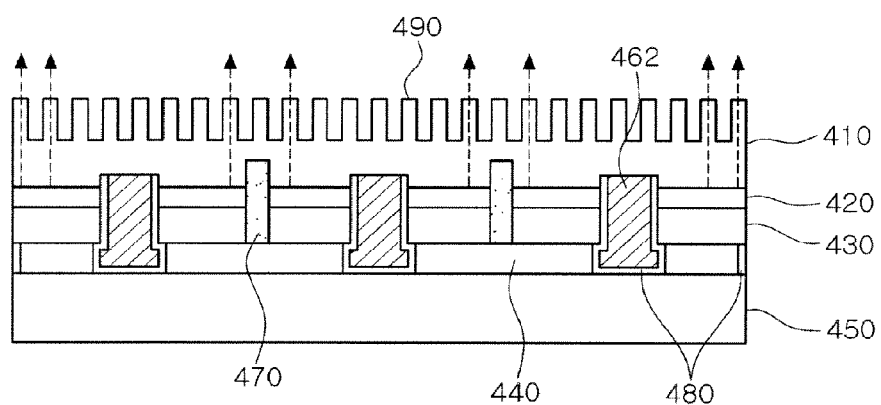

FIG. 20 illustrates the light emission of a light emitting device having an uneven pattern formed on the surface thereof according to an exemplary embodiment of the present invention. The light emitting device according to this embodiment includes the second conductivity type semiconductor layer 410 that forms an outermost surface in a direction where emitted light moves. Accordingly, it is easy to form an uneven pattern on the surface by using a well-known method, such as photolithography. In this case, light emitted from the active layer 420 passes through an uneven pattern 490 that is formed on the surface of the second conductivity type semiconductor layer 410, and then the light is extracted. The uneven pattern 490 increases light extraction efficiency.

The uneven pattern 490 may have a photonic crystal structure. Photonic crystals contain different media with different refractivity in which the media are regularly arranged in a crystal-like manner. The photonic crystals may increase light extraction efficiency by controlling light in unit of length corresponding to a multiple of a wavelength of light. The photonic crystal structure may be formed according to an appropriate process after forming the second conductivity type semiconductor layer 410 and the first electrode structure 460. For example, the photonic crystal structure may be formed by an etching process.

When the uneven pattern 490 is formed on the second conductivity type semiconductor layer 410, the barrier portion 470 preferably extends to the inside of the second conductivity type semiconductor layer 410, not the surface thereof. The barrier portion 470 does not adversely affect the light extraction efficiency improved by the uneven pattern 490 and separates a light emitting region into a plurality of light emitting regions.

A semiconductor light emitting device according to another exemplary embodiment of the present invention will be described with reference to FIGS. 21 through 25.

Figure 21:
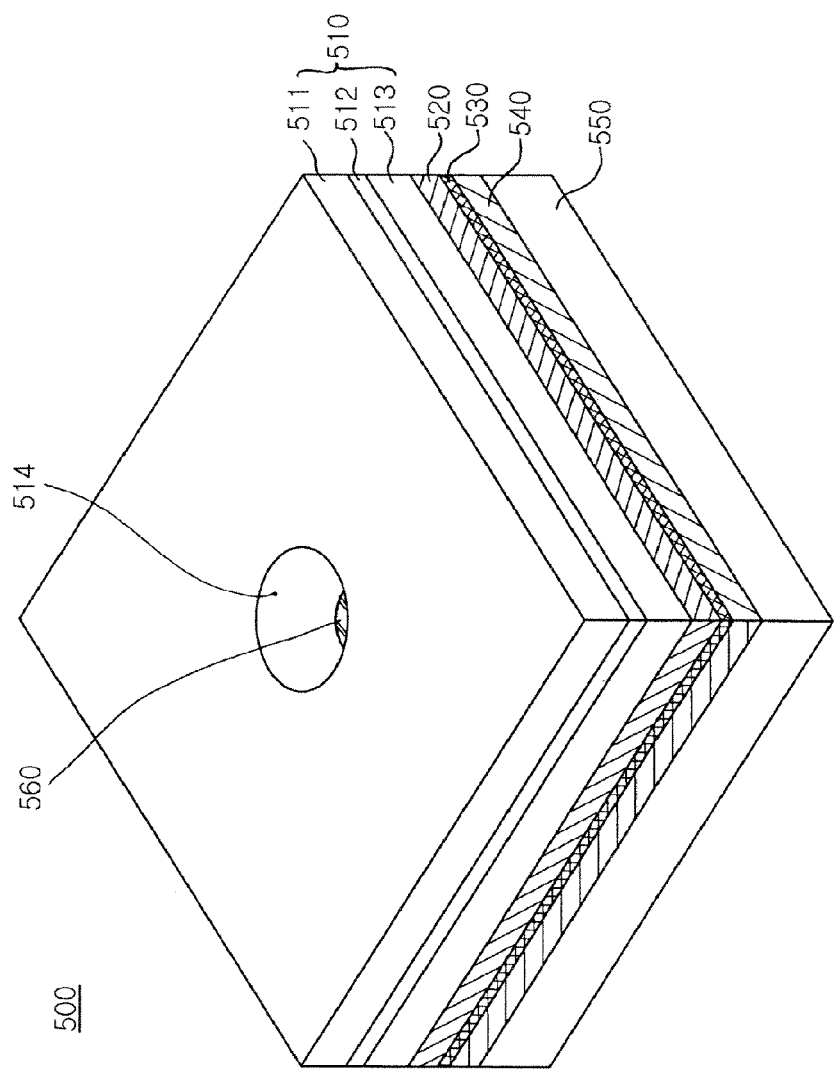
FIGS. 21 through 25 are views illustrating a semiconductor light emitting device according to another exemplary embodiment of the present invention.
Figure 22:
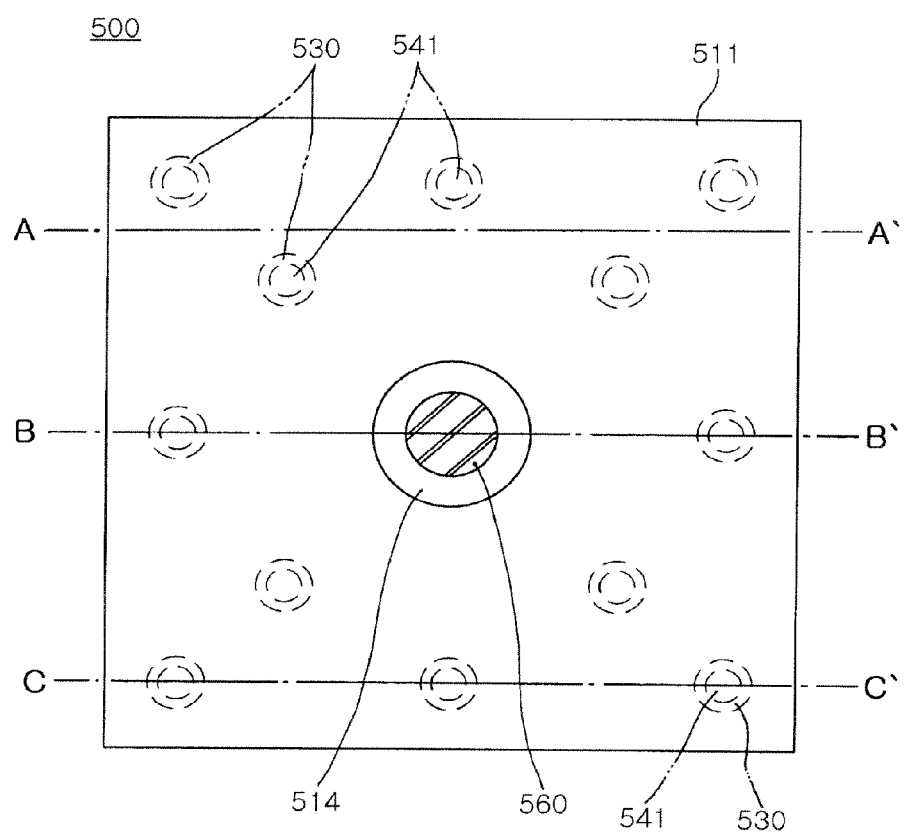

FIG. 21 is a perspective view illustrating a semiconductor light emitting device according to another exemplary embodiment of the invention. FIG. 22 is a plan view illustrating the semiconductor light emitting device of FIG. 21. Hereinafter, a detailed description will be made with reference to FIGS. 21 and 22.

A semiconductor light emitting device 500 according to this embodiment includes a first conductivity type semiconductor layer 511, an active layer 512, a second conductivity type semiconductor layer 513, a second electrode layer 520, a first insulating layer 530, a first electrode layer 540, and a conductive substrate 550 that are sequentially stacked. Here, the second electrode layer 520 includes a region where a portion of an interface in contact with the second conductivity type semiconductor layer 513 is exposed. The first electrode layer 540 includes at least one contact hole 541. The contact hole 541 is electrically connected to the first conductivity type semiconductor layer 511, electrically insulated from the second conductivity type semiconductor layer 513 and the active layer 512, and extends from one surface of the first electrode layer 540 to at least part of the first conductivity type semiconductor layer 511.

In the semiconductor light emitting device 500, the first conductivity type semiconductor layer 511, the active layer 512, and the second conductivity type semiconductor layer 513 perform light emission. Hereinafter, they are referred to as a light emitting stack 510. That is, the semiconductor light emitting device 500 includes the light emitting stack 510, the first electrode layer 540, the second electrode layer 520 and the first insulating layer 530. The first electrode layer 540 is electrically connected to the first conductivity type semiconductor layer 511. The second electrode layer 520 is electrically connected to the second conductivity type semiconductor layer 513. The first insulating layer 530 electrically insulates the electrode layers 520 and 540 from each other. Further, the conductive substrate 550 is included as a substrate to grow or support the semiconductor light emitting device 500.

Each of the semiconductor layers 511 and 513 may include a semiconductor such as a GaN-based semiconductor, a ZnO-based semiconductor, a GaAs-based semiconductor, a GaP-based semiconductor, and a GaAsP-based semiconductor. The semiconductor layers may be formed by using, for example, molecular beam epitaxy (MBE). In addition, each of the semiconductor layers 511 and 513 may be formed of any one of semiconductors, such as a group III-V semiconductor, a group II-VI semiconductor and Si. Each of the semiconductor layers 511 and 513 is formed by doping the above-described semiconductor with appropriate impurities in consideration of the conductivity type.

The active layer 512 is a layer where light emission is activated. The active layer 320 may be formed of a material having a smaller energy band gap than each of the first and second conductivity type semiconductor layers 511 and 513. For example, when the first and second conductivity type semiconductor layers 511 and 513 may be a GaN-based compound semiconductor, the active layer 512 may be formed by using an InAlGaN-based compound semiconductor that has a smaller energy bandgap than GaN. That is, the active layer 512 may include $In_xAl_yGa_{(1-x-y)}N$ (where $0 \leq x \leq 1$, $0 \leq y \leq 1$, and $0 \leq x+y \leq 1$ are satisfied).

Here, in consideration of characteristics of the active layer 512, the active layer 512 is preferably not doped with impurities. A wavelength of emitted light may be controlled by adjusting a mole ratio of constituents. Therefore, the semiconductor light emitting device 500 may emit any one of infrared light, visible light, and UV light according to the characteristics of the active layer 512.

Each of the electrode layers 520 and 540 is formed in order to apply voltage to the same conductivity type semiconductor layer. Therefore, in consideration of electroconductivity, the electrode layers 520 and 540 may be formed of metal. That is, the electrode layers 520 and 540 include electrodes that electrically connect the semiconductor layers 511 and 513 to an external current source (not shown). The electrode layers 520 and 540 may include, for example, Ti as an n-type electrode, and Pd or Au as a p-type electrode.

The first electrode layer 540 is connected to the first conductivity type semiconductor layer 511, and the second electrode layer 520 is connected to the second conductivity type semiconductor layer 513. That is, since the first and second electrode layers 540 and 520 are connected to the different conductivity type semiconductor layers from each other, the first and second layers 540 and 520 are electrically separated from each other by the first insulating layer 530. The first insulating layer 530 may be formed of a material having low electroconductivity. The first insulating layer 530 may include, for example, an oxide such as $SiO_2$.

The second electrode layer 520 may reflect light generated from the active layer 512. Since the second electrode layer 520 is located below the active layer 512, the second electrode layer 520 is located at a surface opposite to a direction, in which the semiconductor light emitting device 500 emits light, on the basis of the active layer 512. Light moving from the active layer 512 to the second electrode layer 520 is opposite to the light emitting direction of the semiconductor light emitting device 500, and thus the light moving toward the second electrode layer 520 needs to be reflected to increase luminous efficiency. Therefore, when the second electrode layer 520 has light reflectivity, the reflected light moves toward a light emitting surface to thereby increase the luminous efficiency of the semiconductor light emitting device 500.

In order to reflect the light generated from the active layer 512, the second electrode layer 520 may be formed of metal that appears white in a visible light region. For example, the white metal may be any one of Ag, Al, and Pt.

The second electrode layer 520 includes a region where a portion of the interface in contact with the second conductivity type semiconductor layer 513 is exposed. A lower surface of the first electrode layer 540 is in contact with the conductive substrate 550, and the first electrode layer 540 is electrically connected to an external current source (not shown) through the conductive substrate 550. However, the second electrode layer 520 requires a separate connecting region so as to be connected to the external current source. Therefore, the second electrode layer 520 includes an area that is exposed by partially etching the light emitting stack 510.

In FIG. 21, an example of a via hole 514 is shown. The via hole 514 is formed by etching the center of the light emitting stack 510 to form an exposed region of the second electrode layer 520. An electrode pad portion 560 may be further formed at the exposed region of the second electrode layer 520. The second electrode layer 520 may be electrically connected to the external power source by the exposed region thereof. At this time, the second electrode layer 520 is electrically connected to the external power source by using the electrode pad portion 560. The second electrode layer 520 may be electrically connected to the external current source by a wire or the like. For convenient connection to the external current source, the diameter of the via hole preferably increases from the second electrode layer toward the first conductivity type semiconductor layer.

The via hole 514 is formed by selective etching. In general, the light emitting stack 510 including the semiconductors is only etched, and the second electrode layer 520 including the metal is not etched. The diameter of the via hole 514 may be appropriately determined by those skilled in the art in consideration of the light emitting area, electrical connection efficiency, and current spreading in the second electrode layer 520.

The first electrode layer 540 includes at least one contact hole 541. The contact hole 541 is electrically connected to the first conductivity type semiconductor layer 511, electrically insulated from the second conductivity type semiconductor layer 513 and the active layer 512, and extends to at least part of the first conductivity type semiconductor layer 511. The first electrode layer 540 includes at least one contact hole 541 in order to connect the first conductivity type semiconductor layer 511 to the external current source. The contact hole 541 penetrates the second electrode layer 520 between the first electrode layer 540 and the second conductivity type semiconductor layer 513, the second conductivity type semiconductor layer 513, and the active layer 512, and extends to the first conductivity type semiconductor layer 511. Further, the contact hole 541 is formed of an electrode material.

When the contact hole 541 is only used for the electrical connection, the first electrode layer 540 may include one contact hole 541. However, in order to uniformly spread current that is transmitted to the first conductivity type semiconductor layer 511, the first electrode layer 540 may include a plurality of contact holes 541 at predetermined positions.

The conductive substrate 550 is formed in contact with and is electrically connected to the first electrode layer 540. The conductive substrate 550 may be a metallic substrate or a semiconductor substrate. When the conductive substrate 550 is the metallic substrate, the conductive substrate 550 may be formed of any one of Au, Ni, Cu, and W. Further, when the conductive substrate 550 is the semiconductor substrate, the conductive substrate 550 may be formed of any one of Si, Ge, and GaAs. The conductive substrate 550 may be a growth substrate. Alternatively, the conductive substrate 550 may be a support substrate. After a non-conductive substrate, such as a sapphire substrate, having relatively small lattice-mismatching is used as a growth substrate, the non-conductive substrate is removed, and the support substrate is bonded.

Also, when the conductive substrate 550 is the support substrate, the conductive substrate 550 may be formed by a plating method or a substrate bonding method. As a method of forming the conductive substrate 550 in the semiconductor light emitting device 500, the plating method of forming a plating seed layer to form a substrate or the substrate bonding method of separately preparing the conductive substrate 550 and bonding the conductive substrate 550 by using a conductive adhesive, such as Au, Au—Sn, and Pb—Sr may be used.

FIG. 22 is a plan view illustrating the semiconductor light emitting device 500. The via hole 514 is formed in the top surface of the semiconductor light emitting device 500, and the electrode pad portion 560 is located at the exposed region of the second electrode layer 520. In addition, though not shown in the top surface of the semiconductor light emitting device 500, the contact holes 541 are shown as a dotted line in order to display the positions of the contact holes 541. The first insulating layer 530 may extend and surround the contact hole 541 so that the contact hole 541 is electrically separated from the second electrode layer 520, the second conductivity type semiconductor layer 513, and the active layer 512. This will be described in more detail with reference to FIGS. 23B and 23C.

Figure 23:
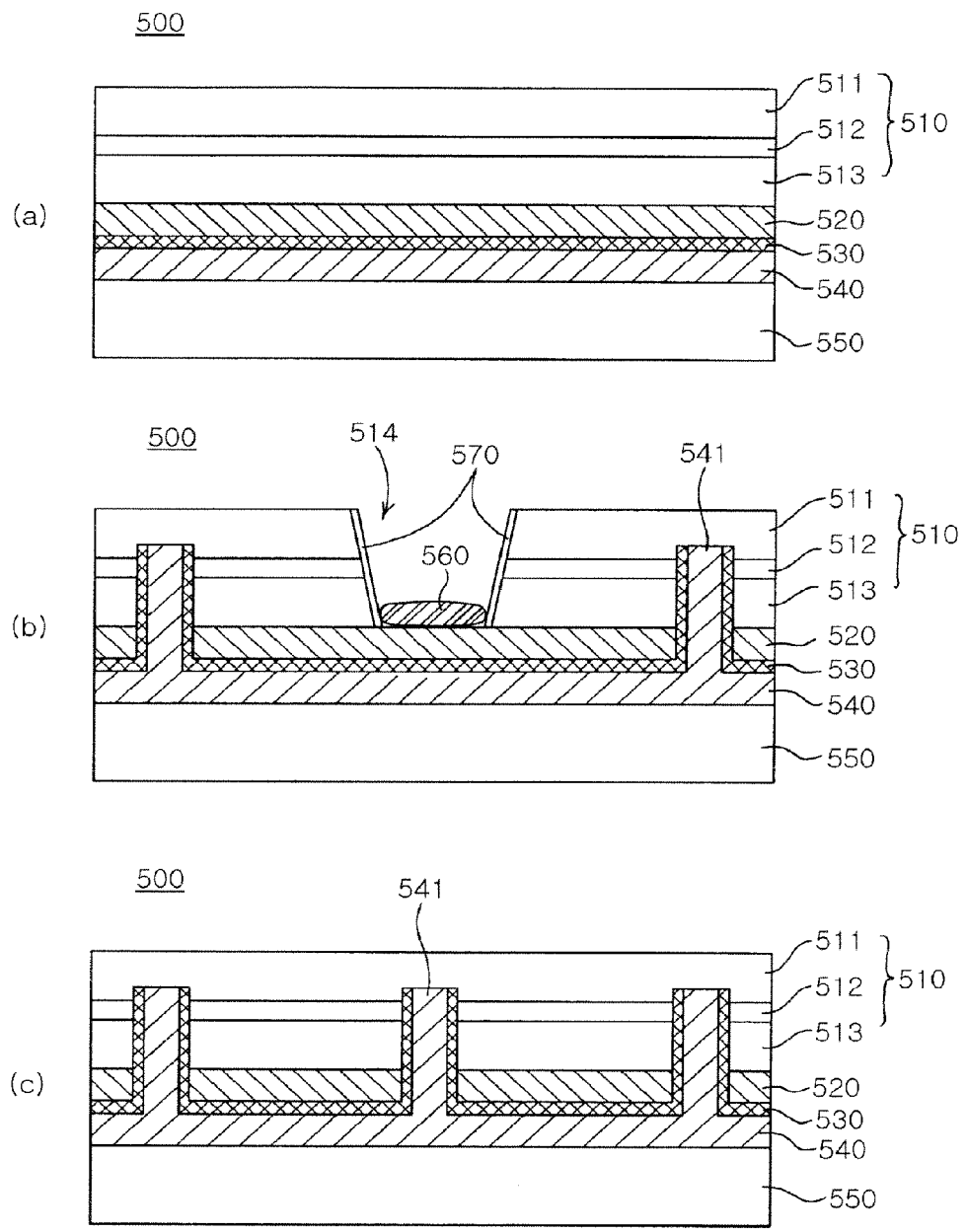

FIGS. 23A through 23C are cross-sectional views of the semiconductor light emitting device shown in FIG. 22 taken along the lines A-A', B-B', and C-C'. The line A-A' is taken to show a cross section of the semiconductor light emitting device 500. The line B-B' is taken to show a cross section that includes the contact holes 541 and the via hole 514. The line C-C' is taken to show a cross section that only includes the contact holes 541. Hereinafter, the description will be made with reference to FIGS. 21 through 23C.

Referring to FIG. 23A, neither the contact hole 541 nor the via hole 514 is shown. Since the contact hole 541 is not connected by using a separate connecting line but is electrically connected by the first electrode layer 540, the contact hole 541 is not shown in the cross section in FIG. 23.

Referring to FIGS. 23B and 23C, the contact hole 541 extends from the interface between the first electrode layer 540 and the second electrode layer 520 to the inside of the first conductivity type semiconductor layer 511. The contact hole 541 passes through the second conductivity type semiconductor layer 513 and the active layer 512 and extends to the first conductivity type semiconductor layer 511. The contact hole 541 extends at least to the interface between the active layer 512 and the first conductivity type semiconductor layer 511. Preferably, the contact hole 541 may extend to part of the first conductivity type semiconductor layer 511. However, the contact hole 541 is used for the electrical connection and current spreading. Once the contact hole 541 is in contact with the first conductivity type semiconductor layer 511, the contact hole 541 does not need to extend to the outer surface of the first conductivity type semiconductor layer 511.

The contact hole 541 needs to have a predetermined area in order to spread current in the first conductivity type semiconductor layer 511. A predetermined number of contact holes 541 may be provided, and may each have an area small enough to allow for uniform current spreading in the first conductivity type semiconductor layer 511. The number of contact holes may be appropriately selected in due consideration of the fact that a small number of contact holes 541 deteriorate electrical characteristics due to non-uniform current spreading, while a large number of contact holes 541 cause difficulties in the formation process thereof and cause a reduction in a light emitting area due to a decrease in the area of the active layer. Each of the contact holes 541 is realized so as to have as small an area as possible yet retain a shape effective for current spreading. The contact hole 541 extends from the second electrode layer 520 into the first conductivity type semiconductor layer 511. Since the contact hole 541 is used for the current spreading in the first conductivity type semiconductor layer, the contact hole 541 needs to be electrically separated from the second conductivity type semiconductor layer 513 and the active layer 512. Therefore, the contact hole 541 may be electrically separated from the second electrode layer 520, the second conductivity type semiconductor layer 513 and the active layer 512. Accordingly, the first insulating layer 530 may extend to surround the circumference of the contact hole 530. This electrical separation may be performed by using an insulating material such as a dielectric.

In FIG. 23B, the exposed region of the second electrode layer 520 serves as an electrical connection point for an external power source (not shown) of the second electrode layer 520. The electrode pad portion 560 may be placed on the exposed region. Here, the second insulating layer 570 is formed on the inner side surface of the via hole 514 to thereby electrically separate the multilayer laminate structure 510 and the electrode pad portion 560.

Referring to FIG. 23A, the first electrode layer 540 and the second electrode layer 520 are formed on the same layer, so that the semiconductor light emitting device 500 has the characteristics of a horizontal semiconductor light emitting device. Referring to FIG. 23B, the electrode pad portion 560 is placed on the surface of the second electrode layer 520, so that the semiconductor light emitting device 500 may have the characteristics of a vertical light emitting device. Consequently, the semiconductor light emitting device 500 has a combination structure having the characteristics of both vertical and horizontal semiconductor light emitting devices.

In FIGS. 23A and 23C, the first conductivity type semiconductor layer 511 is an n-type semiconductor layer, and the first electrode layer 540 may be an n-type electrode. In this case, the second conductivity type semiconductor layer 513 may be a p-type semiconductor layer, and the second electrode layer 520 may be a p-type electrode. Thus, the first electrode layer 540, the n-type electrode, and the second electrode layer 520, the p-type electrode, may be electrically insulated from each other by the first insulating layer 530 provided therebetween.

Figure 24:
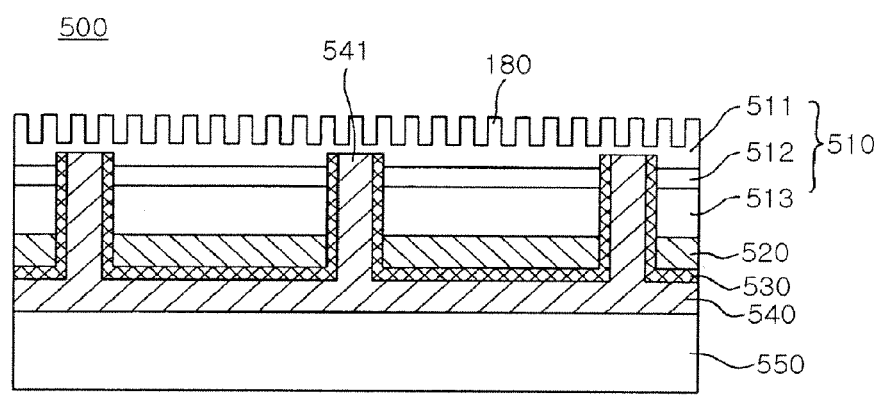

FIG. 24 illustrates light emission in a semiconductor light emitting device having an uneven pattern on the surface thereof, according to this embodiment. A description of the previously described elements will be omitted.

The outermost layer of the semiconductor light emitting device 500, in a direction in which emitted light moves, is the first conductivity type semiconductor layer 511. Thus, the uneven pattern 580 may be easily formed on the surface by using a method known in the art such as a photolithography method. In this case, light emitted from the active layer 512 is extracted through the uneven pattern 580 formed on the surface of the first conductivity type semiconductor layer 511, thereby enhancing light extraction efficiency.

The uneven pattern may be a photonic crystal structure. Photonic crystals refer to media having different refractive indices that are regularly arranged like crystals. The photonic crystals can increase light extraction efficiency by controlling light in the unit of length corresponding to a multiple of a wavelength of light.

Figure 25:
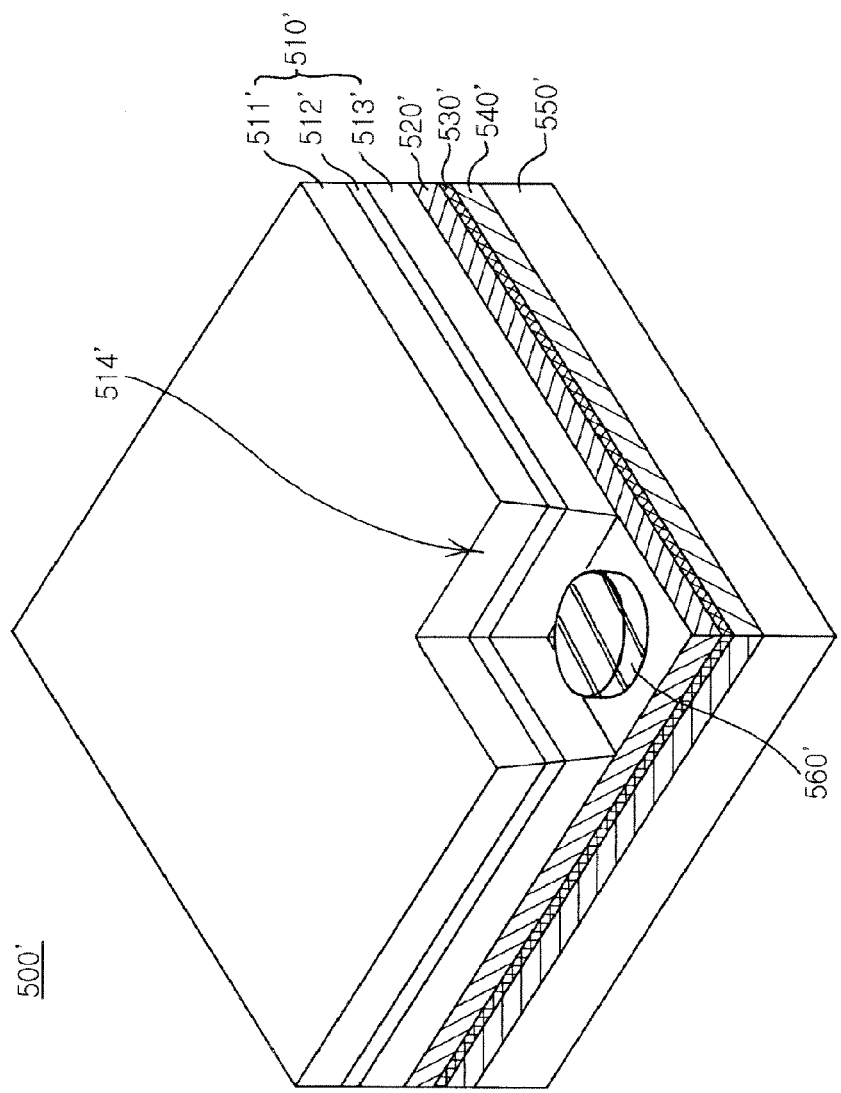

FIG. 25 illustrates a second electrode layer exposed on a corner portion in the semiconductor light emitting device according to this embodiment.

According to another aspect of the present invention, a method of manufacturing a semiconductor light emitting device includes: sequentially stacking a first conductivity type semiconductor layer 511', an active layer 512', a second conductivity type semiconductor layer 513', a second electrode layer 520', an insulating layer 530', a first electrode layer 540', and a conductive substrate 550'; forming an exposed region in a part of the interface of the second electrode layer 520' with the second conductivity type semiconductor layer 513'; and forming at least one contact hole 541' extending from one surface of the first electrode layer 540' to at least a part of the first conductivity type semiconductor layer 511' and electrically insulated from the second conductivity type semiconductor layer 513' and the active layer 512', such that the first electrode layer 540' is electrically connected with the first conductivity type semiconductor layer 511'.

The exposed region of the second electrode layer 520' may be provided by forming the via hole 510' in the light emitting stack 510' (see FIG. 21), or by mesa-etching the light emitting stack 510' (see FIG. 25). In this embodiment, a description of the same elements as those of the embodiment depicted in FIG. 21 will be omitted in the interest of clarity.

Referring to FIG. 25, one corner of the semiconductor light emitting device 500' is mesa-etched. The etching is performed on the light emitting stack 510' so as to expose the second electrode layer 520' at the interface with the second conductivity type semiconductor layer 513'. The exposed region of the second electrode layer 520' is formed at the corner of the semiconductor light emitting device 500'. The process of forming the exposed region at the corner is a simpler process than the process of forming the via hole, and may facilitate a subsequent electrical connection process.

Referring to FIGS. 26 through 36, a semiconductor light emitting device according to another exemplary embodiment of the present invention will now be described.

Figure 26:
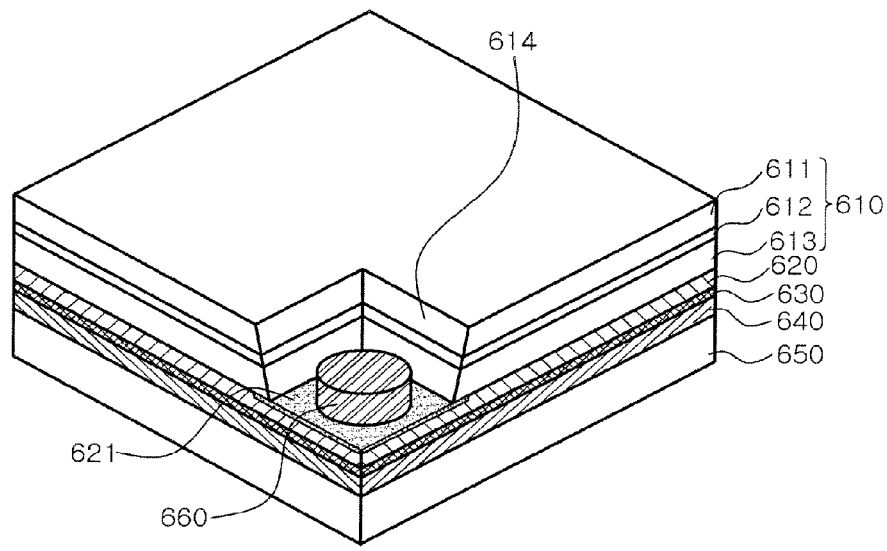
FIGS. 26 through 36 are views illustrating a semiconductor light emitting device according to another exemplary embodiment of the present invention.
Figure 27:
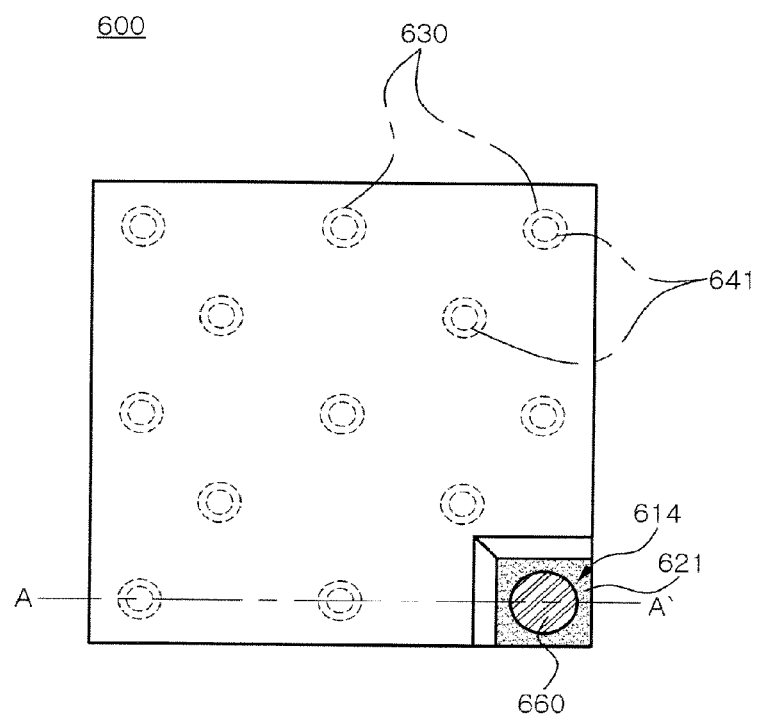
Figure 28:
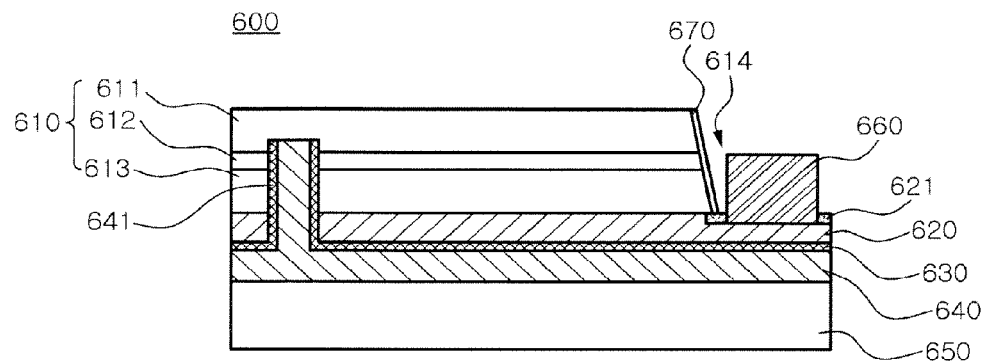

FIG. 26 is a schematic perspective view illustrating a semiconductor light emitting device according to this embodiment. FIG. 27 is a top plan view illustrating the semiconductor light emitting device depicted in FIG. 26, and FIG. 28 is a cross-sectional view taken along line A-A', illustrating the semiconductor light emitting device depicted in FIG. 27. Hereinafter, a description will be made with reference to FIGS. 26 through 28.

A semiconductor light emitting device 600, according to this embodiment, includes a first conductivity type semiconductor layer 611, an active layer 612, a second conductivity type semiconductor layer 613, a second electrode layer 620, an insulating layer 630, a first electrode layer 640 and a conductive substrate 650 that are sequentially stacked. Here, in order to be electrically connected with the first conductivity type semiconductor layer 611, the first electrode layer 640 includes at least one contact hole 641. Here, the at least one contact hole 641 extends from one surface of the first electrode layer 640 up to at least a part of the first conductivity type semiconductor layer 611, and is electrically insulated from the second conductivity type semiconductor layer 613 and the active layer 612. The first electrode layer 640 is not an essential element in this embodiment. Although not shown, the first electrode layer may not be included, and the contact hole 641 may be formed from one surface of the conductive substrate. That is, to be electrically connected with the first conductivity type semiconductor layer 111, the conductive substrate 650 may include at least one contact hole 641 extending from one surface of the conductive substrate 650 up to at least a part of the first conductivity type semiconductor layer 611 and electrically insulated from the second conductivity type semiconductor layer 113 and the active layer 112. Here, the conductive substrate is electrically connected to an external power source (not shown), and the first conductivity type semiconductor layer receives voltage through the conductive substrate.

The second electrode layer 620 has an exposed region 614 that is formed on a part of its interface with the second conductivity type semiconductor layer 613 by etching the first conductivity type semiconductor layer 611, the active layer 612 and the second conductivity type semiconductor layer 613. An etch stop layer 621 is formed on the exposed region 614.

The light emission of the semiconductor light emitting device 600 is carried out by the first conductivity type semiconductor layer 611, the active layer 612, and the second conductivity type semiconductor layer 613, and thus they are referred to as a light emitting stack 610. That is, the semiconductor light emitting device 600 includes the light emitting stack 610, the first electrode layer 640 electrically connected with the first conductivity type semiconductor layer 611 by the contact hole 641, the second electrode layer 620 electrically connected with the second conductivity type semiconductor layer 613, and the insulating layer 630 electrically insulating the electrode layers 620 and 640. In addition, the conductive substrate 650 is provided to support the semiconductor light emitting device 600.

The first conductivity type semiconductor layer 611 and the second conductivity type semiconductor layer 613 may include, for example, a semiconductor material such as a GaN-based semiconductor, a ZnO-based semiconductor, a GaAs-based semiconductor, a GaP-based semiconductor, or a GaAsP-based semiconductor; however, the semiconductor layers 611 and 613 are not limited thereto. The semiconductor layers 611 and 613 may also be formed of a material appropriately selected from the group consisting of group III-V semiconductors, group II-VI semiconductors, and Si. In addition, the semiconductor layers 611 and 613 may be doped with n-type impurities or p-type impurities in consideration of the conductivity type of each of the semiconductors described above.

The active layer 612 activates light emission, and is formed of a material having a smaller energy band gap than the energy band gaps of the first conductivity type semiconductor layer 611 and the second conductivity type semiconductor layer 613. For example, when the first conductivity type semiconductor layer 611 and the second conductivity type semiconductor layer 613 are GaN-based compound semiconductors, the active layer 612 may be formed by using an InAlGaN-based compound semiconductor having a smaller energy band gap than that of GaN. That is, the active layer 612 may include $In_xAl_yGa_{(1-x-y)}N$ ($0 \leq x \leq 1$, $0 \leq y \leq 1$, $0 \leq x+y \leq 1$).

Here, the active layer 612 may not be doped with impurities due to the characteristics of the active layer 612, and the wavelength of emitted light can be regulated by controlling the mole ratio of materials. Accordingly, the semiconductor light emitting device 600 can emit infrared light, visible light or ultraviolet light depending on the characteristic of the active layer 612.

The first electrode layer 640 and the second electrode layer 620 serve to supply voltage to the semiconductor layers of the same conductivity type, respectively. The semiconductor layers 611 and 613 are electrically connected with an external power source (not shown) by the electrode layers 620 and 640.

The first electrode layer 640 is connected with the first conductivity type semiconductor layer 611, and the second electrode layer 620 is connected with the second conductivity type semiconductor layer 613. Thus, the first electrode layer 640 and the second electrode layer 620 are electrically separated from each other by the first insulating layer 630. The first insulating layer 630 may be formed of a material having a low level of electric conductivity, for example, an oxide such as $SiO_2$.

To be electrically connected with the first conductivity type semiconductor layer 611, the first electrode layer 640 includes at least one contact hole 641 extending up to a part of the first conductivity type semiconductor layer 611 and electrically insulated from the second conductivity type semiconductor layer 613 and the active layer 612. Here, this electrical insulation may be made by the extension of the insulating layer 630 placed between the first and second electrode layers. The contact hole 641 extends to the first conductivity type semiconductor layer 611 through the second electrode layer 620, the insulating layer 630 and the active layer 612, and has an electrode material therein. The first electrode layer 640 is electrically connected with the first conductivity type semiconductor layer 611 by the contact hole 641, thereby connecting the first conductivity type semiconductor layer 611 to an external power source (not shown).

In the event that the contact hole 641 is formed only for an electrical connection with the first conductivity type semiconductor layer 611, the first electrode layer 640 may have a single contact hole 641. However, the first electrode layer 640 may include one or more contact holes 641 at predetermined locations in order to ensure uniform current spreading in the first conductivity type semiconductor layer 611.

The second electrode layer 620 is placed under the active layer 612, on the opposite side to a direction that light is emitted from the semiconductor light emitting device 600 with reference to the active layer 612. Accordingly, light moving toward the second electrode layer 620 is reflected, and this enhances luminous efficiency.

The second electrode layer 620 may be formed of a white metal in a visible light region in order to reflect light generated from the active layer 612. For example, the second electrode layer 620 may include at least one of Ag, Ni, Al, Rh, Pd, Ir, Ru, Mg, Zn, Pt and Au.

The second electrode layer 620 has an exposed portion at its interface with the second conductivity type semiconductor layer 613. This exposed portion is formed by etching the first conductivity type semiconductor layer 611, the active layer 612 and the second conductivity type semiconductor layer 613. The etch stop layer 621 is formed on the exposed region 614. The first electrode layer 640, in contact with the conductive substrate 650 placed thereunder, can be connected with an external power source, whereas the second electrode layer 620 requires a separate connection region for a connection with the external power source (not shown). Therefore, the second electrode layer 620 has the exposed region 614 on a part of its interface with the second conductivity type semiconductor layer 613 by etching a portion of the light emitting stack 610. In this manner, the second conductivity type semiconductor layer 613 is connected to the external power source (not shown) by the second electrode layer 620.

Figure 29:
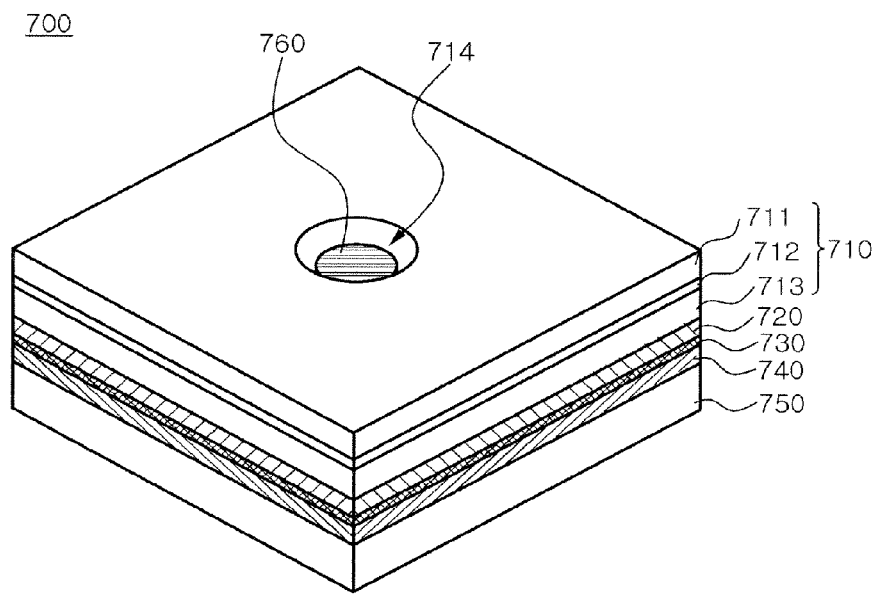

The area of the exposed region 614 may be appropriately selected by those skilled in the art in consideration of a light emitting area, electrical connection efficiency and current spreading in the second electrode layer 620. FIGS. 27 through 29 illustrate an embodiment in which the exposed region 614 of the second electrode layer 620 is formed at the corner by etching the corner of the light emitting stack 610.

The exposed region 614 is formed by selective etching by which only a part of the light emitting stack 610 is etched while the second electrode layer 620, typically containing metal, is not etched. However, full control over this selective etching that etches only the part of the light emitting stack 610 is hard to implement. For this reason, the second electrode layer, placed under the light emitting stack 610, may also be etched in part. The second electrode layer 620, etched in part, may cause the metallic material of the second electrode layer 620 to bond with the second conductivity type semiconductor layer 613, resulting in current leakage. Therefore, the etch stop layer 621 is formed on a region where the etching of the light emitting stack 610 is carried out (i.e., the exposed region of the second electrode layer 620).

The etch-stop layer 621 can prevent the metal, forming the second electrode layer 620, from being bonded to the side of the light-emitting stack 610, thereby reducing a leakage current and facilitating etching. The etch-stop layer 621 may be formed of materials used to prevent the etching of the light-emitting stack 600. Examples of these materials may include insulating materials such as a silicon oxide or a nitride oxide, $SiO_2$, $SiO_xN_y$, or $Si_xN_y$, for example. However, the present invention is not limited thereto. Here, the etch-stop layer 621 is not necessarily formed of insulating materials, and may be formed of conductive materials, which do not have any adverse effect on the operation of the device. Therefore, as long as the etch-stop layer 621 provides etch-stop performance, the etch-stop layer 621 may be appropriately formed of conductive materials.

Furthermore, an electrode pad portion 660 may pass through the etch-stop layer 621 and be formed in the exposed region 614. The electrode pad portion 660 passes through the etch-stop layer 621 and is electrically connected to the second electrode layer. Here, an electrical connection between the second electrode layer 620 and an external power source (not shown) is further facilitated.

The conductive substrate 650 is located under the first electrode layer 640. Further, the conductive substrate 650 comes into contact with the first electrode layer 640 and is electrically connected thereto. The conductive substrate 650 may be a metallic substrate or a semiconductor substrate. The conductive substrate 650 may be formed of a material including any one of Au, Ni, Al, Cu, W, Si, Se, and GaAs, for example, Si—Al alloys. Here, the conductive substrate 650 may be formed by plating or bonding according to the selected material. The conductive substrate 650 may be a support substrate that is bonded after a sapphire substrate with a relatively small mismatch is used as a growth substrate, and is then removed.

FIG. 27 is an upper plan view illustrating the semiconductor light emitting device 600. Though not shown in the upper surface of the semiconductor light emitting device 600, the contact holes 641 are indicated by dotted lines in order to identify where the contact holes 641 are located. An insulating layer 630 may be extended around the contact holes 641 so that the contact holes 641 are electrically insulated from the second electrode layer 620, the second conductivity type semiconductor layer 613, and the active layer 612. This will be described in detail with reference to FIG. 28.

FIG. 28 is a cross-sectional view taken along the line A-A' of the semiconductor light emitting device, shown in FIG. 27. The line A-A' is selected to take in a cross-section including the contact holes 641 and the exposed region 614.

Referring to FIG. 28, the contact holes 641 pass through the interface of the first electrode layer 640, the second electrode layer 620, the second conductivity type semiconductor layer 613, and the active layer 612, and are extended to the inside of the first conductivity type semiconductor layer 611. The contact holes 641 are extended to at least the active layer 612 and the interface of the first conductivity type semiconductor layer 611, preferably, to a portion of the first conductivity type semiconductor layer 611. Here, the contact holes 641 are formed to provide an electrical connection and current spreading for the first conductivity type semiconductor layer 611, which are achieved when the contact holes 641 come into contact with the first conductivity type semiconductor layer 611. The contact holes 641 do not have to be extended to the outer surface of the first conductivity type semiconductor layer 611.

The contact holes 641 are formed to achieve current spreading of the first conductivity type semiconductor layer 611 and may have a predetermined area. As for the contact holes 641, a predetermined number of contact holes, which are as small as possible in order to provide uniform current spreading in the first conductivity type semiconductor layer 611, may be formed. When an insufficient number of contact holes 641 are formed, it becomes difficult to achieve current spreading, thereby worsening electrical characteristics. On the other hand, when an excessive number of contact holes 641 are formed, processing difficulties in forming the contact holes 641 and a reduction in a light-emitting area due to a reduction in the area of the active layer are caused. Therefore, the number of contact holes 641 may be appropriately selected. Therefore, the contact holes 641 are formed in such a manner that the contact holes 641 have as small an area as possible yet provide effective current spreading.

The contact holes 641 are extended from the first electrode layer 640 to the inside of the first conductivity type semiconductor layer 611. Since the contact holes 641 are formed for the current spreading of the first conductivity type semiconductor layer, the contact holes 641 need to be electrically insulated from the second conductivity type semiconductor layer 613 and the active layer 612. Therefore, the insulating layer 630 may be extended to surround the contact holes 641.

In FIG. 28, the second electrode layer 620 includes the exposed region 614, which is an exposed portion of the interface between the second conductivity type semiconductor layer 613 and the second electrode layer 620. The exposed region 614 is formed to provide an electrical connection between the second electrode layer 620 and an external power source (not shown). The etch-stop layer 621 is formed in the exposed region 614. The exposed region 614 may include the electrode pad portion 660 that passes through the etch-stop layer 621 and is electrically connected to the second electrode layer 620. Here, the insulating layer 670 may be formed on the inside surface of the exposed region 614 in order to electrically separate the light-emitting stack 610 from the electrode pad portion 660.

In FIG. 28, since the first electrode layer 641 and the second electrode layer 620 are located in the same plane, the semiconductor light emitting device 600 has the characteristics of a horizontal type semiconductor light emitting device. Since the electrode pad portion 660 is located on the surface of the first conductivity type semiconductor layer 611, the semiconductor light emitting device 600 may also have the characteristics of a vertical semiconductor light emitting device. Therefore, the semiconductor light emitting device 600 has a configuration in which the characteristics of both vertical and horizontal type semiconductor light emitting devices are combined.

Figure 30:
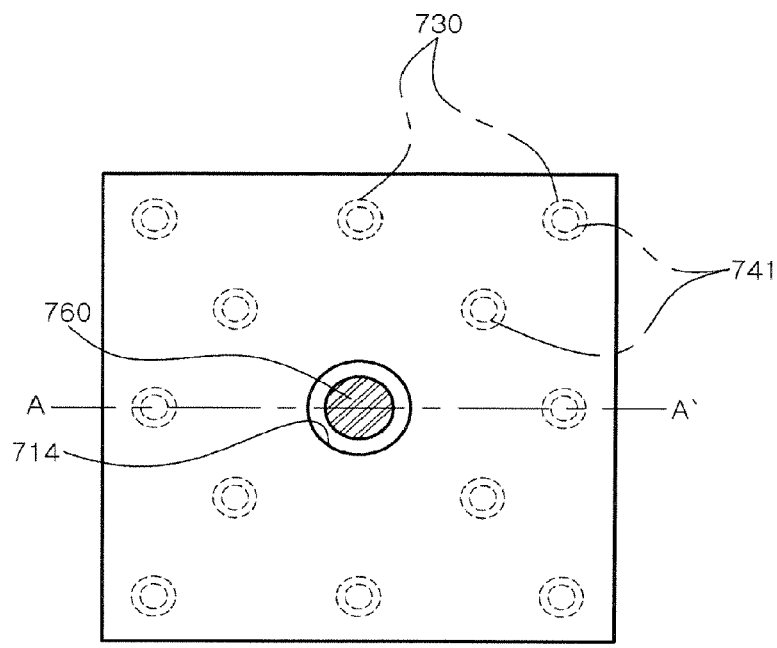
Figure 31:
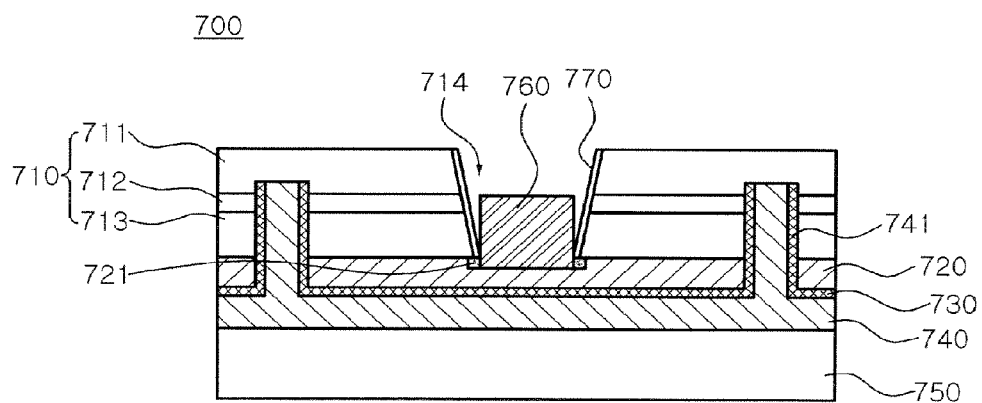

FIGS. 29 through 31 are views illustrating a semiconductor light emitting device according to another exemplary embodiment of the invention. FIG. 29 is a perspective view illustrating the semiconductor light emitting device. FIG. 30 is an upper plan view of the semiconductor light emitting device of FIG. 20. FIG. 31 is a cross-sectional view taken along the line A-A' of the semiconductor light emitting device of FIG. 30.

As shown in FIGS. 29 through 31, a central portion of a light-emitting stack 710 is etched, and an exposed region 714, which is a portion of the interface between a second electrode layer 720 and a second conductivity type semiconductor layer. A description of components identical to those described above will be omitted in the interest of clarity. Here, an etch-stop layer 721 may be partially removed and may be electrically connected to an external power source (not shown). An electrode pad portion 760 that passes through the etch-stop layer 721 and is electrically connected to the second electrode layer 720 may be included. The etch-stop layer 721 may be connected to the external power source (not shown) using wires. For convenience of explanation, the exposed region 714 increases from a first conductivity type semiconductor layer toward a second electrode layer.

Figure 32:
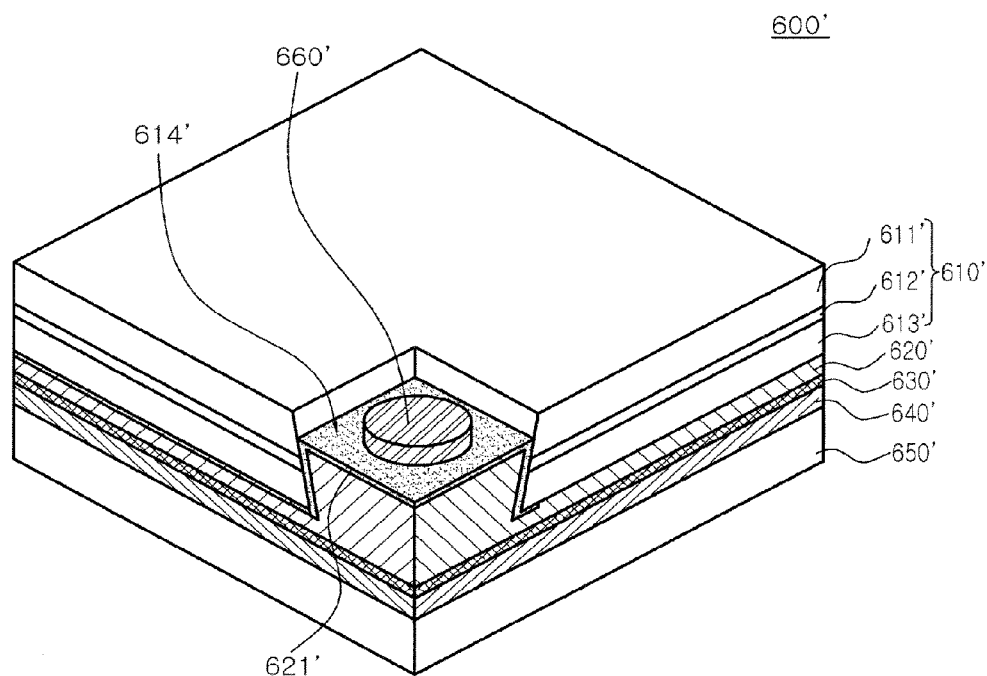
Figure 33:
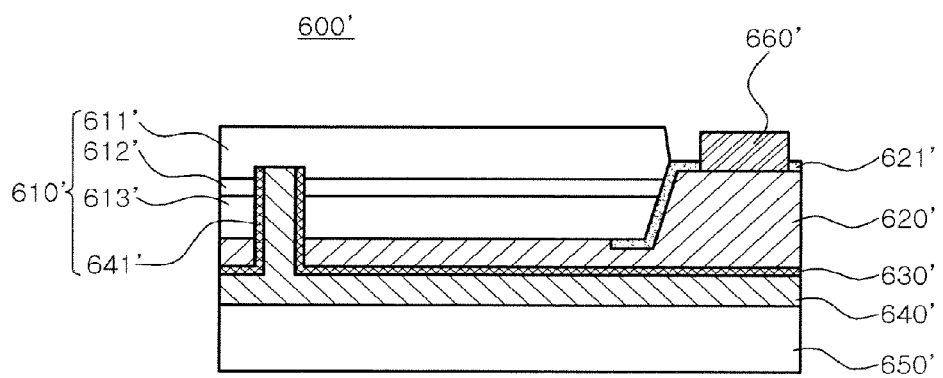
Figure 34:
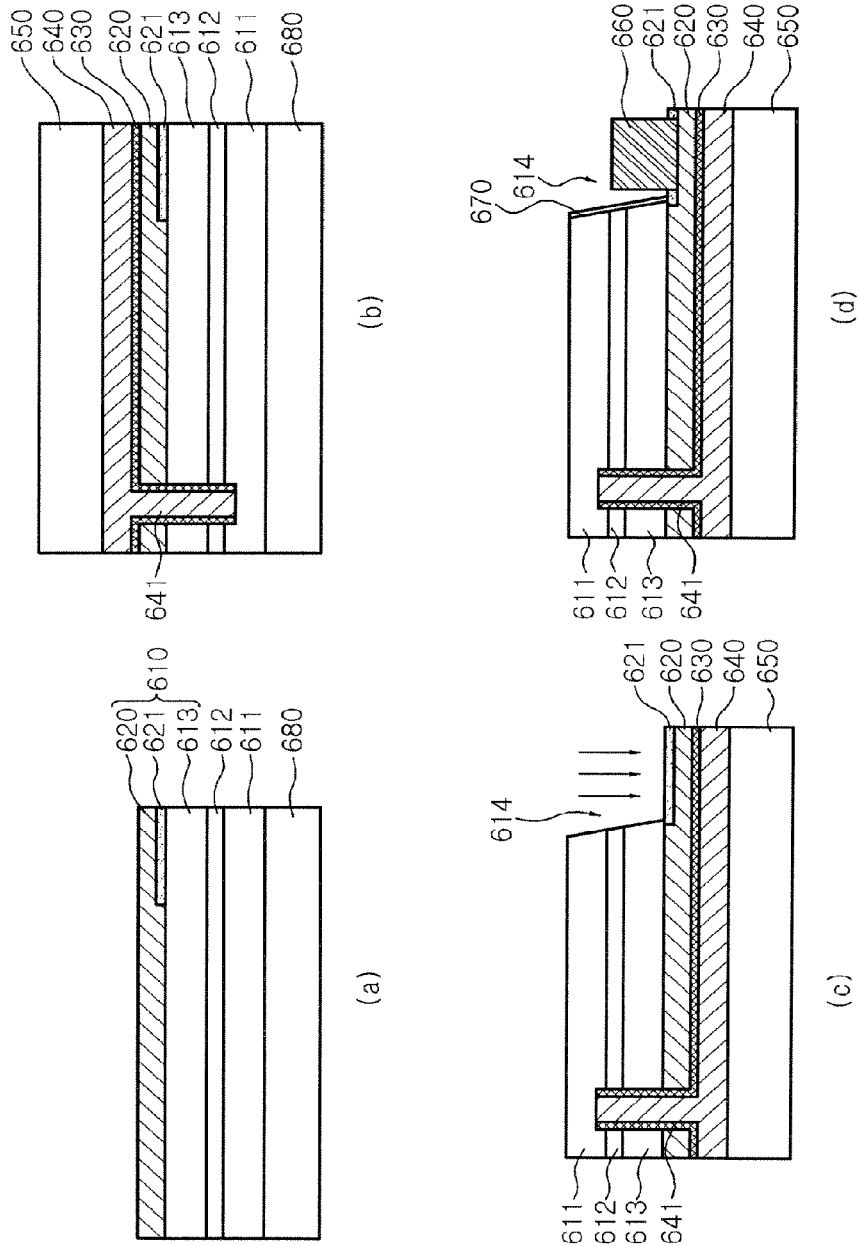
Figure 35:
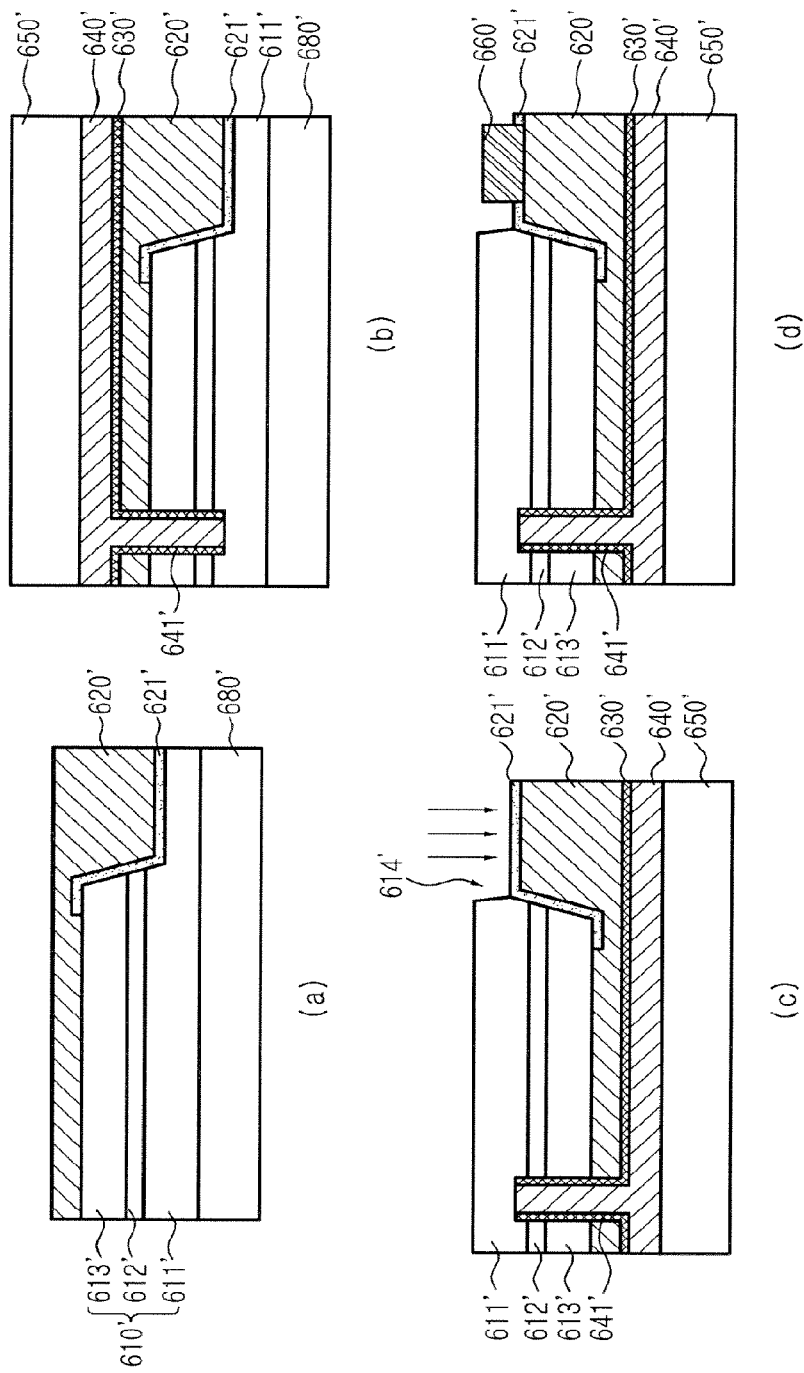

FIGS. 32 and 33 are views illustrating a modified embodiment of a semiconductor light emitting device according to an exemplary embodiment of the invention. FIG. 32 is a perspective view illustrating a semiconductor light emitting device. FIG. 33 is a side sectional view illustrating a semiconductor light emitting device. Here, an upper plan view of the semiconductor light emitting device is similar to that of FIG. 27. Similar to FIG. 28, FIG. 33 is a cross-sectional view taken along the line A-A'. A description of the same components, having been described above, will be omitted.

Referring to FIGS. 32 and 33, a light-emitting stack 610' is etched to thereby expose a second electrode layer. An etch-stop layer 621', which is formed on the exposed region, is extended to the sides of a second conductivity type semiconductor layer 613' and an active layer 612'. In this way, as described above, while the first conductivity type semiconductor layer 611' is being etched, metallic materials of the second electrode layer can be prevented from being bonded to the semiconductor side, and the active layer 612' can also be protected.

Here, a method of manufacturing the above-described semiconductor light emitting device will be omitted.

FIGS. 34A through 34D are cross-sectional views illustrating a method of manufacturing a semiconductor light emitting device according to an exemplary embodiment of the invention. More specifically, a method of manufacturing the semiconductor light emitting device, shown in FIGS. 26 through 28, will be described.

First, as shown in FIG. 34A, the first conductivity type semiconductor layer 611, the active layer 612, the second conductivity type semiconductor layer 613, and the second electrode layer 620 are stacked on a non-conductive substrate 680 in a sequential manner.

Here, the semiconductor layer and the active layer may be stacked using a known process, such as Metal Organic Chemical Vapor Deposition (MOCVD), Molecular Beam Epitaxy (MBE), or Hydride Vapor Phase Epitaxy (HVPE). As for the non-conductive substrate 680, a sapphire substrate that facilitates the growth of semiconductor layers may be used.

The second electrode layer 620 is stacked while the etch-stop layer 621 is formed in a region to be exposed by etching the first conductivity type semiconductor layer 611, the active layer 612, and the second conductivity type semiconductor layer 613.

The insulating layer 630 and the conductive substrate 650 are then formed on the second electrode layer 620. Here, as shown in FIG. 34B, the first electrode layer 640 may be formed between the insulating layer 630 and the conductive substrate 650.

In order that the conductive substrate 650 is electrically connected to the first conductivity type semiconductor layer 611, the conductive substrate 650 includes the one or more contact holes 641 that are electrically insulated from the second conductivity type semiconductor layer 613 and the active layer 612 and are extended to a portion of the first conductivity type semiconductor layer 611 from one surface of the conductive substrate 650.

As shown in FIG. 34A, when the first electrode layer 640 is formed between the insulating layer 630 and the conductive substrate 650, the contact holes 641 are formed starting from one surface of the first electrode layer 640. That is, in order that the first electrode layer 640 is electrically connected to the first conductivity type semiconductor layer 611, the first electrode layer 640 includes one or more contact holes 641 that are electrically insulated from the second conductivity type semiconductor layer 613 and the active layer 612 and are extended from the one surface of the first electrode layer 640 to a portion of the first conductivity type semiconductor layer 611.

Here, as the contact holes 641 are formed for the current spreading of the first conductivity type semiconductor layer 611, the contact holes 641 need to be electrically insulated from the second conductivity type semiconductor layer 613 and the active layer 612. Therefore, the insulating layer 630 may be extended to surround the contact holes 641.

As shown in FIG. 34C, which is a reversed view of FIG. 34B, the non-conductive substrate 680 is removed, a portion of each of the first conductivity type semiconductor layer 611, the active layer 612, and the second conductivity type semiconductor layer 613 is etched to thereby form the exposed region 614 in a portion of the interface between the second electrode layer 620 and the second conductivity type semiconductor layer 613.

The exposed region 614 is formed using selective etching so that the light-emitting stack 610 is partially etched while the second electrode layer 620, which generally contains a metal, is not selected.

As described above, since it is difficult to completely control selective etching to etch a region of the light-emitting stack 610, the second electrode layer 620, located under the light-emitting stack 610, may be partially etched. In this embodiment, the etch-stop layer 621 is formed in a region subjected to etching to thereby facilitate etching, so that the metal of the second electrode layer 620 is prevented from being bonded to the side of the light-emitting stack 610, thereby reducing a leakage current.

As shown in FIG. 34D, one region of the etch-stop layer 621 may be removed in order to provide an electrical connection between the second electrode layer 620 and the external power source. Here, the electrode pad portion 660 may be formed in a region where the etch-stop layer 621 is removed. Furthermore, in order to electrically insulate the light-emitting stack 610 and the electrode pad portion 660, the insulating layer 670 may be formed on the inside surface of the light-emitting stack, where etching has been performed.

FIGS. 34A through 34D are views illustrating an example in which one edge of the light-emitting stack 610 is etched, and the exposed region 614 of the second electrode layer 620 is formed in the etched edge. When the central portion of the light-emitting stack 610 is etched, the semiconductor light emitting device, as shown in FIG. 29, may be manufactured.

FIGS. 35A through 35D are cross-sectional views illustrating a method of manufacturing a modified embodiment of a semiconductor light emitting device according to an exemplary embodiment of the invention. More specifically, a method of manufacturing the semiconductor light emitting device, shown in FIGS. 32 and 33, will be described. A description of the same components, having described above with reference to FIGS. 34A through 34D, will be omitted.

First, as shown in FIG. 35A, the first conductivity type semiconductor layer 611', the active layer 612', the second conductivity type semiconductor layer 613', and a second electrode layer 620' are stacked on a non-conductive substrate 680' in a sequential manner.

The second electrode layer 620' is stacked while the etch-stop layer 621' is formed in a region to be exposed by etching the first conductivity type semiconductor layer 611', the active layer 612', and the second conductivity type semiconductor layer 613'. Here, before etching a light-emitting stack 610' in order to form an exposed region 614', as shown in FIG. 36A, portions of the second conductivity type semiconductor layer 613', the active layer 612', and the second conductivity type semiconductor layer 613' are primarily etched. The etch-stop layer 621' is extended along the portions exposed by primarily etching the second conductivity type semiconductor layer 613', the active layer 612', and the first conductivity type semiconductor layer 611'.

Here, as shown in FIG. 35C, when etching the light-emitting stack 610' in order to form the exposed region 614' in the second electrode layer 620', it is possible to etch only the first conductivity type semiconductor layer 611'. Therefore, the active layer can also be protected.

As shown in FIG. 35B, an insulating layer 630', a first electrode layer 640', and a conductive substrate 650' are formed on the second electrode layer 620'.

Here, in order that the first electrode layer 640' is electrically connected to the first conductivity type semiconductor layer 611', the first electrode layer 640' includes one or more contact holes 641 that are electrically insulated from the second conductivity type semiconductor layer 613' and the active layer 612' and are extended from one surface of the first electrode layer 640' to a portion of the first conductivity type semiconductor layer 611'. Here, since the contact holes 641' are formed for the current spreading of the first conductivity type semiconductor layer 611', the contact holes 641' need to be electrically insulated from the second conductivity type semiconductor layer 613' and the active layer 612'. Therefore, the insulating layer 630' may be extended to surround the contact holes 641'.

As shown in FIG. 35C, which is a reversed view of FIG. 35B, the exposed region 614' is formed in the second electrode layer 620' to partially expose the interface between the second conductivity type semiconductor layer and the second electrode layer. First, the non-conductive substrate 680' is removed, and the first conductivity type semiconductor layer 611' is etched. As described above, in FIG. 36A, since the active layer 612' and the second conductivity type semiconductor layer 613' have undergone etching, the exposed region 614' can only be formed by etching the first conductivity type semiconductor layer.

As described above, when the light-emitting stack 610' is etched, the etch-stop layer 621' may be formed in the exposed region 614' of the second electrode layer 620', thereby facilitating etching. Furthermore, the first conductivity type semiconductor layer 611' is only etched due to the primary etching, performed as shown in FIG. 35A, thereby protecting the active layer.

As shown in FIG. 35D, in order to connect the second electrode layer 620' to an external power source, one region of the etch-stop layer 621', which is formed on the exposed region 614', may be removed. Here, an electrode pad portion 660' may be formed on the removed portion of the etch-stop layer 621' so as to be electrically connected to the second electrode layer. Here, unlike the process shown in FIGS. 34A through 34D, only the first conductivity type semiconductor layer 611' is exposed. Therefore, an insulating layer, which is formed to electrically insulate the electrode pad portion 660' from the second electrode layer 610', is not required.

When mounting the semiconductor light emitting devices 600, 600', and 700, according to the exemplary embodiments of the invention, the conductive substrates 650, 650', and 750 are each electrically connected to the first lead frame, while the electrode pad portions 660, 660', and 760 are each electrically connected to the second lead frame using wires. That is, the mounting process may be performed using die-bonding mixed with wire bonding. That is, since the semiconductor light emitting devices 600, 600', and 700 may be mounted using die-bonding mixed with wire bonding, maximum luminance efficiency can be ensured, and the manufacturing process can be performed at relatively low cost.

Figure 36:
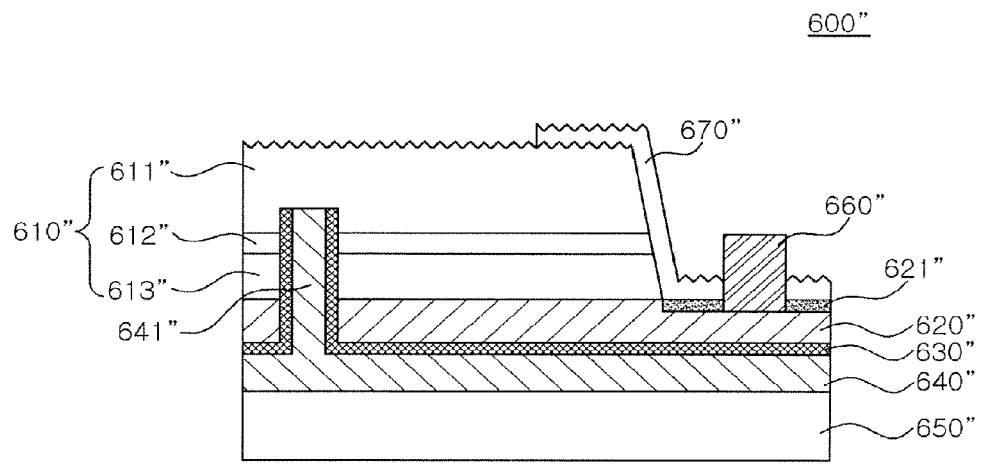

FIG. 36 is a schematic cross-sectional view illustrating another modified embodiment of a semiconductor light emitting device according to an exemplary embodiment of the invention. Referring to FIG. 36, like the above-described embodiments, a semiconductor light emitting device 600" according to this modified embodiment includes a first conductivity type semiconductor layer 611", an active layer 612", a second conductivity type semiconductor layer 613", a second electrode layer 620", an insulating layer 630", a first electrode layer 640", a conductive substrate 650", which are stacked in a sequential manner, an etch-stop layer 621", and an electrode pad portion 660". In order that the first electrode layer 640" is electrically connected to the first conductivity type semiconductor layer 611", the first electrode layer 640" includes one or more contact holes 641" that are electrically insulated from the second conductivity type semiconductor layer 613" and the active layer 612" and are extended to a portion of the first conductivity type semiconductor layer 611" from one surface of the first electrode layer 640". In this modified embodiment, a passivation layer 670" having an uneven structure is added. Since components, which are described in the same terms, have been described in the above-described embodiment, only the passivation layer 670" will be described.

When a configuration having the first conductivity type semiconductor layer 611", the active layer 612", and the second conductivity type semiconductor layer 613" are defined as a light-emitting structure, the passivation layer 670" is formed to cover the sides of the light-emitting structure, thereby protecting the active layer 612" in particular. Here, as shown in FIG. 36, the passivation layer 670" may be formed on the top surface as well as the side surfaces of the light-emitting structure, and may also be formed on the upper surface of the etch-stop layer 621".

The passivation layer 670" may be formed of a silicon oxide, such as $SiO_2$, or a silicon nitride, such as $Si_xN_y$, in order to perform a protective function for the light-emitting structure. The passive layer 670" may have a thickness of approximately 0.1 to 2 μm and a corresponding refractive index of approximately 1.4 to 2.0. It may be difficult for light from the active layer 612" to be emitted to the outside due to the difference in refractive index between the passivation layer 670" and air or a molding structure of a package. In this embodiment, the uneven structure is formed on the passivation layer 670" to thereby improve external light extraction efficiency. In particular, as shown in FIG. 36, when the uneven structure is formed on a region through which light emitted in a lateral direction of the light active layer 612" passes, the amount of light emitted from the sides of the semiconductor light emitting device 600" can be increased. Specifically, according to simulation results, a semiconductor light emitting device according to this embodiment has increased light extraction efficiency by approximately 5% or higher than a semiconductor light emitting device having the same components except for the passivation layer 670" having the uneven structure. Though not necessarily required in this embodiment, the uneven structure of the passivation layer 670" may also be formed on the upper surface of the first conductivity type semiconductor layer 611" to thereby increase light extraction efficiency in a vertical direction, and may also be formed on the side of the passivation layer 670".

A semiconductor light emitting device according to another exemplary embodiment of the invention will be described with FIGS. 37 through 57.

Figure 37:
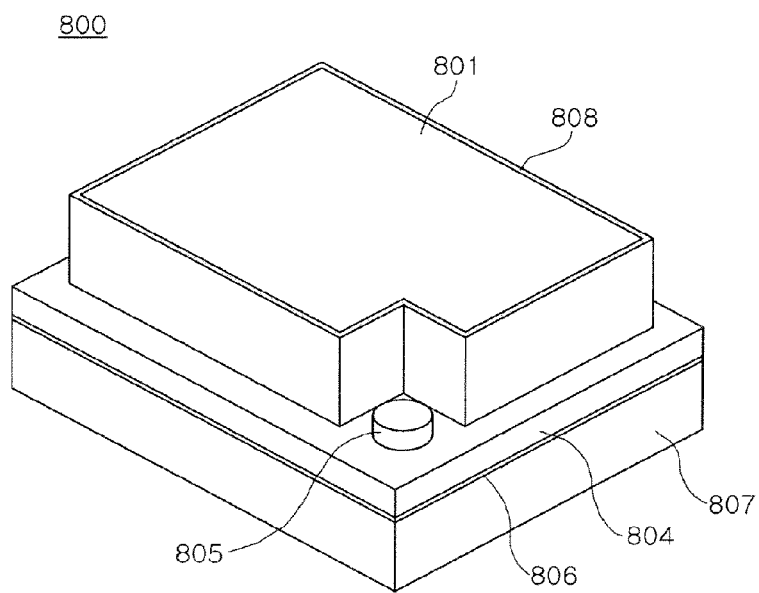
FIGS. 37 through 57 are views illustrating semiconductor light emitting device according to another exemplary embodiment of the present invention.
Figure 38:
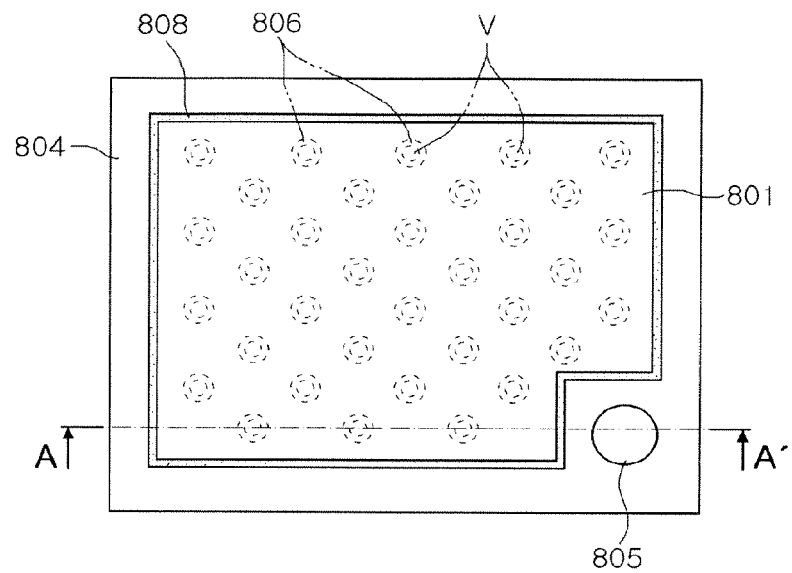
Figure 39:
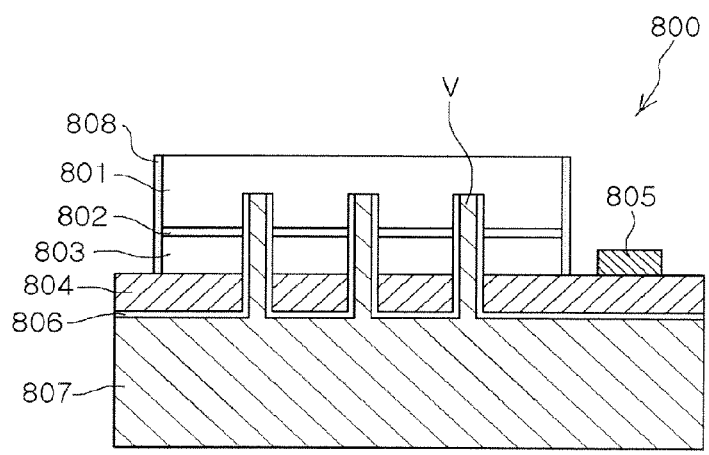

FIG. 37 is a perspective view schematically illustrating a semiconductor light emitting device according to an exemplary embodiment of the invention. FIG. 38 is a schematic plan view illustrating the semiconductor light emitting device of FIG. 37 as viewed from the top side thereof. FIG. 39 is a schematic sectional view taken along the line A-A', as shown in FIG. 38, of the semiconductor light emitting device of FIG. 37. Referring to FIGS. 37 through 39, in a semiconductor light emitting device 800 according to this embodiment, a first conductive contact layer 804 is formed on a conductive substrate 807, and a light-emitting structure, that is, a first conductivity type semiconductor layer 803, an active layer 802, and a second conductivity type semiconductor layer 801 are formed on the first conductive contact layer 804. A high-resistance portion 808 is formed on the sides of the light-emitting structure. As described below, the high-resistance portion 808 may be formed by injecting ions into the sides of the light-emitting structure. The first conductive contact layer 804 is electrically insulated from the conductive substrate 807. To this end, an insulator 806 is interposed between the first conductive contact layer 804 and the conductive substrate 807.

In this embodiment, the first and second conductivity type semiconductor layers 803 and 801 may be p-type and n-type semiconductor layers, respectively, and may be formed of nitride semiconductors. Therefore, in this embodiment, first conductive and second conductive may mean p-type and n-type, respectively. The invention is not limited thereto, however. The first and conductive semiconductor layers 803 and 801 may satisfy an equation of $Al_xIn_yGa_{(1-x-y)}N$ (where $0 \leq x \leq 1$, $0 \leq y \leq 1$, and $0 \leq x+y \leq 1$ are satisfied), for example, GaN, AlGaN, and InGaN. The active layer 802, formed between the first and conductive semiconductor layers 803 and 801, emits light having a predetermined amount of energy by electron-hole recombination and may have a multiple quantum well (MQW) structure in which quantum well layers and quantum barrier layers alternate with each other. As for the multiple quantum well structure, an InGaN/GaN structure may be used.

The first conductive contact layer 804 may reflect light, emitted from the active layer 802, upward from the semiconductor light emitting device 800, that is, toward the second conductivity type semiconductor layer 801. Further, the first conductive contact layer 804 and the first conductivity type semiconductor layer 803 may form ohmic contacts. In consideration of these functions, the first conductive contact layer 804 may contain Ag, Ni, Al, Rh, Pd, Ir, Ru, Mg, Zn, Pt, or Au. Here, though not illustrated in detail, the first conductive contact layer 804 may have a dual or multi-layered structure to thereby increase reflection efficiency. For example, the first conductive contact layer 804 may have a structure of Ni/Ag, Zn/Ag, Ni/Al, Zn/Al, Pd/Ag, Pd/Al, Ir/Ag, Ir/Au, Pt/Ag, Pt/Al, or Ni/Ag/Pt. In this embodiment, a portion of the first conductive contact layer 804 may be exposed to the outside. As shown in the drawings, the light-emitting structure may not be formed on the exposed portion. The exposed portion of the first conductive contact layer 804 corresponds to an electrical connection portion to which an electrical signal is applied. An electrode pad 805 may be formed on the exposed portion thereof.

Figure 40:
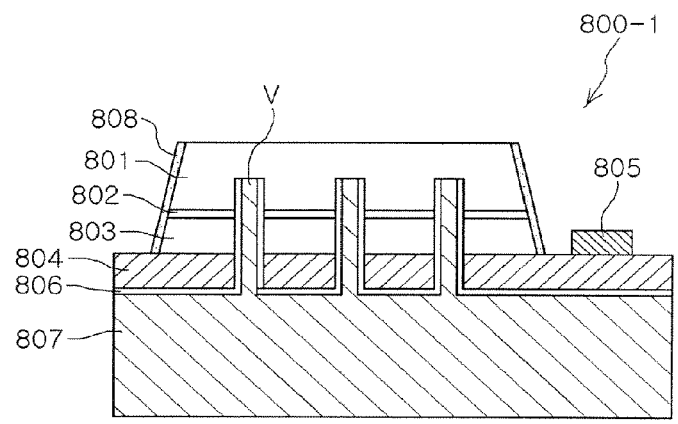

As described below, the conductive substrate 807 serves as a support that holds the light-emitting structure during a laser-lift off process and may be formed of a material containing any one of Au, Ni, Al, Cu, W, Si, Se, and GaAs, for example, Si—Al alloys. Here, according to the selected material, the conductive substrate 807 may be formed using plating or bonding. In this embodiment, the conductive substrate 807 is electrically connected to the second conductivity type semiconductor layer 801, so that an electrical signal may be applied to the second conductivity type semiconductor layer 801 through the conductive substrate 807. To this end, as shown in FIGS. 39 and 40, conductive vias v that are extended from the conductive substrate 807 and are connected to the second conductivity type semiconductor layer 801 need to be provided.

The conductive vias v are internally connected to the second conductivity type semiconductor layer 801. In order to reduce contact resistance, the number, shape, and pitch of the conductive vias v, and a contact area between the conductive vias v and the second conductivity type semiconductor layer 801 may be appropriately determined. Here, since the conductive vias v need to be electrically insulated from the active layer 802, the first conductivity type semiconductor layer 803, and the first conductive contact layer 804, the insulator 806 is interposed therebetween. The insulator 806 may be formed of any substance having electrical insulation. However, since it is desirable to absorb the least amount of light, a silicon oxide or a silicon nitride, such as $SiO_2$, $SiO_xN_y$, or $Si_xN_y$, may be used to form the insulator 806.

As described above, in this embodiment, the conductive substrate 807 is connected to the second conductivity type semiconductor layer 801 through the conductive vias v, and there is no need to separately form an electrode on the upper surface of the second conductivity type semiconductor layer 801. Therefore, the amount of light, emitted upward from the second conductivity type semiconductor layer 801, may be increased. A light-emitting area will be reduced since the conductive vias v are formed in a portion of the active layer 802. However, in spite of that, light extraction efficiency will be significantly improved since an electrode is removed from the upper surface of the second conductivity type semiconductor layer 801. Meanwhile, it can be seen that the entire electrode arrangement of the second conductivity type semiconductor layer 801 according to this embodiment is similar to a horizontal electrode structure rather than a vertical electrode structure since an electrode is not disposed on the upper surface of the second conductivity type semiconductor layer 801. However, sufficient current spreading effects can be ensured due to the conductive vias v formed inside the second conductivity type semiconductor layer 801.

The high-resistance portion 808 is formed along the edge of the light-emitting structure, and protects the light-emitting structure, particularly, the active layer 802 against the outside environment, thereby increasing the electrical reliability of the device. Since the active layer 802, exposed to the outside, may serve as a current leakage path, during the operation of the semiconductor light emitting device 800, the high-resistance portion 808 with relatively high electrical resistance, is formed along the side of the light-emitting structure, thereby preventing a current leakage. Here, the high-resistance portion 808 may be formed by ion implantation. Specifically, when ions, accelerated by a particle accelerator, are implanted into the light-emitting structure, the crystals of the semiconductor layers forming the light-emitting structure are damaged to thereby increase resistance. Here, since the implanted ions can be restored by heat treatment, ions having a large particle size may be used so that the ions are not restored a general heat treatment temperature of semiconductor layers. For example, ions of atoms, such as Ar, C, N, Kr, Xe, Cr, O, Fe, and Ti, may be implanted into the light-emitting structure.

Figure 41:
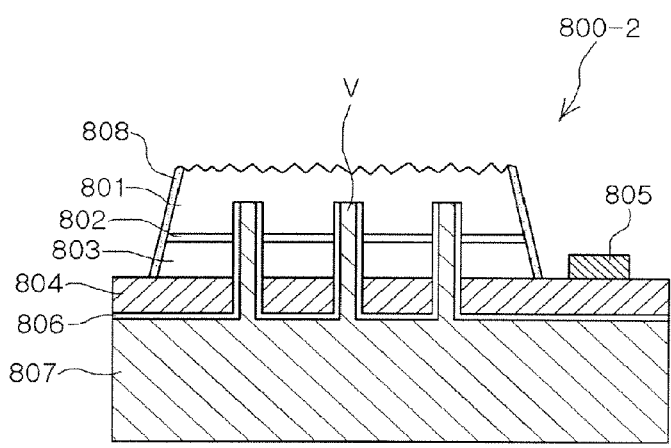

FIGS. 40 and 41 are cross-sectional views schematically illustrating modified embodiments of the semiconductor light emitting device of FIG. 37. First, a semiconductor light emitting device 800-1, as shown in FIG. 40, is formed in such a manner that the sides of a light-emitting structure are inclined relative to the first conductive contact layer 804. Specifically, the sides of the light-emitting structure are inclined toward the upper part of the light-emitting structure. As described below, the inclined light-emitting structure may be naturally obtained through a process of etching the light-emitting structure to expose the first conductive contact layer 804. A semiconductor light emitting device 800-2, as shown in FIG. 41, has unevenness formed on the upper surface of the light-emitting structure of the embodiment, described with reference to FIG. 40, and specifically, the upper surface of the second conductivity type semiconductor layer 801. This unevenness may be appropriately provided using dry etching or wet etching. Here, an uneven structure having facets of irregular sizes, shapes, and periods may be provided by wet etching. This uneven structure may increase the possibility that light, made incident in a direction of the active layer 802, is emitted to the outside. The modified embodiments, which have been described with reference to FIGS. 40 and 41, may be applied to other embodiments of FIGS. 42 through 44.

Figure 42:
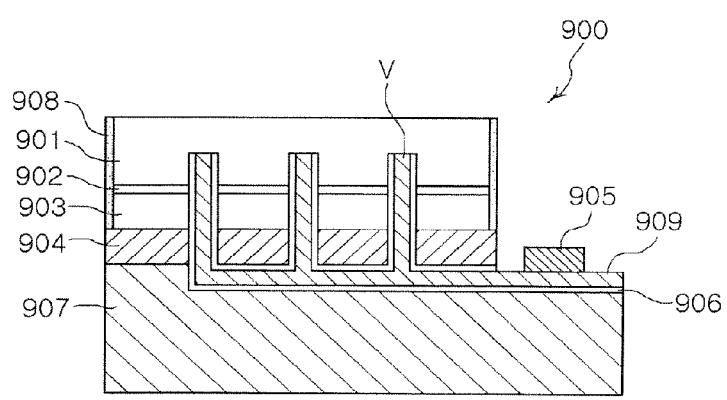

FIG. 42 is a cross-sectional view schematically illustrating a semiconductor light emitting device according to another exemplary embodiment of the invention. Referring to FIG. 42, like the above-described embodiment, in a semiconductor light emitting device 900 according to this embodiment, a first conductive contact layer 904 is formed on a conductive substrate 907, and a light-emitting structure, that is, a first conductivity type semiconductor layer 903, an active layer 902, and a second conductivity type semiconductor layer 901 are provided on the first conductive contact layer 904. A high-resistance portion 908 is formed on the edge of the light-emitting structure by ion implantation. The structural difference between this embodiment and the above-described embodiments is that the conductive substrate 907 is electrically connected to the first conductivity type semiconductor layer 903 rather than the second conductivity type semiconductor layer 901. Therefore, the first conductive contact layer 904 is not necessarily required. Here, the first conductivity type semiconductor layer 903 and the conductive substrate 907 may come into direct contact with each other.

Conductive vias v, internally connected to the second conductivity type semiconductor layer 901, pass through the active layer 902, the first conductivity type semiconductor layer 903, and the first conductive contact layer 904, and are connected to the second conductive electrode 909. The second conductive electrode 909 has an electrical connection portion that is extended from the conductive vias v toward the side of the light-emitting structure and is exposed to the outside. An electrode pad 905 may be formed on the electrical connection portion. Here, an insulator 906 is formed to electrically insulate the second conductive electrode 909 and the conductive vias v from the active layer 902, the first conductivity type semiconductor layer 903, the first conductive contact layer 904, and the conductive substrate 907.

Figure 43:
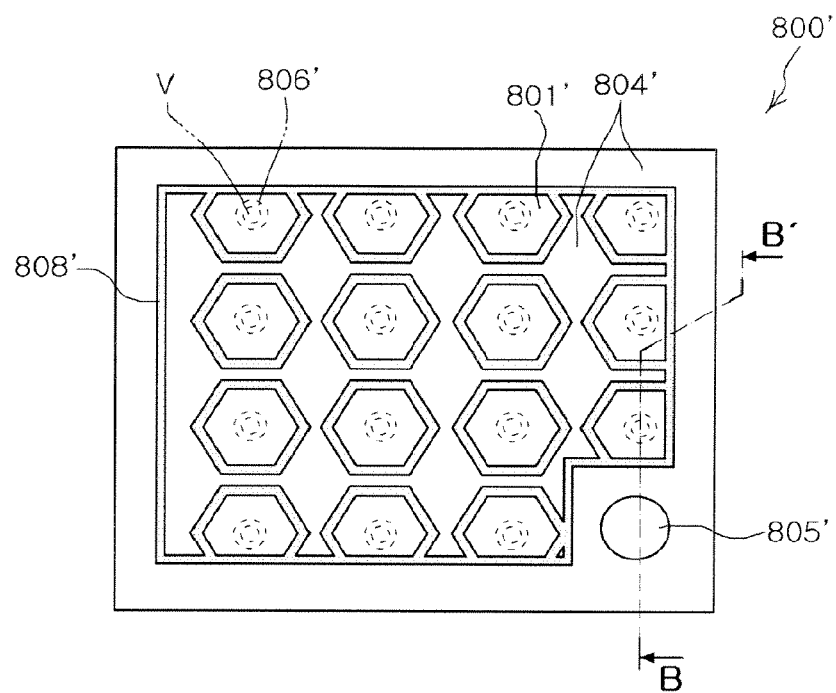
Figure 44:
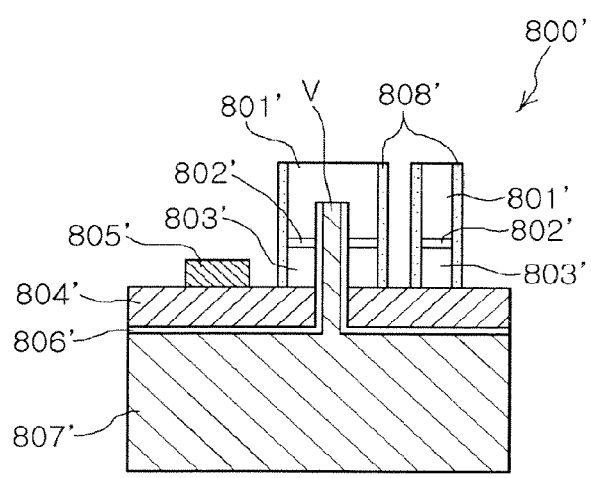

FIG. 43 is a plan view schematically illustrating a semiconductor light emitting device according to another exemplary embodiment to the invention. FIG. 44 is a schematic sectional view taken along the line B-B' of the semiconductor light emitting device of FIG. 43. As described with reference to FIGS. 37 through 39, in a semiconductor light emitting device 800' according to this embodiment, a first conductive contact layer 804' is formed on a conductive substrate 807', and a light-emitting structure, that is, a first conductivity type semiconductor layer 803', an active layer 802', and a second conductivity type semiconductor layer 801' are formed on the first conductive contact layer 804'. A high-resistance portion 808' is formed on the edge of the light-emitting structure by ion implantation. Furthermore, the first conductive contact layer 804' is electrically insulated from the conductive substrate 807'. To this end, an insulator 806' is interposed between the first conductive contact layer 804' and the conductive substrate 807'. In this embodiment, the light-emitting structure is divided into a plurality of structures on the conductive substrate 807'. The light-emitting structure, divided into the plurality of structures, may increase light-scattering effects. Therefore, an improvement in the light extraction efficiency may be expected. In order to ensure a sufficient outside area, as shown in FIG. 43, the light-emitting structure may have a hexagonal shape. However, the invention is not limited thereto. Here, an increase in spacing between the divided structures of the light-emitting structure may reduce the area of the active layer 802', which may cause a reduction in luminance efficiency. Therefore, the divided structures of the light-emitting structure may be brought into as close a contact as possible. As described above, when an etching process is performed in order to divide the light-emitting structure, the sides of the light-emitting structure need to be protected. A high-resistance portion 808' may be formed on the sides of each of the divided structures of the light-emitting structure by ion implantation.

Hereinafter, a process of manufacturing the semiconductor light emitting device having the above-described configuration will be described.

FIGS. 45 through 53 are cross-sectional views illustrating the process flow of a method of manufacturing a semiconductor light emitting device according to this embodiment of the invention. Specifically, a method of manufacturing a semiconductor light emitting device having the configuration, having been described with reference to FIGS. 37 to 39, will be described.

Figure 45:
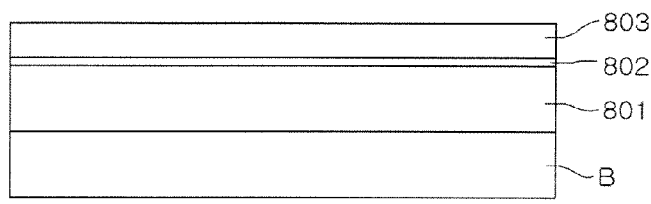

First, as shown in FIG. 45, the second conductivity type semiconductor layer 801, the active layer 802, and the first conductivity type semiconductor layer 803 are sequentially grown on a semiconductor growth substrate B using a semiconductor layer growing process, such as MOCVD, MBE, or HVPE, thereby manufacturing a light-emitting structure. As for the semiconductor growth substrate B, a substrate, formed of SiC, $MgAl_2O_4$, MgO, $LiAlO_2$, $LiGaO_2$, or GaN may be used. Here, sapphire is a crystal having Hexa-Rhombo R3c symmetry (Hexa-Rhombo R3c) and has a lattice constant of 13.001 Å along the c-axis and a lattice constant of 4.758 Å along the a-axis. Orientation planes of the sapphire include the C(0001) plane, the A(1120) plane, and the R(1102) plane. Here, since nitride thin films are relatively easily grown on the C-plane sapphire substrate, which is stable at high temperatures, the C-plane sapphire substrate is widely used as a nitride growth substrate.

Figure 46:
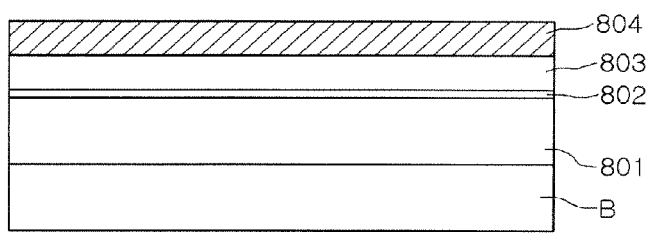
Figure 47:
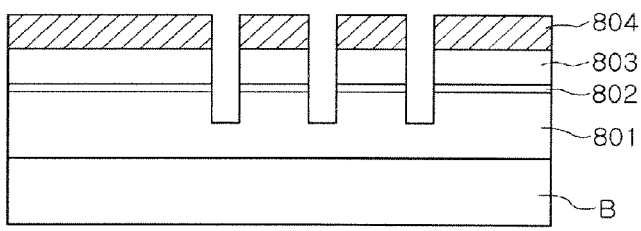

As shown in FIG. 46, the first conductive contact layer 804 is formed on the first conductivity type semiconductor layer 803. The first conductive contact layer 804 may contain Ag, Ni, Al, Rh, Pd, Ir, Ru, Mg, Zn, Pt, or Au in consideration of a light reflection function and ohmic contacts, formed together with first conductivity type semiconductor layer 803, and may be formed using sputtering or deposition, both of which are known in the art. Then, as shown in FIG. 47, recesses are formed in the first conductive contact layer 804 and the light-emitting structure. Specifically, in subsequent operations, the recesses are filled with conductive materials to thereby form conductive vias connected to the second conductivity type semiconductor layer 801. The recesses pass through the first conductive contact layer 804, the first conductivity type semiconductor layer 803, and the active layer 802. The second conductivity type semiconductor layer 801 is exposed as the bottom surfaces of the recesses. The operation of forming recesses, shown in FIG. 47, may be performed using an etching process known in the related art, for example, ICP-RIE.

Figure 48:
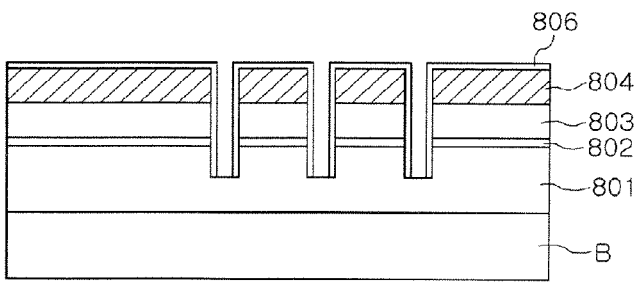

Then, as shown in FIG. 48, a material, such as $SiO_2$, $SiO_xN_y$, or $Si_xN_y$, is deposited to form the insulator 806 so that the insulator 806 covers the top of the first conductive contact layer 804 and the side walls of the grooves. Here, since the second conductivity type semiconductor layer 801 corresponding to the bottom surfaces of the recesses needs to be at least partially exposed, the insulator 806 may be formed not to completely cover the bottom surfaces of the grooves.

Figure 49:
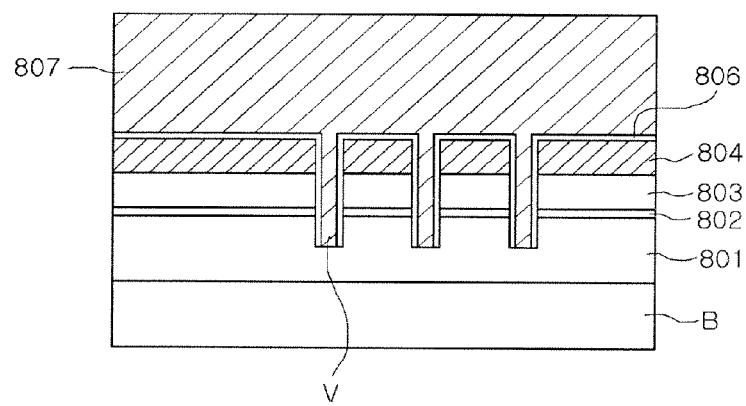

Then, as shown in FIG. 49, conductive materials are formed within the recesses and on the insulator 806 to thereby form the conductive vias v and the conductive substrate 807, so that the conductive substrate 807 is connected to the conductive vias v making contact with the second conductivity type semiconductor layer 801. The conductive substrate 807 may include any one of the materials, such as Au, Ni, Al, Cu, W, Si, Se, and GaAs, by plating, sputtering, or deposition. Here, the conductive vias v and the conductive substrate 807 may be formed of the same material. Alternatively, when the conductive vias v and the conductive substrate 807 may be formed of different materials from each other, they may be formed using separate processes. For example, after the conductive vias v are formed by deposition, the conductive substrate 807 may be previously prepared and bonded to the light-emitting structure.

Figure 50:
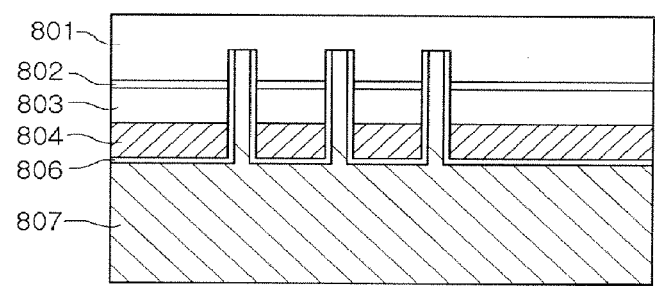

Then, as shown in FIG. 50, the semiconductor growth substrate B is removed to expose the second conductivity type semiconductor layer 801. Here, the semiconductor growth substrate B may be removed using laser lift-off or chemical lift-off. FIG. 50 is a view, rotated by 180 degrees, of FIG. 49, in which the semiconductor growth substrate B is removed.

Figure 51:
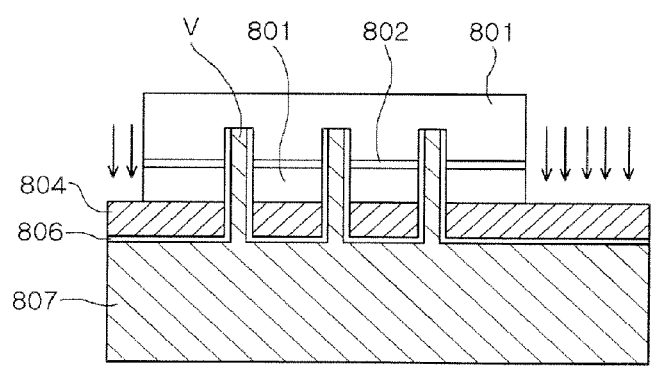
Figure 52:
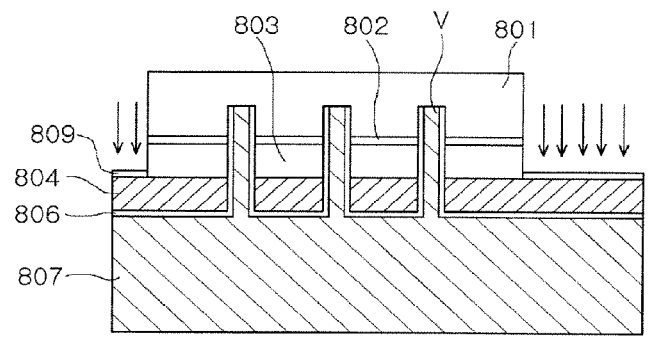

Then, as shown in FIG. 51, the light-emitting structure, that is, the first conductivity type semiconductor layer 803, the active layer 802, and the second conductivity type semiconductor layer 801 are partially removed to expose the first conductive contact layer 804, so that an electrical signal can be applied through the exposed first conductive contact layer 804. Furthermore, as described above, the operation of removing the light-emitting structure may be used to divide the light-emitting structure into a plurality of structures. Though not shown in the drawing, an operation of forming an electrode pad on the exposed portion of the first conductive contact layer 804 may be further performed. In order to expose the first conductive contact layer 804, the light-emitting structure may be etched using ICP-RIE or the like. Here, in order to prevent the material forming the first conductive contact layer 804 from moving to the side of the light-emitting structure and being attached thereto, as shown in FIG. 52, an etch-stop layer 809 may be previously formed inside the light-emitting structure.

Figure 53:
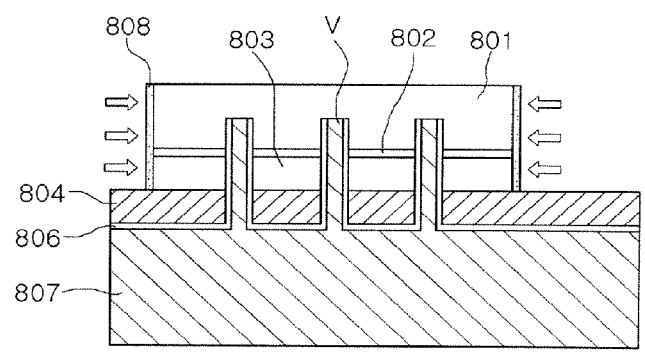

Then, as shown in FIG. 53, the high-resistance portion 808 may be formed on the side surfaces of the light-emitting structure. The high-resistance portion 808 corresponds to a region where crystals of the semiconductor layer forming the light-emitting structure are damaged by ions implanted to the side thereof. Here, since the implanted ions may be restored by heat treatment, ions having a large particle size may be used so that the ions are not restored a general heat treatment temperature of the semiconductor layer. For example, ions of atoms, such as Ar, C, N, Kr, Xe, Cr, O, Fe, and Ti, may be implanted into the light-emitting structure.

FIGS. 54 through 57 are cross-sectional views illustrating the process flow of a method of manufacturing a semiconductor light emitting device according to another exemplary embodiment of the invention, and specifically, a method of manufacturing the semiconductor light emitting device, as shown in FIG. 42. Here, the operations, having been described with FIGS. 45 through 47, may be directly applied to this embodiment. Hereinafter, subsequent operations to the operation of forming recesses in the first conductive contact layer 904 and the light-emitting structure will be described.

Figure 54:
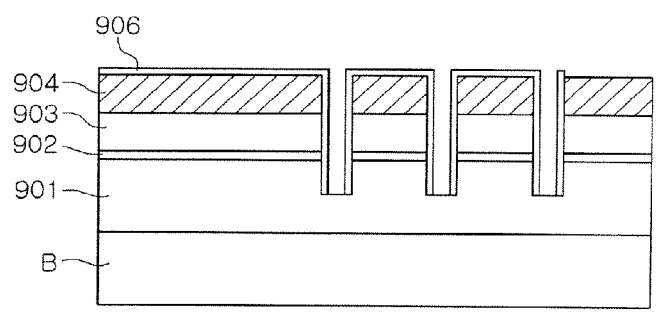

First, as shown in FIG. 54, a material, such as $SiO_2$, $SiO_xN_y$, or $Si_xN_y$, is deposited to form the insulator 906 in order to cover the upper part of the first conductive contact layer 904 and the side walls of the recesses. Here, the insulator 906 may be referred to as a first insulator to differentiate the first insulator from an insulator to be formed to cover the second conductive electrode 909 in subsequent operations. Unlike the above-described embodiments, the insulator 906 is not formed on the entire upper surface of the first conductive contact layer 904 in this embodiment, so that the conductive substrate 907 and the first conductive contact layer 904 come into contact with each other. That is, the insulator 906 may be formed in consideration of a portion of the upper surface of the first conductive contact layer 904, and specifically, a region where the second conductive electrode 909, connected to the second conductivity type semiconductor layer 901, is formed.

Figure 55:
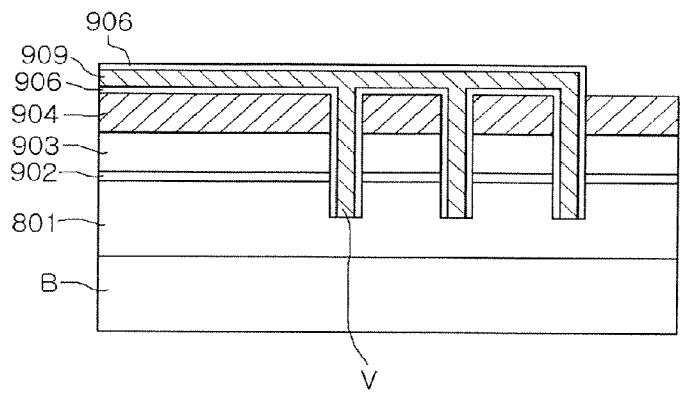

Then, as shown in FIG. 55, conductive materials are formed within the recesses and on the insulator 906 to thereby form the second conductive electrode 909, so that the second conductive electrode 909 includes the conductive vias v connected to the second conductivity type semiconductor layer 901. In this operation, the insulator 906 is previously formed at a position where the second conductive electrode 909 will be formed, thereby forming the second conductive electrode 909 according to the insulator 960. In particular, the second conductive electrode 909 may be exposed to the outside and be extended in a horizontal direction from the conductive vias v so as to serve as an electrical connection portion.

Figure 56:
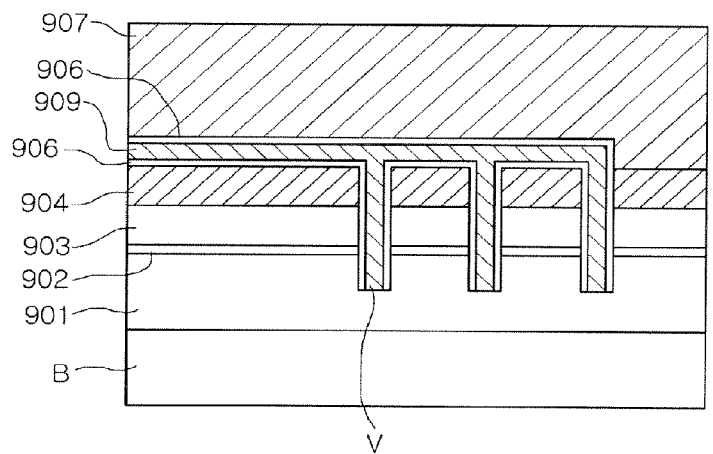
Figure 57:
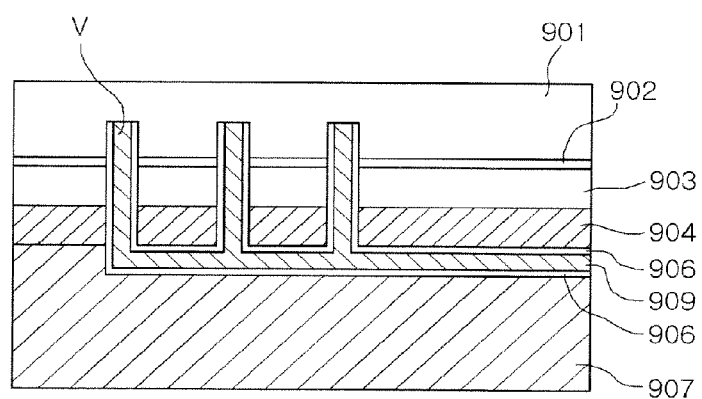

Then, as shown in FIG. 56, the insulator 906 is formed to cover the second conductive electrode 909, and the conductive substrate 907 is formed thereon so as to be electrically connected to the first conductive contact layer 904. Here, the insulator 906, formed in this operation, may be referred to as a second insulator. The earlier insulator and this insulator 906 may form a single insulating structure. In this operation, the second conductive electrode 909 may be electrically insulated from the first conductive contact layer 904 and the conductive substrate 907. Then, as shown in FIG. 57, the second conductivity type semiconductor layer 901 is removed to expose the semiconductor growth substrate B. Though not shown in the drawings, an operation of partially removing the light-emitting structure to expose the second conductive electrode 909 and an operation of forming the high-resistance portion 908 on the side surfaces of the light-emitting structure by ion implantation may be performed using the above-described operations.

A semiconductor light emitting device will according to another exemplary embodiment of the invention will be described with reference to FIGS. 58 through 77.

Figure 58:
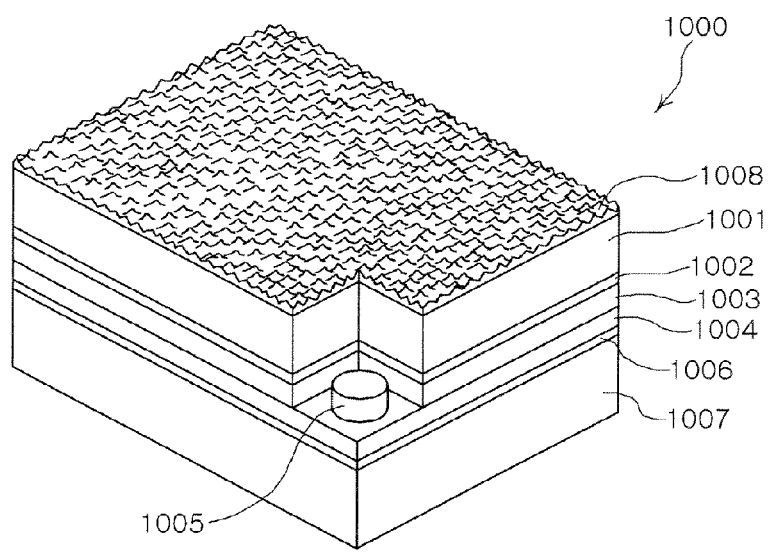
FIGS. 58 through 77 are views illustrating semiconductor light emitting device according to another exemplary embodiment of the present invention.
Figure 59:
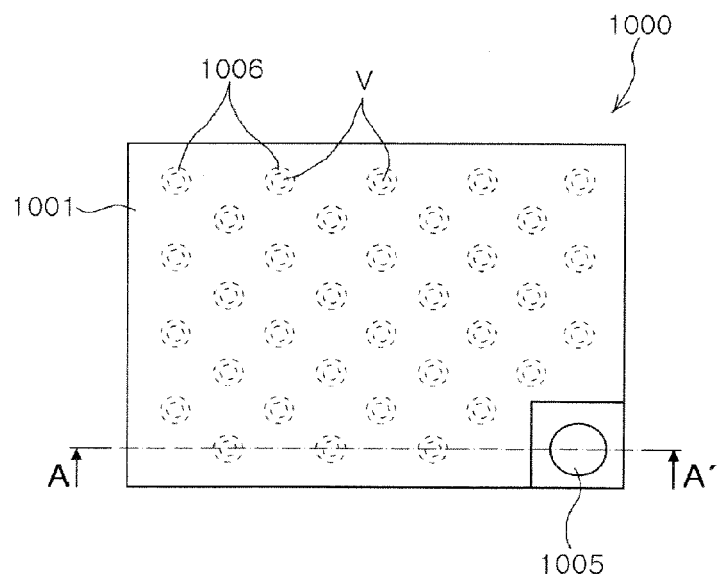
Figure 60:
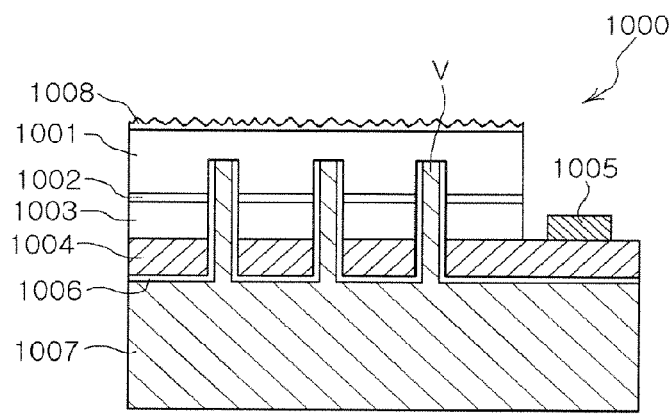

FIG. 58 is a perspective view schematically illustrating a semiconductor light emitting device according to this embodiment. FIG. 59 is a schematic plan view illustrating a second conductivity type semiconductor layer of the semiconductor light emitting device as viewed from top of FIG. 58. FIG. 60 is a schematic sectional view taken along the line A-A', of FIG. 59, of the semiconductor light emitting device of FIG. 58. In a semiconductor light emitting device 1000 according to this embodiment, a first conductive contact layer 1004 is formed on a conductive substrate 1007, and a light-emitting structure, that is, a first conductivity type semiconductor layer 1003, an active layer 1002, and a first conductivity type semiconductor layer 1001, are formed on the first conductive contact layer 1004. An undoped semiconductor layer 1008 is formed on the first conductivity type semiconductor layer 1001. Unevenness is provided on the upper surface of the undoped semiconductor layer 1008, thereby increasing the external extraction efficiency of light emitted from the active layer 1002. The first conductive contact layer 1004 is electrically insulated from the conductive substrate 1007. To this end, an insulator 1006 is interposed between the first conductive contact layer 1004 and the conductive substrate 1007.

In this embodiment, the first and second conductivity type semiconductor layers 1003 and 1001 may be p-type and n-type semiconductor layers, respectively, and may be formed of nitride semiconductors. Therefore, in this embodiment, first conductive and second conductive may mean p-type and n-type, respectively. However, the invention is not limited thereto. The first and second conductivity type semiconductor layers 1003 and 1001 may satisfy an equation of $Al_xIn_yGa_{(1-x-y)}N$ (where $0 \le x \le 1$, $0 \le y \le 1$, and $0 \le x+y \le 1$ are satisfied), for example, GaN, AlGaN, and InGaN. The active layer 1002, formed between the first and conductive semiconductor layers 1003 and 1001, emits light having a predetermined amount of energy by electron-hole recombination and may have a multiple quantum well (MQW) structure in which quantum well layers and quantum barrier layers alternate with each other. As for the multiple quantum well structure, an InGaN/GaN structure may be used.

The first conductive contact layer 1004 may reflect light, emitted from the active layer 1002, upward from the semiconductor light emitting device 1000, that is, toward the second conductivity type semiconductor layer 1001. Further, the first conductive contact layer 1004 and the first conductivity type semiconductor layer 1003 may form ohmic contacts. In consideration of these functions, the first conductive contact layer 1004 may contain Ag, Ni, Al, Rh, Pd, Ir, Ru, Mg, Zn, Pt, or Au. Here, though not illustrated in detail, the first conductive contact layer 1004 may have a dual or multi-layered structure to thereby increase reflection efficiency. For example, the first conductive contact layer 1004 may have a structure of Ni/Ag, Zn/Ag, Ni/Al, Zn/Al, Pd/Ag, Pd/Al, Ir/Ag, Ir/Au, Pt/Ag, Pt/Al, or Ni/Ag/Pt. In this embodiment, a portion of the first conductive contact layer 1004 may be exposed to the outside. As shown in the drawings, the light-emitting structure may not be formed on the exposed portion. The exposed portion of the first conductive contact layer 1004 corresponds to an electrical connection portion to which an electrical signal is applied. An electrode pad 1005 may be formed on the exposed portion thereof.

As described below, the conductive substrate 1007 serves as a support that holds the light-emitting structure during a laser-lift off process and may be formed of a material containing any one of Au, Ni, Al, Cu, W, Si, Se, and GaAs, for example, Si—Al alloys. Here, according to the selected material, the conductive substrate 1007 may be formed using plating or bonding. In this embodiment, the conductive substrate 1007 is electrically connected to the second conductivity type semiconductor layer 1001, so that an electrical signal may be applied to the second conductivity type semiconductor layer 1001 through the conductive substrate 1007. To this end, as shown in FIGS. 59 and 60, conductive vias v that are extended from the conductive substrate 1007 and are connected to the second conductivity type semiconductor layer 1001 need to be provided.

The conductive vias v are internally connected to the second conductivity type semiconductor layer 1001. In order to reduce contact resistance, the number, shape, and pitch of the conductive vias v, and a contact area between the conductive vias v and the second conductivity type semiconductor layer 1001 may be appropriately determined. Here, since the conductive vias v need to be electrically insulated from the active layer 1002, the first conductivity type semiconductor layer 1003, and the first conductive contact layer 1004, the insulator 1006 is interposed therebetween. The insulator 1006 may be formed of any substance having electrical insulation. However, since it is desirable to absorb the least amount of light, a silicon oxide or a silicon nitride, such as $SiO_2$, $SiO_xN_y$, or $Si_xN_y$, may be used to form the insulator 1006.

As described above, in this embodiment, the conductive substrate 1007 is connected to the second conductivity type semiconductor layer 1001 through the conductive vias v, and there is no need to separately form an electrode on the upper surface of the second conductivity type semiconductor layer 1001. Therefore, the amount of light, emitted upward from the second conductivity type semiconductor layer 1001, may be increased. A light-emitting area will be reduced since the conductive vias v are formed in a portion of the active layer 1002. However, in spite of that, light extraction efficiency will be significantly improved since an electrode is removed from the upper surface of the second conductivity type semiconductor layer 1001. Meanwhile, it can be seen that the entire electrode arrangement of the second conductivity type semiconductor layer 1001, according to this embodiment, is similar to a horizontal electrode structure rather than a vertical electrode structure, since an electrode is not disposed on the upper surface of the second conductivity type semiconductor layer 1001. However, sufficient current spreading effects can be ensured due to the conductive vias v formed inside the second conductivity type semiconductor layer 1001.

The undoped semiconductor layer 1008 is formed on the upper surface of the second conductivity type semiconductor layer 1001. As described below, the undoped semiconductor layer 1008 is employed as a buffer layer before the growth of the semiconductor layers forming the light-emitting structure. Here, "undoped" means a state in which a semiconductor layer does not undergo a separate impurity-doping process. When a semiconductor layer having a predetermined level of impurity concentration, for example, if a gallium nitride having a concentration of is grown using MOCVD, Si having a concentration of approximately $10^{16}$ to $10^{18}/cm^3$, being used as a dopant, may be contained without intention. In this embodiment, since an electrode does not have to be formed on the upper surface of the second conductivity type semiconductor layer 1001, the undoped semiconductor layer 1008 is not removed. Therefore, the undoped semiconductor layer 1008 may be formed to cover the entire upper surface of the second conductivity type semiconductor layer 1001. Further, an uneven structure is formed on the undoped semiconductor layer 1008, thereby increasing the possibility that light, made incident in the direction of the active layer 1002, is emitted to the outside. In this embodiment, the description has been made to a case in which unevenness is only applied to the undoped semiconductor layer 1008. However, depending on etching conditions, unevenness may further be formed on a portion of the second conductivity type semiconductor layer 1001.

When the undoped semiconductor layer 1008 is removed, and an uneven structure is then formed on the second conductivity type semiconductor layer 1001, a part of the second conductivity type semiconductor layer 1001 may be damaged. In particular, if an unevenness forming process is not accurately controlled, the uniform thickness of the second conductivity type semiconductor layer 1001 may not be maintained, depending on products. Therefore, like this embodiment, the electrode connection structure of the second conductivity type semiconductor layer 1001 is formed at the lower part thereof through the inside of the second conductivity type semiconductor layer 1001, these problems may be solved by forming the uneven structure on the undoped semiconductor layer 1008 not being removed.

Figure 61:
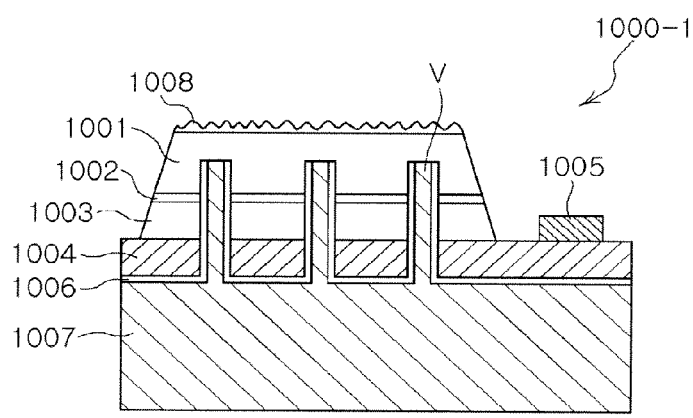
Figure 62:
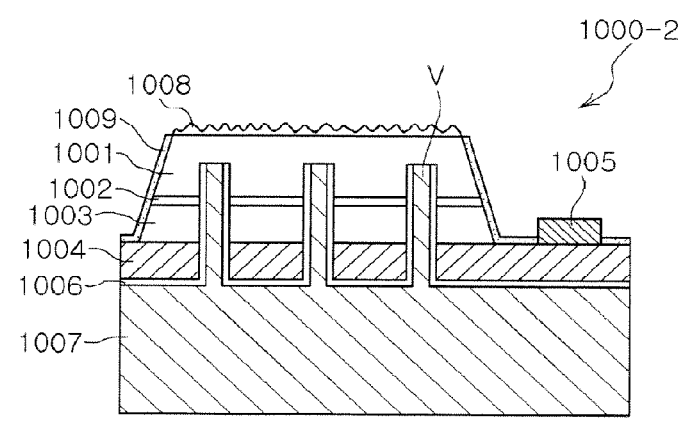

FIGS. 61 and 62 are cross-sectional views schematically illustrating a modified embodiment of the semiconductor light emitting device of FIG. 58. First, a light emitting device 1000-1, as shown in FIG. 61, is formed in such a manner that the side surfaces of a light-emitting structure are inclined relative to the first conductive contact layer 1004. Specifically, the side surfaces of the light-emitting structure are inclined toward the upper part of the light-emitting structure. As described below, the inclined light-emitting structure may be naturally obtained through a process of etching the light-emitting structure to expose the first conductive contact layer 1004. A semiconductor light emitting device 1000-2, as shown in FIG. 61, further includes a passivation layer 1009 in order to cover the side surfaces of the light-emitting structure of FIG. 61. The passivation layer 1009 protects the light-emitting structure, and particularly, the active layer 1002 against the outside environment. The passivation layer 1009 may be formed of a silicon oxide or a silicon nitride, such as $SiO_2$, $SiO_xN_y$, or $Si_xN_y$, and may have a thickness of approximately 0.1 to 2 µm.

Since the active layer 1002, exposed to the outside, may serve as a current leakage path, during the operation of the semiconductor light emitting device 1000, this problem can be prevented by forming the passivation layer 1009 on the side surfaces of the light-emitting structure. Considering this aspect, as shown in FIG. 62, the passivation layer 1009 may further be extended to the exposed upper surface of the first conductive contact layer 1004. The modified embodiments, having been described with reference to FIGS. 61 and 62, may be applied to other embodiments of FIGS. 63 and 64.

Figure 63:
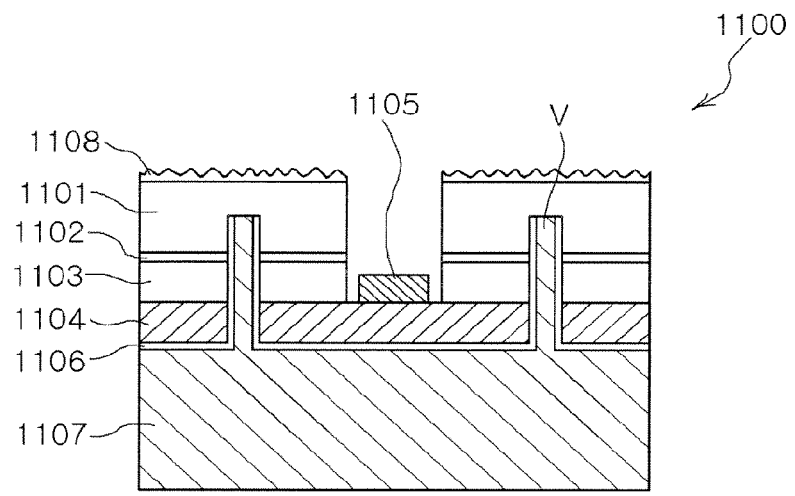

FIG. 63 is a cross-sectional view schematically illustrating a semiconductor light emitting device according to another exemplary embodiment of the invention. Referring to FIG. 63, like the above-described embodiment, in a semiconductor light emitting device 1100 according to this embodiment, a first conductive contact layer 1104 is formed on a conductive substrate 1107, and a light-emitting structure, that is, a first conductivity type semiconductor layer 1103, an active layer 1102, and a second conductivity type semiconductor layer 1101 are formed on the first conductive contact layer 1104. An undoped semiconductor layer 1108 is formed on the first conductivity type semiconductor layer 1101. Unevenness is provided on the upper surface of the undoped semiconductor layer 1108. The first conductive contact layer 1104 is electrically insulated from the conductive substrate 1107. To this end, an insulator 1106 is interposed between the first conductive contact layer 1104 and the conductive substrate 1107.

Unlike the above-described embodiments, in which the electrical connection portion of the first conductive contact layer 1104 is formed at a position corresponding to the edge of the light-emitting structure as viewed from the top of the light-emitting structure, in this embodiment, the electrical connection portion of the first conductive contact layer 1104 is formed at a position corresponding to the center of the light-emitting structure as viewed from the top of the light-emitting structure. As such, the position of the exposed region of the first conductive contact layer 1104 may be changed upon necessity in this invention. An electrode pad 1105 may be formed on the electrical connection portion of the first conductive contact layer 1104.

Figure 64:
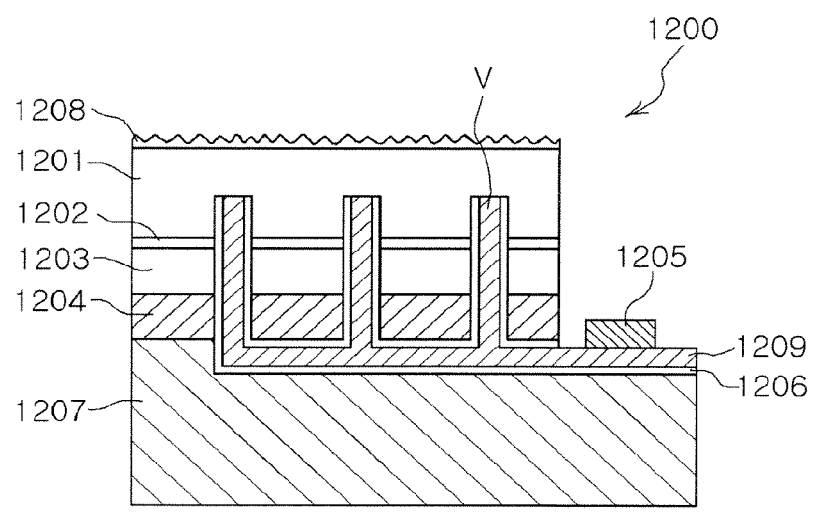

FIG. 64 is a cross-sectional view schematically illustrating a semiconductor light emitting device according to another exemplary embodiment of the invention. Referring to FIG. 64, in a semiconductor light emitting device 1200 according to this embodiment, a first conductive contact layer 1204 is formed on a conductive substrate 1207, and a light-emitting structure, that is, a first conductivity type semiconductor layer 1203, an active layer 1202, and a second conductivity type semiconductor layer 1201 are formed on the first conductive contact layer 1204. An undoped semiconductor layer 1208 is formed on the light emitting structure, that is, on the first conductivity type semiconductor layer 1201. An uneven structure is formed on the upper surface of the undoped semiconductor layer 1208. The structural difference between the semiconductor light emitting device 1200 according to this embodiment and the above-described embodiments is that the conductive substrate 1207 is electrically connected to the first conductivity type semiconductor layer 1203 rather than the second conductivity type semiconductor layer 1201. Therefore, the first conductive contact layer 1204 is not necessarily required. In this case, the first conductivity type semiconductor layer 1203 may come into direct contact with the conductive substrate 1207.

Conductive vias v, which are internally connected to the second conductivity type semiconductor layer 1201, pass through the active layer 1202, the first conductivity type semiconductor layer 1203, and the first conductive contact layer 1204, and are connected to the second conductive electrode 1209. The second conductive electrode 1209 has an electrical connection portion that is extended from the conductive vias v toward the side of the light-emitting structure and is exposed to the outside. An electrode pad 1205 may be formed on the electrical connection portion. Here, an insulator 1206 is formed to electrically insulate the second conductive electrode 1209 and the conductive vias v from the active layer 1202, the first conductivity type semiconductor layer 1203, the first conductive contact layer 1204, and the conductive substrate 1207.

Hereinafter, a process of manufacturing the semiconductor light emitting device having the above-described configuration will be described.

FIGS. 65 through 73 are cross-sectional views illustrating the process flow of a method of manufacturing a semiconductor light emitting device according to this embodiment of the invention. Specifically, a method of manufacturing a semiconductor light emitting device having the configuration, having been described with reference to FIGS. 58 to 60, will be described.

Figure 65:
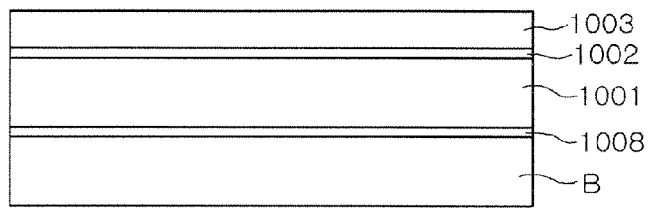

First, as shown in FIG. 65, the second conductivity type semiconductor layer 1001, the active layer 1002, and the first conductivity type semiconductor layer 1003 are sequentially grown on a semiconductor growth substrate B using a semiconductor layer growing process, such as MOCVD, MBE, or HVPE, thereby manufacturing a light-emitting structure. Here, as described above, in terms of configuration, the light-emitting structure is defined as a configuration having the second conductivity type semiconductor layer 1001, the active layer 1002, and the first conductivity type semiconductor layer 1003, while in terms of growth and etching, the buffer layer 1008 can be considered a component forming the light-emitting structure. Therefore, hereinafter, the light-emitting structure will be defined as a configuration having the buffer layer 1008, the second conductivity type semiconductor layer 1001, the active layer 1002, and the first conductivity type semiconductor layer 1003.

As for the semiconductor growth substrate B, a substrate, formed of SiC, $MgAl_2O_4$, MgO, $LiAlO_2$, $LiGaO_2$, or GaN may be used. Here, sapphire is a crystal having Hexa-Rhombo R3c symmetry (Hexa-Rhombo R3c) and has a lattice constant of 13.001 Å along the c-axis and a lattice constant of 4.758 Å along the a-axis. Orientation planes of the sapphire include the C(0001) plane, the A(1120) plane, and the R(1102) plane. Here, since nitride thin films are relatively easily grown on the C-plane sapphire substrate, which is stable at high temperatures, the C-plane sapphire substrate is widely used as a nitride growth substrate. As described above, as for the buffer layer 1008, an undoped semiconductor layer, formed of a nitride, may be used to prevent the lattice defects of the light-emitting structure to be formed thereon.

Figure 66:
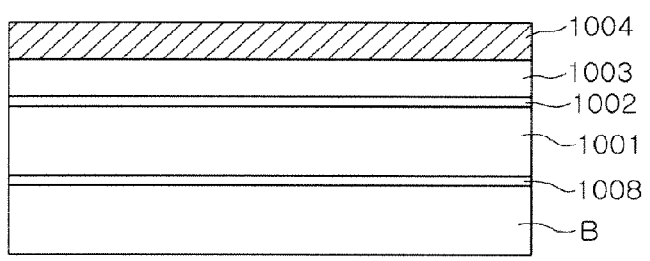
Figure 67:
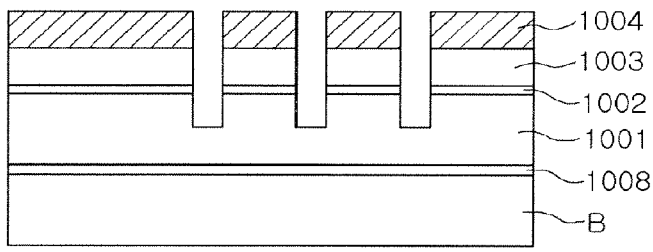

Then, as shown in FIG. 66, the first conductive contact layer 1004 is formed on the first conductivity type semiconductor layer 1003. The first conductive contact layer 1004 may contain Ag, Ni, Al, Rh, Pd, Ir, Ru, Mg, Zn, Pt, or Au in consideration of light reflection function and ohmic contacts, formed together with first conductivity type semiconductor layer 1003, and may be formed using sputtering or deposition, which both of which are known in the art. Then, as shown in FIG. 67, recesses are formed in the first conductive contact layer 1004 and the light-emitting structure. Specifically, in subsequent operations, the recesses are filled with conductive materials to thereby form conductive vias connected to the second conductivity type semiconductor layer 1001. The recesses pass through the first conductive contact layer 1004, the first conductivity type semiconductor layer 1003, and the active layer 1002. The second conductivity type semiconductor layer 1001 is exposed as the bottom surface of the recesses. The operation of forming recesses, shown in FIG. 67, may be performed using an etching process known in the related art, for example, ICP-RIE.

Figure 68:
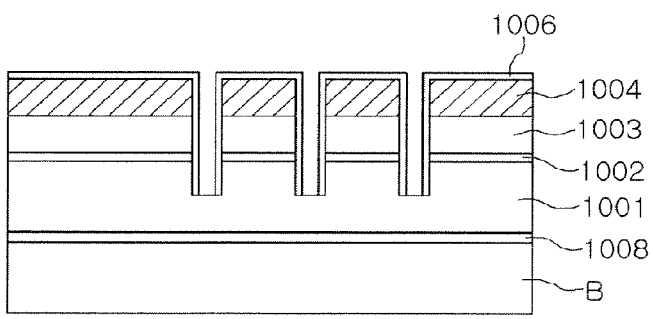

Then, as shown in FIG. 68, a material, such as $SiO_2$, $SiO_xN_y$, or $Si_xN_y$, is deposited to form the insulator 1006 so that the insulator 1006 covers the top of the first conductive contact layer 1004 and the side walls of the grooves. Here, since the second conductivity type semiconductor layer 1001 corresponding to the bottom surfaces of the recesses needs to be at least partially exposed, the insulator 1006 may be formed so as not to completely cover the bottom surfaces of the grooves.

Figure 69:
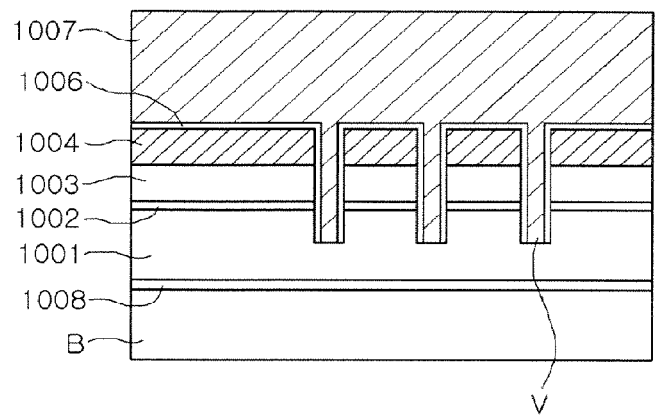

Then, as shown in FIG. 69, conductive materials are formed within the recesses and on the insulator 1006 to thereby form the conductive vias v and the conductive substrate 1007, so that the conductive substrate 1007 is connected to the conductive vias v making contact with the second conductivity type semiconductor layer 1001. The conductive substrate 1007 may include any one of the materials, such as Au, Ni, Al, Cu, W, Si, Se, and GaAs, by any one of plating, sputtering, and deposition. Here, the conductive vias v and the conductive substrate 1007 may be formed of the same material. Alternatively, when the conductive vias v and the conductive substrate 1007 may be formed of different materials from each other, they may be formed using separate processes. For example, after the conductive vias v are formed by deposition, the conductive substrate 1007 may be previously prepared and bonded to the light-emitting structure.

Figure 70:
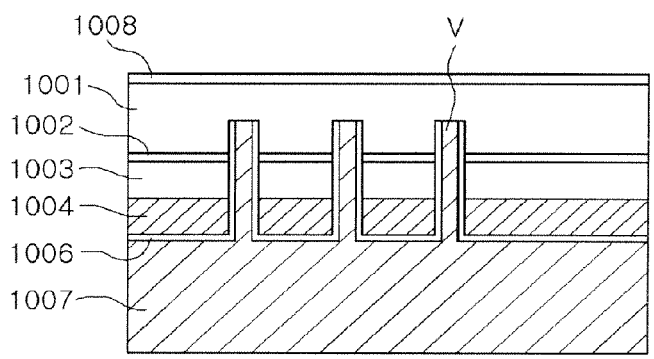

As shown in FIG. 70, the semiconductor growth substrate B is removed to expose the buffer layer 1008. Here, the semiconductor growth substrate B may be removed using laser lift-off or chemical lift-off. FIG. 70 is a view, rotated by 180 degrees, of FIG. 68, in which the semiconductor growth substrate B is removed.

Figure 71:
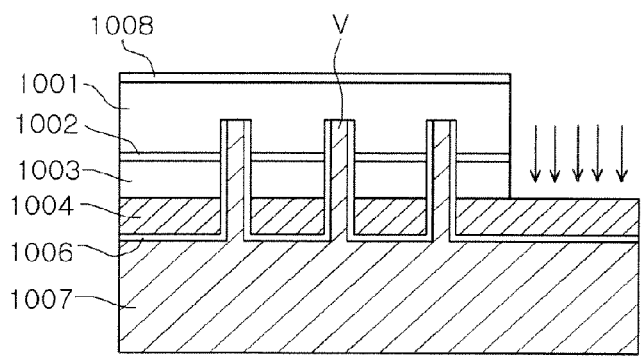
Figure 72:
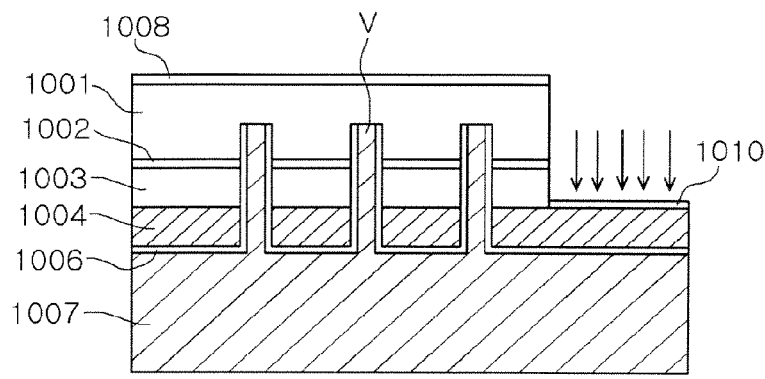

Then, as shown in FIG. 71, the light-emitting structure, that is, the buffer layer 1008, the first conductivity type semiconductor layer 1003, the active layer 1002, and the second conductivity type semiconductor layer 1001 are partially removed to expose the first conductive contact layer 1004, so that an electrical signal can be applied through the exposed first conductive contact layer 1004. Though not shown in the drawings, an operation of forming an electrode pad on the exposed portion of the first conductive contact layer 1004 may be further performed. In order to expose the first conductive contact layer 1004, the light-emitting structure may be etched using ICP-RIE or the like. Here, in order to prevent the material, forming the first conductive contact layer 1004, from moving to the side of the light-emitting structure and being attached thereto, as shown in FIG. 72, an etch-stop layer 1010 may be previously formed inside the light-emitting structure. Furthermore, as a more reliable insulating structure, after etching the light-emitting structure, the passivation layer 1009, as shown in FIG. 62, may be formed on the side surfaces of the light-emitting structure.

Figure 73:
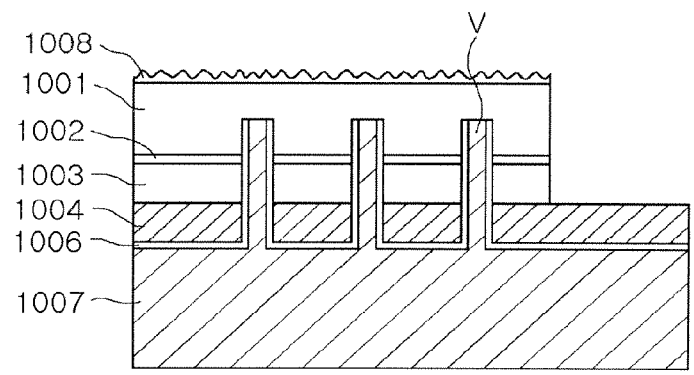

Then, as shown in FIG. 73, an uneven structure is formed on the buffer layer 1008. Here, unevenness may be mainly formed on the upper surface of the buffer layer 1008 that is exposed by removing the semiconductor growth substrate B. This uneven structure may increase light extraction efficiency. Here, the uneven structure may be formed using dry or wet etching. Here, an uneven structure having facets of irregular sizes, shapes, and periods may be provided by wet etching. In this embodiment, an electrical signal is smoothly applied to the first conductivity type semiconductor layer 1001 without removing the buffer layer 1008 with low electrical conductivity. By forming the uneven structure on the buffer layer 1008, the uniform thickness of the first conductivity type semiconductor layer 1001 can be ensured.

FIGS. 74 through 77 are cross-sectional views illustrating the process flow of a method of manufacturing a semiconductor light emitting device according to another exemplary embodiment of the invention. Specifically, a method of manufacturing the semiconductor light emitting device having the configuration, having been described with reference to FIG. 64, will be described. The operations, having been described with reference to FIGS. 65 through 67, may be directly applied to this embodiment. Hereinafter, operations subsequent to the operation of forming the recesses in the first conductive contact layer 1204 and the light-emitting structure will be described.

Figure 74:
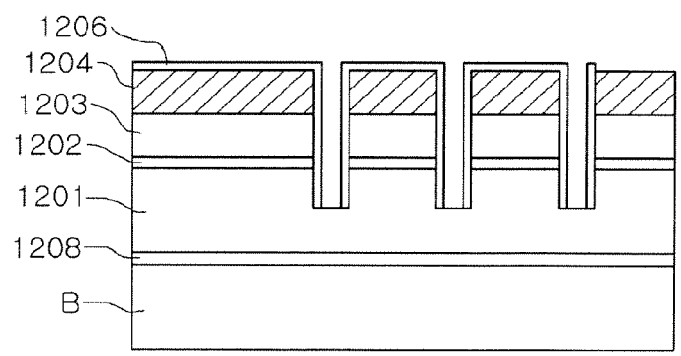

First, as shown in FIG. 74, a material, such as $SiO_2$, $SiO_xN_y$, or $Si_xN_y$, is deposited to form the insulator 1206 in order to cover the upper part of the first conductive contact layer 1204 and the side walls of the recesses. Here, the insulator 1206 may be referred to as a first insulator to differentiate the first insulator from an insulator to be formed to cover the second conductive electrode 1209 in subsequent operations. Unlike the above-described embodiments, the insulator 1206 is not formed on the entire upper surface of the first conductive contact layer 1204 in this embodiment, so that the conductive substrate 1207 and the first conductive contact layer 1204 come into contact with each other. That is, the insulator 1206 may be formed in consideration of a portion of the upper surface of the first conductive contact layer 1204, and specifically, a region in which the second conductive electrode 1209, connected to the second conductivity type semiconductor layer 1201, is formed.

Figure 75:
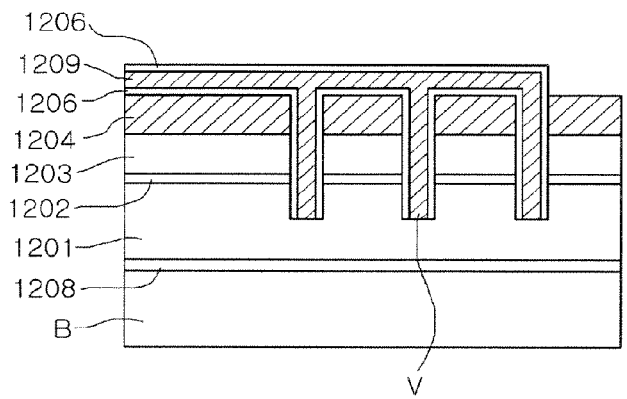

Then, as shown in FIG. 75, conductive materials are formed within the recesses and on the insulator 1206 to thereby form the second conductive electrode 1209, so that the second conductive electrode 1209 includes the conductive vias v connected to the second conductivity type semiconductor layer 1201. In this operation, the insulator 1206 is previously formed at a position where the second conductive electrode 1209 will be formed, thereby forming the second conductive electrode 1209 according to the insulator 1206. In particular, the second conductive electrode 1209 is exposed to the outside and is extended in a horizontal direction from the conductive vias v so as to serve as an electrical connection portion.

Figure 76:
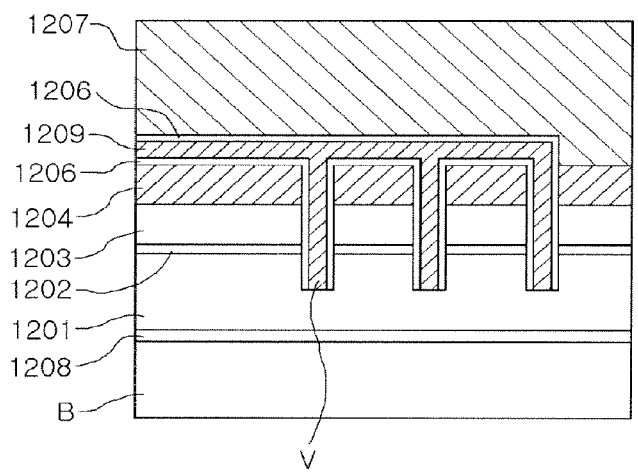
Figure 77:
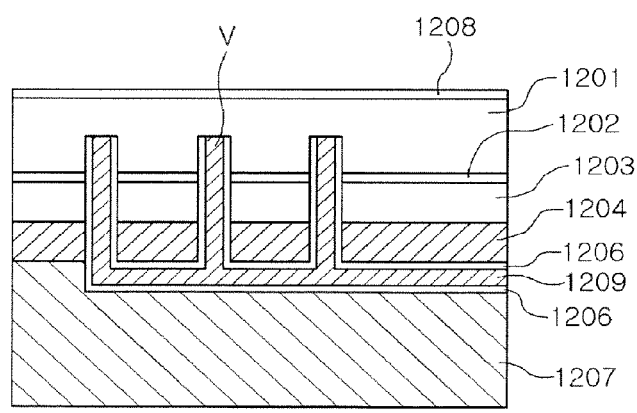

Then, as shown in FIG. 76, the insulator 1206 is formed to cover the second conductive electrode 1209, and the conductive substrate 1207 is formed thereon so as to be electrically connected to the first conductive contact layer 1204. Here, the insulator 1206, formed in this operation, may be referred to as a second insulator. The earlier insulator and the insulator 1206 may form a single insulating structure. In this operation, the second conductive electrode 1209 may be electrically insulated from the first conductive contact layer 1204 and the conductive substrate 1207. Then, as shown in FIG. 77, the second conductivity type semiconductor layer 1201 is removed to expose the semiconductor growth substrate B. Though not shown in the drawings, an operation of partially removing the light-emitting structure to expose the second conductive electrode 1209 and an operation of forming the high-resistance portion 1208 along the side surfaces of the light-emitting structure by ion implantation may be then performed using the above-described operations.

A semiconductor light emitting device according to another exemplary embodiment of the invention will now be described with reference to FIGS. 78 through 91.

Figure 78:
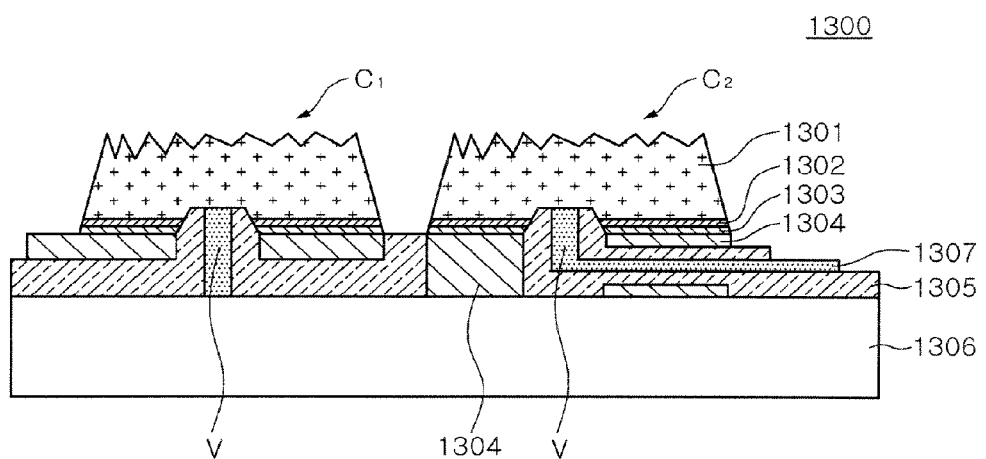
FIGS. 78 through 91 are views illustrating semiconductor light emitting device according to another exemplary embodiment of the present invention.
Figure 79:
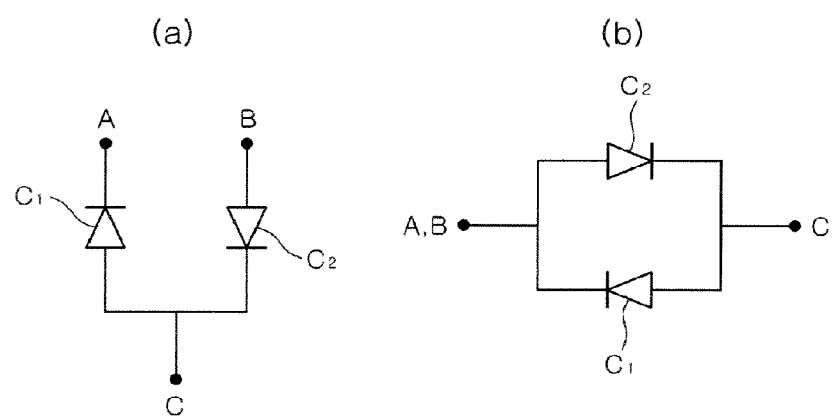

FIG. 78 is a cross-sectional view schematically illustrating a semiconductor light emitting device according to this embodiment. FIG. 79 is a circuit diagram illustrating the semiconductor light emitting device of FIG. 78. Referring to FIG. 78, in a semiconductor light emitting device 1300 according to this embodiment, a plurality of light-emitting structures C1 and C2 are formed on a substrate 1306 while the light-emitting structures C1 and C2 are electrically connected to each other. Here, two light-emitting structures are referred to as first and second light-emitting structures C1 and C2, respectively. The first and second light-emitting structures C1 and C2 each have a first conductivity type semiconductor layer 1303, an active layer 1302, and a second conductivity type semiconductor layer 1301 stacked upon each other in a sequential manner on the substrate 1306, and have first and second electrical connection portions 1304 and 1307, respectively, in order to provide an electrical connection therebetween.

The first electrical connection portion 1304 is formed under the first conductivity type semiconductor layer 1303, and may provide ohmic contacts and light reflection function in addition to electrical connections. The second electrical connection portion 1307 may be electrically connected to the second conductivity type semiconductor layer 1301 and have conductive vias v passing through the first electrical connection portion 1304, the first conductivity type semiconductor layer 1303, and the active layer 1302 so as to be connected to the second conductivity type semiconductor layer 1301. The second connection portion of the first light-emitting structure C1, that is, the conductive vias v and the first electrical connection portion 1304 of the second light-emitting structure C2 are electrically connected to each other through the substrate 1306. To this end, the substrate 1306 is formed of a material having electrical conductivity. As the substrate 1306 has this electrical connection structure, the semiconductor light emitting device 1300 can be operated even though external AC power is applied.

In this embodiment, the first and second conductivity type semiconductor layers 1303 and 1301 may be p-type and n-type semiconductor layers, respectively, and may be formed of nitride semiconductors. Therefore, in this embodiment, first conductive and second conductive may mean p-type and n-type, respectively. The invention is not limited thereto, however. The first and second conductivity type semiconductor layers 1303 and 1301 may satisfy an equation of $Al_xIn_yGa_{(1-x-y)}N$ (where $0 \leq x \leq 1$, $0 \leq y \leq 1$, and $0 \leq x+y \leq 1$ are satisfied), for example, GaN, AlGaN, and InGaN. The active layer 1302, formed between the first and conductive semiconductor layers 1303 and 1301, emits light having a predetermined amount of energy by electron-hole recombination and may have a multiple quantum well (MQW) structure in which quantum well layers and quantum barrier layers alternate with each other. As for the multiple quantum well structure, an InGaN/GaN structure may be used.

As described above, the first conductive contact layer 1304 may reflect light, emitted from the active layer 1302, upward from the semiconductor light emitting device 1300, that is, toward the second conductivity type semiconductor layer 1301. Further, the first conductive contact layer 1304 and the first conductivity type semiconductor layer 1303 may form ohmic contacts. In consideration of these functions, the first conductive contact layer 1304 may contain Ag, Ni, Al, Rh, Pd, Ir, Ru, Mg, Zn, Pt, or Au. Here, though not illustrated in detail, the first conductive contact layer 1304 may have a dual or multi-layered structure to thereby increase reflection efficiency. For example, the first conductive contact layer 1304 may have a structure of Ni/Ag, Zn/Ag, Ni/Al, Zn/Al, Pd/Ag, Pd/Al, Ir/Ag, Ir/Au, Pt/Ag, Pt/Al, or Ni/Ag/Pt.

When manufacturing the semiconductor light emitting device 1300, the substrate 1306 serves as a support that holds the first and second light-emitting structures C1 and C2 during a laser-lift off process. In order to electrically connect the first and second light-emitting structures C1 and C2 to each other, a conductive substrate may be used. The substrate 1306 may be formed of a conductive material containing any one of Au, Ni, Al, Cu, W, Si, Se, and GaAs, for example, Si—Al alloys. Here, according to the selected material, the substrate 1306 may be formed by plating or bonding.

The conductive vias v, provided in the second electrical connection portion 1307, are internally connected to the second conductivity type semiconductor layer 1301. In order to reduce contact resistance, the number, shape, and pitch of the conductive vias v, and a contact area between the conductive vias v and the second conductivity type semiconductor layer 1301 may be appropriately controlled. Here, since the conductive vias v need to be electrically insulated from the active layer 1302, the first conductivity type semiconductor layer 1303, and the first conductive contact layer 1304, the insulator 1305 is interposed therebetween. The insulator 1305 may be formed of any substance having electrical insulation. However, since it is desirable to absorb the least amount of light, a silicon oxide or a silicon nitride, such as $SiO_2$, $SiO_xN_y$, or $Si_xN_y$, may be used to form the insulator 1305.

Like this embodiment, the second conductivity type semiconductor layer 1301 is formed through the second electrical connection portion 1307 at a lower portion thereof, there is no need to separately form an electrode on the upper surface of the second conductivity type semiconductor layer 1301. Therefore, the amount of light, emitted upward from the second conductivity type semiconductor layer 1301, may be increased. A light-emitting area will be reduced since the conductive vias v are formed in a portion of the active layer 1302. However, in spite of that, light extraction efficiency will be significantly improved since there is no need to form an electrode on the upper surface of the second conductivity type semiconductor layer 1301. Meanwhile, it can be seen that the entire electrode arrangement of the second conductivity type semiconductor layer 1301, according to this embodiment, is similar to a horizontal electrode structure, rather than a vertical electrode structure, since an electrode is not disposed on the upper surface of the second conductivity type semiconductor layer 1301. However, sufficient current spreading effects can be ensured due to the conductive vias v formed inside the second conductivity type semiconductor layer 1301. Furthermore, an uneven structure may be formed on the upper surface of the second conductivity type semiconductor layer 1301 to thereby increase the possibility that light incident in a direction of the active layer 1302 is emitted to the outside.

As described above, the semiconductor light emitting device 1300 may be driven by AC power. To this end, as shown in FIG. 79, the first and second light-emitting structures C1 and C2 form an n-p junction. This n-p junction may be formed in such a manner that the second electrical connection portion v of the first light-emitting structure C1 and the first electrical connection portion 1304 of the second light-emitting structure C2 are connected to each other, external power is applied to the first electrical connection portion 1304 of the light-emitting structure C1 and the second electrical connection portion 1307 of the second light-emitting structure C2. Specifically, in FIG. 79A, terminals A and B correspond to the first electrical connection portion 1304 of the first light-emitting structure C1 and the second electrical connection portion 1307 of the second light-emitting structure C2, respectively. A terminal C corresponds to the substrate 1306. Here, as shown in FIG. 79B, when the terminals A and B are connected to each other, and an AC signal is applied to the terminals A and B connected to each other and the terminal C, an AC light emitting device may be realized.

Figure 80:
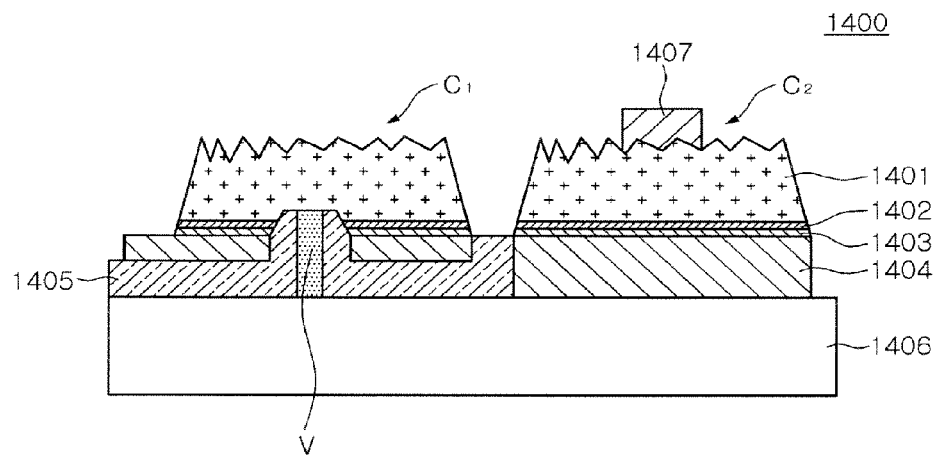
Figure 81:
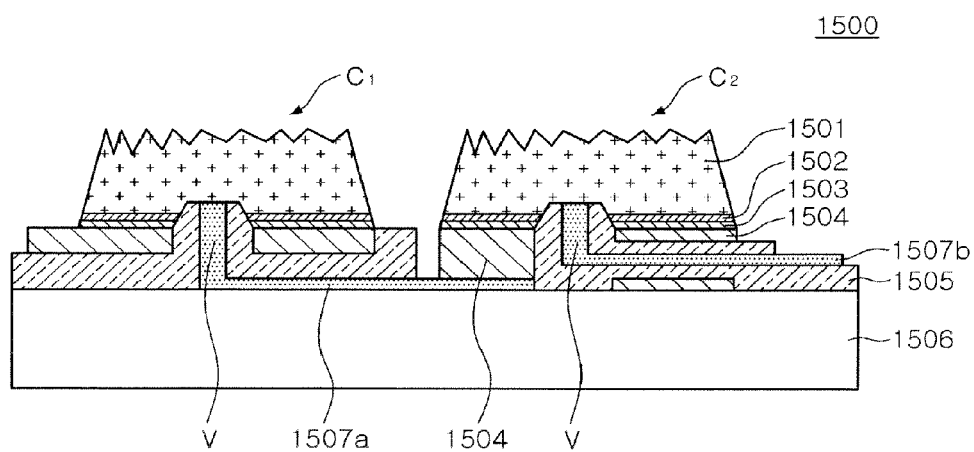
Figure 82:
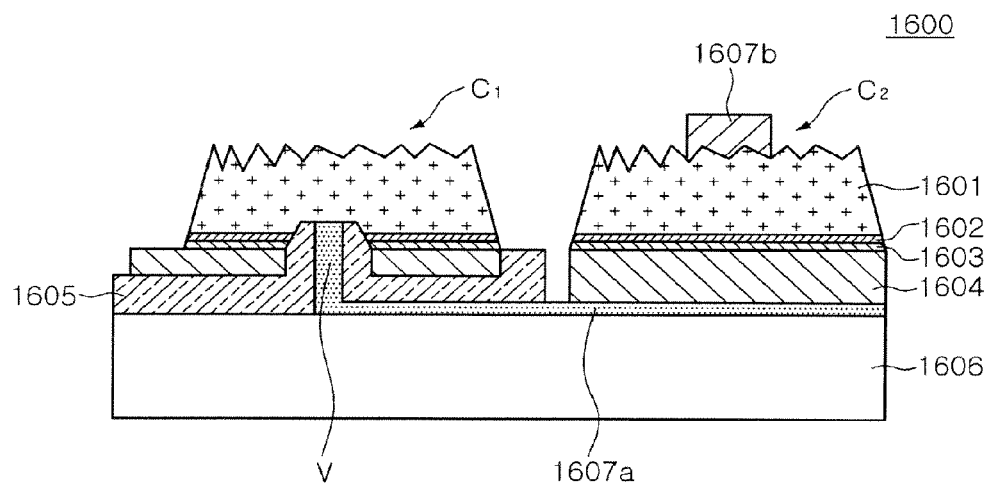

FIGS. 80 through 82 are cross-sectional views schematically illustrating modified embodiments of the semiconductor light emitting device of FIG. 78. An electrical connection structure between light-emitting structures of the semiconductor light emitting device according to the modified embodiment, as shown in FIGS. 80 through 82, is different from that of the above-described embodiment. A circuit diagram of the realized semiconductor light emitting device is the same as that of FIG. 80. First, in a semiconductor light emitting device 1400, first and second light-emitting structures C1 and C2 are disposed on a substrate 1406. Here, the first light-emitting structure C1 has the same configuration as the first light-emitting structure of FIG. 78. Unlike the above-described embodiment, a vertical electrode structure can be used as a part of the light-emitting structure. Specifically, the second light-emitting structure C2 corresponds to a vertical electrode structure. Specifically, a first conductivity type semiconductor layer 1403, an active layer 1402, and a second conductivity type semiconductor layer 1401 may be sequentially formed on the first electrical connection portion 1404 connected to the substrate 1406. A second electrical connection portion 1407 is formed on the second conductivity type semiconductor 1401.

Then, the embodiments of FIGS. 81 and 82 have configurations in which the substrates are formed of electrically insulating materials as shown in FIGS. 78 and 79, respectively. In a semiconductor light emitting device 1500, as shown in FIG. 81, first and second light-emitting structures C1 and C2 are disposed on a substrate 1506 having electrical insulation. Here, like the embodiment of FIG. 78, the first and second light-emitting structures C1 and C2 each have a first conductivity type semiconductor layer 1503, an active layer 1502, and a second conductivity type semiconductor layer 1501 stacked upon each other in a sequential manner on a substrate 1506. Second electrical connection portions 1507a and 1507b have conductive vias v connected to the second conductivity type semiconductor layer 1501. Furthermore, an insulator 1505 is formed in order that the second electrical connection portions 1507a and 1507b are electrically insulated from the first electrical connection portion 1504, the first conductivity type semiconductor layer 1503, and the active layer 1502. As the substrate 1506 having electrical insulation is used, the second electrical connection portion 1507a of the first light-emitting structure C1 is connected to the first electrical connection portion 1504 of the second light-emitting structure C2 by portions extended in parallel with the substrate 1506 from the conductive vias v.

In a similar manner, like the embodiment of FIG. 80, in a semiconductor light emitting device 1600, as shown in FIG. 82, a second light-emitting structure C2 has a first conductivity type semiconductor layer 1603, an active layer 1602, and a second conductivity type semiconductor layer 1601 formed on a first electrical connection portion 1604 in a sequential manner. A second electrical connection portion 1607 is formed on the second conductivity type semiconductor 1601. As the substrate 1606 having electrical insulation is used, a second electrical connection portion 1607a of a first light-emitting structure C1 is extended in parallel with the substrate 1606 to the second light-emitting structure C2 from conductive vias v connected to the second conductivity type semiconductor layer 1601. Therefore, the first and second light-emitting structures C1 and C2 may share the second electrical connection portion 1607a.

Figure 83:
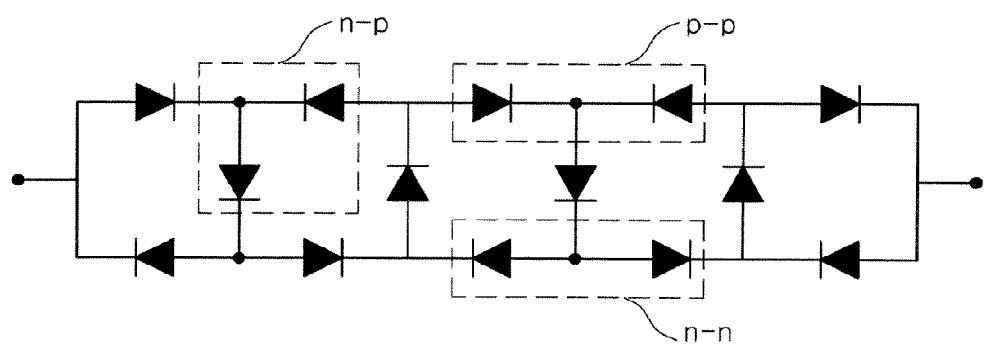

Meanwhile, as for the above-described embodiments, an AC driven light emitting device is realized using two light-emitting structures. However, the light-emitting structure, that is, the number of light emitting diodes and a connection structure thereof may vary. FIG. 83 is a circuit diagram illustrating the semiconductor light emitting device according to this embodiment. In FIG. 83, one diode is a light emitting diode and corresponds to a light-emitting structure. The circuit diagram, shown in FIG. 83, is a so-called ladder network circuit and has fourteen light-emitting structures. In this embodiment, when a forward voltage is applied, nine light-emitting structures are operated. Even when a reverse voltage is applied, nine light-emitting structures are operated. To this end, there are provided three basic electrical connection structures. As shown in FIG. 83, these three electrical connection structures are an n-p junction, an n-n junction, and a p-p junction. Examples of the n-p junction, the n-n junction, and the p-p junction will be described below. By using these basic junctions, an AC driven light emitting device having many different numbers of light emitting diodes and circuit configurations can be obtained.

Figure 84:
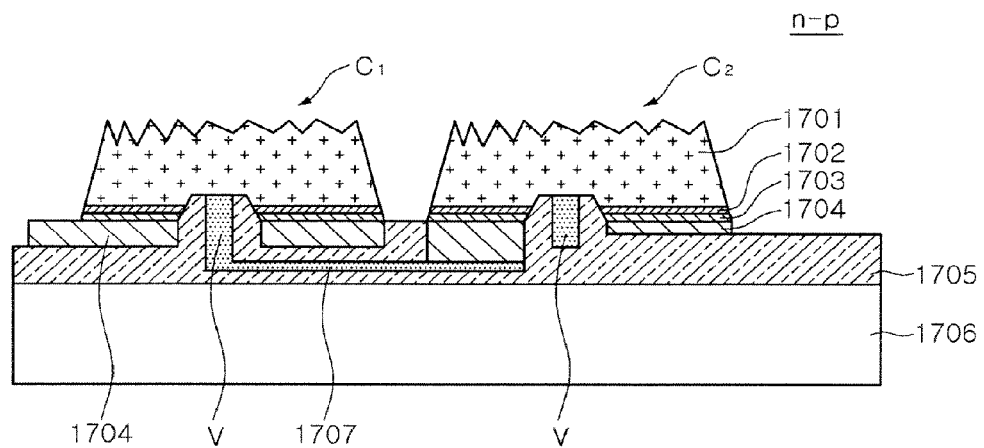
Figure 85:
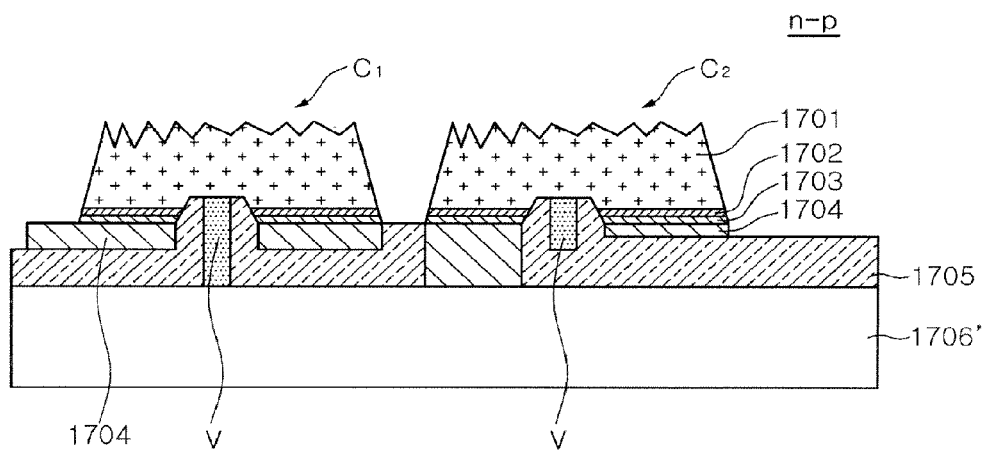

First, FIGS. 84 and 85 are cross-sectional views schematically illustrating an example of an n-p junction. Referring to FIGS. 84 and 85, the first and second light-emitting structures C1 and C2 forming an n-p junction are disposed on substrates 1706 and 1706'. The first and second light-emitting structures C1 and C2 have a first conductivity type semiconductor layer 1703, an active layer 1702, and a second conductivity type semiconductor layer 1701 sequentially stacked on a first electrical connection portion 1704. An insulator 1705 is formed in order to electrically insulate conductive vias v, internally connected to the second conductivity type semiconductor layer 1701, from the first electrical connection portion 1704, the first conductivity type semiconductor layer 1703, and the active layer 1702. A second electrical connection portion 1707 of the first light-emitting structure C1 is connected to the first electrical connection portion 1704 of the second light-emitting structure C2. Here, the configuration of FIG. 84, using the conductive substrate 1706, and the configuration of FIG. 85, using the electrical insulating substrate 1706', create slightly different shapes of the second electrical connection portion 1707, which are similar to the configurations of FIGS. 78 and 81, respectively. However, since in order to implement AC driving, the n-p junction is connected to another light-emitting structure to form the entire device, rather than being solely used, the second electrical connection portion provided in the second light-emitting structure C2, that is, the conductive vias v may be electrically connected to another light-emitting structure rather than a structure for applying an external electrical signal.

Figure 86:
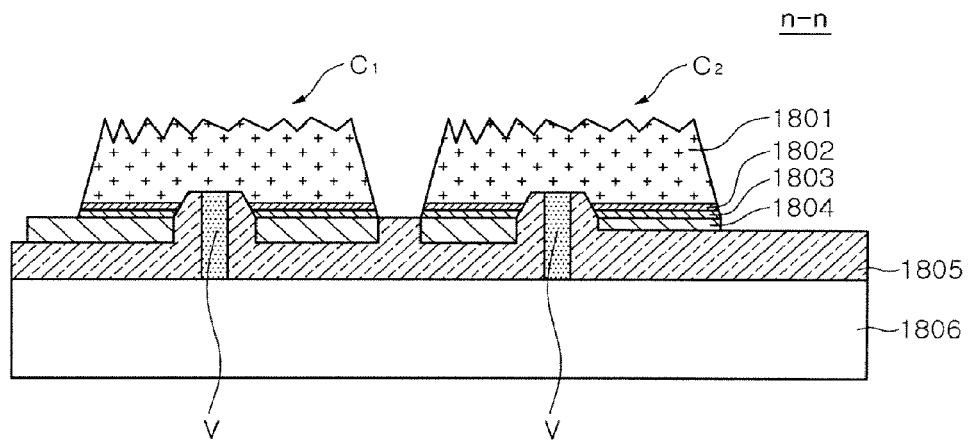
Figure 87:
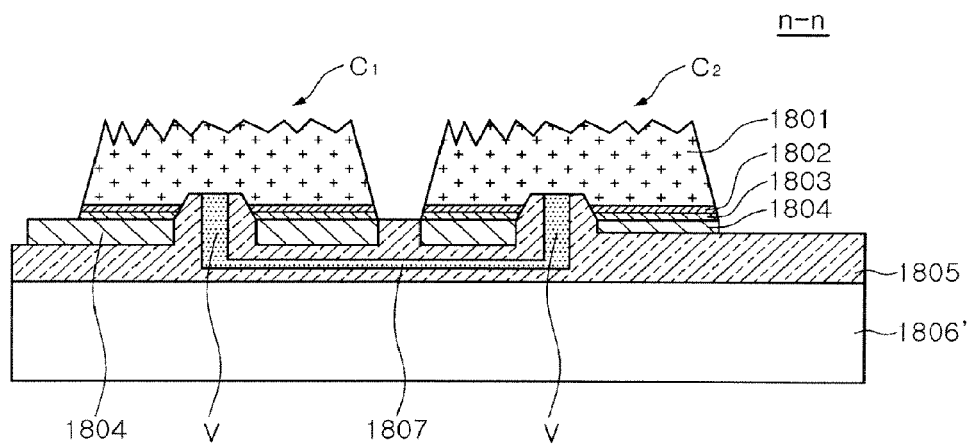
Figure 88:
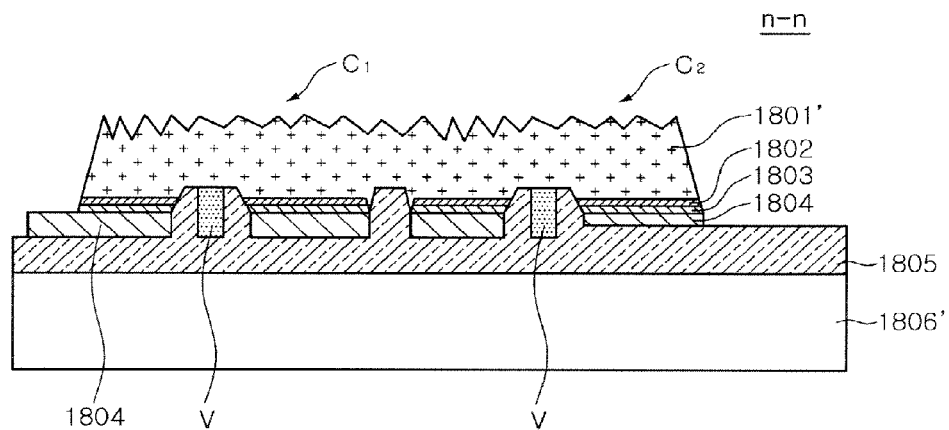

Then, FIGS. 86 through 88 are cross-sectional views schematically illustrating an example of an n-n junction. Referring to FIGS. 86 through 88, first and second light-emitting structures C1 and C2 forming an n-n junction are disposed on substrates 1806 and 1806'. The first and second light-emitting structures C1 and C2 each have a configuration in which a first conductivity type semiconductor layer 1803, an active layer 1802, and a second conductivity type semiconductor layer 1801 are sequentially stacked on a first electrical connection portion 1804. Here, an insulator 1805 is formed in order to electrically insulate conductive vias v, internally connected to the second conductivity type semiconductor layer 1801, from the first electrical connection portion 1804, the first conductivity type semiconductor layer 1803, and the active layer 1802. In order to form an n-n junction, the second electrical connection portions 1807 of the first and second light-emitting structures C1 and C2 need to be connected to each other. For example, as shown in FIG. 86, conductive vias v, provided in first and second light-emitting structures C1 and C2, may be connected to each other through a conductive substrate 1806. Furthermore, as shown in FIG. 87, when an electrically insulating substrate 1806' is used, the second electrical connection portion 1807 can connect conductive vias v, individually provided in first and second light-emitting structures C1 and C2, through a portion extended in parallel with the substrate 1806'. In addition to a connecting method using an electrical connection portion, a second conductivity type semiconductor layer 1801' may be used according to a method similar to that described in FIG. 88. First and second light-emitting structures C1 and C2 may share the second conductivity type semiconductor layer 1801'. In this case, an n-n junction may be formed without separately connecting conductive vias v.

Figure 89:
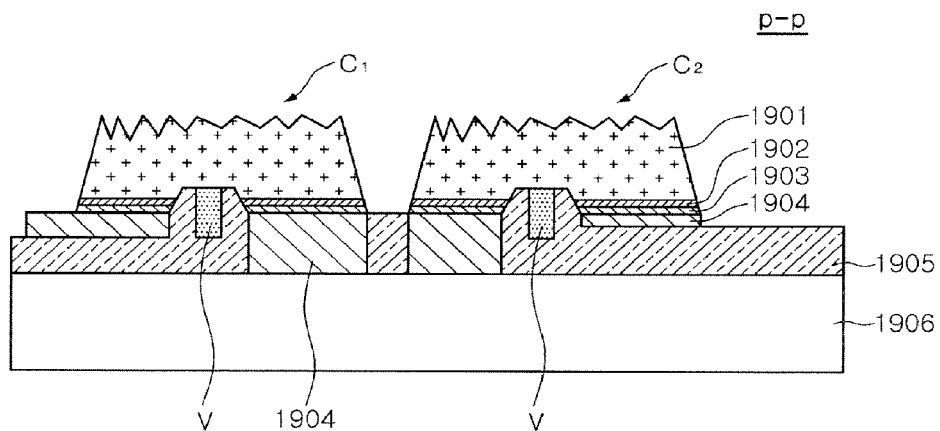
Figure 90:
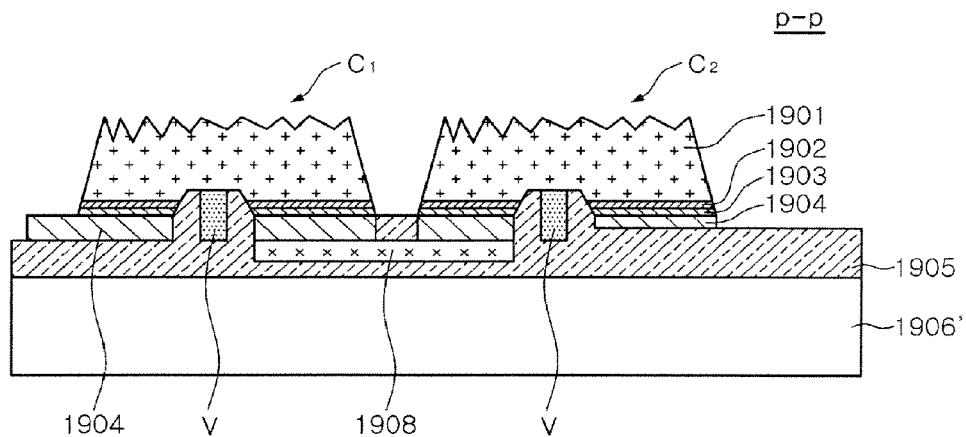
Figure 91:
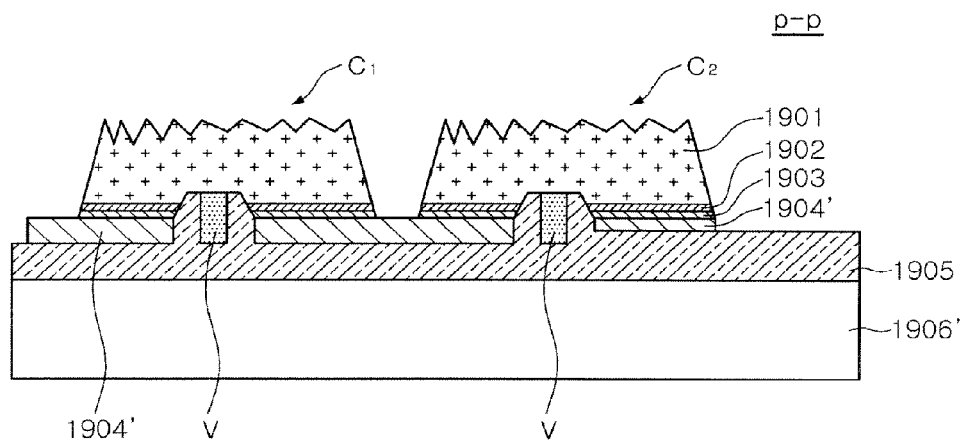

Finally, FIGS. 89 through 91 are cross-sectional views schematically illustrating an example of a p-p junction. With reference to FIGS. 89 through 91, first and second light-emitting structures C1 and C2 forming a p-p junction are disposed on substrates 1906 and 1906'. The first and second light-emitting structures C1 and C2 each have a first conductivity type semiconductor layer 1903, an active layer 1902, and a second conductivity type semiconductor layer 1901 stacked upon each other in a sequential manner on a first electrical connection portion 1904. Here, an insulator 1905 is formed in order that conductive vias v, individually internally connected to the second conductivity type semiconductor layer 1901, are electrically insulated from the first electrical connection portion 1904, the first conductivity type semiconductor layer 1903, and the active layer 1902. In order to form a p-p junction, the first electrical connection portions 1904 of the first and second light-emitting structures C1 and C2 need to be connected to each other. Here, the conductive vias v may be connected to another light-emitting structure (not shown), which forms the entire AC light emitting device. As an example of a p-p junction, as shown in FIG. 89, the first electrical connection portions 1904, individually provided in the first and second light-emitting structures C1 and C2, may be connected to each other through the substrate 1906 (not shown). Here, as shown in FIG. 90, when the substrate 1906', having electrical insulation, is used, a connecting metallic layer 1908 is separately disposed to thereby connect the first electrical connection portions 1904 individually provided in the first and second light-emitting structures C1 and C2. Alternatively, without employing a separate connecting metallic layer, as shown in FIG. 91, a configuration in which the first and second light-emitting structures C1 and C2 share the first electrical connection portion 1904 may also be employed.

A semiconductor light emitting device according to another exemplary embodiment of the invention will now be described with reference to FIGS. 92 through 102.

Figure 92:
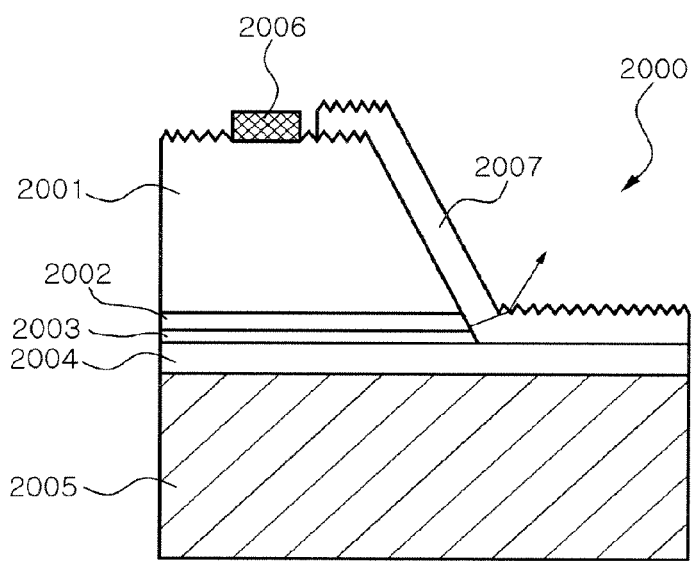
FIGS. 92 through 102 are views illustrating a semiconductor light emitting device according to another exemplary embodiment of the present invention.
Figure 93:
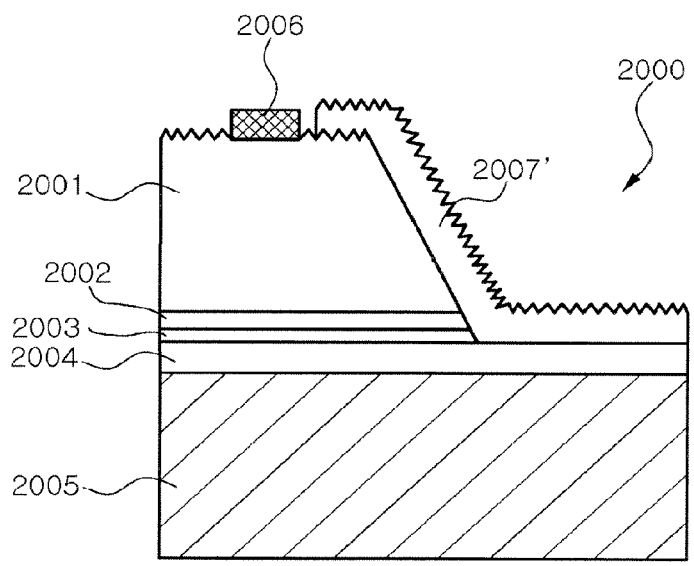
Figure 94:
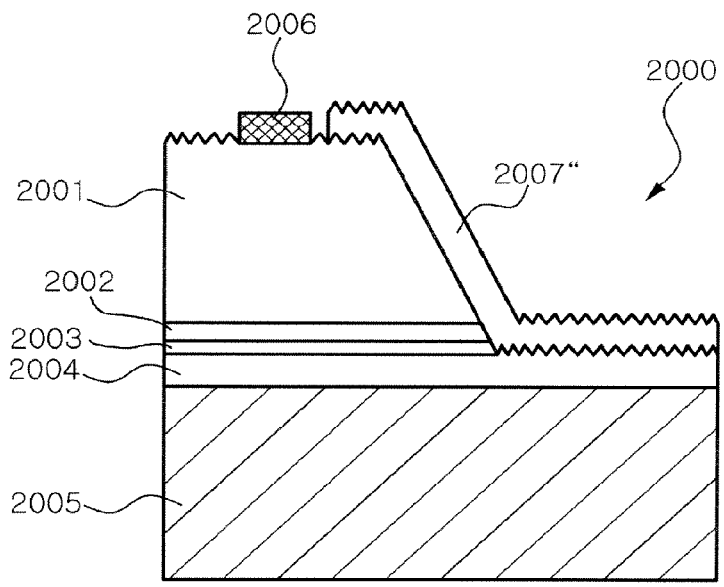

FIG. 92 is a cross-sectional view illustrating a vertical semiconductor light emitting device according to this embodiment. FIGS. 93 and 94 are views illustrating a modified embodiment of the vertical semiconductor light emitting device of FIG. 92.

Referring to FIG. 92, a vertical semiconductor light emitting device 2000 according to this embodiment includes n-type and p-type semiconductor layers 2001 and 2003 and an active layer 2002 interposed therebetween, thereby forming a light-emitting structure. A reflective metal layer 2004 and a conductive substrate 2005 are formed under the light-emitting structure. An n-type electrode 2006 is formed on the n-type semiconductor layer 2001, and a passivation layer 2007 having an uneven structure is formed to cover the side surfaces of the light-emitting structure.

The n-type semiconductor layer 2001 and the p-type semiconductor layer 2003 may be typically formed of nitride semiconductors. That is, the n-type semiconductor layer 2001 and the p-type semiconductor layer 2003 may be formed of semiconductor materials doped with an n-type impurity and a p-type impurity satisfying an equation of $Al_xIn_yGa_{(1-x-y)}N$ (where $0 \leq x \leq 1$, $0 \leq y \leq 1$, and $0 \leq x+y \leq 1$ are satisfied), for example, GaN, AlGaN, and InGaN. The n-type impurity may include Si, Ge, Se, Te or the like. The p-type impurity may include Mg, Zn, Be, or the like. Meanwhile, an uneven structure may be formed on the upper surface of the n-type semiconductor layer 2001 in order to increase the efficiency of light being emitted in a vertical direction.

The active layer 2002, formed between the n-type and p-type nitride semiconductor layers 2001 and 2003, emits a predetermined amount of energy by electron-hole recombination and may have a multiple quantum well (MQW) structure in which quantum well layers and quantum barrier layers alternate with each other. As for the multiple quantum well structure, an InGaN/GaN structure may be widely used.

The first conductive contact layer 2004 may reflect light, emitted from the active layer 2002, upward from the semiconductor light emitting device 2000, and may be formed of Ag, Ni, Al, Rh, Pd, Ir, Ru, Mg, Zn, Pt, or Au. Here, though not illustrated in detail, the first conductive contact layer 2004 may have a dual or multi-layered structure to thereby increase reflection efficiency. For example, the first conductive contact layer 2004 may have a structure of Ni/Ag, Zn/Ag, Ni/Al, Zn/Al, Pd/Ag, Pd/Al, Ir/Ag, Ir/Au, Pt/Ag, Pt/Al, or Ni/Ag/Pt. However, in this embodiment, the reflective metal layer 2004 is not necessarily included. The reflective metal layer 2004 may also be removed.

The conductive substrate 2005 serves as a p-type electrode and a support holding the light-emitting structure, that is, the n-type semiconductor layer 201, the active layer 2002, and the p-type semiconductor layer 2003 during a laser-lift off process to be described below. Here, the conductive substrate 2005 may be formed of a material containing Si, Cu, Ni, Au, W, or Ti. Here, according to the selected material, the conductive substrate 2005 may be formed using plating or bonding.

The passivation layer 2007 is an insulating layer formed to protect the light-emitting structure, and particularly, the active layer 2002. Further, the passivation layer 2007 is formed on a partially removed region of the light-emitting structure. Specifically, in addition to the side surfaces of the light-emitting structure, as shown in FIG. 92, the passivation layer 2007 may be formed on a portion of the upper surface of the n-type semiconductor layer 2001 and the upper surface of the reflective metal layer 2004. Here, when the reflective metal layer 2004 is not used, the passivation layer 2007 is formed on the upper surface of the conductive substrate 2005. When the side surfaces exposed by partially removing the light-emitting structure may be inclined upward as shown in FIG. 92, this structure may increase a light-emitting area and may further facilitate the formation of the passivation layer 2007.

The passivation layer 2007 may be formed of a silicon oxide or a silicon nitride, such as $SiO_2$, $SiO_xN_y$, or $Si_xN_y$, in order to perform a protection function, and may have a thickness of approximately 0.1 to 2 μm. Therefore, the passivation layer 2007 may have a refractive index of approximately 1.4 to 2.0. It may be difficult for light from the active layer 2002 to be emitted to the outside due to the difference in refractive index between the passivation layer 2007 and air or a molding structure of a package. In particular, in the vertical semiconductor light emitting device 2000 according to this embodiment, the p-type semiconductor layer 2003 has a relatively small thickness. For this reason, light, emitted toward the side of the active layer 2002, can be emitted to the outside only when this light passes through the passivation layer 2007. Since light, emitted in a lateral direction toward the passivation layer 2007 from the active layer 2002, has a very small incidence angle with respect to the passivation layer 2007, it becomes more difficult for the light to be emitted to the outside.

In this embodiment, an uneven structure is formed on the passivation layer 2007 to thereby increase external light extraction effects. In particular, as shown in FIG. 92, when the uneven structure is formed at a region through which the light, emitted in the lateral direction of the active layer 2002, passes, the amount of light emitted towards the side of the vertical semiconductor light emitting device 2000 may be increased. Here, the region, through which light, emitted along the lateral direction of the active layer 2002, passes, may be considered a region of the upper surface of the reflective metal layer 2004, at which the light-emitting structure is not formed. According to simulation results, a configuration according to this embodiment has increased light extraction efficiency by approximately 5% or higher than another configuration having the same components except for the passivation layer 2007 employing the uneven structure. Meanwhile, though not necessarily required in this embodiment, the uneven structure of the passivation layer 2007 may also be formed on the upper surface of the n-type semiconductor layer 2001 to thereby increase vertical light extraction efficiency.

As shown in FIGS. 93 and 94, a region where an uneven structure of a passivation layer is formed may vary in order to maximize external light extraction effects. As shown in FIG. 93, an uneven structure may be formed to the side surfaces of a passivation layer 2007'. Furthermore, as shown in FIG. 94, an uneven structure may also be formed on a lower surface of the passivation layer 2007', that is, a surface facing the reflective metal layer 2004. Here, a pattern having a shape corresponding thereto may be formed on the reflective metal layer 2004.

FIGS. 95 through 98 are cross-sectional views for describing a method of manufacturing a vertical semiconductor light emitting device having a structure described with reference to FIG. 92.

Figure 95:
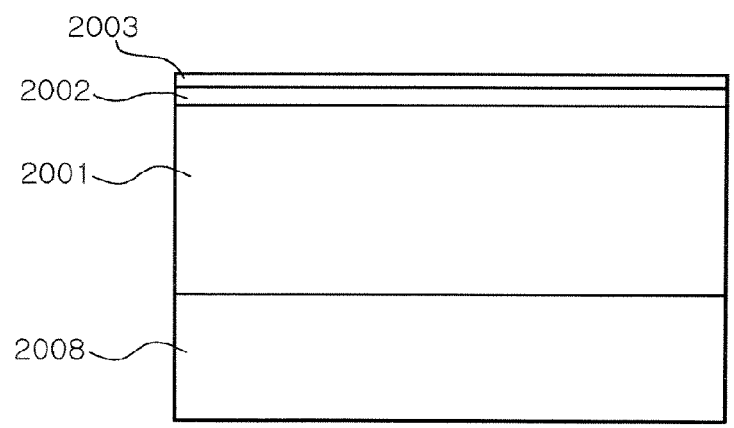

As shown in FIG. 95, an n-type semiconductor layer 2001, an active layer 2002 and a p-type semiconductor layer 2003 are grown sequentially on a substrate 2008 for semiconductor single-crystal growth by using a process such as MOCVD, MBE, or HVPE. The substrate 2008 for semiconductor single-crystal growth may utilize sapphire, SiC, $MgAl_2O_4$, MgO, $LiAlO_2$, $LiGaO_2$, GaN or the like. In this case, the sapphire, a crystal having Hexa-Rhombo R3c symmetry, has lattice constants of 13.001 Å along the c-axis orientation and 4.758 Å along the a-axis orientation, respectively, and has a C(0001) plane, an A(1120) plane, and an R(1102) plane. In this case, since the C plane is stable at high temperatures and ensures the relatively easy growth of a nitride thin film, it is commonly used as a substrate for nitride growth.

Figure 96:
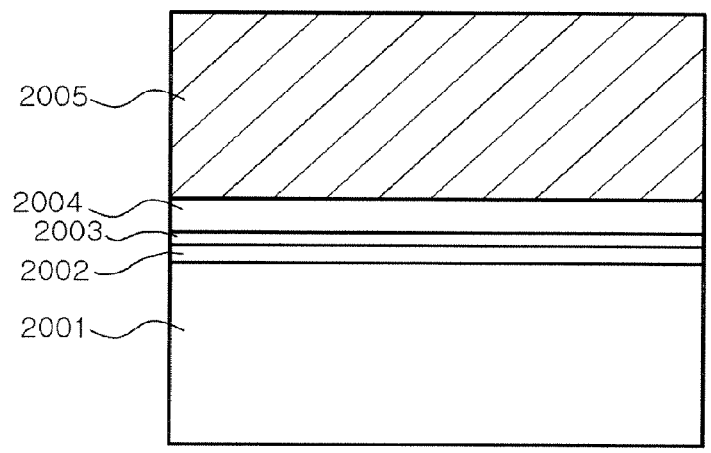

Subsequently, as shown in FIG. 96, a reflective metal layer 2004 and a conductive substrate 2005 are formed on the p-type semiconductor layer 2003 using a method such as plating or sub-mount bonding. Thereafter, although not shown in detail, the substrate 2008 for semiconductor single crystal growth is removed using an appropriate lift-off process such as laser lift-off or chemical lift-off.

Figure 97:
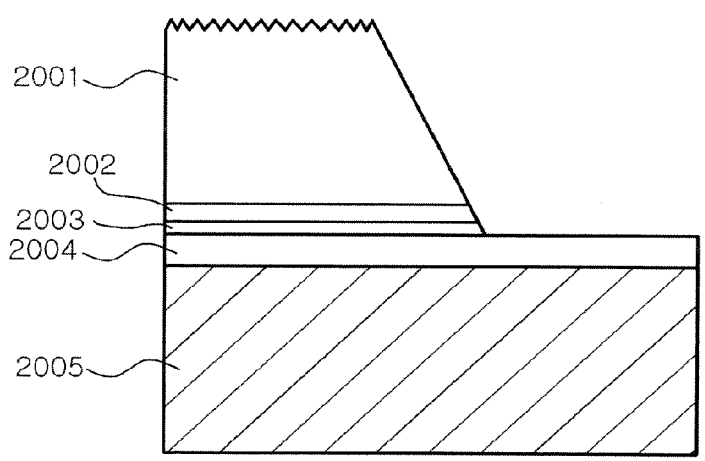

Thereafter, as shown in FIG. 97, a resultant light emitting structure is partially removed for the purpose of dicing it in the unit of devices and forming a passivation layer. In this case, a side surface exposed by the removal may be sloped upward. Furthermore, a process such as wet etching is performed on the top surface of the n-type semiconductor layer 2001, which is exposed by the removal of the substrate for semiconductor signal crystal growth, thereby forming an uneven structure that is contributive to enhancing light extraction efficiency in a vertical direction.

Figure 98:
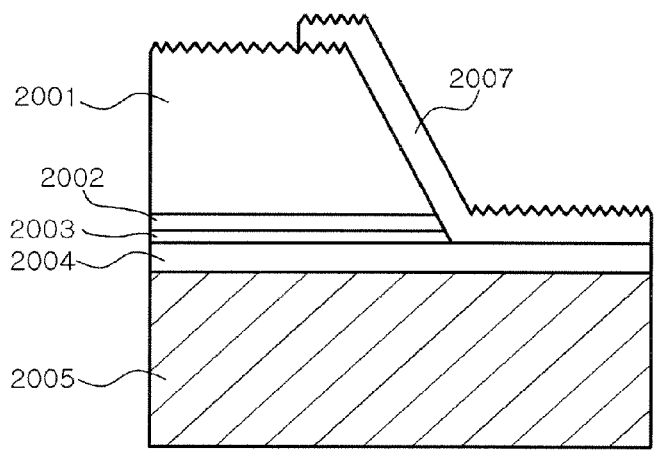

Thereafter, as shown in FIG. 98, a passivation layer 2007 for protecting the light emitting structure is formed. This process may be carried out by appropriately depositing, for example, a silicon oxide or a silicon nitride. An uneven structure may be formed in the light emitting surface of the passivation layer 2007 to thereby enhance luminous efficiency in a lateral direction. In this case, this uneven structure may be formed by appropriately using a dry-etching or wet-etching process known in the art. Also, if necessary, the uneven structure may formed even in another light emitting surface of the passivation layer 2007. After the formation of the passivation layer 2007, an n-type electrode is formed on the top surface of the n-type semiconductor layer 2001, thereby completing a structure illustrated in FIG. 92.

The present invention provides a semiconductor light emitting device having a modified structure from the above vertical structure in order to further enhance electrical characteristics and optical characteristics.

Figure 99:
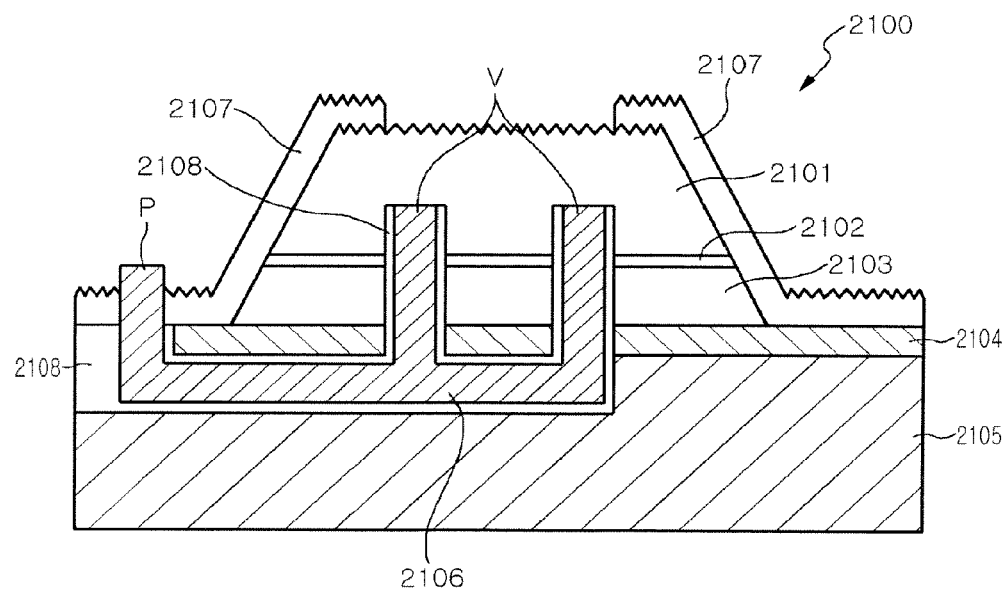

FIG. 99 is a schematic cross-sectional view illustrating a semiconductor light emitting device according to another exemplary embodiment of the present invention. Referring to FIG. 99, a semiconductor light emitting device 2100, according to this embodiment, includes a conductive substrate 2105, a light emitting structure including a first conductivity type semiconductor layer 2103, an active layer 2102 and a second conductivity type semiconductor layer 2101 sequentially formed on the conductive substrate 2105, a second conductivity type electrode 2106 applying an electrical signal to the second conductivity type semiconductor layer 2101, and a passivation layer 2107 having an uneven structure and disposed on the side surface of the light emitting structure. In FIG. 99, the active layer 2102 is placed on a relatively upper level as compared to the structure shown in FIG. 92 or the like. However, the active layer 2102 may be placed at various locations, and may, for example, be located at a similar height to that of the lower portion of the passivation layer 2107.

In the previous embodiment, that is, in the vertical semiconductor light emitting device, the n-type electrode is formed on the surface of the n-type semiconductor layer exposed when removing the sapphire substrate. However, according to this embodiment, an n-type electrode is exposed to the outside from under the n-type semiconductor layer by using a conductive via. In detail, the second conductivity type electrode 2106 includes conductive vias v penetrating the first conductivity type semiconductor layer 2104 and the active layer 2102 and connected to the second conductivity type semiconductor layer 2101 within the second conductivity type semiconductor layer 2101, and an electrical connection portion P extending therefrom and exposed to the outside of the light emitting structure. In this case, the second conductivity type electrode 2106 needs to be electrically separated from the conductive substrate 2105, the first conductivity type semiconductor layer 2103, and the active layer 2102. Therefore, an insulator 2108 is formed appropriately around the second conductivity type electrode 2106. Any material having a low level of electrical conductivity is usable as the insulator 2108; however, a material with a low level of light absorbency is preferred. For example, the insulator 2108 may be formed of the same material as the passivation layer 2107.

The second conductivity type electrode 2106 may be formed of a metallic material that can form an ohmic-contact with the second conductivity type semiconductor layer 2101. Also, the second conductivity type electrode 2106 may be formed entirely of the same material. Alternatively, the electrical connection portion P may be formed of a different material from another part of the second conductivity type electrode 2106, in consideration of the fact that the electrical connection portion P may be used as a bonding pad portion. Regarding the previously described manufacturing process, the first and second conductivity type semiconductor layers 2101 and 2103 may be p-type and n-type semiconductor layers in general, but the present invention is not limited thereto. As shown in FIG. 99, a first contact layer 2104 may be formed as an additional element between the first conductivity type semiconductor layer 2103 and the conductive substrate 2105, and may utilize a metal having a high level of reflectivity, such as Ag or Al. In this case, the first contact layer 2104 and the second conductivity type electrode 2106 are electrically separated from each other by the insulator 2108.

The above electrical connection structure allows the second conductivity type semiconductor layer 2101 to receive an electrical signal from its inside rather than from above. Notably, no electrode is formed on the second conductivity type semiconductor layer 2101, thereby achieving an increase in light emitting area. In addition, the conductive vias V, formed in the second conductivity type semiconductor layer 2101, may contribute to enhancing a current spreading effect. In this case, desired electrical characteristics can be attained by appropriately controlling, for example, the number, area and shape of the conductive vias V. According to this embodiment, the main process such as the formation of the conductive substrate, the removal of the sapphire substrate or the like adopts the process of manufacturing a vertical semiconductor light emitting device, but the device shape obtained by such process is rather similar to a horizontal structure. In this regard, the structure according to this embodiment may be referred to as a combination structure of vertical and horizontal structures.

As in the previous embodiment, the passivation layer 2107 is formed on the side surface or the like of the light emitting structure, and has an uneven structure on the path of light emitted from the active layer 2102, thereby enhancing the extraction efficiency of light emitted in a lateral direction from the active layer 2102 toward the passivation layer 2107. Furthermore, as shown in FIG. 99, an uneven structure may also be formed on the top surface of the second conductivity type semiconductor layer 2101. Although not shown, an uneven portion may also be formed on the sloped side surface of the passivation layer 2107.

Figure 100:
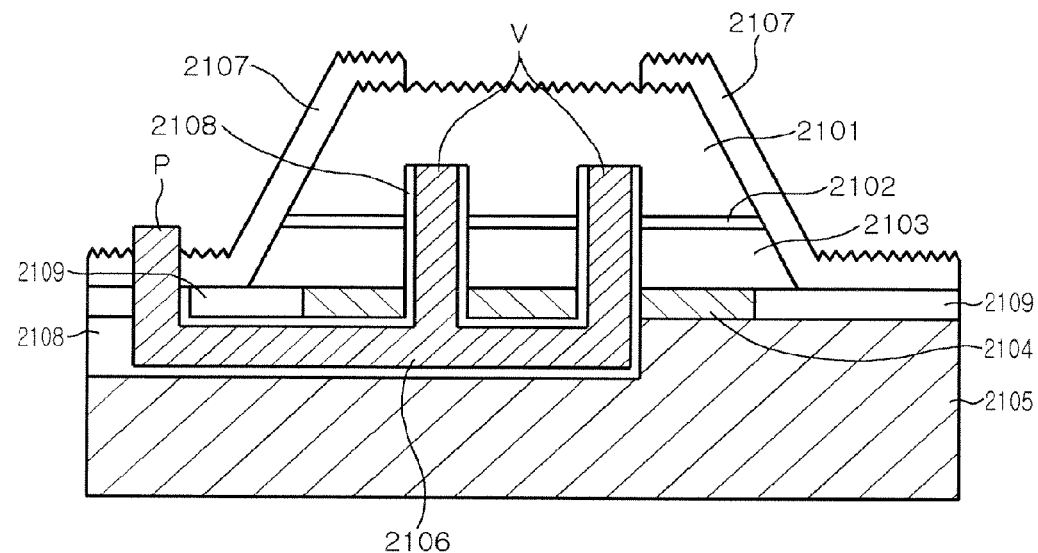

FIG. 100 is a schematic cross-sectional view illustrating a semiconductor light emitting device having a modified structure of that depicted in FIG. 99. An exemplary embodiment depicted in FIG. 100 further includes an etch stop layer 2109 in the structure depicted in FIG. 99. Thus, only the etch stop layer 2109 will now be described. The etch stop layer 2109 is formed on a portion of at least the conductive substrate 2105 on which the light emitting structure is absent, and is formed of a material (e.g., an oxide such as $SiO_2$) that shows a different etching characteristic for a specific etching method from a semiconductor material (e.g., a nitride semiconductor) used in the light emitting structure. An etching depth can be controlled by the etch stop layer 2109 since the light emitting structure can be etched only up to a region where the etch stop layer 2109 is located. In this case, the etch stop layer 2109 and the insulator 2108 may be formed of the same material for ease of the process. When the light emitting structure is etched in order to, for example, expose the second conductivity type electrode 2106 to the outside, this may result in current leakage due to the deposition of the material of the conductive substrate 2105 or the first contact layer 2104 on the side surface of the light emitting structure. Therefore, the etch stop layer 2109 is formed in advance under the light emitting structure, which is to be removed by etching, thereby minimizing the above-mentioned problem.

Figure 101:
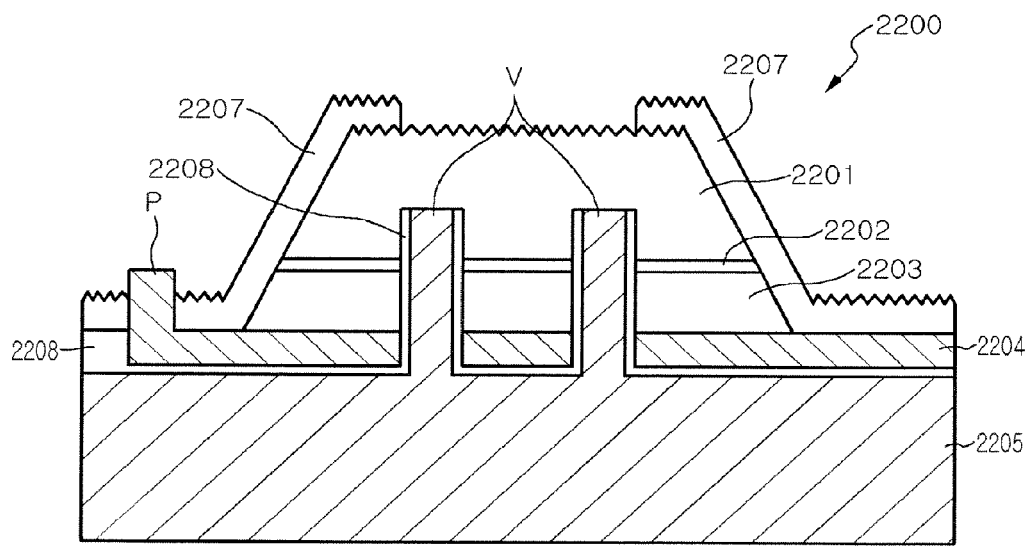
Figure 102:
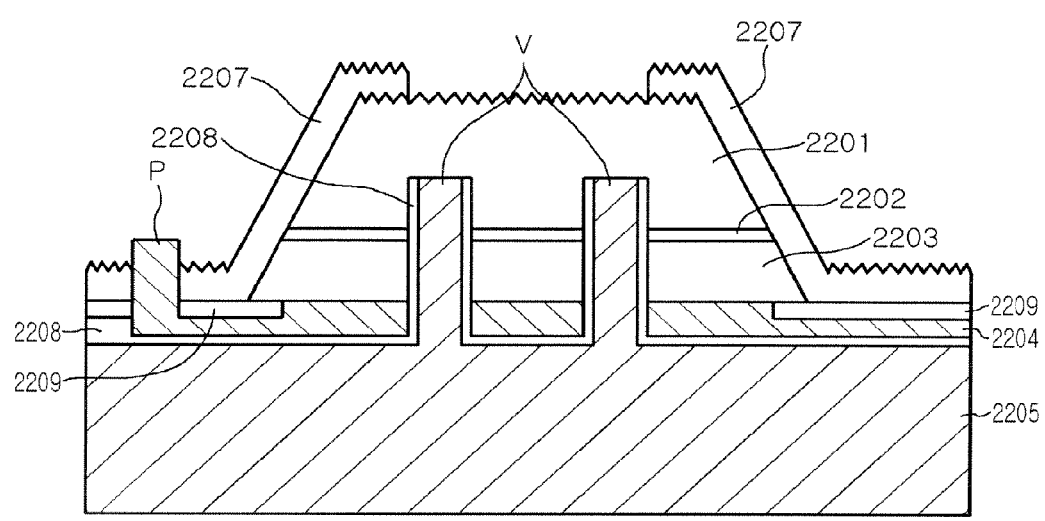

FIG. 101 is a schematic cross-sectional view illustrating a semiconductor light emitting device according to another exemplary embodiment of the present invention. FIG. 102 illustrates a structure further including an etch stop layer in the structure depicted in FIG. 101. Referring to FIG. 101, a semiconductor light emitting device 2200, according to this embodiment, includes a conductivity substrate 2205, a light emitting structure that includes a first conductivity type semiconductor layer 2203, an active layer 2202 and a second conductivity type semiconductor layer 2201 sequentially formed on the conductive substrate 2205, a first contact layer 2204 applying an electrical signal to the first conductivity type semiconductor layer 2203, conductive vias v extending from the conductive substrate 2205 up to the inside of the second conductivity type semiconductor layer 2201, and a passivation layer 2207 formed on the side surface of the light emitting structure and having an uneven structure.

As for differences from the structure described with reference to FIG. 99, the conductive substrate 2205 is electrically connected with the second conductivity type semiconductor layer 2201, and the first contact layer 2204 connected with the first conductivity type semiconductor layer 2203 includes an electrical connection portion P and is thus exposed to the outside. The conductive substrate 2205 may be electrically separated from the first contact layer 2204, the first conductivity type semiconductor layer 2203, and the active layer 2202 by an insulator 2208. That is, this embodiment of FIG. 101 has a structural difference from the embodiment of FIG. 99 in that, in FIG. 101, the first contact layer 2204, connected with the first conductivity type semiconductor layer 2203, is exposed to the outside to thereby provide the electrical connection portion P, whereas, in FIG. 99, the second conductivity type electrode 2106, connected with the second conductivity type semiconductor layer 2101, is exposed to the outside to thereby provide the electrical connection portion P. Effects obtained from this structure other than this difference regarding electrical connections are identical to those described with reference to FIG. 99. As shown in FIG. 102, an etch stop layer 2209 may also be provided. However, the structure in which the first contact layer 2204 is exposed to the outside according to this embodiment depicted in FIG. 101 may actually facilitate the process of forming the insulator 2208, as compared to the embodiment depicted in FIG. 99.

<Light Emitting Device Package and Light Source Module>

A light emitting device package, according to the present invention, includes the above semiconductor light emitting device.

Hereinafter, a light emitting device package including a semiconductor light emitting device will be described according to various exemplary embodiments of the present invention.

Figure 103:
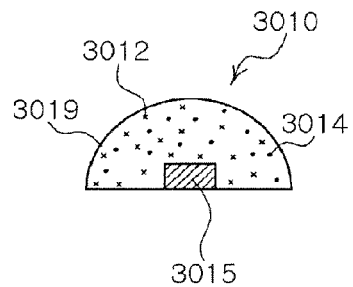
FIGS. 103 through 105 are schematic views illustrating various embodiments of a white light emitting device package according to an exemplary embodiment of the present invention.

FIG. 103 is a schematic view illustrating a white light emitting device package according to an exemplary embodiment of the present invention.

As shown in FIG. 103, a white light emitting device package 3010, according to this embodiment, includes a blue light emitting device 3015, and a resin encapsulant 3019 encapsulating the blue light emitting device 3015 and having an upwardly convex lens shape.

The resin encapsulant 3019, employed in this embodiment, is illustrated as having a hemispheric lens shape for ensuring a wide orientation. The blue light emitting device 3015 may be mounted directly onto a separate circuit board. The resin encapsulant 3019 may be formed of a silicon resin, an epoxy resin or a combination thereof. Green phosphors 3012 and red phosphors 3014 are dispersed within the resin encapsulant 3019.

The green phosphor 3012, applicable to this embodiment, may be at least one selected from the group consisting of a silicate-based phosphor of $M_2SiO_4$:Eu,Re, a sulfide-based phosphor of $MA_2D_4$:Eu,Re, a phosphor of $\beta$-SiAlON:Eu,Re, and an oxide-based phosphor of $M'A'_2O_4$:Ce,Re'.

Here, M denotes at least two elements selected from the group consisting of Ba, Sr, Ca and Mg, A denotes at least one selected from the group consisting of Ga, Al and In, D denotes at least one selected from the group consisting of S, Se and Te, M' denotes at least one selected from the group consisting of Ba, Sr, Ca and Mg, A' denotes at least one selected from the group consisting of Sc, Y, Gd, La, Lu, Al and In, Re denotes at least one selected from the group consisting of Y, La, Ce, Nd, Pm, Sm, Gd, Tb, Dy, Ho, Er, Tm, Yb, Lu, F, Cl, Br and I, and Re' denotes at least one selected from the group consisting of Nd, Pm, Sm, Tb, Dy, Ho, Er, Tm, Yb, F, Cl, Br and I. Furthermore, Re and Re' are added at 1 ppm to 50000 ppm in amount.

The red phosphors 3014, applicable to this embodiment, are at least one selected from the group consisting of nitride-based phosphors of M'AlSiN$_x$:Eu,Re ($1 \leq x \leq 5$) and sulfide-based phosphors of M'D:Eu,Re.

Here, M' denotes at least one selected from the group consisting of Ba, Sr, Ca and Mg, D denotes at least one selected from the group consisting of S, Se and Te, A' denotes at least one selected form the group consisting of Sc, Y, Gd, La, Lu, Al and In, Re denotes at least one selected from the group consisting of Y, La, Ce, Nd, Pm, Sm, Gd, Tb, Dy, Ho, Er, Tm, Yb, Lu, F, Cl, Br and I. Re is added at 1 ppm to 50000 ppm.

According to the present invention, specific green phosphors and specific red phosphors are combined in due consideration of a half amplitude, a peak wavelength and/or conversion efficiency, so that white light having a high color rendering index of 70 or higher can be provided. Since light in various wavelength bands is obtained by multiple phosphors, color reproducibility can be enhanced.

The dominant wavelength of the blue light emitting device may range from 430 nm to 455 nm. In this case, in order to increase a color rendering index by ensuring a wide spectrum in a visible light band, the peak wavelength of light, emitted from the green phosphors 3012, may range from 500 nm to 550 nm, and the peak wavelength of light, emitted from the red phosphors 3014, may range from 610 nm to 660 nm.

The blue light emitting device may have an half amplitude ranging from 10 nm to 30 nm, and the green phosphors may have a half amplitude ranging from 30 nm to 100 nm, and the red phosphors may have a half amplitude ranging from 50 nm to 150 nm.

According to another exemplary embodiment of the present invention, yellow or yellowish orange phosphors may be used in addition to the red phosphors 3014 and the green phosphors 3012. This may ensure an improved color rendering index. An associated embodiment is illustrated in FIG. 104.

Figure 104:
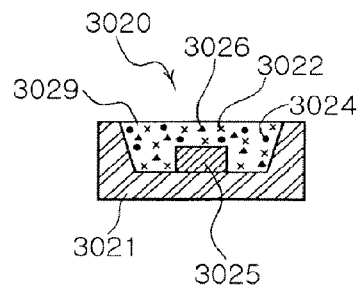

Referring to FIG. 104, a white light emitting device package 3020, according to this embodiment, includes a package body 3021 having a reflective cup in its center, a blue light emitting device 3025 mounted on the bottom of the reflective cup, and a transparent resin encapsulant 3029 encapsulating the blue light emitting device 3025 in the reflective cup.

The resin encapsulant 3029 may be formed of, for example, a silicon resin, an epoxy resin or a combination thereof; however, the invention is not limited thereto. According to this embodiment, the resin encapsulant 3029 contains yellow phosphors or yellowish orange phosphors 3026 in addition to green phosphors 3022 and red phosphors 3012 that are the same as those described with reference to FIG. 103.

That is, the green phosphors 3022 may be at least one selected from the group consisting of silicate-based phosphors of M$_2$SiO$_4$:Eu,Re, sulfide-based phosphors of MA$_2$D$_4$:Eu,Re, phosphors of β-SiAlON:Eu,Re, and oxide-based phosphors of M'A'$_2$O$_4$:Ce,Re'. The red phosphors 3024 may be at least one of nitride-based phosphors of M'AlSiN$_x$:Eu,Re ($1 \leq x \leq 5$) and sulfide-based phosphors of M'D:Eu,Re.

According to this embodiment, third phosphors 3026 are further included. The third phosphors may be yellow or yellowish orange phosphors that can emit light within an intermediate wavelength band between green and red light wavelength bands. The yellow phosphors may be silicate-based phosphors, and the yellowish orange phosphors may be phosphors of α-SiAlON:Eu,Re.

According to the exemplary embodiments above, two or more kinds of phosphor powders are mixed and dispersed in a single resin encapsulant region; however they may be variously modified in structure. In greater detail, the two or three kinds of phosphors may be provided in respectively different layers. For example, the green phosphors, the red phosphors and the yellow or yellowish orange phosphors may be provided as a multilayer phosphor structure by distributing powders thereof under high pressure.

Alternatively, the phosphor structure may be implemented as multilayer phosphor-containing resin layers.

Figure 105:
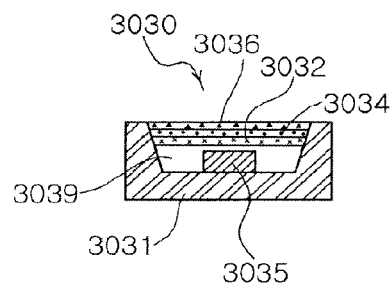

Referring to FIG. 105, a white light emitting device package 3030, according to this embodiment, includes a package body 3031 having a reflective cup in its center, a blue light emitting device 3035 mounted on the bottom of the reflective cup, and a transparent resin encapsulant 3039 encapsulating the blue light emitting device 3035 in the reflective cup, as in the previous embodiment.

Resin layers, each containing different kinds of phosphors, are provided on the resin encapsulant 3039. That is, a wavelength conversion part may be configured such that it has a first resin layer 3032 containing the green phosphors, a second resin layer 3034 containing the red phosphors, and a third resin layer 30306 containing the yellow or yellowish orange phosphors.

The phosphors used in this embodiment may be identical or similar phosphors to those described with reference to FIG. 104.

White light, obtained by the combination of the phosphors proposed by the present invention, can ensure a high rendering index. This will now be described in more detail with reference to FIG. 106.

Figure 106:
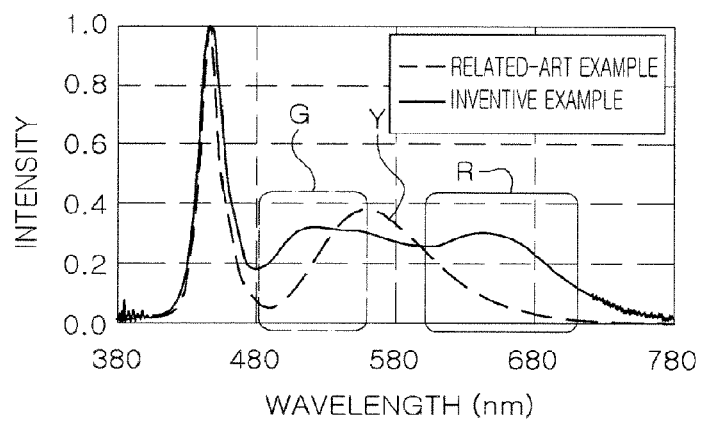
FIG. 106 illustrates the light emission spectrum of a white light emitting device package according to an exemplary embodiment of the present invention.
Figure 107:
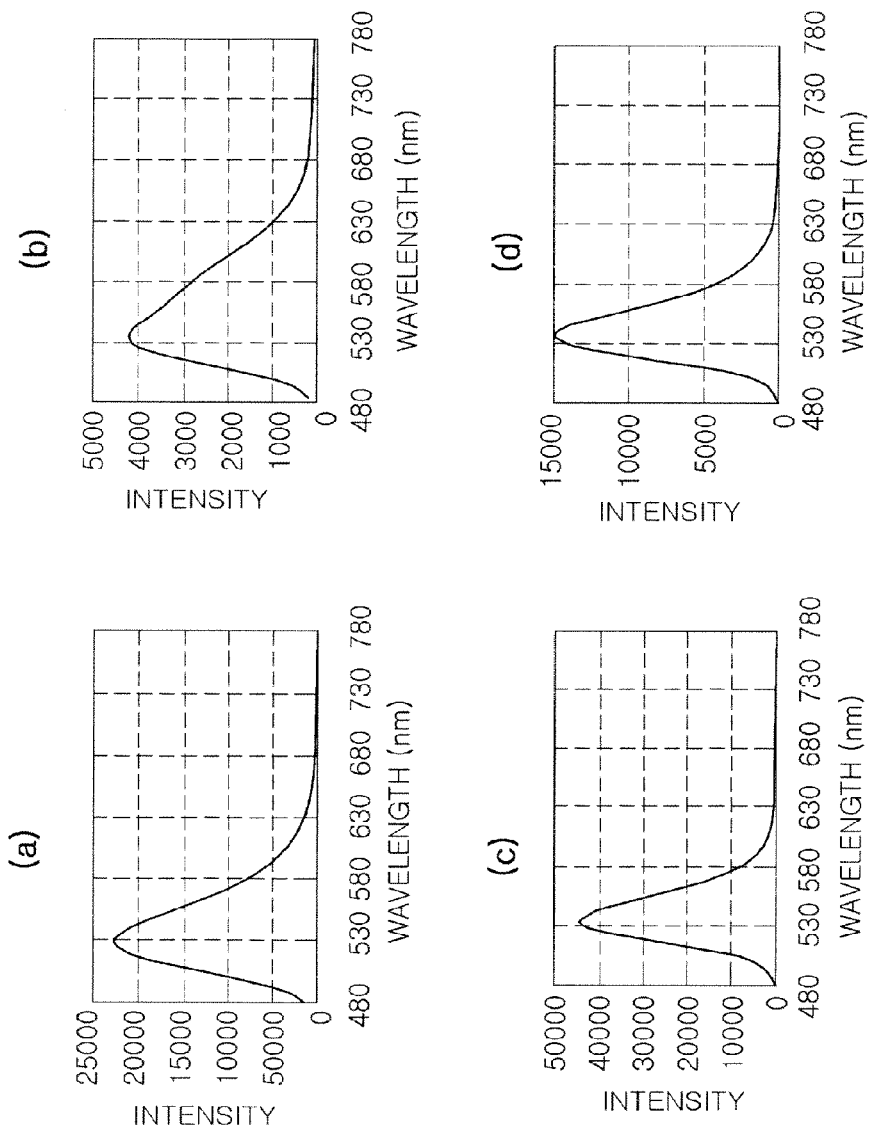
FIGS. 107A through 107D illustrate the light emission characteristics of green phosphors applicable to the present invention.

Referring to FIG. 106, in a related-art example, yellow phosphors are combined with a blue light emitting device, thereby obtaining converted yellow light as well as light in a blue wavelength band. Since the overall visible light spectrum contains virtually no light from the green and red wavelength bands, it is difficult to ensure a color rendering index close to natural light. Notably, the converted yellow light has a small half-amplitude in order to achieve high conversion efficiency, which further lowers the color rendering index.

Comparative to the above, in an inventive example, green phosphors G and red phosphors R are combined with a blue light emitting device. Since light is emitted in green and red wavelength bands, unlike in the case of the comparative example, a wider spectrum can be obtained in the visible light band, thereby significantly enhancing a color rendering index. Additionally, the color rendering index can be further enhanced by adding yellow or yellowish orange phosphors that can emit light in an intermediate wavelength band between the green and red wavelength bands.

With reference to FIGS. 107A through 109B, the green phosphors, the red phosphors, and the selectively added yellow and yellowish orange phosphors, employed in the present invention, will now be described.

FIGS. 107A through 109B illustrate the wavelength spectrums of phosphors proposed by the present invention, regarding light generated from a blue light emitting device (about 440 nm).

FIGS. 107A through 107D illustrate spectrums regarding green phosphors employed in the present invention.

First, FIG. 107A illustrates the spectrum of silicate-based phosphors of M$_2$SiO$_4$:Eu,Re where M denotes at least two selected from the group consisting of Ba, Sr, Ca and Mg, Re denotes at least one selected from the group consisting of Y, La, Ce, Nd, Pm, Sm, Gd, Tb, Dy, Ho, Er, Tm, Yb, Lu, F, Cl, Br and I, and Re is in the range of 1 ppm to 50,000 ppm. Converted green light has a peak wavelength of about 530 nm, and a half amplitude of about 65 nm.

FIG. 107B illustrates the spectrum of oxide-based phosphors of M'A'$_2$O$_4$:Ce,Re', where M' denotes at least one selected from the group consisting of Ba, Sr, Ca and Mg, A' denotes at least one selected from the group consisting of Sc, Y, Gd, La, Lu, Al and In, Re' is at least one selected from the group consisting of Nd, Pm, Sm, Tb, Dy, Ho, Er, Tm, Yb, F, Cl, Br and I, and Re' is in the range of 1 ppm to 50,000 ppm. Converted green light has a peak wavelength of about 515 nm, and a half amplitude of about 100 nm.

FIG. 107C illustrates the spectrum of sulfide-based phosphors of MA$_2$D$_4$:Eu,Re where M denotes at least two selected from the group consisting of Ba, Sr, Ca and Mg, A denotes at least one selected from the group consisting of Ga, Al and In, D denotes at least one selected from the group consisting of S, Se and Te, Re denotes at least one selected from the group consisting of La, Ce, Nd, Pm, Sm, Gd, Tb, Dy, Ho, Er, Tm, Yb, Lu, F, Cl, Br and I, and Re is in the range of 1 ppm to 50,000 ppm. Converted green light has a peak wavelength of about 636 nm and a half amplitude of about 60 nm.

FIG. 107D illustrates the spectrum of phosphors of β-SiAlON:Eu,Re where Re denotes at least one selected from the group consisting of Y, La, Ce, Nd, Pm, Sm, Gd, Tb, Dy, Ho, Er, Tm, Yb, Lu, F, Cl, Br and I, and Re is in the range of 1 ppm to 50,000 ppm. Converted green light has a peak wavelength of about 540 nm, and a half amplitude of about 45 nm.

FIGS. 108A and 108B illustrate the spectrums of red phosphors employed in the present invention.

Figure 108:
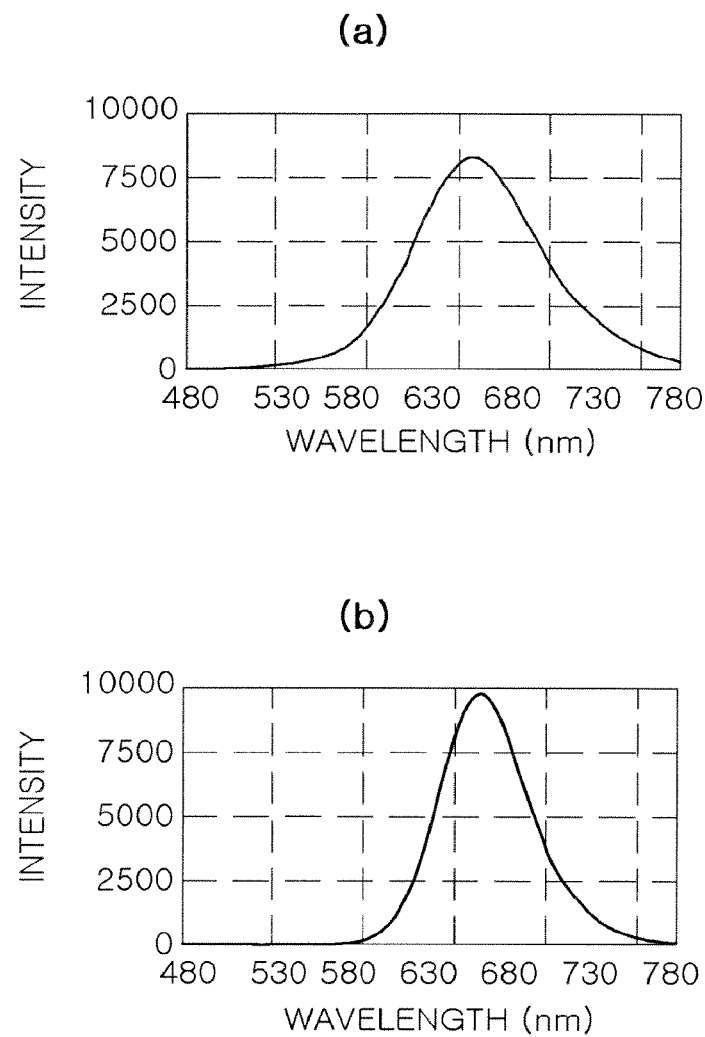
FIG. 108A and FIG. 108B illustrate light emission spectrums showing the light emission characteristics of green phosphors applicable to the preset invention.
Figure 109:
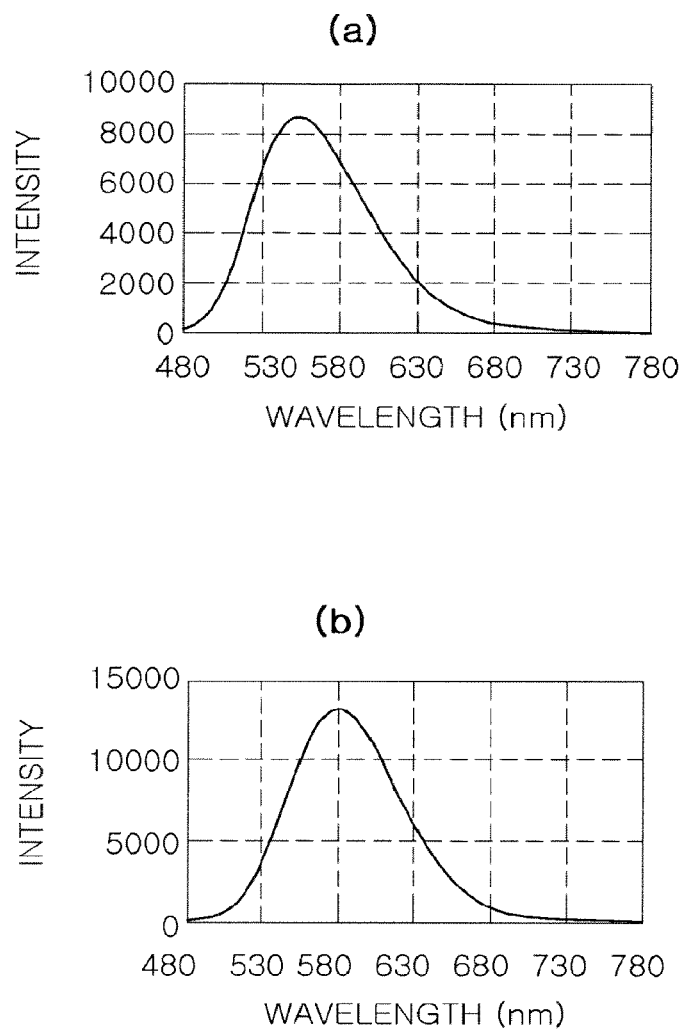
FIGS. 109A and 109B illustrate light emission spectrums showing the light emission characteristics of yellow phosphors applicable to the present invention.

FIG. 108$a$ illustrates the spectrum of nitride-based phosphors of M'AlSiN$_x$:Eu,Re (1≤x≤5) where M' denotes at least one selected from the group consisting of Ba, Sr, Ca and Mg, Re denotes at least one selected from the group consisting of Y, La, Ce, Nd, Pm, Sm, Gd, Tb, Dy, Ho, Er, Tm, Yb, Lu, F, Cl, Br and I, and Re is in the range of 1 ppm to 50,000 ppm. Converted red light has a peak wavelength of about 640 nm, and a half amplitude of about 85 nm.

FIG. 108B illustrates the spectrum of sulfide-based phosphors of M'D:Eu,Re where M' denotes at least one selected from the group consisting of Ba, Sr, Ca and Mg, D denotes at least one selected from the group consisting of S, Se and Te, Re denotes at least one selected from the group consisting of Y, La, Ce, Nd, Pm, Sm, Gd, Tb, Dy, Ho, Er, Tm, Yb, Lu, F, Cl, Br and I, and Re is in the range of 1 ppm to 50000 ppm. Converted red light has a peak wavelength of about 655 nm and a half amplitude of about 55 nm.

FIGS. 109A and 109B illustrate the spectrums of yellow or yellowish orange phosphors selectively employed in the present invention.

FIG. 109A illustrates the spectrum of silicate-based phosphors. Converted yellow light has a peak wavelength of about 555 nm and a half amplitude of about 90 nm.

FIG. 109B illustrates the spectrum of phosphors of α-SiAlON:Eu,Re where Re denotes at least one selected from the group consisting of Y, La, Ce, Nd, Pm, Sm, Gd, Tb, Dy, Ho, Er, Tm, Yb, Lu, F, Cl, Br and I, and Re is in the range of 1 ppm to 50,000 ppm. Converted yellow light has a peak wavelength of about 580 nm and a half amplitude of about 35 nm.

According to the present invention, specific green phosphors and specific red phosphors are combined or yellow or yellowish orange phosphors are added to this combined phosphors in consideration of the half amplitude, the peak wavelength and/or conversion efficiency. Accordingly, white light having a high color rendering index of 70 or higher can be provided.

When the dominant wavelength of the blue light emitting device ranges from 430 nm to 455 nm, the peak wavelength of light emitted from the green phosphors may range from 500 nm to 550 nm, and the peak wavelength of light emitted from the red phosphors may range from 610 nm to 660 nm. The peak wavelength of light emitted from the yellow or yellowish orange phosphors may range from 550 nm to 600 nm.

When the blue light emitting device has a half amplitude ranging from 10 nm to 30 nm, the green phosphors may have a half amplitude ranging from 30 nm to 100 nm, and the red phosphors may have a half amplitude ranging from 50 nm to 150 nm. The yellow or yellowish orange phosphors may have a half amplitude ranging from 20 nm to 100 nm.

According to the present invention, a wide spectrum can be ensured in a visible light band according to the selections and combinations of the phosphors, and superior white light having a higher color rendering index can be provided.

Figure 110:
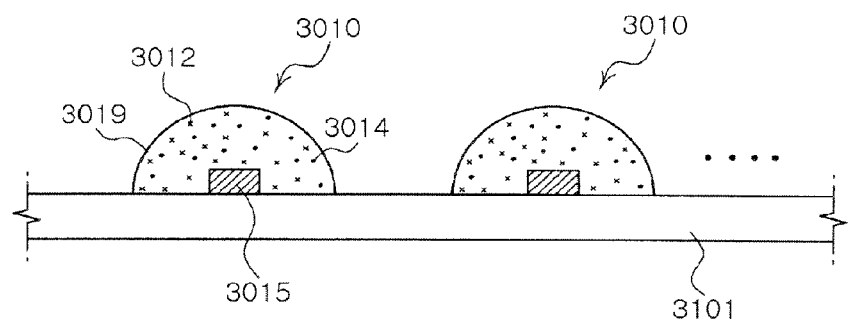
FIGS. 110 and 111 are cross-sectional views illustrating white various embodiments of a white light source module according to another exemplary embodiment of the present invention.
Figure 111:
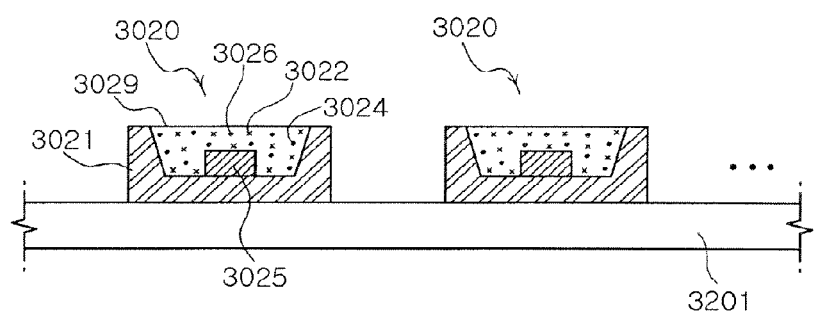

Such a light emitting device package may provide a white light source module that can be useful as a light source for an LCD backlight unit. Namely, the white light source module, according to this embodiment, may constitute a backlight assembly as a light source for an LCD backlight unit by being combined with various optical members such as a diffusing plate, a light guide plate, a reflective plate and a prism sheet. FIGS. 110 and 111 illustrate such white light source module.

Referring to FIG. 110, a light source module 3100 for an LCD backlight includes a circuit board 3101 and an array of a plurality of white light emitting device packages mounted on the circuit board 3101. A conductive pattern (not shown), connected with LED devices 3010, may be formed on the top surface of the circuit board 3101.

Each of the white light emitting device packages 3010 may be understood as a white light emitting device package described with reference to FIG. 103. That is, the blue light emitting device 3015 is mounted directly on the circuit board 3101 by using a chip-on-board (COB) method. Each of the white light emitting device packages 3010 includes the hemispherical resin encapsulant 3019 equipped with a lens function and having no separate reflective wall, thereby attaining a wide angle of orientation. The wide angle of orientation of each white light source may contribute to reducing the size (thickness or width) of an LCD.

Referring to FIG. 111, a light source module 3200 for an LCD backlight includes a circuit board 3201 and an array of a plurality of white light emitting device packages 3020 mounted on the circuit board 3201. As described above with reference to FIG. 104, the white light emitting device package 3020 includes the blue light emitting device 3025 mounted in the reflective cup of the package body 3021, and the resin encapsulant 3029 encapsulating the blue light emitting device 3025. The resin encapsulant 3029 may contain the yellow or yellowish orange phosphors 3026 dispersed therein, as well as the green and red phosphors 3022 and 3024.

Figure 112:
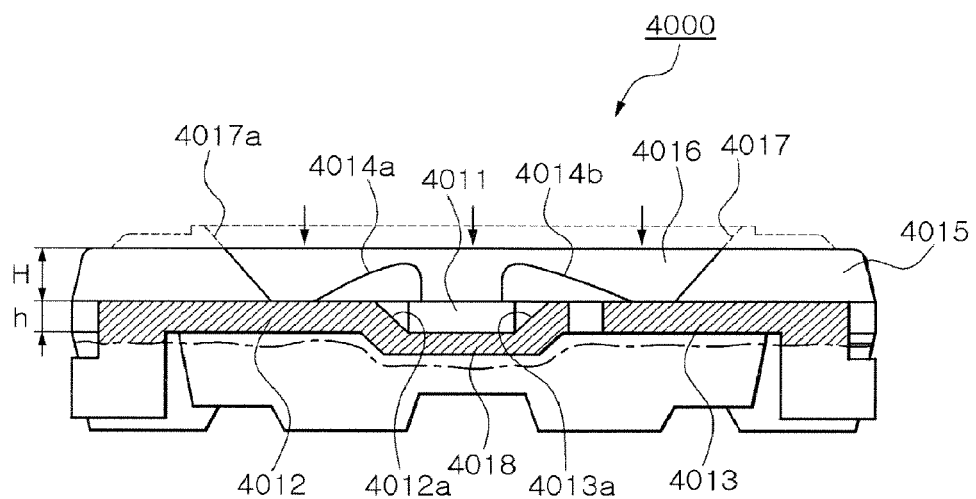
FIGS. 112 and 113 are schematic views illustrating various embodiments of a light emitting device package according to another exemplary embodiment of the present invention.

FIG. 112 is a cross-sectional view illustrating a light emitting device package according to another exemplary embodiment of the present invention.

Referring to FIG. 112, a light emitting device package 400, according to this embodiment, includes a light emitting device 4011, electrode structures 4012 and 4013, a package body 4015, a transmissive transparent resin 4016 and a recess 4018 on which the light emitting device 4011 is mounted.

The light emitting device 4011 is bonded and connected with one set of the ends of the (metallic) wires 4014$a$ and 4014$b$. The electrode structures 4012 and 4013 are bonded and connected with the other set of the ends of the pair of wires 4014$a$ and 4014$b$, respectively.

Here, the light emitting devices according to the above-described exemplary embodiment of the present invention may be used as the light emitting device 4011 of this embodiment.

The package body 4015 is a molded structure obtained by injecting-molding a resin material, and includes a cavity 4016 having a closed bottom and an open top.

Here, the cavity 4017 has an upper slope surface inclined at a predetermined angle. A reflective member 4017a, formed of a metallic material having a high reflectivity such as Al, Ag or Ni, may be provided on the upper slope surface so as to reflect light generated from the reflective member 4017a.

The package body 4015 is fixed by the pair of electrode structures 4012 and 4013 molded integrally with the package body 4015. The top surface of each of the electrode structures 4012 and 4013 has one end portion exposed to the outside through the bottom of the cavity 4017.

The other end portion of each of the electrode structures 4012 and 4013 is exposed to the outside of the package body 4015 and is connected with an external power source.

The recess 4018 is formed by downwardly recessing the top surfaces of the electrode structures 4012 and 4013, exposed in the bottom of the cavity 4017, to a predetermined depth. Here, the recess 4018 may be formed in one electrode structure 4012 of the pair of electrode structures 4012 and 4013 on which the light emitting device 4011 is mounted.

The recess 4018 is provided in the form of a downwardly bent portion at one end portion of the electrode structure 4012 where at least one light emitting device 4011 is mounted. This bent portion includes a flat mounting surface on which the light emitting device 4011 is mounted, and a pair of lower slope surfaces respectively extending upward at a predetermined angle from the left and right sides of the mounting surface and facing the outer surface of the light emitting device 4011.

The lower slope surfaces 4012a and 4013a may be provided with a reflective member to reflect light generated from the light emitting device 4011.

The recess 4018 may formed at a depth H ranging from 50 μm to 400 μm in due consideration of the height h of the mounted light emitting device 4011. This may reduce the height H of the cavity 4017 of the package body up to 150 μm to 500 μm, and also reduce the amount of transmissive transparent resin filled in the cavity 4017. Accordingly, manufacturing costs can be reduced, light intensity can be enhanced, and a reduction in the overall size of products can be achieved.

Figure 113:
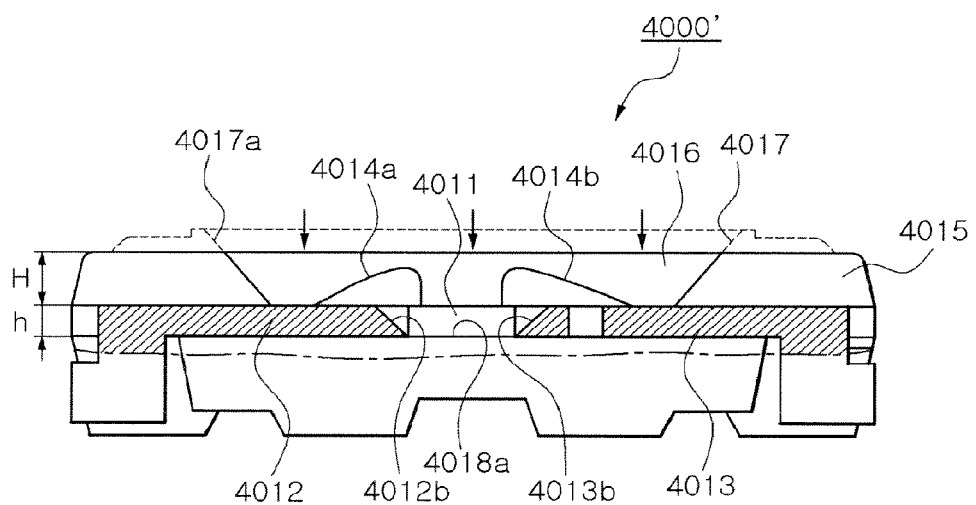

FIG. 113 is a cross-sectional view illustrating a light emitting device package according to a modified embodiment from the embodiment illustrated in FIG. 112.

As shown in FIG. 113, the light emitting device package, according to this modified embodiment, includes a hole 4018a instead of the recess 4018, between the opposing end portions of the pair of electrode structures 4012 and 4013. The hole 4018a is formed by recessing the bottom of the cavity 4017 to a predetermined depth when the package body 4015 is molded.

In this modified embodiment, elements other than the hole 4018a are identical to those of the light emitting device package according to the exemplary embodiment of FIG. 112, and the descriptions thereof will be omitted.

The transmissive transparent resin 4016 is formed of a transparent resin material such as epoxy, silicon or resin. Such a transparent resin material is filled in the cavity 4017 in order to cover and protect the light emitting device 4011 and wires 4014a and 4014b against external conditions.

Here, the transmissive transparent resin 4016 may include one of wavelength converting phosphors among YAG-, TAG-, silicate-, sulfide- or nitride-based phosphors capable of converting light, generated from the light emitting device 4011, into white light.

The YAG- and TAG-based phosphors may be selected from (Y, Tb, Lu, Sc, La, Gd, Sm)3(Al, Ga, In, Si, Fe)5(O, S)12:Ce, and the silicate-based phosphors may be selected from (Sr, Ba, Ca, Mg)2SiO4: (Eu, F, Cl). The sulfide-based phosphors may be selected from (Ca,Sr)S:Eu, (Sr,Ca,Ba)(Al,Ga)2S4:Eu. The nitride-based phosphors may be selected from phosphor components of (Sr, Ca, Si, Al, O)N:Eu (e.g., CaAlSiN4:Eu β-SiAlON:Eu) or Ca-α SiAlON:Eu-based (Ca$_x$,M$_y$)(Si,Al)12(O,N)16 where M denotes at least one of Eu, Tb, Yb and Er, $0.05<(x+y)<0.3$, $0.02<x<0.27$ and $0.03<y<0.3$.

The white light may be generated by combining a blue (B) light emitting device with yellow (Y) phosphors, green (G) and red (R) phosphors, or yellow (Y), green (G) and red (R) phosphors. The yellow, green and red phosphors are excited by the blue light emitting device to thereby respectively emit yellow light, green light and red light. The yellow light, the green light and the red light are mixed with a part of blue light emitted from the blue light emitting device, so that the white light is output.

A detailed description of those phosphors for white-light output has been made in detail in the above-described embodiments, and thus is omitted in this modified example.

Lower slope surfaces 4012b and 4013b may be formed at the end portions of the electrode structures 4012 and 4013 facing the outer surface of the light emitting device 4011 mounted in the hole 4018a. In this case, a reflective member is provided on the lower slope surfaces 4012b and 4013b and reflects light emitted from the light emitting device 4011.

As for the light emitting device packages 4000 and 4000', the light emitting device 4011 disposed at the very center of the cavity 4017 is mounted on the mounting surface of the recess formed by downwardly bending the electrode structure 4012, or in the hole 4018a formed between the opposing end portions of the electrode structures 4012 and 4013. Accordingly, the top surface of the light emitting device 4011, wire-bonded with the electrode structures 4012 and 4013 using the wires 4014a and 4014b, may be located on roughly the same level as the top surfaces of the electrode structures 4012 and 4013.

Accordingly, the maximum height of the wires 4014a and 4014b wire-bonded with the light emitting device 4011 can be lowered by the lowered mounting height of the light emitting device 4011.

This reduction in height ensures a reduction in the amount of transmissive transparent resin 4016 filled in the cavity to protect the light emitting device 4011 and the wires 4014a and 4014b. Also, the filling height H of the transmissive transparent resin 4016 can be decreased by the reduced height of the mounted light emitting device 4011. Accordingly, the intensity of light, emitted from the light emitting device 4011, can be enhanced relative to the related art.

Since the filling height H of the transmissive transparent resin 4016 in the cavity 4017 is lowered, the level of the top of the package body 4015 is lowered by the lowered filling height. Thus, a reduction in the overall size of the package can be achieved.

Figure 114:
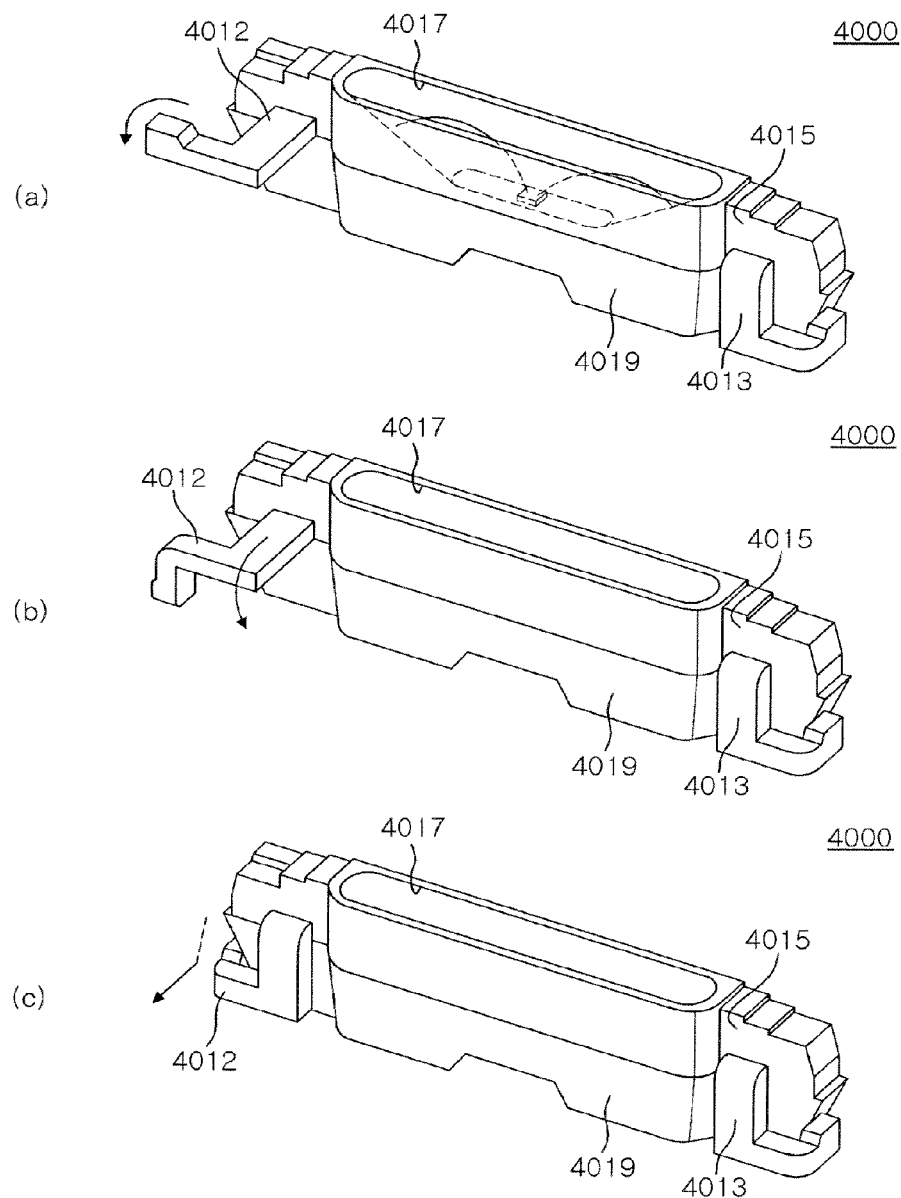
FIGS. 114A through 114C are schematic views illustrating the process of forming an external lead frame in the light emitting device package depicted in FIG. 112.

FIGS. 114A through 114C are schematic views illustrating the process of an external lead frame in the light emitting device package according to this embodiment.

As shown in FIG. 114A, the electrode structures 4012 and 4013, which are respectively cathode and anode electrodes, are fixed integrally to the package body 4015 injection-molded mostly using a resin material. However, their end portions are exposed to the outer side of the package body 4015 and connected with an external power source.

The electrode structures 4012 and 4013, downwardly exposed to the outside of the package body 4015, are bent toward the side surface and/or the bottom surface of the package body such that the electrode structures 4012 and 4013 are bent in an opposite direction to the light emitting surface where the cavity 4017 is formed.

The electrode structures 4012 and 4013 are bent toward the side surface and/or the back surface (rear or lower portion) of the mounting surface (bottom surface 4019) of the package.

As for the process of forming such electrode structures 4012 and 4013, as shown in FIG. 114B, the end portion of the exposed electrode structure 4012 is bent first to conform with the shape of the side surface of the package 4000, and is then bent rearward of the bottom 4019 of the package to thereby complete the overall shape of the electrode structure 4012 as shown in FIG. 114B.

Hereinafter, a method of manufacturing β-sialon phosphors among the above-described phosphors, which can be regulated to have high light intensity and desired particle characteristics.

The method of manufacturing β-sialon phosphors according to the present invention relates to manufacturing β-sialon phosphors having a chemical formula expressed as $Si_{(6-x)}Al_xO_yN_{(6-y)}$: Lnz where Ln is a rare-earth element and $0<x\leq4.2$, $0<y\leq4.2$ and $0<z\leq1.0$ are satisfied. The method of manufacturing the β-sialon phosphors includes: preparing a raw-material mixture by mixing a base raw material with an activator raw material activating the base raw material, the base raw material including a silicon raw material containing metal silicon, and an aluminum raw material including at least one of metal aluminum and an aluminum compound; and heating the raw-material mixture in a nitrogen atmosphere According to the present invention, raw materials are mixed and heated in a nitrogen atmosphere to thereby manufacture β-sialon phosphors. The raw materials include silicon, aluminum and a rare-earth metal acting as an activator.

The silicon raw material refers to a raw material containing silicon, and may include only metal silicon or both metal silicon and a silicon compound mixed therewith. The silicon compound may utilize silicon nitride or silicon oxide.

The metal silicon may be high-purity metal silicon that is in a powder phase with a low content of impurities such as Fe. In the case of metal silicon powder, the particle size or distribution thereof do not have a direct influence on the particle composition of phosphors. However, depending on the firing conditions or the raw material being mixed, the particle size or distribution of the silicon powder affects particle characteristics such as the particle size and the shape of phosphors, and also affects the light emitting characteristic of the phosphors. In this regard, the particle size of the metal silicon powder may be 300 μm or less.

Regarding reactivity, the smaller the particle size of the metal silicon is, the higher the reactivity becomes. However, since the reactivity is also affected by a raw material being mixed or a firing rate, the metal silicon does not necessarily have a small particle size, and is not limited to the powder phase.

The aluminum raw material may include metal aluminum, an aluminum compound containing aluminum or both. The aluminum compound containing aluminum may be, for example, aluminum nitride, aluminum oxide or aluminum hydroxide. In the event that the metal silicon is used as the silicon raw material, the aluminum raw material does not need to utilize metal aluminum and may utilize only the aluminum compound.

In the event that the metal aluminum is used, high-purity metal aluminum that is in a powder phase with a low content of impurities such as Fe may be used. Regarding the above-described viewpoint, the metal aluminum may have a particle size of 300 μm or less. However, since raw materials being mixed or a firing rate have their influence even in the case of the metal aluminum, the metal aluminum does not necessarily have a small particle size, and is not limited to the powder phase.

The activator raw material may utilize a rare-earth metal selected from the group consisting of Eu, Ce, Sm, Yb, Dy, Pr, and Tb. In detail, an example thereof may include an oxide such as $Eu_2O_3$, $Sm_2O_3$, $Yb_2O_3$, $CeO$, $Pr_7O_{11}$ or $Tb_3O_4$, $Eu(NO_3)_3$, or $EuCl_3$. Preferably, the activator raw material may be Eu or Ce.

By controlling a mixing ratio between the silicon raw material and the aluminum raw material, the particle characteristic of the β-sialon phosphors may be controlled. Furthermore, the particle characteristic of the β-sialon phosphors may be controlled by controlling a mixing ratio between the silicon compound and the metal silicon of the silicon raw material, or a mixing ratio between the aluminum compound and the metal aluminum of the aluminum raw material. The effects of the raw materials of the metal silicon or the metal aluminum will be described in greater detail through inventive examples that will be described later.

The β-sialon phosphors, manufactured according to the present invention, may have the following chemical formula 1: $Si(6-x)Al_xO_yN(6-y)$: Lnz . . . Chemical formula 1 where Ln is a rare-earth element, and $0<x\leq4.2$, $0<y\leq4.2$, and $0<z\leq1.0$ are satisfied. The β-sialon phosphors may be green light emitting phosphors, and the peak wavelength thereof may range from 500 nm to 570 nm.

As described above, the activator raw material, containing a rare-earth element such as Eu, Sm, Yb, Ce, Pr of Tb as an activator, is measured and mixed to the silicon raw material containing the metal silicon, and the aluminum raw material containing at least one of the metal aluminum and the aluminum compound. Thereafter, a boron nitride (BN) crucible is filled with this raw-material mixture and is fired at high temperature under a nitrogen atmosphere, thereby manufacturing β-sialon phosphors.

Phosphors are produced from the raw-material mixture by being fired at a high temperature in the nitrogen atmosphere. Here, the $N_2$ concentration in the nitrogen atmosphere may be 90% or higher. Also, the gas pressure in the nitrogen atmosphere may range from 0.1 Mpa tp 20 Mpa. To create the nitrogen atmosphere, a vacuum state may be formed and a nitrogen atmosphere may be then introduced. Alternatively, the nitrogen atmosphere may be introduced without forming a vacuum state, and it may be introduced discontinuously.

When the raw-material mixture including the metal silicon is fired in the nitrogen atmosphere, nitrogen reacts with silicon and thus nitrides the silicon to thereby form sialon, so that the nitrogen gas serves as a nitrogen supply source. At this time, since the silicon, aluminum and the activator raw material react together before or during the nitriding process, sialon with a uniform composition can be manufactured. In such a manner, the light intensity of the produced β-sialon phosphors can be improved.

Heating in this firing process may be conducted at a high temperature ranging from 1850° C. to 2150° C. This heating temperature may be varied according to the composition of the raw material. However, to produce phosphors having high light intensity, the firing may be carried out at a high temperature ranging from 1900° C. to 2100° C. under a gas pressure of 0.8 Mpa or higher. After the heating process, milling or classification may be performed in order to control the particle characteristics of the heated raw-material mixture. The milled or classified raw-material compound may be re-fired at a high temperature.

Hereinafter, the present invention will now be described in greater detail with reference to inventive examples of producing β-sialon phosphors using the method of manufacturing β-sialon phosphors according to the present invention.

In the following exemplary embodiments, raw materials are made into a mixture by measuring predetermined amounts of activator raw material as well as silicon and aluminum raw materials, which are the base raw materials, and mixing them using a ball mill or a mixer. The resultant raw-material mixture is put into a high-temperature-resistant container such as a BN crucible and is then put into an electric furnace where pressure-firing or vacuum-firing takes place. This is increased in temperature at a temperature-raising rate of 20° C./minute under a gas pressure of 0.2 Mpa to 2 Mpa in a nitrogen atmosphere, and thus heated to 1800° C. or higher, thereby manufacturing β-sialon phosphors.

Inventive examples 1 through 9 involve manufacturing phosphors by varying silicon raw materials, the aluminum raw material and the mixing ratios therebetween, and comparative examples 1 through 3 involve manufacturing phosphors using a silicon raw material without metal silicon.

All the phosphors manufactured according to the inventive examples 1 through 9 and the comparative examples 1 through 3 are Eu-activated β-sialon phosphors, and are green light emitting phosphors having a peak wavelength ranging from 520 nm to 560 nm.

INVENTIVE EXAMPLE 1

Silicon nitride ($Si_3N_4$) and metal silicon (Si) were used as a silicon raw material, alumina ($Al_2O_3$) was used as an aluminum raw material, and europium oxide ($Eu_2O_3$) was used as an activator. $Si_3N_4$ of 4.047 g, Si of 5.671 g, $Al_2O_3$ of 0.589 g, and $Eu_2O_3$ of 0.141 g were measured and mixed using a mixer and a sieve, and was then filled in a BN crucible and set into a pressure-resistant furnace. In a firing process, heating is carried out up to 500° C. in a vacuum, and an $N_2$ gas was introduced at 500° C. Under the $N_2$ atmosphere, the temperature was raised from 500° C. to 1950° C. at 5° C./minute, and firing was performed thereon at 1950° C. under the gas pressure of 0.8 Mpa or higher for five hours.

Cooling was performed after the firing process, and the crucible was taken out of the electric furnace. Thereafter, phosphors, generated through the firing at the high temperature, were milled and sieved using a 100-mesh sieve. The phosphors, obtained in the above manner, were washed and dispersed using hydrofluoric acid and hydrochloric acid, were dried sufficiently, and were classified using a 50-mesh sieve, thereby obtaining phosphors of the inventive example 1.

INVENTIVE EXAMPLE 2

β-sialon phosphors were manufactured using the same method as in the inventive example 1, except that $Si_3N_4$ of 1.349 g and Si of 7.291 g were used.

INVENTIVE EXAMPLE 3

β-sialon phosphors were manufactured using the same method as in the inventive example 1, except that $Si_3N_4$ of 6.744 g and Si of 4.051 g were used.

INVENTIVE EXAMPLE 4

β-sialon phosphors were manufactured using the same method as in the inventive example 1, except that $Si_3N_4$ of 9.442 g and Si of 2.430 g were used.

INVENTIVE EXAMPLE 5

β-sialon phosphors were manufactured using the same method as in the inventive example 1, except that only Si of 8.101 g, rather than $Si_3N_4$, was used as the silicon raw material.

COMPARATIVE EXAMPLE 1

β-sialon phosphors were manufactured using the same method as in the inventive example 1, except that only $Si_3N_4$ of 13.488 g, rather than Si, was used as the silicon raw material.

INVENTIVE EXAMPLE 6

Silicon nitride ($Si_3N_4$) and metal silicon (Si) were used as a silicon raw material, aluminum nitride (AlN) was used as an aluminum raw material, and europium oxide ($Eu_2O_3$) was used as an activator. $Si_3N_4$ of 5.395 g, Si of 3.241 g, AlN of 0.379 g and $Eu_2O_3$ of 0.137 g were measured and mixed using a mixer and a sieve, and were then filled in a BN crucible and set into a pressure-resistant furnace. In a firing process, heating was carried out at 1450° C. for five hours or longer under a nitrogen atmosphere, and cooling was then conducted. Thereafter, the resultant fired material was milled. The milled fired material was filled in the BN crucible again and is set into the pressure-resistant electric furnace. Subsequently, heating was conducted up to 500° C. in a vacuum, and an $N_2$ gas was introduced at 500° C. Under an $N_2$ atmosphere, the temperature was raised from 500° C. to 2000° C. at 5° C./minute, and firing was carried out at 2000° C. under the gas pressure of 0.8 Mpa or higher for five hours.

Cooling was performed after the firing, and the crucible was taken out of the electric furnace. Thereafter, phosphors, generated through the firing at a high temperature, were milled and sieved using a 100-mesh sieve. The phosphors, obtained in the above manner, were washed and dispersed using hydrofluoric acid and hydrochloric acid, were dried sufficiently, and were classified using a 50-mesh sieve, thereby obtaining phosphors of the inventive example 6.

INVENTIVE EXAMPLE 7

β-sialon phosphors were manufactured using the same method as in the inventive example 6, except that $Si_3N_4$ of 7.554 g and Si of 1.944 g were used.

INVENTIVE EXAMPLE 8

β-sialon phosphors were manufactured using the same method as in the inventive example 6, except that only Si of 6.481 g, rather than $Si_3N_4$, was used as the silicon raw material.

COMPARATIVE EXAMPLE 2

β-sialon phosphors were manufactured using the same method as in the inventive example 6, except that only $Si_3N_4$ of 10.791 g, rather than Si, was used as the silicon raw material.

INVENTIVE EXAMPLE 9

β-sialon phosphors were manufactured using the same method as in the inventive example 6, except that $Si_3N_4$ of 6.744 g, Si of 4.051 g, $Eu_2O_3$ of 0.172 g, and only metal aluminum (Al) of 0.312 g rather than $Al_2O_3$ or AlN as the aluminum raw material were used.

COMPARATIVE EXAMPLE 3

β-sialon phosphors were manufactured using the same method as in the inventive example 9, except that only $Si_3N_4$ of 13.488 g rather than Si as the silicon raw material, and Al of 0.473 g were used.

The mixing ratios of the raw materials used in the above inventive examples and comparative examples are shown in the following Table 2.

TABLE 2

| Example number | Si3N4 (g) | Si (g) | Al₂O₃ (g) | AlN (g) | Al (g) | Eu₂O₃ (g) |
|---|---|---|---|---|---|---|
| Inventive example 1 | 4.047 | 5.671 | 0.589 | — | — | 0.141 |
| Inventive example 2 | 1.349 | 7.291 | 0.589 | — | — | 0.141 |
| Inventive example 3 | 6.744 | 4.051 | 0.589 | — | — | 0.141 |
| Inventive example 4 | 9.442 | 2.430 | 0.589 | — | — | 0.141 |
| Inventive example 5 | — | 8.101 | 0.589 | — | — | 0.141 |
| Comparative example 1 | 13.488 | — | 0.589 | — | — | 0.141 |
| Inventive example 6 | 5.395 | 3.241 | — | 0.379 | — | 0.137 |
| Inventive example 7 | 7.554 | 1.944 | — | 0.379 | — | 0.137 |
| Inventive example 8 | — | 6.481 | — | 0.379 | — | 0.137 |
| Comparative example 2 | 10.791 | — | — | 0.379 | — | 0.137 |
| Inventive example 9 | 6.744 | 4.051 | — | — | 0.312 | 0.172 |
| Comparative example 3 | 13.488 | — | — | — | 0.473 | 0.172 |

Figure 115:
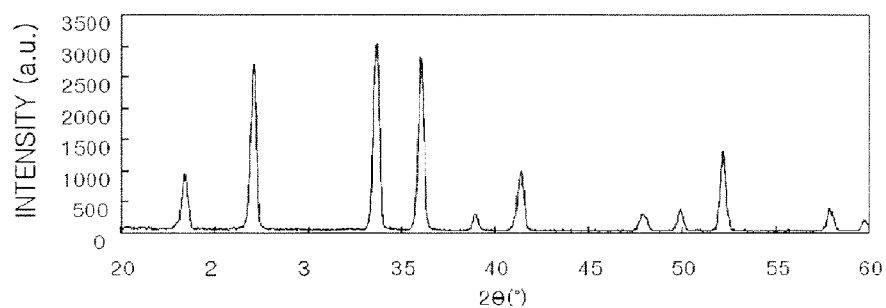
FIGS. 115 through 117 are graphs showing the X-ray diffraction analysis result, light emission spectrum and excitation spectrum of β-sialon phosphors manufactured according to inventive example 1.

The phosphors, manufactured according to the inventive example 1, were classified by a powder X-ray diffraction (XRD), and the result thereof is shown in FIG. 115. FIG. 115 and JCPD data confirm that the manufactured phosphors are β-sialon phosphors.

Figure 116:
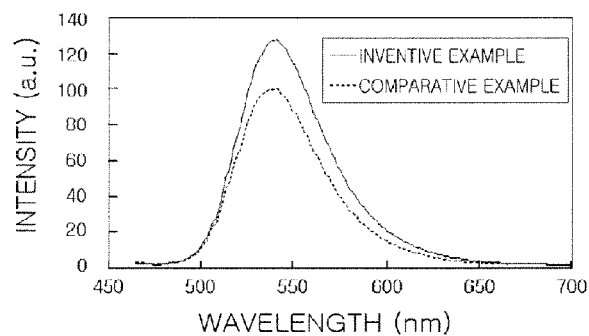

Furthermore, the light emission characteristic thereof was measured by emitting excitation light of 460 nm thereto. FIG. 116 illustrates the light emission spectrums of the β-sialon phosphors obtained using the inventive example 1 and the β-sialon phosphors obtained using the comparative example 1. The β-sialon phosphors obtained using the inventive example 1 are green light emitting phosphors having a peak wavelength of 541 nm and a half amplitude of 54.7 nm. The light intensity thereof is higher than that of the β-sialon phosphors obtained using the comparative example 1 by 27%.

Figure 117:
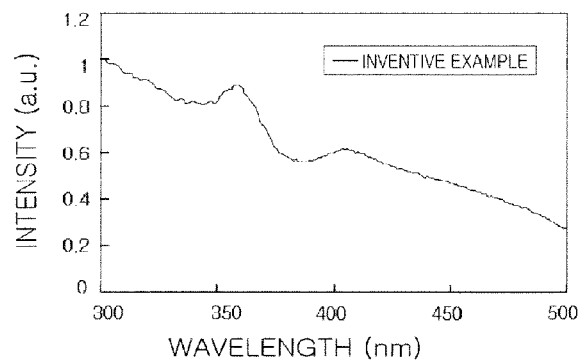

The excitation spectrum of the β-sialon phosphors obtained by the inventive example 1 was measured using emission light of 541 nm as detection light. The result thereof is shown in FIG. 117. It can be seen that an excitation band exists in an ultraviolet light region and even a visible light region of about 500 nm.

β-sialon phosphors of 7 wt %, obtained by each of the inventive examples 1 to 9 and comparative examples 1 to 3, red CaAlSiN3:Eu phosphors of 3 wt %, and silicon resin of 10 wt % were appropriately mixed and made into a slurry. This slurry is injected into a cup on a mount lead equipped with a blue LED, and is then cured at 130° C. for an hour. Using the resultant phosphors, a white LED was manufactured. The light intensity of the manufactured white LED was measured.

The peak wavelengths of light, emitted from the β-sialon phosphors, obtained using the inventive examples 1 to 9 and the comparative examples 1 to 3, and the light intensity of white LEDs using the same are shown in Table 3 below (wt %).

TABLE 3

| Example number | silicon raw material Kinds | Si/Si₃N₄ (wt %) | Aluminum raw material Kinds | Peak wavelength(nm) of emitted light | Intensity (sb) |
|---|---|---|---|---|---|
| Inventive example 1 | Si/Si₃N₄ | 70/30 | Al₂O₃ | 541 | 127 |
| Inventive example 2 | Si/Si₃N₄ | 90/10 | Al₂O₃ | 541 | 124 |
| Inventive example 3 | Si/Si₃N₄ | 50/50 | Al₂O₃ | 541 | 124 |
| Inventive example 4 | Si/Si₃N₄ | 30/70 | Al₂O₃ | 541 | 107 |
| Inventive example 5 | Si | — | Al₂O₃ | 541 | 118 |
| Comparative example 1 | Si₃N₄ | — | Al₂O₃ | 541 | 100 |
| Inventive example 6 | Si/Si₃N₄ | 50/50 | AlN | 540 | 113 |
| Inventive example 7 | Si/Si₃N₄ | 30/70 | AlN | 538 | 115 |
| Inventive example 8 | Si | — | AlN | 540 | 106 |
| Comparative example 2 | Si₃N₄ | — | AlN | 540 | 100 |
| Inventive example 9 | Si/Si₃N₄ | 50/50 | Al | 540 | 119 |
| Comparative example 3 | Si₃N4 | — | AlN | 536 | 100 |

The phosphors, obtained using the inventive examples 1 to 9 and the comparative examples 1 to 3, emit light having a peak wavelength of about 540 nm, and are thus determined to be green light emitting phosphors. The white LEDs using the phosphors, obtained using the inventive examples 1 to 3, have relatively high light intensity levels ranging from 124 to 127.

However, the inventive example 4 in which the content of metal silicon is smaller than the content of silicon nitride, realizes a lower light intensity level than the light intensity levels in the inventive examples 1 to 3 in which the content of the metal silicon is greater than the content of silicon nitride. The inventive examples 5 and 8, utilizing only Si as the silicon raw material, realize a lower light intensity level than the light intensity levels in the inventive examples 1, 2, 3 and 6, while realizing a higher light intensity level than the light intensity levels of the inventive examples 4, 6 and 7, in which the content of metal silicon is smaller than the content of silicon nitride. Thus, it can be confirmed that β-sialon phosphors realizing high light intensity can be manufactured when using the metal silicon.

The comparative examples 1 through 3 using only $Si_3N_4$ as the silicon raw material each realize a light intensity level of 100. Thus, it can be seen that they have lower light intensity levels than when metal silicon is not used as a base raw material as in the inventive examples.

In addition, a high level of light intensity is attained even when both metal silicon and metal aluminum are used as in the inventive example 9.

The above-described β-sialon phosphors may be advantageously applied to light emitting devices and modules that generate white light by the combination with other phosphors.

<Backlight Unit>

A backlight unit, according to the present invention, includes the above-described light emitting device package. The light emitting device package, equipped with the semiconductor light emitting device according to the present invention, may be used as light sources for various devices such as lighting equipment, car headlights and the like, as well as surface light sources such as backlight units.

Hereinafter, a backlight unit including the light emitting device package will be described according to various embodiments of the present invention.

Figure 118:
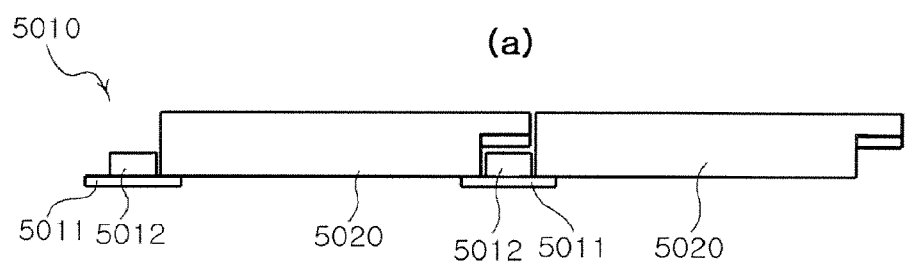
FIGS. 118 and 119 are schematic perspective views illustrating a surface light source device having a flat light guide plate, and the light guide plate according to an exemplary embodiment of the present invention.
Figure 118:
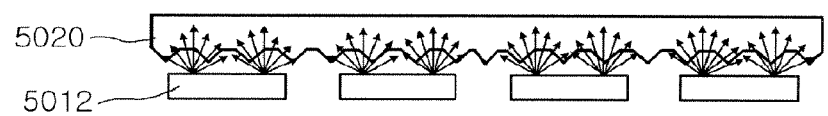

FIGS. 118A and 118B are schematic views illustrating a surface light source device including a flat light guide plate, i.e., a backlight unit, according to an exemplary embodiment of the present invention.

As shown in FIG. 118A, a backlight unit 5000 including a flat light guide plate according to the present invention, is a tandem surface light source device, and includes N LED light source modules 5010, and N flat light guide plates 5020.

Each of the N LED light source modules 5010 includes a board 5011, and a plurality of light emitting device packages 5012 arranged in a row on the board 5011. The N LED light source modules 5010, configured in the above manner, are arranged parallel to one another. Each flat light guide plate 5020 is arranged and installed along one side of a corresponding LED light source module of the N LED light source modules 5010.

The backlight unit having the flat light guide plates 5020 may include a reflective member (not shown) disposed under the LED light source module 5010 and the flat light guide plate 5020 and reflecting light emitted from the LED light source module 5010.

Also, an optical sheet (not shown) may be provided on the flat light guide plate 5020. An example of the optical sheet may include a diffusion sheet diffusing light, output toward a liquid crystal panel after being reflected by the reflective member and refracted by the flat light guide plate, in various directions, or a prism sheet collecting light, having passed through the diffusion sheet, within a front viewing angle.

In more detail, the LED light source module 5010 may include a plurality of light emitting device packages 5012 each mounted using a top-view method. The flat light guide plate 5020 is a plate-type, and is formed of a transparent material to transmit light and disposed in a direction in which light is emitted from the LED light source. The flat light guide plate is simple in shape and easy to manufacture as compared to a wedge type light guide plate, and facilitates the positioning thereof on an LED light source.

The flat light guide plate 5020 includes a light input portion 5021 receiving light emitted from the LED light source module 5010, a light output portion 5024 having a flat plate shape with a uniform thickness and outputting light, received from the LED light source module, toward a liquid crystal panel as illuminating light, and a leading edge portion 5022 protruding from the opposite side to the light input portion 5021 with reference to the light output portion 5024, and having a smaller thickness than that of the light input portion 5021. The flat light guide plate 5020 is disposed such that the leading edge portion 5022 thereof covers the LED light source module 5010. Namely, the N+1$^{th}$ LED light source module 5010 is placed under the leading edge portion 5022 of the n$^{th}$ flat light guide plate 5020. The bottom of the leading edge portion 5022 of the flat light guide plate 5020 has a prism shape 5023.

As shown in FIG. 118B, light emitted from the light emitting device package 5012 is not directly output to the flat light guide plate 5020 but is scattered and dispersed by the prism shape 5023 formed on the bottom of the leading edge portion 5022 of the flat light guide plate 5020. Accordingly, hot spots may be removed from the light guide plate over the LED light source module 5010.

Figure 119:
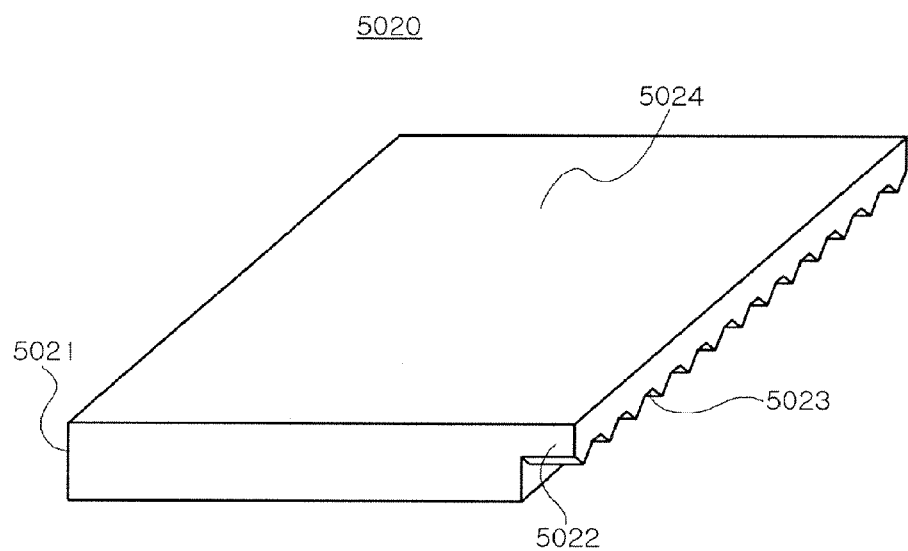

FIG. 119 is a schematic perspective view illustrating the flat light guide plate 5020 depicted in FIGS. 118A and 118B. As shown in FIG. 119, the flat light guide plate 5020 includes the light input portion 5021 receiving light emitted from the light source module 5010 including the plurality of light emitting device packages 5012, the light output portion 5024 having a flat plate shape with a uniform thickness and outputting light, incident on the light input portion 5021, toward a liquid crystal panel (not shown) as illuminating light, and the leading edge portion 5022 formed at the opposite side to the light input portion 5021 with reference to the light output portion 5024 and having a smaller section than the light incidence section of the light input portion 5021.

The leading edge portion 5022 has the prism shape 5023 in order to disperse a portion of light emitted from the light emitting device packages 5012 arranged thereunder. The prism shape may be at least one of a triangular prism, a cone prism and a hemispherical prism.

The prism shape of the leading edge portion 5022 may be formed on the entirety of the leading edge portion 5022, or may be formed only over the light emitting device packages 5012. The prism shape is contributive to removing hot spots generated on the flat light guide plate 5020 over the light emitting device packages 5012.

According to the present invention, the prism shape 5023 is formed on the bottom of the leading edge portion 5022 of the flat light guide plate 5020. Thus, there is no need for performing the process of forming a separate diffusion sheet and a prism sheet between the light emitting device package 5012 and the flat light guide plate 5020 in order to disperse hot spots that are generated by a portion of the light, emitted from the light emitting device package 5012, over the flat light guide plate 5020.

A backlight unit including a flat light guide plate, according to another exemplary embodiment of the present invention, will now be described with reference to FIGS. 120 through 125.

Figure 120:
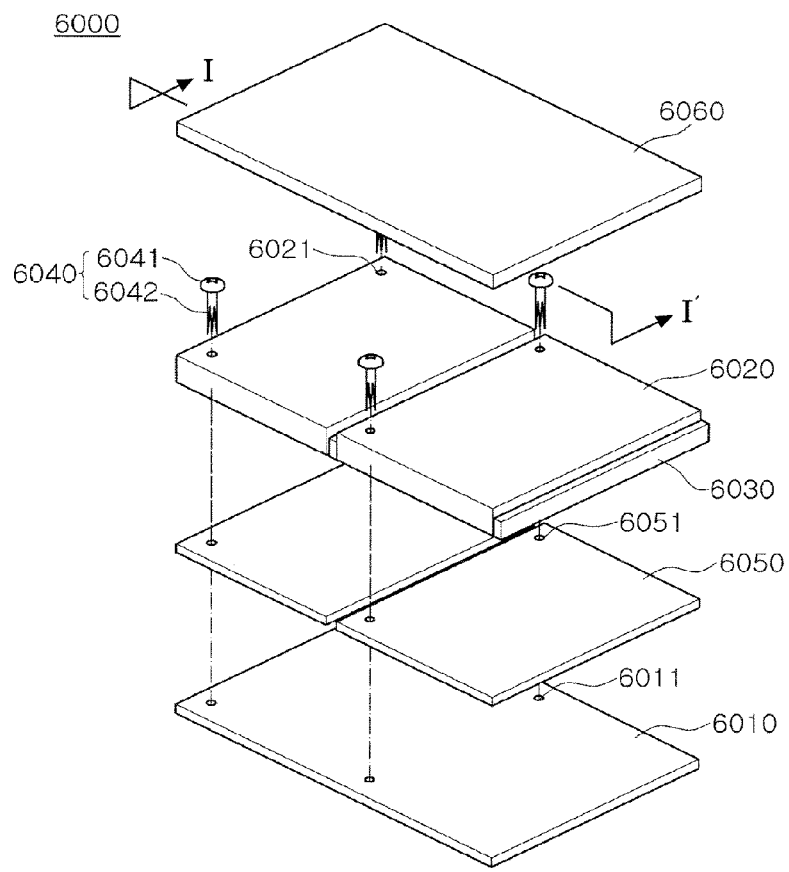
FIGS. 120 through 125 are views illustrating a backlight unit having a flat light guide plate according to another exemplary embodiment of the present invention.
Figure 121:
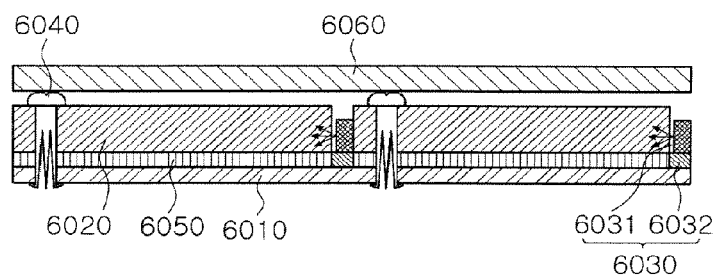

FIG. 120 is an exploded perspective view illustrating a backlight unit according to another exemplary embodiment of the present invention, FIG. 121 is a cross-sectional view taken along line I-I' of FIG. 120, illustrating the assembled backlight unit. Here, the backlight unit may include a plurality of light guide plates. However, two light guide plates are illustrated for the ease of description.

Referring to FIGS. 120 and 121, a backlight unit 600 includes a lower cover 6010, a light guide plate 6020, a light source device 6030 and a fixing member 6040.

The lower cover 6010 has a receiving space. For example, the receiving space may be formed by a plate constituting the bottom of the lower cover 6010, and the sidewall extending from the edge of the plate in a perpendicular manner.

The lower cover 6010 may include a coupling hole or a coupling portion 6011 to which the fixing member 6040 to be described later is coupled. Here, the coupling hole or the coupling portion 6011 may be provided in the form of a hole portion through which the fixing member 6040 penetrates, or a recess portion in which the fixing member 6040 is inserted.

The light guide plate 6020 may provided in the form of a plurality of divided light guide plates 6020. The divided light guide plates 6020 are disposed in the receiving space of the lower cover 6010 in a parallel manner.

Each of the light guide plates 6020 has through holes 6021 penetrating the body thereof. The through hole 6021 is disposed at the edge of the light guide plate 6020. In this embodiment of the present invention, the location and number of through holes 6021 is not limited. The through hole 6021 is located corresponding to the coupling portion 6011.

Although illustrated as having a quadrangular shape, the light guide plate 6020 is not limited to the illustrated shape, but may have various shapes such as a triangle, a hexagon or the like.

A plurality of light source devices 6030 are disposed at one side of each light guide plate 6020 to provide light to the light guide plate 6020. Each of the light source devices 6030 may include a light emitting device package 6031, a light source that forms light, and a board 6032 including a plurality of circuit patterns for supplying the driving voltage of the light emitting device package 6031.

For example, the light emitting device package 603 may include sub-light emitting devices respectively realizing blue, green and red colors. Red light, green light and red light emitted from the sub-light emitting devices, realizing blue, green and red colors respectively, are mixed to generate white light. Alternatively, the light emitting device package may include a blue light emitting device and phosphors that convert blue light from the blue light emitting device into yellow light. At this time, the blue light and the yellow light are mixed to thereby realize white light.

The light emitting device package and the phosphors have already been described above in detail, and thus a description thereof will be omitted.

Light formed by the light source device 6030 is incident on the side surface of the light guide plate 6020 and is output upwardly by the total internal reflection of the light guide plate 6020.

The fixing member 6040 serves to fix the light guide plate 6020 to the lower cover 6010 so as to prevent the movement of the light guide plate 6020. The fixing member 6040 is inserted into the through hole 6021 of the light guide plate 5020 to thereby fix the light guide plate 6020 onto the lower cover 6010. Furthermore, the fixing member 6040 may be coupled with the coupling portion 6011 by way of the through hole 6021 of the light guide plate 120. For example, the fixing member 6040 may pass through the coupling portion 6011 configured as the hole portion or be inserted into the coupling portion 6011 configured as the recess portion.

The fixing member 6040 includes a body portion 6042, and a head portion 6041 extending from the body portion 6042.

The body portion 6042 penetrates the through hole of the light guide plate 6020, and is coupled with the coupling portion 6011. That is, the body portion 6042 couples the light guide plate 6020 and the lower cover 6010 with each other to thereby fix the light guide plate 6020 on the lower cover 6010.

The head portion 6041 has a wider width than the body portion 6042 to thereby prevent the fixing member 6040 from being completely separated from the through hole 6021 of the light guide plate 6020.

The head portion 6041 may have one of various sectional shapes such as semi-circular, semi-oval, quadrangular and triangular shapes. Here, the head portion 6041, when having a triangular sectional shape, may minimize contact between the fixing member 6040 and an optical member 6060 to be described later, and this may minimize the generation of black spots caused by the fixing member 6040.

The light guide plate 6020 and the optical member 6060 are spaced apart from each other at a predetermined interval, and thus light emitted from the light guide plate 6020 may be uniformly provided on the optical member 6060. Here, the head portion 6041 supports the optical member 6060 and serves to maintain the interval between the light guide plate 6020 and the optical member 6060. Here, the interval between the light guide plate 6020 and the optical member 6060 may be adjusted by controlling the height of the head portion 6041.

The fixing member 6040 may be formed of a light transmissive material, for example transparent plastic, in order to minimize its influence on image quality.

Furthermore, a reflective member 6050 may be disposed under each of the light guide plates 6020. The reflective member 6050 reflects light emitted to the lower side of the light guide plate 6020 and thus causes the light to be re-incident on the light guide plate 6020, thereby enhancing the light efficiency of the backlight unit.

The reflective member 6050 may include a through portion 6051 corresponding to the through hole 6021 and the coupling portion 6011. The fixing member 6040 may be coupled with the coupling portion 6011 by way of the through hole 6021 and the through portion 6051. Accordingly, when the reflective member 6050 is provided in the form of a plurality of divided reflective members 6050 like the light guide plate 6020, the reflective member 6050 can be fixed on the lower cover 6010 by the fixing member 6040.

Furthermore, the backlight unit may further include the optical member 6060 disposed over the light guide plate 6020. An example of the optical member 6060 may include a diffusion plate, a diffusion sheet, a prism sheet and a protective sheet disposed over the light guide plate 6020.

Thus, according to this embodiment of the present invention, the backlight unit includes a plurality of divided light guide plates, thereby further enhancing a local dimming effect through local driving.

Also, the plurality of divided light guide plates are fixed on the lower cover using the fixing member, thereby preventing defects caused by the movement of the light guide plate.

Moreover, since the fixing member can maintain the uniform interval between the light guide plate and the optical member, light can be uniformly provided to a liquid crystal panel.

Figure 122:
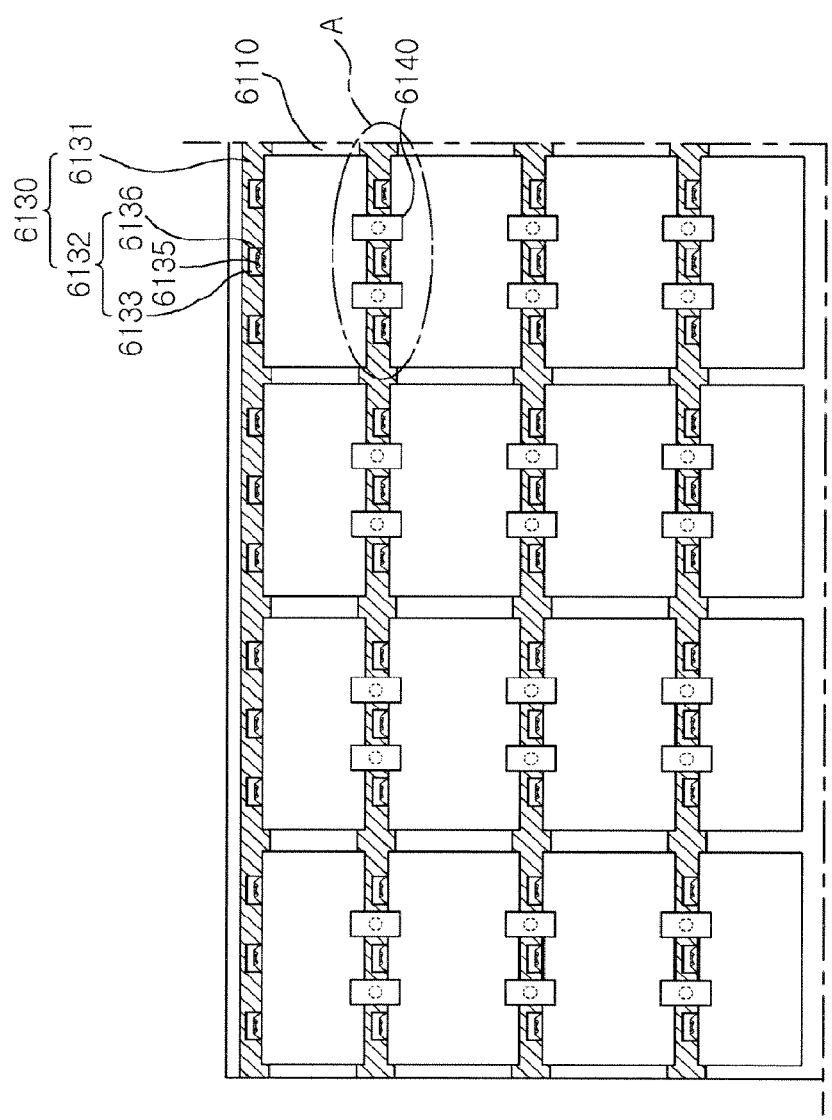
Figure 123:
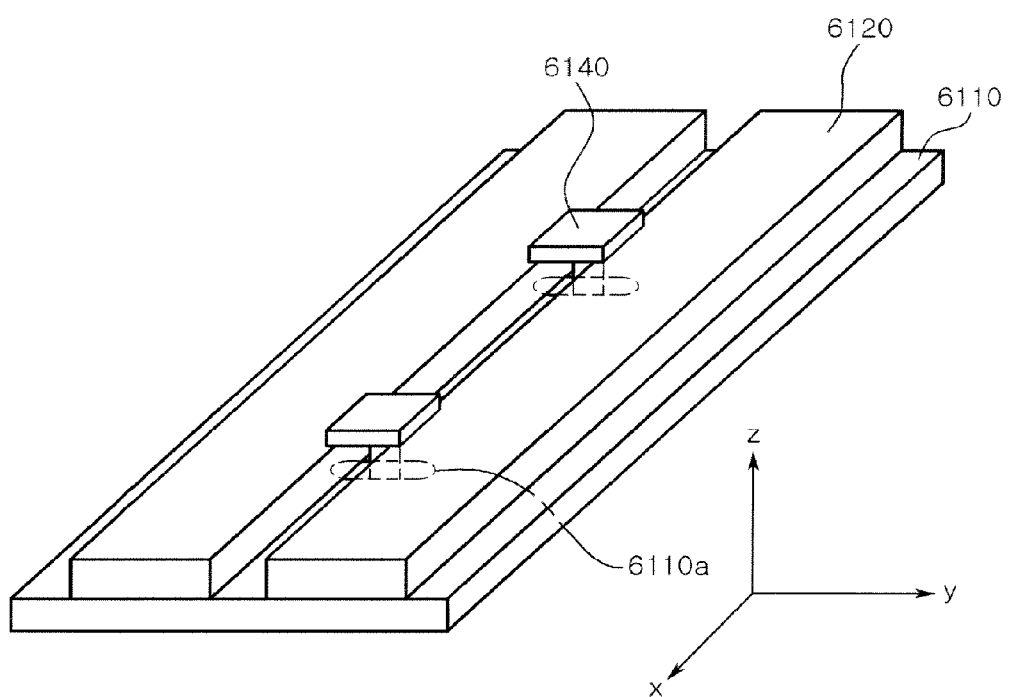
Figure 124:
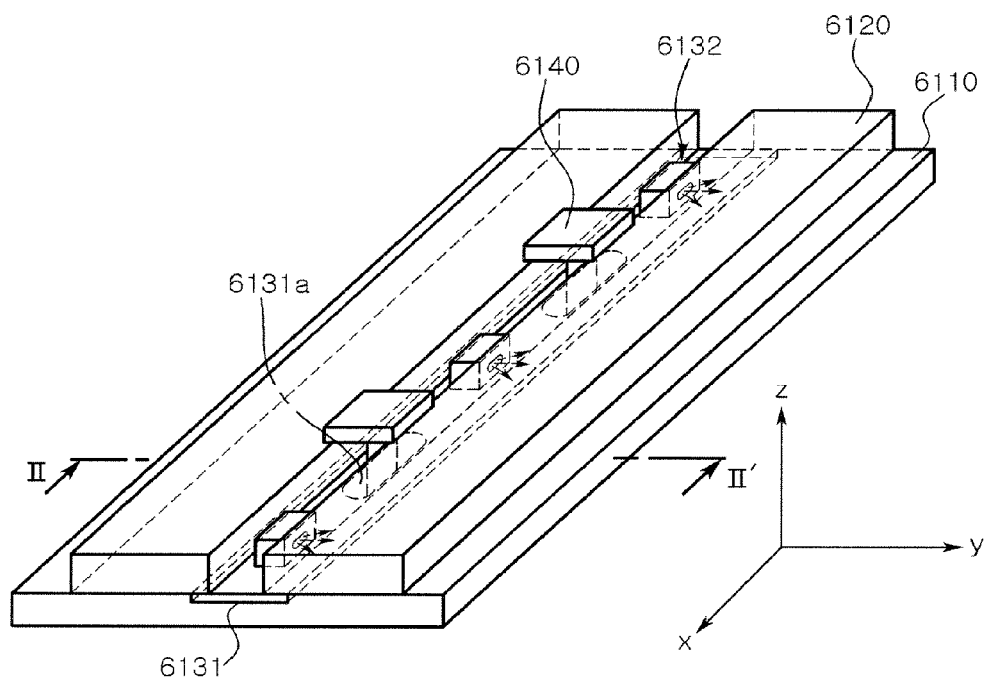
Figure 125:
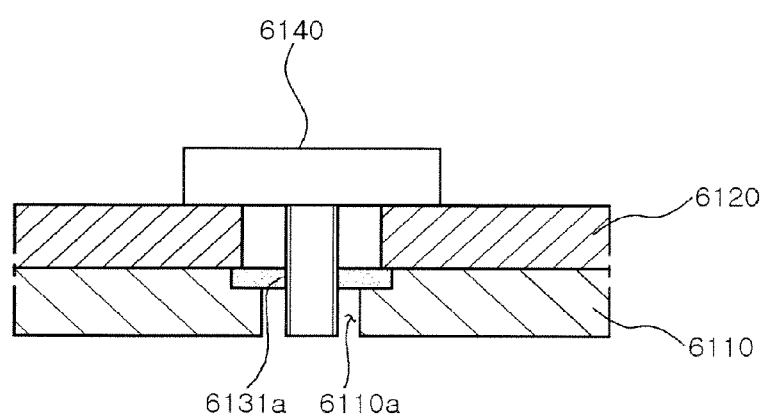

FIG. 122 is a plan view illustrating an LED backlight unit according to another exemplary embodiment of the present invention. FIG. 123 is a cross-sectional perspective view illustrating region A indicated in FIG. 122 before a board is coupled, and FIG. 124 is a cross-sectional perspective view illustrating the region A indicated in FIG. 122 after the board is coupled. FIG. 125 is a cross-sectional view taken along line II-II' of FIG. 124.

As shown in FIGS. 122 through 125, an LED backlight unit, according to the present invention, includes a lower cover 6110, a plurality of light guide plates 6120, a board 6131, a plurality of LED packages 6132, and a fixing member 6140. The lower cover 6110 has a coupling hole or portion provided in the form of a first through hole 6110a or a recess. The plurality of light guide plates 6120 are disposed on the lower cover 6110. The board 6131 is disposed at one side of each of the light guide plates 6120 in a manner parallel to the bottom of the bottom of the lower cover 6110, includes wires receiving voltage from the outside, and has a second through hole 6131a corresponding (or facing) the first through hole 6110a of the lower cover 6110. The plurality of light emitting device packages 6132 are mounted on the board 6131 provided at one side of a corresponding light guide plate of the light guide plates 6120. The fixing member 6140 is coupled with the second through hole 6131a of the board 6131 and/or the first through hole 6110a of the lower cover 6110, and press the edge portions of the adjacent light guide plates 6120.

Here, the lower cover 6110 has the first through hole 6110a penetrating a plate in the form of, for example, a circular, rectangular or oval shape (alternatively, a coupling recess recessed in the plate). Here, the plate serves as the bottom of the receiving space of the lower cover 6110. Such a lower cover 6110 is formed of material such as iron (Fe) or electrolytic galvanized iron (EGI). Also, the lower cover 6110 may have a sidewall, namely, a side frame extending upwardly from the edge of the plate, serving as the bottom, in a perpendicular manner. The bottom of the lower frame may be divided into a plurality of regions arranged in a row in order to realize a backlight unit capable of local dimming. The plurality of regions may be bordered by a recess or the like. Of course, the recess, bordering the plurality of regions, corresponds to a receiving recess for the board 6131 as will be described later.

The first through hole 6110a in the lower cover 6110 may have various shapes besides a circular, oval or rectangular shape. However, the first through hole 6110a may have two parallel longer sides and two shorter sides formed with a predetermined curvature at both ends of the two longer sides so as to connect the two longer sides. Here, the first through hole 6110a may be formed such that the longer axis (Y-axis) of the first through hole 6110a is located in the same direction as the direction in which light moves. Even when the coupling recess, rather than the first through hole 6110a, is formed, the coupling recess has the same structural characteristic as described above.

A reflective plate (not shown) is attached to the entirety of the bottom of the lower cover 6110. Alternatively, when a receiving recess is formed in the bottom of the lower cover 6100, a plurality of reflective plates (not shown) are respectively attached on a plurality of bottom regions other than the receiving recess. The reflective plate utilizes a white polyester film or a film coated with metal such as Ag or Al. The visible light reflectance of the reflective plate ranges from about 90% to 97%. The thicker the coated film is, the higher the reflectance becomes.

The plurality of reflective plates on the bottom of the lower cover 6110 may each extend so as to be placed between the light emitting device packages 6132 providing light and the light guide plate 6120 adjacent to the back of the light emitting device package 6132. In this case, induced light provided from one side of the light guide plate 6120 may be reflected again by the reflective plate without being interrupted by the light emitting device package 6132 disposed at the opposite side of the light guide plate 6120. Then, the reflected light may be provided toward an optical member (not shown) provided at the upper side, thereby enhancing the light reflection efficiency.

An LED light source 6130 is provided in the receiving recess of the lower cover 6110 or at one side of the light guide plate 6120. The LED light source 6130 includes the board 6131, i.e., a printed circuit board (PCB), and the light emitting device package 6132 mounted on the board 6131. The board 6131 is provided in, for example, the receiving recess to thus be placed on the same horizontal level as the bottom of the lower cover 6110, includes wires for receiving voltage from the outside, and has a second through hole 6131a corresponding to the first through hole 6110a of the lower cover 6110.

The board 6131 has the second through hole 6131a formed between the light emitting device package 6132 and the light emitting device package 6132. The board 6131 having the second through hole 6131a is provided on the bottom of the lower cover 6110 such that the second through hole 6131a corresponds to (or faces) the first through hole 6110a of the lower cover 6110. The second through hole 6131a in the board 6131 may have, for example, a circular or oval shape like the first through hole 6110a of the lower cover 6110. However, according to the present invention, the second through hole 6131a may have two parallel longer sides and two shorter sides formed with a predetermined curvature at both ends of the two longer sides so as to connect the two longer sides. At this time, the second through hole 6131a is formed such that the direction of the longer axis (X-axis) of the second through hole 6131a becomes perpendicular to the direction in which light moves. Accordingly, the second through hole 6131a of the board 6131 has its longer axis (X-axis) crossing the longer axis (Y-axis) of the first through hole 6110a of the lower cover 6110.

The size of the second through hole 6131a formed in the board 6131, more precisely, the interval between the two longer sides thereof, may be associated with the diameter of the body of the fixing member 6140 including a screw thread. This is because the size of the second through hole 6131a may affect the interval between the light emitting device package 6132 providing light and the light guide plate 6120 receiving and inducing light provided from the light emitting device package 6132. This will be described later.

In addition, the light emitting device package 6132 includes a package body 6133 fixed on the board 6131, forming an exterior frame and having a receiving recess, a light emitting device 6136 mounted in the receiving recess of the package body 6133 and providing light, and a pair of first and second electrode structures (not shown) exposed in the receiving recess, electrically connected with a wire formed on the board 6131, and on which the light emitting device 6135 is mounted.

In the case that the light emitting device 6136 is a blue light emitting device, the light emitting device package 6132 may additionally include a resin encapsulant 6136 in the receiving recess in order to provide white light. Here, the resin encapsulant 6136 may include yellow phosphors. For example, the resin encapsulant 6136 may be formed by injecting a gel-phase epoxy resin containing YAG-based yellow phosphors or a gel-phase silicon resin containing YAG-based yellow phosphors into the receiving recess of the package body 6133, and subsequently performing UV curing or thermal curing thereon.

Of course, the present invention is not limited to the light emitting device package 6132 including the blue light emitting device and the yellow phosphors. For example, the light emitting device package 6132 may include a near ultraviolet chip and a resin encapsulant provided on the near ultraviolet chip and containing a mixture of red, green and blue phosphors. Also, the resin encapsulant may be formed by sequentially stacking layers respectively containing red, green and blue phosphors.

The plurality of light guide plates 6120 are provided on the bottom of the lower cover 6110 divided into a plurality of regions, respectively. In this case, the side surface of the light guide plate 6120 may be adhered to the package body 6133, so that light, provided from the light emitting device 6135 mounted in the receiving recess of the package body 6133, can be induced into the light guide plate 6120 without loss.

The light guide plate 6120 is formed of PMMA, and as PMMA has the lowest light absorbency in a visible light region among polymer materials, it thus has significantly high transparency and gloss. The light guide plate 6120, formed of PMMA, is not broken or deformed due to its high mechanical strength, and has high visible-light transmittance of 90% to 91% and considerably low internal loss. Also, this light guide plate 6120 has superior chemical properties, resistance and mechanical properties such as tensile strength and bending strength.

The fixing unit 6140 is coupled to the board 6131 between the light guide plates 6120. The fixing member 6140 is formed of a transparent material and has a screw-like shape. The fixing member 6140 is coupled by penetrating the second through hole 6131*a* of the board 6131 and the first through hole 6110*a* of the lower cover 6110 corresponding to the second through hole 6131. Thus, the fixing member 6140 fixes the adjacent light guide plates 6120 placed at both sides of the light emitting device package 6132, that is, at the front side outputting light and the back side opposite to the front side, while maintaining a uniform interval between the light guide plates.

Here, the fixing member 6140, according to the present invention, is formed of a transparent material, so that light, induced in the light guide plate 6120, can be provided to the optical member above without interruption. The fixing member 6140 may be formed of the same material as the light guide plate 6120.

The fixing member 6140, according to the present invention, includes a head portion that may have various shapes such as a circular or quadrangular shape, and a body portion extending from the head portion and having a cylindrical shape or the like. The fixing member 6140 may be fixed to the second through hole 6131*a* of the board 6131 and/or the first through hole 6110*a* of the lower cover 6110 by using a screw thread formed on the outer surface of the body portion of the fixing member 6140. Of course, the body portion of the fixing member 6140 may have a square column shape.

The head portion has a size large enough to cover the interval between the light guide plates 6120, and the edge of the light guide plates 6120 in part. Thus, the size of the head portion may be slightly varied depending on the interval between the light guide plates 6120, and the diameter of the body portion may be the same as the interval between the two parallel longer sides of the second through hole 6131*a* of the board 6131 and/or the first through hole 6110*a* of the lower cover 6110.

Furthermore, the size of the head portion of the fixing unit 6140 or the diameter of the body portion thereof may be slightly varied depending on the size of the second through hole 6131*a* of the board 6131 described above. For example, when the size of the second through hole 6131*a* of the board 6131 is small, the diameter of the body portion of the fixing member 6140 is also small. This may mean that the interval between the light emitting device package 6132 and the light guide plate 6120 can be reduced.

When the fixing member 6140 is coupled with the board 6131 and/or the lower cover 6110 in a screw-like manner, the head portion of the fixing member 6140 presses the upper edge portions of the adjacent light guide plates 6120 disposed on the board 6131 to which the light emitting device package 6132 is fixed. Accordingly, the movements of the light guide plates 6120 can be prevented even under external shock.

Also, a nut may be coupled to a portion of the fixing member 6140 exposed to the outside through the first through hole 6110*a* of the lower cover 6110, so that the fixing member 6140 can attain reinforced strength.

Consequently, the fixing member 6140 coupled on the board 6131 may serve as a spacer between the light emitting device package 6132 and the light guide plate 6120. Thus, the fixing member 6140 maintains a uniform interval between the light emitting device package 6132 and the light guide plate 6120, thereby becoming capable of coping with the shrinkage and/or expansion of the light guide plate 6120.

Of course, the fixing member 6140 is not limited to having a screw thread. For example, as shown in FIG. 121, the fixing member 6140 may be provided as a screw having a head portion and an opposite hooked end portion. In this case, the fixing member 6140 penetrates the second through hole 6131*a* of the board 6131 and the first through hole 6110*a* of the lower cover, and is fixed to the lower cover 6110 by the hooked end portion.

An optical member (not shown) is provided above the plurality of light guide plates in order to supplement the optical characteristic of light provided through the light guide plates 6120. Here, the optical member may include a diffusion plate having a diffusion pattern to reduce the non-uniformity of light transmitted through the light guide plates 6120, and a prism sheet having a condensing pattern for enhancing the front intensity of light.

By the above construction according to the present invention, the fixing member 6410 is provided between the light guide plates 6120 so as to fix the light guide plates 6120 while maintaining a uniform interval therebetween. This construction can prevent the movement of the light guide plates 6120, caused by external shock, and cope with the shrinkage of the light guide plates 6120 in a direction (X-axis) perpendicular to the direction in which light moves.

The second through hole 6131*a* of the board 6131, having a longer axis and a shorter-axis direction, can deal with the shrinkage of the board 6131 in the longer-axis direction (X-axis) of the second through hole 6131*a*.

Furthermore, the fixing member 6140 is coupled with the first through hole 6110*a* having a longer-axis (Y-axis) in the direction that light moves. Thus, even if the light guide plate 6120 shrinks and/or expands, the light guide plate 6120, the fixing member 6140 and/or the board 6131 can move together along the longer axis (Y-axis) of the first through hole 6110*a* of the lower cover 6110. Accordingly, the uniform interval between the light guide plate 6120 and the light emitting device package 6132 can be maintained, bright spots and bright lines can be further prevented as compared to the related art.

A liquid crystal display according to the present invention may include the LED backlight unit according to the above exemplary embodiments, and may further include a liquid crystal panel (not shown) provided on the optical member.

Here, the liquid crystal display may further include a mold structure called a main support in order to prevent the warp of the display device caused by external shock. The backlight unit is provided under the main support, and the liquid crystal panel is loaded on the main support.

The liquid crystal panel includes a thin film transistor array substrate and a color filter substrate that are attached together, and a liquid crystal layer injected between these two substrates.

Signal lines such as gate lines and data lines cross one another on the thin film transistor array substrate, and thin film transistors (TFT) are formed at the respective crossings of the data and gate lines. The TFT transfers video signals, which are to be sent to liquid crystal cells of the liquid crystal layer from the data lines, that is, red (R), green (G) and blue (B) data signals, in response to scan signals provided through the gate lines. Also, pixel electrodes are formed in the pixel regions between the data and gate lines.

The color filter substrate includes thereon, a black matrix formed corresponding to the gate and data lines of the thin film transistor array substrate, color filters formed in regions defined by the black matrix to provide red (R), green (G) and blue (B) colors, and a common electrode provided on the black matrix and the color filters.

Data pads extending from the data lines and gate pads extending from the gate lines are formed at the edge of the thin film transistor array substrate attached with the color filter substrate. A gate driver and a data driver are respectively connected to the data pads and the gate pads, and supply signals thereto.

An upper cover may be provided on the liquid crystal panel. Here, the upper cover covers the four sides of the liquid crystal panel and is fixed to the lower cover 210 or the sidewall of the main support. Of course, the upper cover is formed of the same material as the lower cover 210.

As set forth above, according to exemplary embodiments of the invention, the semiconductor light emitting device includes a first electrode having a portion formed on a light-emitting surface and the other portion disposed under an active layer, thereby maximizing the light-emitting area.

Since the electrode is uniformly disposed on the light emitting surface, the current can be spread stably even when high operating current is applied thereto.

Furthermore, the uniform current spreading can be achieved to thereby reduce current crowding during high-current operation and thus enhance reliability.

While the present invention has been shown and described in connection with the exemplary embodiments, it will be apparent to those skilled in the art that modifications and variations can be made without departing from the spirit and scope of the invention as defined by the appended claims.

The invention claimed is:

1. A semiconductor light emitting device, comprising:
a conductive substrate;
a light emitting structure having a second semiconductor layer, an active layer, and a first semiconductor layer sequentially disposed on the conductive substrate, the first semiconductor layer having first and second surfaces, the first surface being adjacent to the active layer and the second surface being opposite to the first surface;
a second electrode layer including at least one exposed region formed by exposing a portion of an interface between the second electrode layer and the second semiconductor layer, the exposed region extending toward a side surface of the light emitting structure that is exposed outwardly of the light emitting structure;
a first electrode layer penetrating the second electrode layer, the second semiconductor layer, and the active layer and being electrically connected to the first semiconductor layer by being extended toward the second surface of the first semiconductor layer through a plurality of contact holes penetrating predetermined regions of the first semiconductor layer, the first electrode layer being electrically connected to the conductive substrate by being in contact with the conductive substrate;
an insulating layer electrically separating the first electrode layer from the second electrode layer, the second semiconductor layer, and the active layer by being disposed between the first electrode layer and the second electrode layer and on side surfaces of the contact holes; and
an electrode pad portion disposed on the exposed region of the second electrode layer.

2. The semiconductor light emitting device of claim 1, wherein the contact holes are uniformly arranged.

3. The semiconductor light emitting device of claim 1, wherein the number of the contact holes is 1 to 48,000.

4. The semiconductor light emitting device of claim 1, wherein the contact area between the first electrode layer and the first semiconductor layer is $6,150\,\mu m^2$ to $156,800\,\mu m^2$ per $1,000,000\,\mu m^2$ area of the semiconductor light emitting device.

5. The semiconductor light emitting device of claim 2, wherein a distance between central points of adjacent contact holes among the contact holes is $5\,\mu m$ to $500\,\mu m$.

6. The semiconductor light emitting device of claim 1, wherein the exposed region of the second electrode layer is formed at a corner of the semiconductor light emitting device.

7. The semiconductor light emitting device of claim 1, wherein the second electrode layer elects light generated from the active layer.

8. The semiconductor light emitting device of claim 1, wherein the second electrode layer includes one selected from the group consisting of Ag, Al, Pt, Ni, Pt, Pd, Au, Ir and a transparent conductive oxide.

9. The semiconductor light emitting device of claim 1, wherein the conductive substrate includes one selected from the group consisting of Au, Ni, Al, Cu, W, Si, Se, and GaAs.

10. The semiconductor light emitting device of claim 1, wherein the contact area between the first electrode layer and the first semiconductor layer is 3% to 13% of a total area of the second surface of the light emitting structure.

11. The semiconductor light emitting device of claim 1, wherein a contact area between the first electrode layer and the first semiconductor layer is 0.615% to 15.68% of a total area of the second surface of the light emitting structure.

12. The semiconductor light emitting device of claim 1, wherein the first electrode layer has a substantially flat shape except for a region in which the contact holes are disposed.

13. The semiconductor light emitting device of claim 1, wherein the second electrode layer has a substantially flat shape.

* * * * *